(12) United States Patent
Hashimoto

(10) Patent No.: US 12,353,722 B2
(45) Date of Patent: *Jul. 8, 2025

(54) INFORMATION PROCESSING APPARATUS, METHOD FOR CONTROLLING INFORMATION PROCESSING APPARATUS, NON-TRANSITORY RECORDING MEDIUM STORING CONTROL TOOL, HOST DEVICE, NON-TRANSITORY RECORDING MEDIUM STORING PERFORMANCE EVALUATION TOOL, AND PERFORMANCE EVALUATION METHOD FOR EXTERNAL MEMORY DEVICE

(71) Applicant: KIOXIA CORPORATION, Tokyo (JP)

(72) Inventor: Daisuke Hashimoto, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 82 days.

This patent is subject to a terminal disclaimer.

(21) Appl. No.: 18/336,188

(22) Filed: Jun. 16, 2023

(65) Prior Publication Data

US 2023/0342039 A1 Oct. 26, 2023

Related U.S. Application Data

(63) Continuation of application No. 17/445,273, filed on Aug. 17, 2021, now Pat. No. 11,726,661, which is a
(Continued)

(30) Foreign Application Priority Data

Aug. 19, 2011 (JP) .................... 2011-179890
Aug. 29, 2011 (JP) .................... 2011-186542

(51) Int. Cl.
*G06F 15/177* (2006.01)
*G06F 3/06* (2006.01)
(Continued)

(52) U.S. Cl.
CPC .......... *G06F 3/0616* (2013.01); *G06F 3/0619* (2013.01); *G06F 3/0647* (2013.01);
(Continued)

(58) Field of Classification Search
CPC ................................. G06F 9/4418; G06F 1/32
(Continued)

(56) References Cited

U.S. PATENT DOCUMENTS 5,936,971 A * 8/1999 Harari .................... G11C 16/16
711/E12.04
6,529,992 B1 3/2003 Thomas et al.
(Continued)

FOREIGN PATENT DOCUMENTS

JP 07-78102 3/1995
JP 2000-99338 4/2000
(Continued)

OTHER PUBLICATIONS

International Search Report issued on Oct. 9, 2012 for PCT/JP2012/070777 filed on Aug. 9, 2012.
(Continued)

*Primary Examiner* — Volvick Derose
(74) *Attorney, Agent, or Firm* — Oblon, McClelland, Maier & Neustadt, L.L.P.

(57) ABSTRACT

According to the embodiments, a nonvolatile memory device is configured to store a normal operating system, and store a bootloader. A host device is capable of initiating the normal operating system by using the bootloader. The host device is configured to determine whether a first condition is established based on information obtained from the nonvolatile memory device; and rewrite, when determined the first condition is established, the bootloader so that an emergency software is initiated when booting the host device. The emergency software is executed on the host
(Continued)

device. The host device is capable of issuing only a read command to the nonvolatile memory device under a control of the emergency software.

10 Claims, 98 Drawing Sheets

Related U.S. Application Data continuation of application No. 16/567,693, filed on Sep. 11, 2019, now Pat. No. 11,119,661, which is a continuation of application No. 16/123,586, filed on Sep. 6, 2018, now Pat. No. 10,452,283, which is a continuation of application No. 15/399,475, filed on Jan. 5, 2017, now Pat. No. 10,101,923, which is a continuation of application No. 14/178,654, filed on Feb. 12, 2014, now Pat. No. 9,594,611, which is a continuation of application No. PCT/JP2012/070777, filed on Aug. 9, 2012.

(51) Int. Cl.
| | |
|---|---|
| *G06F 9/4401* | (2018.01) |
| *G06F 11/00* | (2006.01) |
| *G06F 11/07* | (2006.01) |
| *G06F 11/10* | (2006.01) |
| *G06F 11/14* | (2006.01) |
| *G06F 11/34* | (2006.01) |
| *G06F 12/10* | (2016.01) |
| *G11C 29/52* | (2006.01) |
| *G06F 9/445* | (2018.01) |

(52) U.S. Cl.
CPC .......... *G06F 3/0652* (2013.01); *G06F 3/0653* (2013.01); *G06F 3/0659* (2013.01); *G06F 3/0679* (2013.01); *G06F 9/4401* (2013.01); *G06F 11/004* (2013.01); *G06F 11/0754* (2013.01); *G06F 11/1068* (2013.01); *G06F 11/1417* (2013.01); *G06F 11/1456* (2013.01); *G06F 11/3485* (2013.01); *G06F 12/10* (2013.01); *G11C 29/52* (2013.01); *G06F 9/4403* (2013.01); *G06F 9/4406* (2013.01); *G06F 9/4416* (2013.01); *G06F 9/44505* (2013.01); *G06F 11/1461* (2013.01); *G06F 11/3419* (2013.01); *G06F 2201/81* (2013.01); *G06F 2212/1032* (2013.01); *G06F 2212/2022* (2013.01); *G06F 2212/65* (2013.01)

(58) Field of Classification Search
USPC .......................................................... 713/2
See application file for complete search history.

(56) References Cited

U.S. PATENT DOCUMENTS

| | | | |
|---|---|---|---|
| 7,184,932 B1 | 2/2007 | Lopez et al. | |
| 7,231,322 B2 | 6/2007 | Kenworthy | |
| 7,277,821 B2 | 10/2007 | Ochi et al. | |
| 7,684,962 B2 | 3/2010 | Kenworthy | |
| 7,840,836 B2* | 11/2010 | Chang ................ | G06F 12/0246 714/11 |
| 7,861,122 B2 | 12/2010 | Cornwell et al. | |
| 8,082,384 B2 | 12/2011 | Sareen et al. | |
| 8,166,232 B2 | 4/2012 | Kawaguchi | |
| 8,230,255 B2 | 7/2012 | Dickens et al. | |
| 8,407,409 B2 | 3/2013 | Kawaguchi | |
| 8,473,670 B2 | 6/2013 | Sareen et al. | |
| 8,631,191 B2 | 1/2014 | Hashimoto | |
| 8,667,216 B2 | 3/2014 | Hashimoto | |
| 8,683,117 B2 | 3/2014 | Hashimoto | |
| 8,756,367 B2 | 6/2014 | Hashimoto | |
| 9,201,717 B2 | 12/2015 | Yano | |
| 2003/0135793 A1* | 7/2003 | Craig ................ | G11C 16/349 714/42 |
| 2004/0083473 A1 | 4/2004 | Thomas et al. | |
| 2004/0260919 A1* | 12/2004 | Takahashi ............ | H04L 69/329 713/2 |
| 2005/0204115 A1* | 9/2005 | Matsuno ............ | G06F 12/0246 711/163 |
| 2005/0235131 A1* | 10/2005 | Ware ................. | G06F 12/10 711/156 |
| 2006/0085166 A1 | 4/2006 | Ochi et al. | |
| 2007/0180186 A1 | 8/2007 | Cornwell et al. | |
| 2007/0255950 A1* | 11/2007 | Asanuma ............ | H04L 67/1097 713/168 |
| 2007/0260811 A1* | 11/2007 | Merry ................. | G11C 16/349 711/103 |
| 2007/0271413 A1* | 11/2007 | Fujibayashi .......... | G06F 3/0613 711/112 |
| 2008/0046649 A1* | 2/2008 | Ito ...................... | G11C 16/349 711/115 |
| 2008/0082736 A1* | 4/2008 | Chow ................. | G06F 12/0246 711/E12.001 |
| 2008/0086631 A1* | 4/2008 | Chow ................. | G06F 8/654 711/E12.008 |
| 2008/0229003 A1* | 9/2008 | Mizushima ......... | G06F 12/0804 711/E12.008 |
| 2008/0244165 A1* | 10/2008 | Kunimatsu ......... | G06F 12/0246 711/E12.008 |
| 2009/0083478 A1* | 3/2009 | Kunimatsu ......... | G06F 12/0804 711/E12.001 |
| 2009/0222617 A1* | 9/2009 | Yano ................... | G06F 12/0802 711/170 |
| 2009/0235015 A1 | 9/2009 | Hatsuda et al. | |
| 2009/0248964 A1* | 10/2009 | Yano .................. | G06F 3/061 711/E12.001 |
| 2009/0249052 A1* | 10/2009 | Sareen ................ | G06F 12/0246 711/202 |
| 2009/0249140 A1* | 10/2009 | Yeh ..................... | G11C 29/72 714/E11.147 |
| 2009/0313444 A1* | 12/2009 | Nakamura ............ | G06F 3/0679 711/159 |
| 2010/0064111 A1* | 3/2010 | Kunimatsu ......... | G06F 12/0804 711/E12.001 |
| 2010/0082890 A1* | 4/2010 | Heo .................... | G06F 12/0246 711/E12.001 |
| 2010/0180068 A1 | 7/2010 | Matsumoto et al. | |
| 2010/0235617 A1* | 9/2010 | Chen ................... | G06F 11/1433 713/2 |
| 2010/0257306 A1* | 10/2010 | Kawaguchi .......... | G06F 3/0688 711/E12.001 |
| 2010/0306577 A1* | 12/2010 | Dreifus ................ | G11C 29/76 711/E12.001 |
| 2011/0185145 A1 | 7/2011 | Moro | |
| 2011/0264842 A1* | 10/2011 | Nakanishi ........... | G11C 16/349 711/E12.008 |
| 2012/0047323 A1 | 2/2012 | Sareen et al. | |
| 2012/0059972 A1* | 3/2012 | Chen ................... | G06F 12/0246 711/E12.001 |
| 2012/0179864 A1 | 7/2012 | Kawaguchi | |
| 2012/0268995 A1* | 10/2012 | Sugimoto ............ | G11C 16/349 365/185.11 |
| 2013/0024600 A1* | 1/2013 | Wakrat ................ | G06F 12/08 711/E12.008 |
| 2014/0223088 A1 | 8/2014 | Hashimoto | |
| 2015/0106556 A1* | 4/2015 | Yu ..................... | G06F 12/0246 711/103 |

FOREIGN PATENT DOCUMENTS

| | | |
|---|---|---|
| JP | 2001-154922 A | 6/2001 |
| JP | 2001-154927 A | 6/2001 |
| JP | 2002-32271 A | 1/2002 |
| JP | 2002-351621 | 12/2002 |
| JP | 2003-303056 | 10/2003 |
| JP | 2004-70916 A | 3/2004 |

(56) References Cited

FOREIGN PATENT DOCUMENTS

| | | |
|---|---|---|
| JP | 2005-190075 | 7/2005 |
| JP | 3766429 | 4/2006 |
| JP | 3767818 | 4/2006 |
| JP | 2007-207139 A | 8/2007 |
| JP | 2008-009594 A | 1/2008 |
| JP | 2008-9594 A | 1/2008 |
| JP | 2008-46923 A | 2/2008 |
| JP | 2008-90539 | 4/2008 |
| JP | 2008-139927 A | 6/2008 |
| JP | 2008-146253 A | 6/2008 |
| JP | 2008-269335 A | 11/2008 |
| JP | 2009-054221 A | 3/2009 |
| JP | 2009-211219 A | 9/2009 |
| JP | 2009-217603 | 9/2009 |
| JP | 2009-282993 | 12/2009 |
| JP | 2010-61578 A | 3/2010 |
| JP | 2010-204851 A | 9/2010 |
| JP | 2010-224629 | 10/2010 |
| JP | 2010-244521 A | 10/2010 |
| JP | 2010-287242 A | 12/2010 |
| JP | 2011-508357 A | 3/2011 |
| JP | 2011-095886 | 5/2011 |
| JP | 2011-128998 A | 6/2011 |
| JP | 2011-154556 | 8/2011 |
| WO | WO 2008/018258 A1 | 2/2008 |
| WO | WO 2008/063647 A2 | 5/2008 |
| WO | WO 2009/120423 A2 | 10/2009 |
| WO | WO 2011/102126 A1 | 8/2011 |

OTHER PUBLICATIONS

International Written Opinion issued on Oct. 9, 2012 for PCT/JP2012/070777 filed on Aug. 9, 2012.
Office Action issued May 27, 2014 in Japanese Patent Application No. 2011-179890 (with English translation).
Office Action issued on Jul. 29, 2014, in Japanese Patent Application No. 2014-086993 with English translation.
Zalman, External Hard Disk Case: ZM-VE200_eng, Replaces existing CD/DVDs into ISO files and then load on a virtual drive of HDD, 2011, 6 pages, http://www.zalman.com/ENG/product/Product_Read.asp?idx=431.
Office Action and Search Report issued on Dec. 25, 2014 in the corresponding Taiwanese Patent Application No. 101129619 (with English Translation and Translation of Category of Cited Documents).
SSD, 2011, 18 pages http://botchyworld.iinaa.net/ssd_ssdn.htm.
INCITS T13. Information technology—ATA/ATAPI Command Set-2 (ACS-2), Working Draft Project American National Standard, T13/2015-D, Feb. 22, 2011, 47 pages (p. 73-74, p. 290-306, p. 98-99, p. 50, p. 342-365) http://www.t13.org.
CrystalDiskInfo, (CrystalDiskinfo is a HDD/SSD utility with supports S.M.A.R.T.) Software for monitoring the health condition of HDDs/SSDs, 2008-2011, http://crystalmar,kinfo/software/CrystalDiskInfo/manual-en.
Smartmontools, 2011, 2 pages, Software for monitoring the health condition of HDDs/SSDs, http://sourceforge.net/apps/trac/smartmontools/wiki.
Samsung SSD Magician User Manual, SSD maintenance tool, httpp://www.samsung.com/us/supportrt/downloads/MZ-5PA256/US, 2011, 54 pages.
Zalman, External Hard Disk Case: ZM-VE200_eng, Replaces existing CD/DVDs into ISO files and then load on a virtual drive of HDD, 2011, 6 pages, http://www.zalman.com/ENG/product/Product_Read.asp?idx=431.
Buffalo HD-PHB40U2/UC, Nov. 24, 2004, 19 pages, 1). http: //buffalo.jp/products/catalog/item/h/hd -phbu2_uc/index.html 2). http://manual.buffalo_ipfbuf-doc/d30184al.pdf.
Intel Solid State Drive Thoolbox, SSD maintenance tool, 2011, 2 pages http://downloadcenter.intel.com/Detail_Desc.aspx?lang=eng&DwnIdId=18455.
S.M.A.R.T. attributes meaning, Detail description of each element of SMART attribute filed , 2011, 2 pages, http://www.ariolic.com/activesmart/smart-attributes/.
S.M.A.R.T. attributes meaning, S.M.A.R.T. IDE Guardian (SIGuardian) Online Help, Detail description of each element of SMART attribute filed, 2011, 4 pages http://www.siguardian.com/products/siguardian/on_line_help/s_m_a_r_t_attribute_mean_ing.html.
Self-Monitoring, Analysis and Reporting Technology :: Attributes, 2011, 2 pages, http://smartlinux.sourceforge.net/smart/attributes.php.
"13.9 Phy Event Counters (Optional)", Serial ATA International Organization: Serial ATA Revision 3.1RC, Clean Draft Sep. 29, 2010, pp. 554-558.
SNIA, Solid State Storage (SSS) Performance Test Specification (STP)—V0.9, Advancing storage & information technology, Jun. 22, 2010 , 48 pages,http://www.snia.org/tech_activities/publicreview/SSS_Performance_Test_Spec_-VO.9_DRAFT.pdf.
SYSmark 2007, An Overview of SYSmark 2007 Preview, BAPCO, 10 pages, http://www.bapco.com/support/technical_documents/SYSmark2007Preview WhitePaper.pdf.
Nicklas Renqvist, et al., "PCMark Vantage Whitepaper v1.0", 2007, 54 pages http://www.futuremark.com.pressroom/companypdfs/PCMark_Vantage_Whitepaper v1.0 (PDF)?m=v.
PCMARK 05, PC Performance Analysis, Whitepaper v1.0, Jun. 13, 2005, 9 pages http://www.futuremark.com/pressroom/companypdfs/PCMark05_Whitepaer_1.0pdf?m=v.
IOmeter User's Guide, Version 2003, 18 pages http://www.iometer.org/doc/downloads.html.
CrystalDiskMark User's Guide, 2007-2010, 1 page, http://crystalmark.info/software/CrystalDiskMark/manual-en/.
Drive Meter, Drive Meter Windows Sidebar Gadget, Software monitoring a storage device, 2009, 1 page http://hansolav.net/gadgets/drivemeter.
Working Draft Project American National Standard, T13/2015-D Revision 6, Feb. 22, 2011, Information Technology—ATA/ATAPI, Command Set-2 (ACS-2) p. 98-99, p. 50:Data Set Management Command (Trim Command), p. 342-365:SCT Command Transport, p. 218-219, p. 324-325:Read FPDMA Queued/Write FPDMA Queued.
Extended European Search Report issued Mar. 12, 2015 in Patent Application No. 12825835.7.
Office Action issued on Jun. 9, 2015 in Korean Patent Application No. 10-2014-7004119 with English translation.
Office Action issued on Feb. 16, 2016 in Japanese Patent Application No. 2014-248997 with English translation.
Office Action issued Jun. 2, 2016, in Chinese Patent Application No. 201280051269.1, w/English-language Translation.
Dan Le, "High Reliability SSD for Servers Using the Cheap Many Values Flash", Nikkei Electronics, Feb. 8, 2010 Edition, Japan, Nikkei BP, archived Feb. 5, 2010, No. 1023, p. 69-75, with an unedited English machine translation.

* cited by examiner

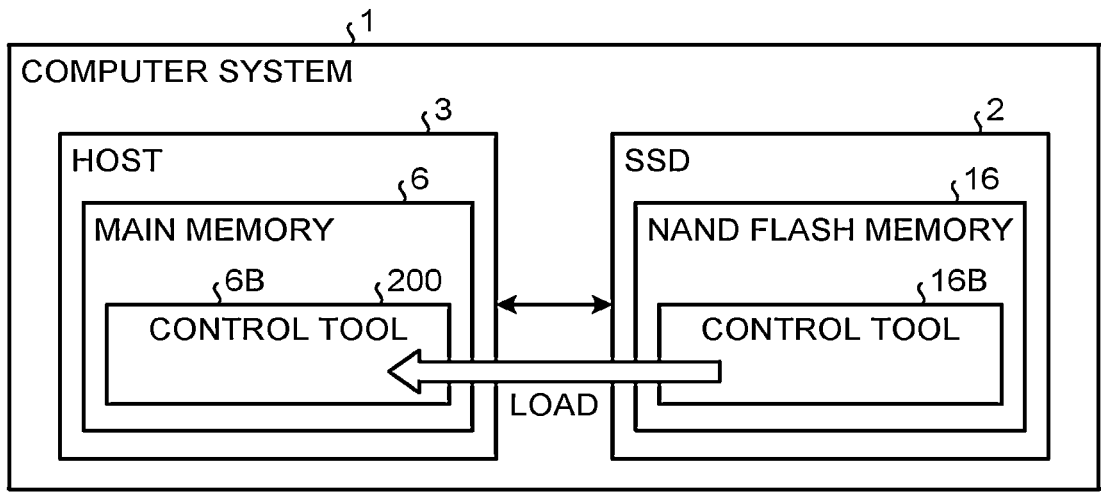
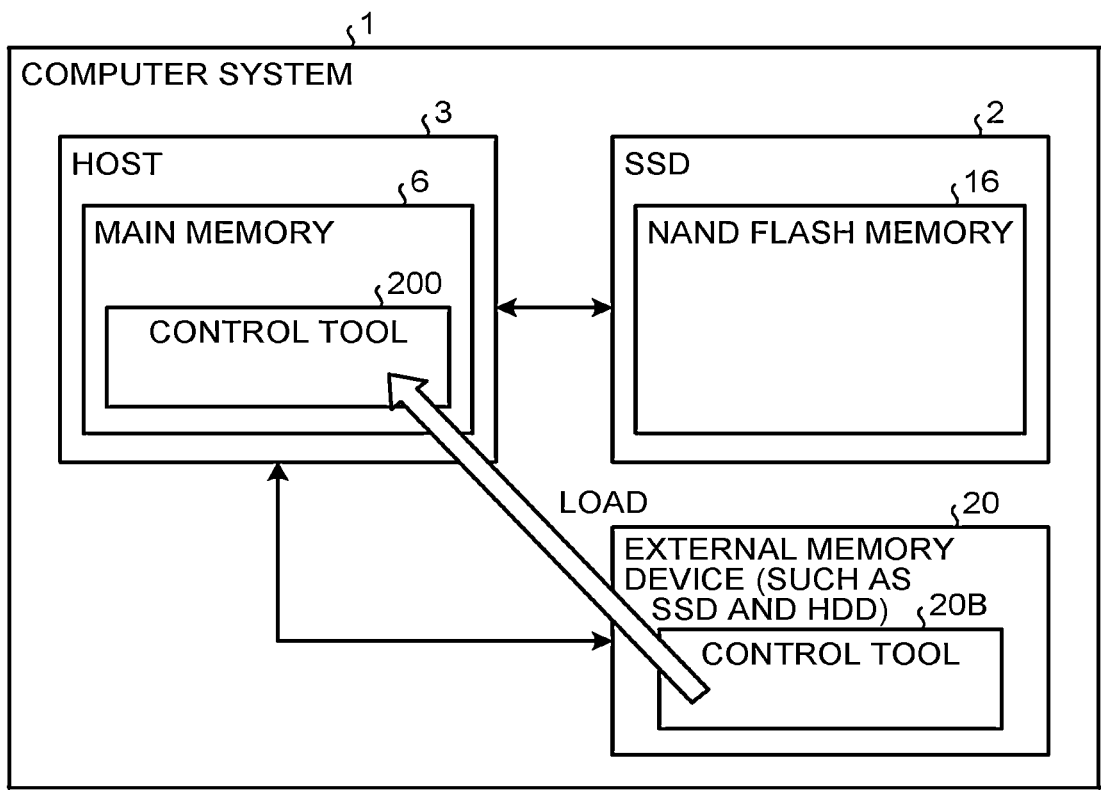

FIG.23

MANAGEMENT INFORMATION

FREE BLOCK TABLE (FBT): 60

| PHYSICAL BLOCK ID | ERASE COUNT |
|---|---|
| ... | ... |
| ... | ... |
| ... | ... |
| ... | ... |

BAD BLOCK TABLE (BBT): 61

| PHYSICAL BLOCK ID |
|---|
| ... |
| ... |
| ... |
| ... |

ACTIVE BLOCK TABLE (ABT): 62

| PHYSICAL BLOCK ID | ERASE COUNT |
|---|---|
| ... | ... |
| ... | ... |
| ... | ... |
| ... | ... |

TRACK TABLE: 63

| TRACK ADDRESS | PHYSICAL BLOCK ID |
|---|---|
| ... | ... |
| ... | ... |
| ... | ... |
| ... | ... |

CLUSTER TABLE: 64

| CLUSTER ADDRESS | PHYSICAL BLOCK ID | INTRA-PHYSICAL-BLOCK PAGE ADDRESS |
|---|---|---|
| ... | ... | ... |
| ... | ... | ... |
| ... | ... | ... |
| ... | ... | ... |

STATISTICAL INFORMATION ~65

FIG.34

| attribute ID | attribute NAME | Value | Threshold | Worst | Raw Data |
|---|---|---|---|---|---|
| ... | TOTAL NUMBER OF BAD BLOCKS (STATISTICAL INFORMATION X01) | ... | ... | ... | ... |
| ... | TOTAL NUMBER OF ERASE COUNT (STATISTICAL INFORMATION X02) | ... | ... | ... | ... |
| ... | AVERAGE NUMBER OF TIMES ERASING IS PERFORMED (STATISTICAL INFORMATION X03) | ... | ... | ... | ... |
| ... | CUMULATIVE NUMBER OF WRITE ERROR OCCURRENCES IN NAND MEMORY (STATISTICAL INFORMATION X04) | ... | ... | ... | ... |
| ... | CUMULATIVE NUMBER OF ERASE ERROR OCCURRENCES IN NAND MEMORY (STATISTICAL INFORMATION X05) | ... | ... | ... | ... |
| ... | TOTAL NUMBER OF READ LOGICAL SECTORS (STATISTICAL INFORMATION X06) | ... | ... | ... | ... |
| ... | TOTAL NUMBER OF WRITE LOGICAL SECTORS (STATISTICAL INFORMATION X07) | ... | ... | ... | ... |
| ... | TOTAL NUMBER OF TIMES ERROR CANNOT BE CORRECTED BY ECC (STATISTICAL INFORMATION X08) | ... | ... | ... | ... |
| ... | TOTAL NUMBER OF N BIT TO M BIT ECC CORRECTION UNITS (STATISTICAL INFORMATION X09) | ... | ... | ... | ... |
| ... | NUMBER OF R ERROR OCCURRENCES IN SATA COMMUNICATION (STATISTICAL INFORMATION X10) | ... | ... | ... | ... |
| ... | NUMBER OF ERROR OCCURRENCES IN SATA COMMUNICATION (STATISTICAL INFORMATION X11) | ... | ... | ... | ... |
| ... | NUMBER OF ERROR OCCURRENCES IN RAM (STATISTICAL INFORMATION X12) | ... | ... | ... | ... |
| ... | TOTAL OPERATING TIME OF SSD (STATISTICAL INFORMATION X13) | ... | ... | ... | ... |
| ... | CUMULATIVE TIME DURING WHICH TEMPERATURE EXCEED HIGHEST VALUE OF RECOMMENDED OPERATING TEMPERATURE (STATISTICAL INFORMATION X14) | ... | ... | ... | ... |
| ... | CUMULATIVE TIME DURING WHICH TEMPERATURE BECOME LOWER THAN LOWEST VALUE OF RECOMMENDED OPERATING TEMPERATURE (STATISTICAL INFORMATION X15) | ... | ... | ... | ... |
| ... | MAXIMUM RESPONSE TIME TO COMMAND (STATISTICAL INFORMATION X16) | ... | ... | ... | ... |
| ... | AVERAGE RESPONSE TIME TO COMMAND (STATISTICAL INFORMATION X17) | ... | ... | ... | ... |
| ... | MAXIMUM RESPONSE TIME OF NAND MEMORY (STATISTICAL INFORMATION X18) | ... | ... | ... | ... |
| ... | AVERAGE RESPONSE TIME OF NAND MEMORY (STATISTICAL INFORMATION X19) | ... | ... | ... | ... |
| ... | STATISTICAL INFORMATION INCREASE RATE (STATISTICAL INFORMATION X23) | ... | ... | ... | ... |
| ... | NAND GC FAILURE FLAG (STATISTICAL INFORMATION X24) | ... | ... | ... | ... |

FIG.55

TIME-SERIES DATA ON STATISTICAL INFORMATION

| TIME | attribute ID | Value | Threshold | Worst | Raw Data |
|---|---|---|---|---|---|
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |

TIME

REWRITE DIFFERENCE LOG OF BOOTLOADER

| REWRITTEN LBA | DATA BEFORE REWRITING |
|---|---|
| ... | ... |
| ... | ... |
| ... | ... |
| ... | ... |
| ... | ... |
| ... | ... |
| ... | ... |
| ... | ... |
| ... | ... |
| ... | ... |
| ... | ... |
| ... | ... |
| ... | ... |
| ... | ... |
| ... | ... |
| ... | ... |

FIG.75

MANAGEMENT INFORMATION

FREE BLOCK TABLE: 1021

| PHYSICAL BLOCK ID | ERASE COUNT |
|---|---|
| ... | ... |
| ... | ... |
| ... | ... |
| ... | ... |

ACTIVE BLOCK TABLE: 1022

| PHYSICAL BLOCK ID | ERASE COUNT |
|---|---|
| ... | ... |
| ... | ... |
| ... | ... |
| ... | ... |

TRACK TABLE: 1023

| TRACK ADDRESS | PHYSICAL BLOCK ID |
|---|---|
| ... | ... |
| ... | ... |
| ... | ... |
| ... | ... |

CLUSTER TABLE: 1024

| CLUSTER ADDRESS | PHYSICAL BLOCK ID | INTRA-PHYSICAL-BLOCK PAGE ADDRESS |
|---|---|---|
| ... | ... | ... |
| ... | ... | ... |
| ... | ... | ... |
| ... | ... | ... |

FIG.89

ACCESS LOG TABLE

| TIME (IN UNITS ≥ SECONDS) | TIME (IN UNITS OF μ SECONDS LESS THAN SECONDS) | DIRECTION | QUEUE ID | COM-MAND | TRANSFER LENGTH (SECTOR) | LBA |
|---|---|---|---|---|---|---|
| 2011/01/25 16:02:25 | 999,999 | REQUEST TRANSMISSION | 1 | WRITE | 8 | |
| 2011/01/26 16:02:25 | 5 | REQUEST TRANSMISSION | 2 | WRITE | 256 | |
| 2011/01/27 16:02:25 | 134 | REQUEST TRANSMISSION | 3 | READ | 8 | |
| 2011/01/28 16:02:25 | 618 | COMPLETION NOTIFICATION | 1 | – | – | |
| 2011/01/29 16:02:25 | 1,982 | COMPLETION NOTIFICATION | 3 | – | – | |
| 2011/01/30 16:02:25 | 2,779 | REQUEST TRANSMISSION | 1 | READ | 64 | |
| 2011/01/31 16:02:25 | 2,980 | COMPLETION NOTIFICATION | 2 | – | – | |
| ⋮ | ⋮ | ⋮ | ⋮ | ⋮ | ⋮ | ⋮ |

FIG.90

ACCESS LOG TABLE

REQUEST TRANSMISSION LOG

| TIME (IN UNITS ≥ SECONDS) | TIME (IN UNITS OF μ SECONDS LESS THAN SECONDS) | QUEUE ID | COM-MAND | TRANSFER LENGTH (SECTOR) |
|---|---|---|---|---|
| 2011/01/25 16:02:25 | 999,999 | 1 | WRITE | 8 |
| 2011/01/26 16:02:25 | 5 | 2 | WRITE | 256 |
| 2011/01/27 16:02:25 | 134 | 3 | READ | 8 |
| 2011/01/30 16:02:25 | 2,779 | 1 | READ | 64 |
| ⋮ | ⋮ | ⋮ | ⋮ | ⋮ |

COMPLETION NOTIFICATION LOG

| TIME (IN UNITS ≥ SECONDS) | TIME (IN UNITS OF μ SECONDS LESS THAN SECONDS) | QUEUE ID |
|---|---|---|
| 2011/01/28 16:02:25 | 618 | 1 |
| 2011/01/29 16:02:25 | 1,982 | 3 |
| 2011/01/31 16:02:25 | 2,980 | 2 |
| ⋮ | ⋮ | ⋮ |

FIG.93

PERFORMANCE LOG TABLE

| TIME (IN UNITS ≥ SECONDS) | TOTAL TRANSFER DATA RATE (MiB/s) | READ TRANSFER DATA RATE (MiB/s) | WRITE TRANSFER DATA RATE (MiB/s) |
|---|---|---|---|
| 2011/01/25 16:02:00 | 238 | 238 | NO COMMAND |
| 2011/01/25 16:02:10 | 220 | 225 | 180 |
| 2011/01/25 16:02:20 | 225 | 230 | 185 |
| 2011/01/25 16:02:30 | 200 | NO COMMAND | 200 |
| 2011/01/25 16:02:40 | 232 | 240 | 200 |
| 2011/01/25 16:02:50 | 225 | 235 | 181 |
| 2011/01/25 16:03:00 | 200 | 210 | 175 |
| ⋮ | ⋮ | ⋮ | ⋮ |

First Party DMA Write (fp DMA Write)

First Party DMA Write (fp DMA Write)

PERFORMANCE LOG TABLE

| TIME (IN UNITS ≥ SECONDS) | TOTAL TRANSFER DATA RATE | | | |
|---|---|---|---|---|
| | Q0 | Q1 | ... | Q31 |
| 2011/01/25 16:02:00 | 238 | 220 | ... | 220 |
| 2011/01/25 16:02:10 | 220 | 225 | ... | 225 |
| 2011/01/25 16:02:20 | 225 | NO COMMAND | ... | NO COMMAND |
| 2011/01/25 16:02:30 | 200 | 200 | ... | 200 |
| 2011/01/25 16:02:40 | NO COMMAND | 232 | ... | 232 |
| 2011/01/25 16:02:50 | 225 | 225 | ... | 225 |
| 2011/01/25 16:03:00 | 200 | 200 | ... | 200 |
| ⋮ | ⋮ | ⋮ | ⋮ | ⋮ |

FIG.112

SEQUENTIAL READING

| TIME (IN UNITS ≥ SECONDS) | DATA TRANSFER RATE | | |
|---|---|---|---|
| | b0≤DATA LENGTH<b1 | b1≤DATA LENGTH<b2 | ... |
| 2011/01/25 16:02:00 | 238 | 238 | NO COMMAND |
| 2011/01/25 16:02:10 | 220 | 225 | 180 |
| 2011/01/25 16:02:20 | 225 | 230 | 185 |
| 2011/01/25 16:02:30 | 200 | NO COMMAND | 200 |
| 2011/01/25 16:02:40 | 232 | 240 | 200 |
| 2011/01/25 16:02:50 | 225 | 235 | 181 |
| 2011/01/25 16:03:00 | 200 | 210 | 175 |
| ⋮ | ⋮ | ⋮ | ⋮ |

SEQUENTIAL WRITING

| TIME (IN UNITS ≥ SECONDS) | DATA TRANSFER RATE | | |
|---|---|---|---|
| | b0≤DATA LENGTH<b1 | b1≤DATA LENGTH<b2 | ... |
| ⋮ | ⋮ | ⋮ | ⋮ |

RANDOM READING

| TIME (IN UNITS ≥ SECONDS) | DATA TRANSFER RATE | | |
|---|---|---|---|
| | b0≤DATA LENGTH<b1 | b1≤DATA LENGTH<b2 | ... |
| ⋮ | ⋮ | ⋮ | ⋮ |

RANDOM WRITING

| TIME (IN UNITS ≥ SECONDS) | DATA TRANSFER RATE | | |
|---|---|---|---|
| | b0≤DATA LENGTH<b1 | b1≤DATA LENGTH<b2 | ... |
| ⋮ | ⋮ | ⋮ | ⋮ |

INFORMATION PROCESSING APPARATUS, METHOD FOR CONTROLLING INFORMATION PROCESSING APPARATUS, NON-TRANSITORY RECORDING MEDIUM STORING CONTROL TOOL, HOST DEVICE, NON-TRANSITORY RECORDING MEDIUM STORING PERFORMANCE EVALUATION TOOL, AND PERFORMANCE EVALUATION METHOD FOR EXTERNAL MEMORY DEVICE

CROSS-REFERENCE TO RELATED APPLICATIONS

This application is a continuation of and claims benefit under 35 U.S.C. § 120 to U.S. application Ser. No. 17/445,273, filed Aug. 17, 2021, which is a continuation of and claims benefit under 35 U.S.C. § 120 to U.S. application Ser. No. 16/567,693, (now U.S. Pat. No. 11,119,661) filed Sep. 11, 2019, which is a continuation of and claims benefit under 35 U.S.C. § 120 to U.S. application Ser. No. 16/123,586, (now U.S. Pat. No. 10,452,283) filed Sep. 6, 2018, which is a continuation of and claims benefit under 35 U.S.C. § 120 to U.S. application Ser. No. 15/399,475, (now U.S. Pat. No. 10,101,923) filed Jan. 5, 2017, which is a continuation of and claims benefit under 35 U.S.C. § 120 to U.S. application Ser. No. 14/178,654, (now U.S. Pat. No. 9,594,611) filed Feb. 12, 2014, which is a continuation of PCT International Application No. PCT/JP2012/070777 filed on Aug. 9, 2012 which designates the United States, which is based upon and claims benefit under 35 U.S.C. § 119(e) from Japanese Patent Application No. 2011-186542, filed on Aug. 29, 2011 and Japanese Patent Application No. 2011-179890, filed on Aug. 19, 2011; the entire contents of each of which are incorporated herein by reference.

FIELD

The present embodiments generally relate to an information processing apparatus, a method for controlling an information processing apparatus, a non-transitory recording medium storing control tool, a host device, a non-transitory recording medium storing a performance evaluation tool, and a performance evaluation method for an external memory device.

BACKGROUND

As external memory devices used in a computer system, an SSD (Solid State Drive), on which a nonvolatile semiconductor memory such as a NAND-type flash memory is mounted, attracts attention. A flash memory has advantages such as high speed and lightweight compared with a magnetic disk device. An SSD includes therein a plurality of flash memory chips, a controller that performs read/write control of each flash memory chip according to a request from a host apparatus, a buffer memory for performing data transfer between each flash memory chip and the host apparatus, a power circuit, a connection interface to the host apparatus, and the like.

BRIEF DESCRIPTION OF THE DRAWINGS

FIG. 2 is a block diagram illustrating a function configuration example of the computer system in a case of storing a control tool in an SSD.

FIG. 3 is a block diagram illustrating a function configuration example of the computer system in a case of storing the control tool in another external memory device.

FIG. 23 is a diagram illustrating management information in the SSD.

FIG. 34 is a diagram illustrating an example of a management table of statistical information X01 to X19, X23, and X24.

FIG. 55 is a diagram illustrating time-series data example on the statistical information.

FIG. 75 is a diagram illustrating management information of the SSD;

FIG. 89 is a diagram illustrating an example of an access log table;

FIG. 90 is a diagram illustrating an example of another access log table;

FIG. 93 is a diagram illustrating an example of a performance log table;

FIG. 112 is a diagram illustrating an example of a performance log table when performance logs are classified according to sequential access/random access and transfer length;

FIG. 120 is a flowchart illustrating an example of an operation procedure by the performance information obtaining tool when performance of an HDD decreases;

FIG. 121 is a block diagram illustrating a function configuration example of a host in a eleventh embodiment;

FIG. 122 is a flowchart illustrating an operation example by a performance information obtaining tool in the eleventh embodiment;

FIG. 123 is a diagram illustrating an operation example of unloading and loading an access information obtaining tool; and FIG. 124 is a diagram illustrating an operation example of unloading and loading the access information obtaining tool.

DETAILED DESCRIPTION

Figure 1:
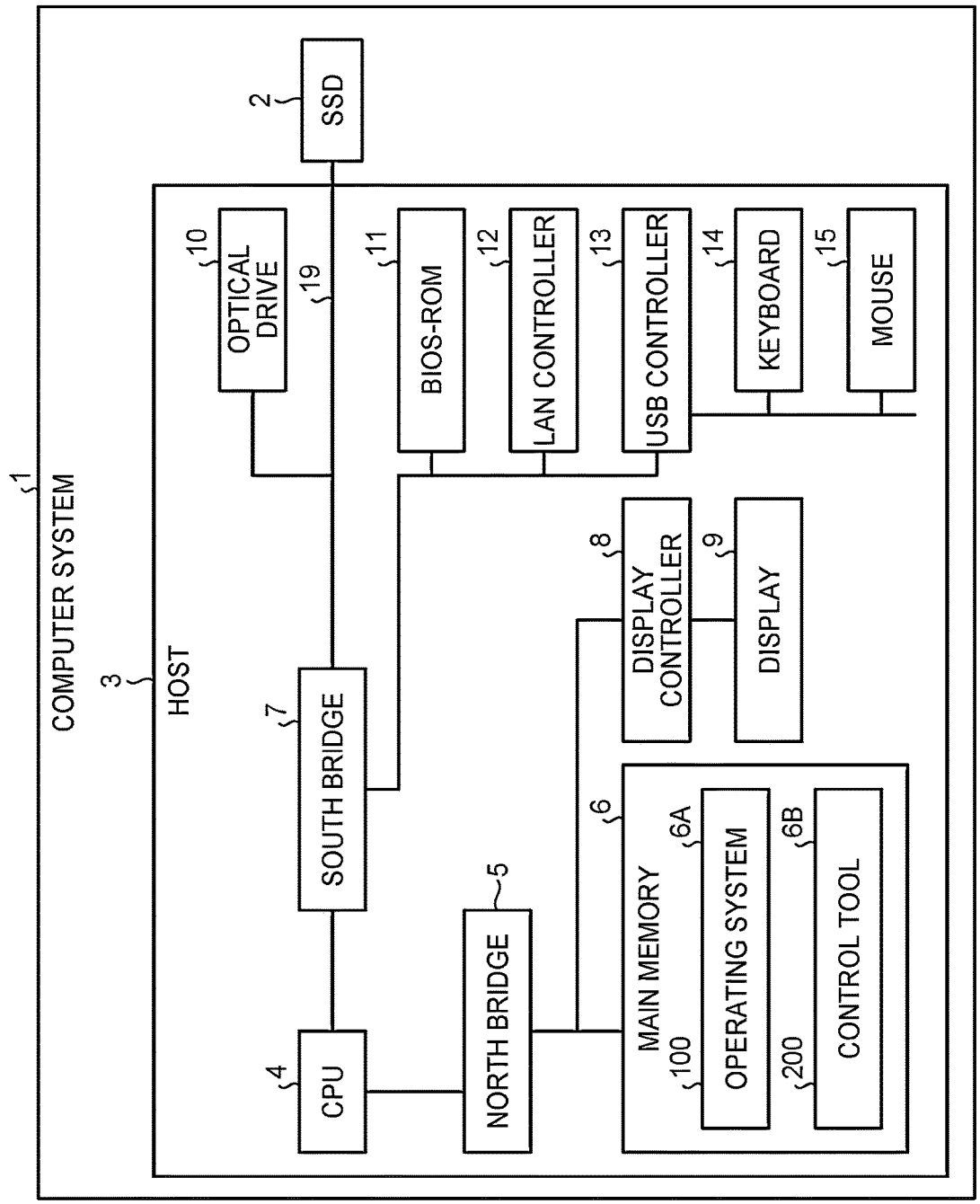
FIG. 1 is a block diagram illustrating a function configuration example of a computer system in a first embodiment.

According to embodiments, a host device is connectable to a nonvolatile memory device. The nonvolatile memory device is configured to store a normal operating system executed on the host device, the host device being capable of issuing both of read and write commands to the nonvolatile memory device under a control of the normal operating system. The nonvolatile memory device is configured to store a bootloader executed on the host device when booting the host device, the host device being capable of initiating the normal operating system by using the bootloader. The host device is configured to determine whether a first condition is established based on information obtained from the nonvolatile memory device. The host device is configured to rewrite, when determined the first condition is established, the bootloader so that an emergency software is initiated when booting the host device, the emergency software being executed on the host device, the host device being capable of issuing only a read command among read and write commands to the nonvolatile memory device under a control of the emergency software.

According to embodiments, an information processing apparatus includes a host apparatus in which a performance evaluation tool is installed, an external memory device including a readable and writable nonvolatile memory, and an interface unit connecting the host apparatus and the external memory device. The performance evaluation tool includes an access log obtaining unit and a performance log obtaining unit. The access log obtaining unit obtains a command including an instruction and a response when an OS or a software other than the performance evaluation tool installed in the host apparatus normally accesses the external memory device, from the OS, and sequentially records the command as an access log. The performance log obtaining unit calculates performance information on the external memory device by using the access log recorded by the access log obtaining unit and records this calculation result as a performance information log.

Nonvolatile semiconductor memories include a memory in which the unit of erasing/writing/reading is fixed, such as a memory that, in the case of storing data, performs writing after once erasing data in units of blocks and a memory that performs writing/reading in units of pages, like a NAND-type flash memory. On the other hand, the unit of writing/reading of data to a secondary memory device such as a hard disk by a host apparatus such as a personal computer is called a logical sector. A logical sector is defined independently from the unit of erasing/writing/reading in a semiconductor memory device. For example, in some cases, the unit of erasing/writing/reading in a nonvolatile semiconductor memory is larger than the unit of writing/reading in the host apparatus.

Moreover, when a nonvolatile semiconductor memory device of a personal computer is composed of a flash memory, in some cases, some blocks and some areas should not be used as a memory area if program errors, erase errors, an uncorrectable ECC errors or the like happened on the blocks. Such blocks are called as "bad blocks" ("defective blocks"), and such areas are called as "bad areas" ("defective areas") or may be called as "bad clusters" in some cases. When the number of such defective blocks or defective areas exceeds an upper limit, a new defective block or defective area cannot be registered and cannot be remapped, therefore it is not possible to ensure that data stored in a buffer memory (cache memory) and data for which a write request is made are written in the flash memory. Thus, when the number of defective blocks or the number of defective areas exceeds a predetermined value, the nonvolatile memory device suddenly enters a data unwritable state despite the fact that the flash memory still does have a free space (good blocks).

As a solution thereto, there is a method of managing the number of bad blocks and bad clusters generated in a NAND-type flash memory and switching the operation mode when writing data from a host apparatus to the NAND-type flash memory according to the number of bad blocks and the number of bad clusters. A cluster is a management unit as a logical address in an SSD. A cluster size is twice or a larger natural number times as large as a logical sector size and a cluster address is formed of a bit string higher in order than a predetermined bit of LBA.

In this method, the operation mode of the SSD is divided into, for example, the following three modes.

WB mode (Write Back Mode): Normal operation mode for writing data once in a cache memory and flushing the data to the NAND-type flash memory according to a predetermined condition.

WT mode (Write Through Mode): Operation mode for writing data, which is written in the cache memory in one write request, to the NAND-type flash memory each time. Data written from the host is ensured as much as possible by writing data to the NAND-type flash memory each time. When the number of remaining entries in a bad cluster table or a bad block table becomes equal to or less than a predetermined number, the SSD transitions to the WT mode.

RO mode (Read Only Mode): Mode in which all processing accompanied with writing to the NAND-type flash memory are inhibited. An error is returned to all the write requests from the host to inhibit writing, thereby ensuring data already written from the host as much as possible when the SSD approaches the end of its lifespan (the end of its life). When the number of remaining entries in a bad cluster table or a bad block table becomes equal to or less than a predetermined number, or when a free block becomes insufficient, the SSD transitions to the RO mode.

In the WB mode and the WT mode, the SSD receives both a read request and a write request from the host and performs processing. In contrast, in the RO mode, the SSD performs processing upon reception of a read request from the host but returns an error in response to a write request from the host without performing processing.

When the SSD is connected to the host in which an operating system (OS), such as Windows (registered trademark), is installed, the host transmits a write request to the SSD, and, when the write request is normally processed, the host recognizes the SSD as an available external memory device.

On the other hand, when an SSD that has transitioned to the above RO mode is connected to the host in which Windows (registered trademark) is installed, if the host transmits a write request to the SSD, the SSD returns an error to the host, therefore the host does not recognize the SSD as an available external memory device in some cases. Thus, even if the SSD in the RO mode, in which data is readable, is connected to the host, there is a possibility that previously recorded data cannot be read from the SSD.

As described above, when an SSD has reached the end of its lifespan or is approaching the end of its lifespan, writing to the SSD should be inhibited. However, with a normal operating system (OS) installed in a computer system, some data may be written to the SSD at the time of booting and some data may be written to the SSD in the background process unintentionally for users. Therefore, when the SSD has reached the end of its lifespan or is approaching the end of its lifespan, under the condition that the normal OS is installed in the computer system, the reliability of the SSD further degrades and data already written may be destroyed.

Thus, in the present embodiments, when it is determined that an SSD has reached the end of its lifespan, a bootloader is rewritten to enable, for example, an emergency OS, which is emergency software that does not perform a write operation on an SSD 2, to be booted when a system is rebooted, thereby preventing reliability degradation of the SSD and destruction of data already written. As the emergency OS, software is used that performs only a read operation on the SSD at the time of booting and does not perform writing on the SSD in the background that a user does not intend. The emergency software includes an emergency operating system.

The main instructions issued from an information processing apparatus to an external memory device, such as a hard disk and a solid state drive (SSD), include a data read instruction and a data write instruction. In a data read instruction, an instruction including information on a logical address (LBA: Logical Block Addressing) in an external memory device and data length (transfer length, payload length) is transmitted from the information processing apparatus to the external memory device and the controller of the external memory device reads data specified by the instruction from a recording medium in response to the instruction and returns the read data to the information processing apparatus. In a data write instruction, an instruction including information on a logical address (LBA) in the external memory device and transfer length is transmitted from the information processing apparatus to the external memory device and, when the external memory device enters a writable state, the information processing apparatus transmits data to the external memory device and the controller of the external memory device writes the received data to a recording medium as data having LBA specified by the instruction.

Measures for measuring the read and write performance of an external memory device include the transfer data rate, processing command rate, response time, processing time, relative score, and the like.

The transfer data rate is the data amount transferred to and from an external memory device per unit time. For example, for data reading, if an information processing apparatus receives an average of 250 MiB of data per second from an external memory device, the transfer rate of the external memory device for reading is 250 MiB/s.

The processing command rate is the number of instructions transferred to and from an external memory device per unit time. For example, for data writing, if an information processing apparatus completes an average of 100000 instructions to an external memory device per second, the transfer rate of the external memory device for reading is 100000 IOPS.

The response time is the time from when an information processing apparatus sends an instruction to an external memory device to when processing relating to the instruction is completed. In the case of a read instruction, the response time is the time until the information processing apparatus receives data in response to the instruction, and, in the case of a write instruction, the response time is the time until the information processing apparatus receives a completion response to the instruction from the external memory device. For example, in a data read instruction, if 10 milliseconds are required for the information processing apparatus to complete the reception of data in response to the instruction, the response time of the external memory device is 10 milliseconds.

The processing time is the time required for the completion of a specific application or specific processing to an external memory device in an information processing apparatus after it has been started. For example, if 50 seconds are required to copy a file of 10 GBytes in an external memory device, the processing time for copying the file of 10 GBytes is 50 seconds.

The relative score is a score obtained by weighting a plurality of scores (such as the transfer data rate, processing command rate, response time, and processing time) under various conditions and performing addition, subtraction, multiplication and division thereon.

Examples of the relative score include the following indexes.

PCMark05 (trademark) http://www.futuremark.com/
PCMark VANTAGE (trademark) http://www.futuremark.com/35
SYSmark 2007 Preview (trademark) http://www.bapco.com/

Conditions when measuring the performance of an external memory device vary. One of the main conditions is the pattern of LBA from which data is read (or to which data is written). The patterns are roughly classified into two, i.e., sequential and random.

The sequential pattern is an access pattern in which continuous LBAs are sequentially provided. Specifically, the sequential pattern is an access pattern in which an information processing apparatus transmits a read instruction (write instruction) having a certain transfer length with respect to a certain LBA to an external memory device and then transmits a read instruction (write instruction) having a certain transfer length with respect to a certain LBA, which is obtained by incrementing the above LBA by the transfer length, to the external memory device, and after that, the information processing apparatus repeats a read command (write command) while incrementing LBA. The random pattern is an access pattern in which random discontinuous LBAs are sequentially provided.

Other conditions when measuring the performance of an external memory device include the range (access range) of LBA, from which data is read (or to which data is written), data transfer length (payload length) per command when performing reading (writing), the number of threads when performing reading (writing) in the case of a multithread, content of data to be read (written), measurement execution time, and the like.

In performance evaluation of an external memory device in which a lot of indexes and conditions are present as above, even under the same index and measurement conditions, the performance is not always the same. Especially, when an external memory device is an SSD, the performance of an SSD largely depends on the state of the logical-physical translation table managing the correspondence relation between physical addresses in a flash memory, which is the recording medium of an SSD, and LBAs. This is because, in an SSD, the relation between logical addresses (LBAs) and physical addresses (storage locations in a NAND 10) is not statically determined in advance and a logical-physical translation method of dynamically associating physical addresses with LBAs at the time of writing data is employed. For example, when overwriting data in the same LBA address, an operation as described below is performed. In the case where valid data is stored in a logical address A1 and a block B1 is used as a storage area, when a command to overwrite data (having a block size) of the logical address A1 is received from an information processing apparatus, one free block (block B2) is reserved and data received from the information processing apparatus is written in the free block. Thereafter, the logical address A1 is associated with the block B2. Consequently, the block B2 becomes an active block and data stored in the block B1 becomes invalid, therefore the block B1 becomes a free block. In this manner, in an SSD, a block to be used as an actual recording area for data having the same logical address A1 changes for every writing. When selecting a free block, normally, wear leveling processing is performed to make the number of times of erasing (erase count) and the erase interval approximately the same between all blocks.

In order to eliminate such variations of the internal state of an external memory device from measurement results, for example, there is a preconditioning standard for measurement in the SNIA, Solid State Storage Performance Test Specification http://www.snia.org/. However, the internal state of a user's SSD varies depending on the use of the SSD by the user, the hardware environment of the computer to which the SSD is connected, the type of software operating on the computer, the operating time, and the like, so that the internal state of an SSD after the preconditioning performed according to the above standard does not always match the internal condition of an SSD when a user experiences the performance thereof in a state where various applications are actually operated by the user (while in actual use).

A user can obtain the performance of his/her own SSD by performing measurement by him/herself without performing the preconditioning while in actual use. Therefore, the user can obtain a performance index relatively close to the performance that the user experiences compared with a standardized uniform method. However, this method has the following problems.

As described above, the internal state of an SSD changes momentarily and is therefore easily affected by access from outside. Thus, the measurement itself affects the internal state of the SSD, so that the internal state deviates from the internal state while in actual use by a user due to the measurement and therefore the measurement result deviates from the speed that the user experiences. For example, when a sequential write access is made to an SSD from a computer for performance measurement itself, the correspondence relation between LBA as a write target and a physical address in a flash memory, in which data is actually written, is reflected in the logical-physical translation table in the SSD, so that the internal state of the SSD changes. This changed internal state affects the measurement result, so that the final calculated performance of the SSD deviates from the performance that the user actually experiences. In practice, many performance measurement tools have specifications in which sequential writing of several gigabytes or more of data is performed on an SSD as the preconditioning before various measurements, therefore the performance measured by these tools substantially deviates from the performance that a user experiences.

As described above, in performance measurement by a typical performance measurement tool, a large amount of data is written to an SSD from a computer, so that the erase count on a flash memory, which is the recording medium of an SSD, increases. The failure rate of a flash memory increases as the erase count increases, so that the reliability of an SSD is degraded by performance measurement. Therefore, it is not preferable for a user to monitor the performance of an SSD frequently because it accelerates the reliability degradation of the SSD.

As described above, software and conditions in performance measurement vary. Reading/writing, sequential/random, access range, payload length, and the number of threads are defined by selecting software and conditions. In the following, these are generically referred to as a workload. A workload selected at the time of performance measurement does not always match the workload (actually used workload) that occurs in an SSD when a user is operating it with various applications. It is difficult for a user to find a workload appropriate for the user by analyzing the protocol of the interface between an SSD and a computer.

Moreover, there is software that monitors the performance of an external memory device on the basis of the amount of reading and writing with respect to the external memory device (see software monitoring the speed of an external memory device, http://www.forest.impress.co.jp/docs/review/20100222_350600.html and http://hansolay.net/gadgets/drivemeter/). In this conventional technology, the read transfer data rate and the write transfer data rate are defined as follows.

(read transfer data rate)=(data amount read during measurement period)/(measurement time length)

(write transfer data rate)=(data amount written during measurement period)/(measurement time length)

However, if the software, for example, have an interruption to wait for input from a user or an interruption to wait for a response from a CPU or other hardware's interruption during access to an external memory device, the data amount read during the measurement period decreases. The transfer data rate decreases because the length of the measurement time is constant. Especially, when a user executes an application, which does not substantially access an external memory device, or when an information processing apparatus is in an idle state, in which an application is not executed, the transfer data rate of the external memory device is zero or a value extremely close to zero regardless of the actual performance of the external memory device. The transfer data rate being a value close to zero does not mean that the performance of the external memory device that a user experiences is not good. That means that the performance obtained by this conventional technology is easily affected by external factors other than an external memory device and it is difficult to say that the performance of an external memory device and the performance of an external memory device that a user experiences can be obtained.

For such reasons, it is difficult to say that performance measurement by current performance measurement tools reflects the performance that each user experiences while in actual use. Moreover, it is not preferable to perform extra writing in performance measurement in terms of the reliability of an external memory device. The present embodiments provide a performance measurement tool capable of correctly obtaining the performance of an external memory device that a user experiences while in actual use in real time without affecting the reliability of the external memory device.

An information processing apparatus, a control method for the information processing apparatus, a control tool, a host apparatus, a non-transitory recording medium storing a performance evaluation tool, and a performance evaluation method for an external memory device according to the embodiments will be explained below in detail with reference to the accompanying drawings. The present invention is not limited to these embodiments.

First Embodiment

FIG. 1 illustrates a configuration of a computer system in the first embodiment. A computer system 1 includes an SSD 2 as a nonvolatile memory device, a host apparatus 3, and a memory interface 19 that connects the SSD 2 and the host apparatus 3. In the present embodiment, an SSD (Solid State Drive) is used as a nonvolatile memory device, however, for example, it is also possible to use other nonvolatile memory devices such as a hard disk drive, a hybrid disk drive, an SD card, a USB memory, and a NAND-type flash memory directly mounted on a mother board. Moreover, in the present embodiment, an ATA (Advanced Technology Attachment) interface is used as the interface 19, however, other interfaces, such as USB (Universal Serial Bus), SAS (Serial Attached SCSI), Thunderbolt (registered trademark), and PCI Express, may be used. A CPU (control circuit) 4 is a central processing unit in the host apparatus 3 and the CPU 4 executes various operations and control in the host apparatus 3. The CPU 4 executes control of the SSD 2 and an optical drive 10, such as a DVD-ROM, via a south bridge 7. The CPU 4 executes control of a main memory 6 via a north bridge 5. For example, a DRAM may be employed as the main memory 6.

A user performs control of the host apparatus 3 via an input apparatus such as a keyboard 14 and a mouse 15 and a signal from the keyboard 14 and the mouse 15 is processed in the CPU 4 via a USB (Universal Serial Bus) controller 13 and the south bridge 7. The CPU 4 sends image data, text data, and the like to a display (display apparatus) 9 via the north bridge 5 and a display controller 8. A user can view image data, text data, and the like from the host apparatus 3 through the display 9.

The CPU 4 is a processor provided for controlling an operation of the computer system 1 and executes an operating system (OS) 100 loaded into the main memory 6 from the SSD 2. Furthermore, when the optical drive 10 is capable of executing at least one of read processing and write processing on a loaded optical disk, the CPU 4 executes the processing. Moreover, the CPU 4 executes a firmware stored in a ROM 11. The firmware may be system BIOS stored in a BIOS (Basic Input/Output System)-ROM 11 or may be Unified Extensible Firmware Interface Firmware (UEFI firmware) stored in a ROM 11. The firmware in the ROM 11 is a program for controlling hardwares in the computer system 1. In this embodiment, system BIOS is used as the firmware stored in a ROM 11. In this embodiment, OS 100 may include the firmware in the ROM 11. In this case, the OS 100 may be loaded from SSD 2 and from ROM 11, or the OS 100 may be loaded from SSD 20 and from ROM 11.

Furthermore, the CPU 4 controls a LAN (Local Area Network) controller 12 via the south bridge 7.

The north bridge 5 is a bridge device connected to a local bus of the CPU 4. A memory controller for performing access control on the main memory 6 is built in the north bridge 5. Moreover, the north bridge 5 has a function of, for example, performing communication with the display controller 8.

The main memory 6 temporarily stores therein a program and data and functions as a work area of the CPU 4. The main memory 6 includes a memory area 6A that stores the OS 100 and a memory area 6B that stores a control tool 200. The OS, as is generally known, is a program that manages the entire host apparatus 3 such as performing control to enable software to use the hardware of the host apparatus 3 by managing an input/output apparatus of the host apparatus 3 and managing a disk and a memory. The firmware stored in ROM 11 may be loaded to the area 6A and may be used as a part of the OS.

The display controller 8 is a video reproduction controller for controlling the display 9 of the computer system 1. The south bridge 7 is a bridge device connected to a local bus of the CPU 4. The south bridge 7 controls the SSD 2, which is a memory device for storing various software and data, through the ATA interface 19.

The computer system 1 accesses the SSD 2 in units of logical sectors. A write command (write request), a read command (read request), a flush command, and the like are input to the SSD 2 through the ATA interface 19. For example, WRITE DMA EXT (35h) described in INCITS ACS-2 and WRITE FPDMA QUEUED (61h) described in INCITS ACS-2 may be used as a write command. For example, READ DMA EXT (25h) described in INCITS ACS-2 and READ FPDMA QUEUED (60h) described in INCITS ACS-2 may be used as a read command. For example, FLUSH CACHE EXT (EAh) described in INCITS ACS-2 may be used as a flush command.

The south bridge 7 has a function of performing access control on the BIOS-ROM 11, the optical drive 10, the LAN controller 12, and the USB controller 13. The keyboard 14 and the mouse 15 are connected to the USB controller 13.

For example, as shown in FIG. 2, the control tool 200 is stored in an area 16B in a NAND-type flash memory (NAND memory) 16 of the SSD 2 when the power of the host apparatus 3 is off, and the control tool 200 is loaded into the area 6B in the main memory 6 from the area 16B in the NAND memory 16 when the host 3 is booted or a program is started.

For example, as shown in FIG. 3, the SSD control tool 200 may be stored in an area 20B in a nonvolatile memory device 20 different from the SSD 2 when a plurality of nonvolatile memory devices is connected to the host 3, and the control tool 200 may be loaded into the area 6B in the main memory 6 from the area 20B when the host apparatus 3 is booted or a program is started. Especially, when the nonvolatile memory device 20 is used as a system drive for storing an OS and the SSD 2 is used as a data drive for storing user data such as documents, still image data, and moving image data, it is desirable to store the control tool in the nonvolatile memory device 20 as a system drive in terms of clearly distinguishing the roles of the drive 2 and the drive 20 from each other, such as in the case of using the system drive 20 as a drive for mainly storing an OS and an application program and using the data drive 2 as a drive for storing user data.

Figure 4:
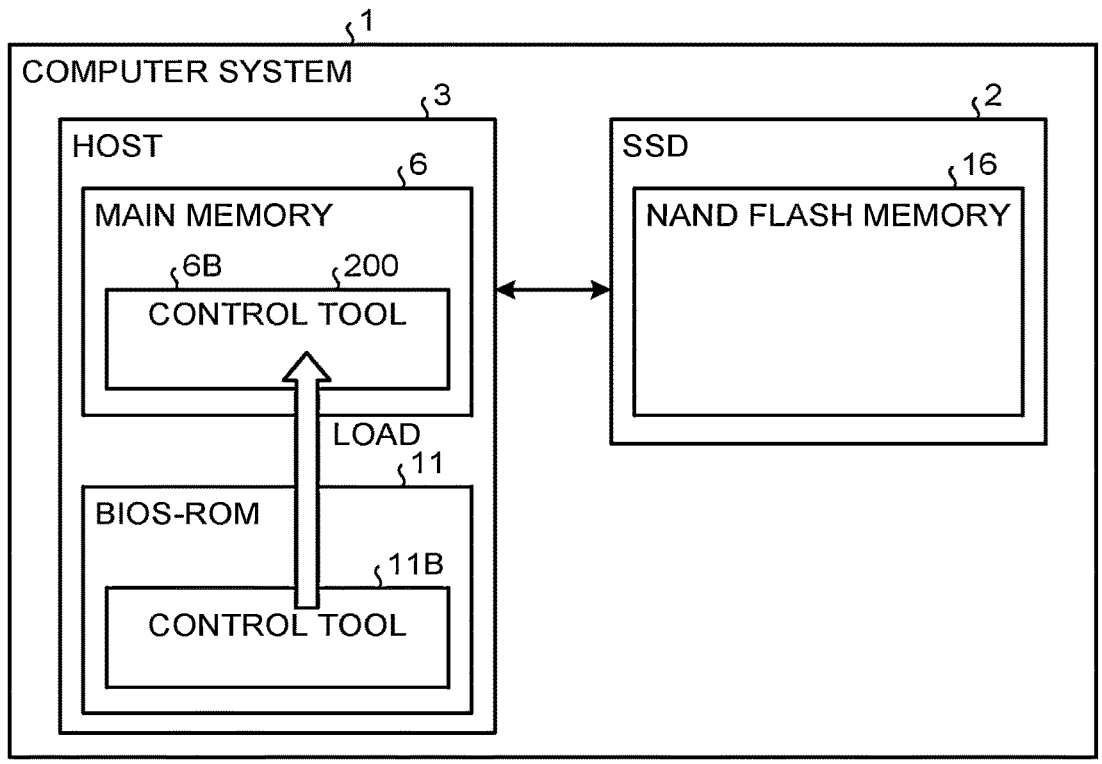
FIG. 4 is a block diagram illustrating a function configuration example of the computer system in a case of storing the control tool in ROM.

For example, as shown in FIG. 4, the control tool 200 may be stored in an area 11B in a ROM 11 of the host apparatus 3 when the power of the host apparatus 3 is off, the control tool 200 is loaded into the area 6B in the main memory 6 from the area 11B when the host 3 is booted or a program is started.

Figure 5:
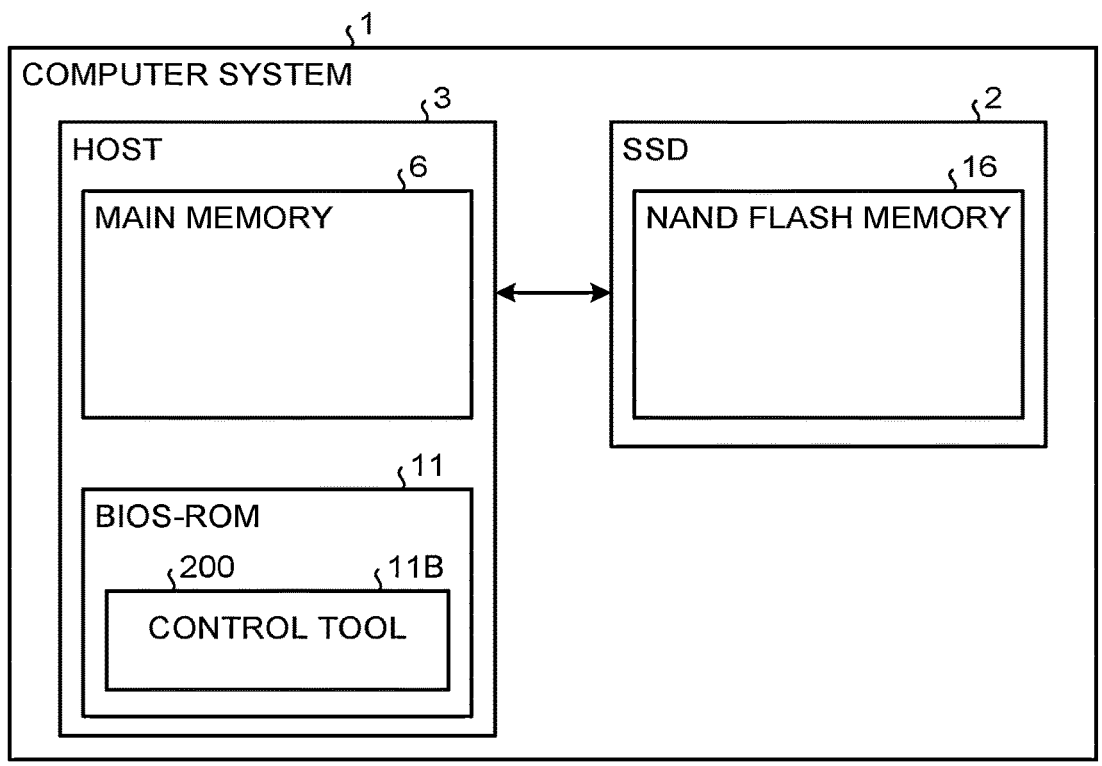
FIG. 5 is a block diagram illustrating a function configuration example of the computer system in a case of storing the control tool in ROM without loading the control tool to the main memory.

For example, as shown in FIG. 5, the control tool 200 may be stored in an area 11B in a ROM 11 of the host apparatus 3 when the power of the host apparatus 3 is off, the area 6B may be mapped in the area of ROM 11 and the control tool 200 may be executed by CPU 4 directly from the area 11B without loading the control tool 200 to the main memory 6 when the host 3 is booted or a program is started.

In terms of saving labor of a user required for setting up the control tool 200, for example as shown in FIG. 2, FIG. 3, FIG. 4 and FIG. 5, it is desirable that the computer system 1 is shipped in a state where the control tool 200 is stored in the SSD 2, the nonvolatile memory device 20 or ROM 11, arrives in stores, and is handed to a user. On the other hand, in terms of enabling a user to select whether to install the control tool and enabling provision of the latest control tool to a user, it is desirable that the control tool 200 is capable of being stored in the SSD 2, the nonvolatile memory device 20 or ROM 11 by downloading it from the WEB or installing it from an external storage medium such as a DVD-ROM and a USB memory.

Figure 6:
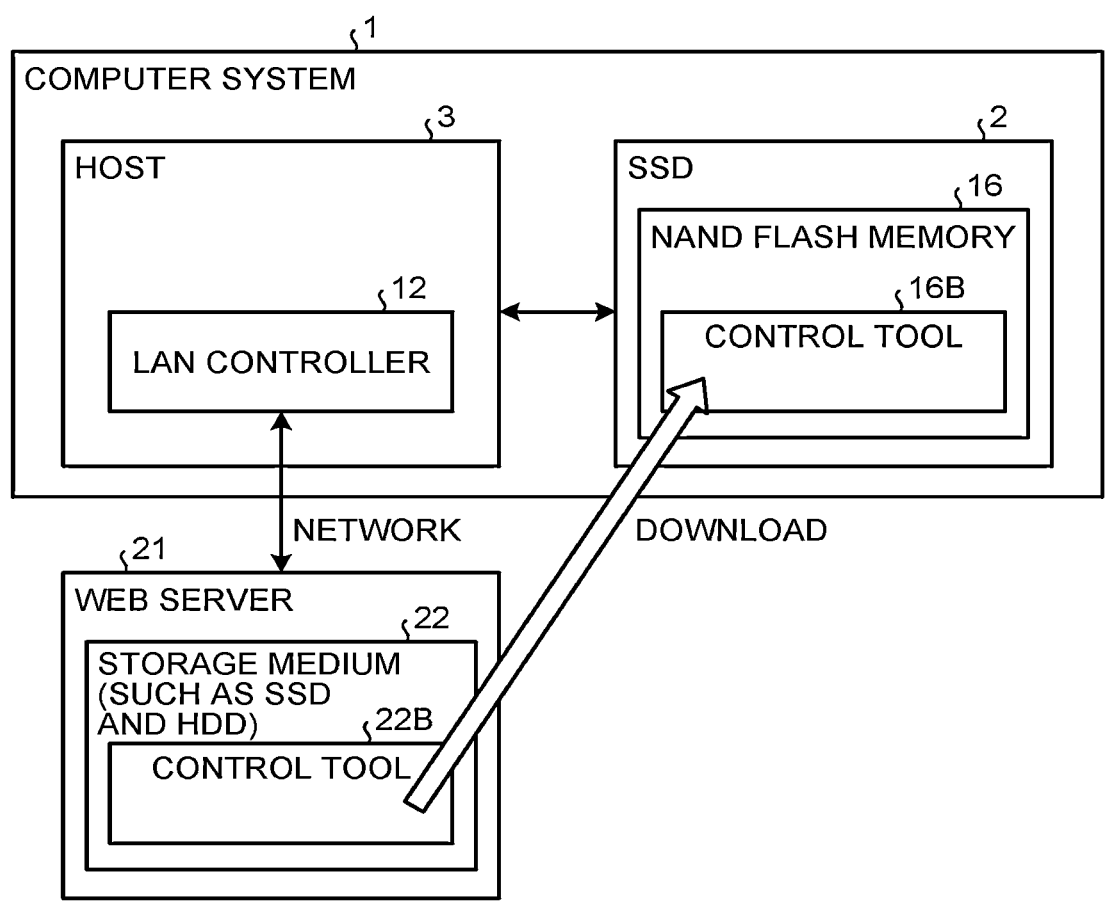
FIG. 6 is a block diagram illustrating a function configuration example of the computer system in a case of installing the control tool from the WEB.

FIG. 6 is an example of downloading from the WEB. The control tool 200 is stored in an area 22B in a storage medium 22 on a WEB server 21 and the control tool 200 is downloaded (or installed) in the area 16B in the NAND memory 16 of the SSD 2 via a network, such as the Internet, a local network, and a wireless LAN, for example, through the LAN controller 12. In the case of FIG. 3, the control tool 200 is downloaded or installed in the area 20B in the nonvolatile memory device 20.

Figure 7:
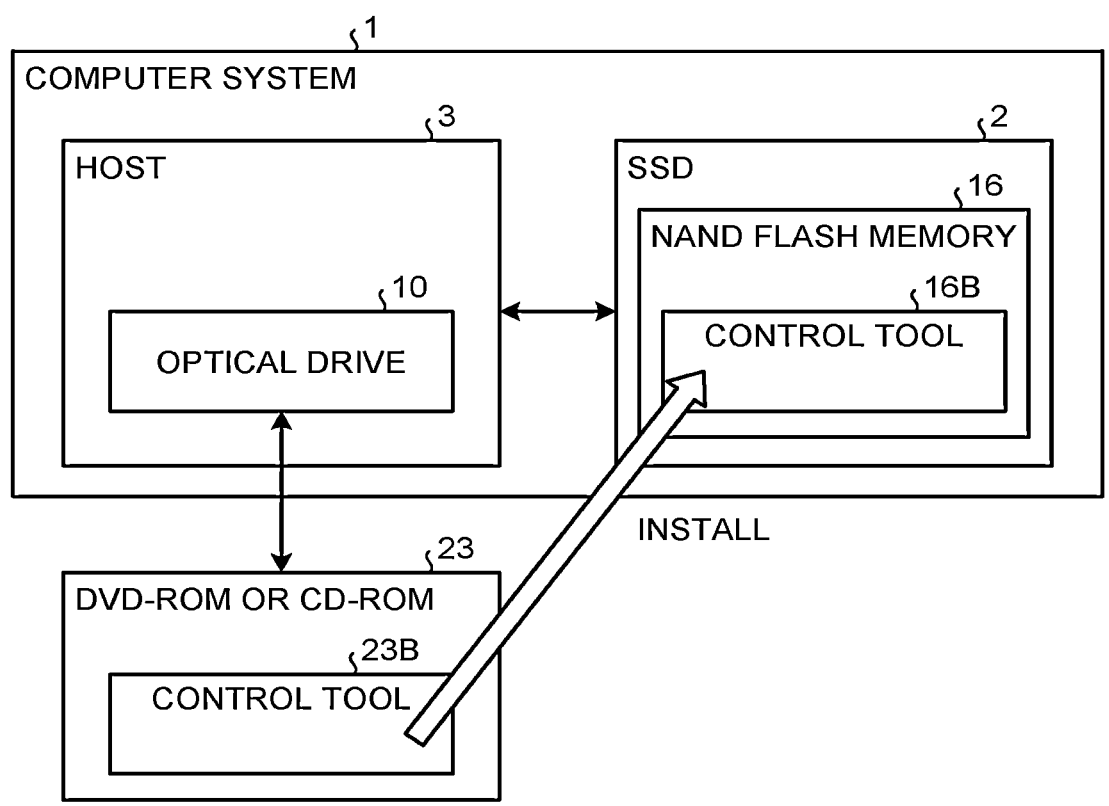
FIG. 7 is a block diagram illustrating a function configuration example of the computer system in a case of installing the control tool from an optical drive.
Figure 8:
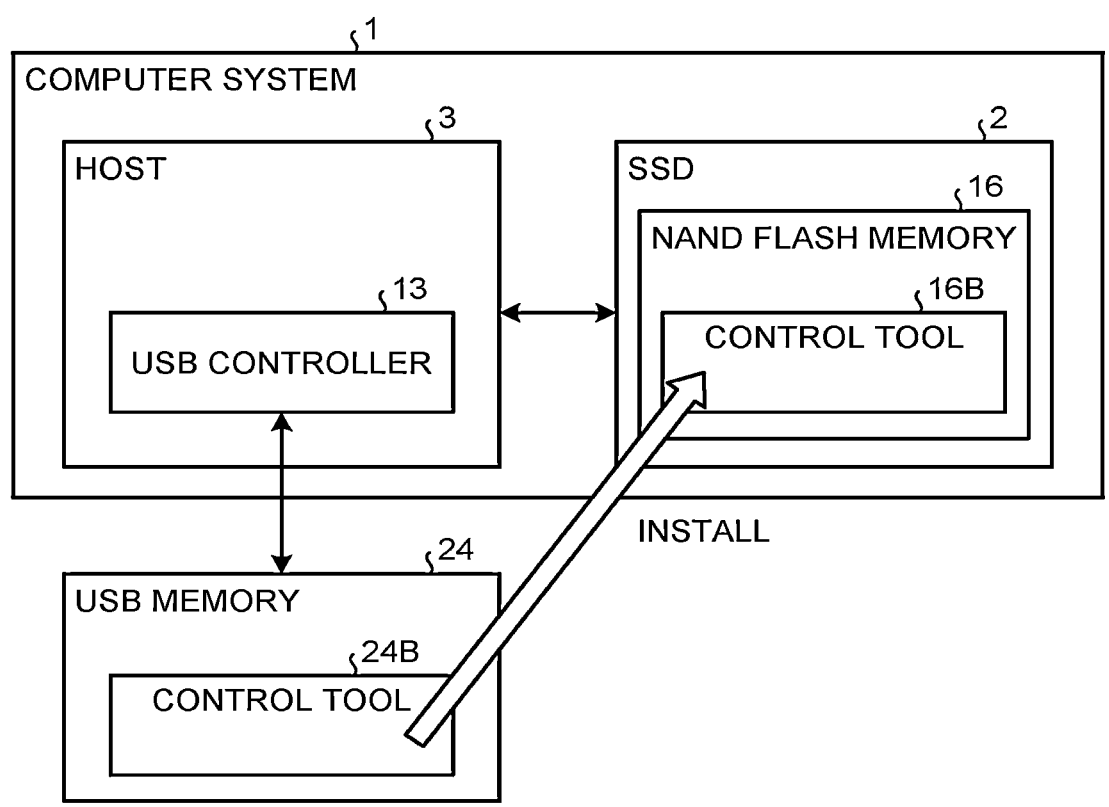
FIG. 8 is a block diagram illustrating a function configuration example of the computer system in a case of installing the control tool from an USB memory.

FIG. 7 is an example of installing from an optical medium such as a DVD-ROM and a CD-ROM. The control tool 200 is stored in an optical medium 23 such as a DVD-ROM and a CD-ROM and is installed in the area 16B (or the area 20B) in the NAND memory 16 of the SSD 2 via the optical drive 10 by setting the optical medium 23 in the optical drive 10. FIG. 8 is an example of installing from a USB memory. The control tool 200 is stored in an area 24B in a USB memory 24 and is installed in the area 16B (or the area 20B) in the NAND memory 16 of the SSD 2 via the USB controller 13 by connecting the USB memory 24 to the USB controller 13. Obviously, other external memories such as an SD card may be used instead of the USB memory 24. In terms of ease of availability by a user, the optical medium 23 or the USB memory 24 is desirably packed together with the SSD 2 as an accessory when shipping the SSD 2 and sold. On the other hand, the optical medium 23 or the USB memory 24 may be sold separately as a software product or may be attached to a magazine or a book as a supplement.

Figure 9:
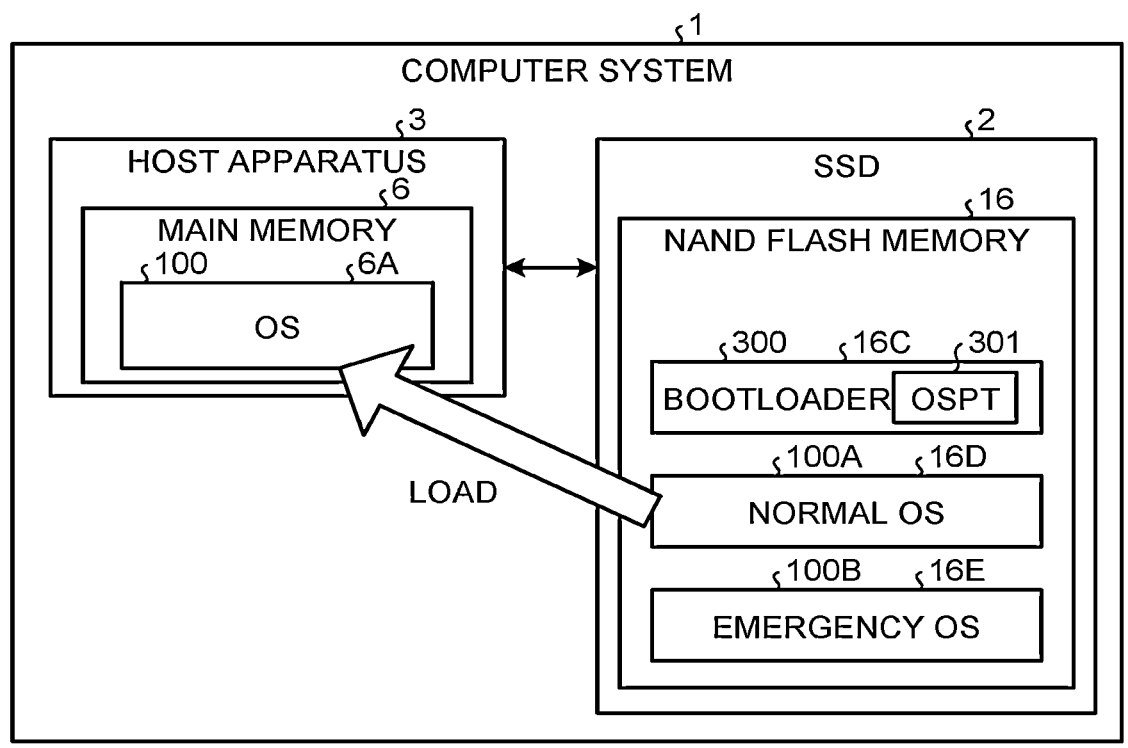
FIG. 9 is a block diagram illustrating a function configuration example of the computer system in a case where a normal OS and an emergency OS are stored in the SSD.

In the present embodiment, there are two types of OSs, that is, a normal OS (first operating system) 100A and an emergency OS (second operating system) 100B as the OS 100. The normal OS 100A is an operating system used when the reliability of the SSD 2 is not degraded. As described above, with the normal OS, some data may be written to the SSD at the time of booting and some data may be written to the SSD in the background process unintentionally for users. As shown in FIG. 9, when the power of the host apparatus 3 is off, the normal OS 100A is stored in an area 16D in the NAND memory 16. The emergency OS 100B is an operating system used when the reliability of the SSD 2 is degraded and does not perform writing to the SSD 2 (writing non-support). That means that the emergency OS performs only a read operation to the SSD at the time of booting and does not perform writing to the SSD in the background, which a user does not intend. The emergency OS 100B may be capable of performing writing to a nonvolatile memory device other than the SSD 2 when the reliability is degraded. Moreover, when part of data, such as system information on the emergency OS, needs to be written to the SSD 2, the emergency OS 100B may exceptionally permit writing of the data to the SSD 2, however, the amount of the data is desirably sufficiently smaller than the capacitance of the NAND memory 16. More desirably, in order to prevent a user from erroneously transmitting a write command and data from being written to the SSD 2, the emergency OS 100B inhibits execution of a normal write command to the SSD 2 and, when data needs to be exceptionally written to the SSD 2, the emergency OS 100B permits writing to the SSD 2 only by a command using a special command such as SCT Command Transport described in INCITS ACS-2 and a command unique to a vendor.

As shown in FIG. 9, when the power of the host apparatus 3 is off, the emergency OS 100B is stored in an area 16E in the NAND memory 16. Because the emergency OS 100B is not used when the SSD 2 is in a normal state, it is desirable that, when the normal OS is used, the area 16E is set to be unrewritable from the host apparatus 3 in terms of preventing destruction of the emergency OS data in the area 16E. For example, when the normal OS 100A is operating, LBA is desirably not allocated to the area 16E in management information in the SSD 2, which will be described later, and, in this case, LBA is allocated to the area 16E when the emergency OS needs to be operated. Alternatively, when the normal OS 100A is operating, the area 16E is desirably set to write-protect by the normal OS 100A.

In terms of reducing access to the SSD 2 as much as possible in a state where the reliability of the SSD 2 is degraded, the amount of data in the area 16E, in which the emergency OS 100B is stored, is desirably significantly smaller than the capacitance of the NAND memory 16. The emergency OS 100B may be, for example, one obtained by customizing an OS, such as MS-DOS (trademark) and Linux, to inhibit writing to the SSD 2, one obtained by adding a backup function of the SSD 2 to the OS, or software uniquely developed for the SSD 2.

When the computer system 1 is booted, such as when the power of the computer system 1 is turned on or an OS is rebooted, the host apparatus 3 reads a bootloader 300 written in an area 16C in the NAND memory 16 and determines which one of the normal OS 100A and the emergency OS 100B is loaded into the area 6A in the host apparatus 3 on the basis of the information on the bootloader 300. In order thereto, OS pointer information OSPT indicating LBA of an OS to be read is stored in the bootloader 300. When reading the bootloader 300, the CPU 4 performs reading from LBA indicated by the OS pointer information OSPT as a starting point and writes the read data to the area 6A in the main memory 6. The bootloader 300 is configured to load the normal OS 100A in the initial state. After the reliability of the SSD 2 is degraded, the control tool 200 stored in the area 6B in the main memory 6 reconstructs the bootloader 300 to read the emergency OS 100B by rewriting the bootloader 300 stored in the area 16C in the NAND memory 16. As the bootloader 300, for example, a master boot record (MBR) may be employed or a GUID partition table (GPT) may be employed.

Figure 12:
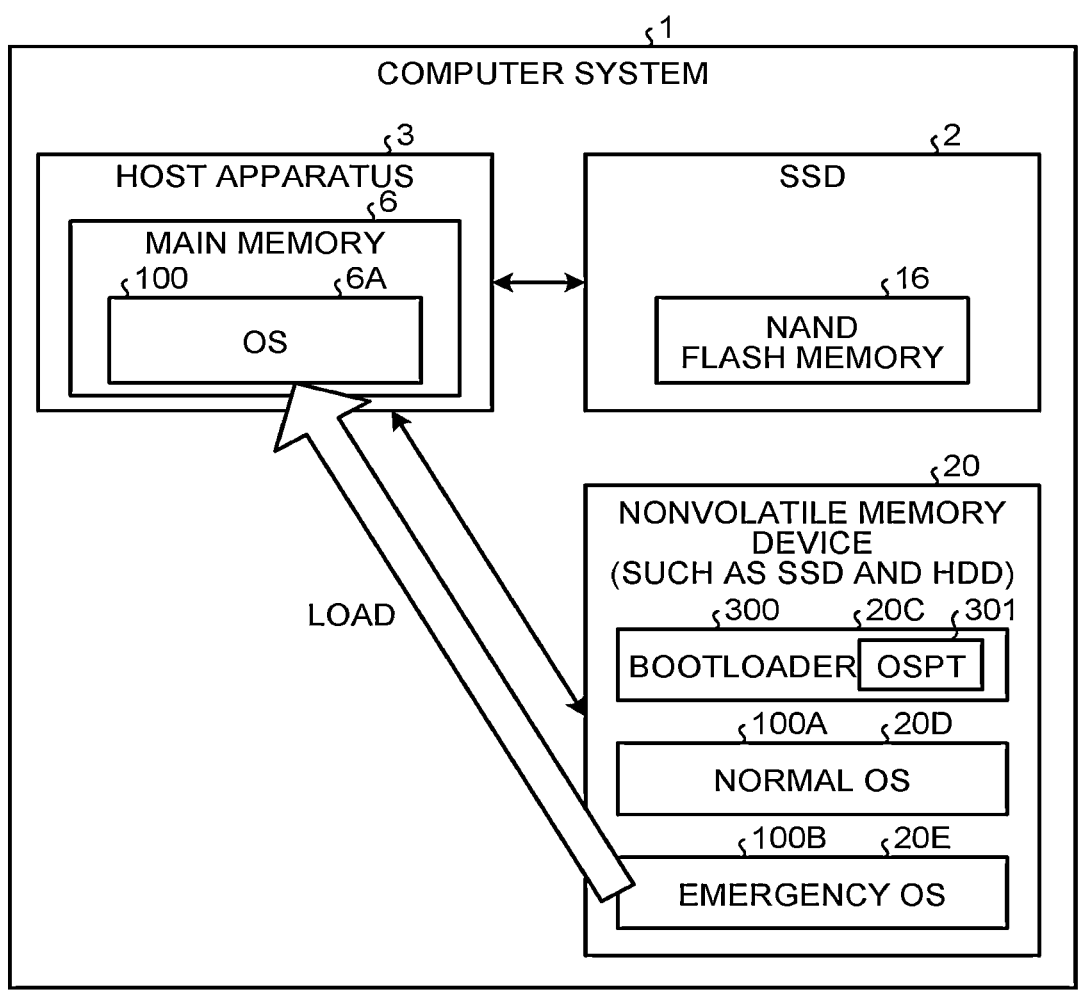
FIG. 12 is a block diagram illustrating a function configuration example of the computer system in a case where a normal OS and an emergency OS are stored in a nonvolatile memory device other than the SAD with degraded reliability.

When a plurality of nonvolatile memory devices is connected to the host apparatus 3, the OS may be stored in the nonvolatile memory device 20 different from the SSD 2. For example, as shown in FIG. 12, both the normal OS and the emergency OS may be stored in the nonvolatile memory device 20, the normal OS may be stored in the SSD 2 and the emergency OS may be stored in the nonvolatile memory device 20, or the normal OS may be stored in the nonvolatile memory device 20 and the emergency OS may be stored in the SSD 2. Especially, when the nonvolatile memory device 20 is used as a system drive for storing the OS and the SSD 2 is used as a data drive for storing user data such as documents, still image data, and moving image data, it is desirable to store the normal OS in the nonvolatile memory device 20 as a system drive in terms of clearly distinguishing the roles of the drive 2 and the drive 20 from each other, such as in the case of using the system drive 20 as a drive for mainly storing an OS and an application program and using the data drive 2 as a drive for storing user data. More desirably, the emergency OS is also stored in the nonvolatile memory device 20 as a system drive.

Figure 10:
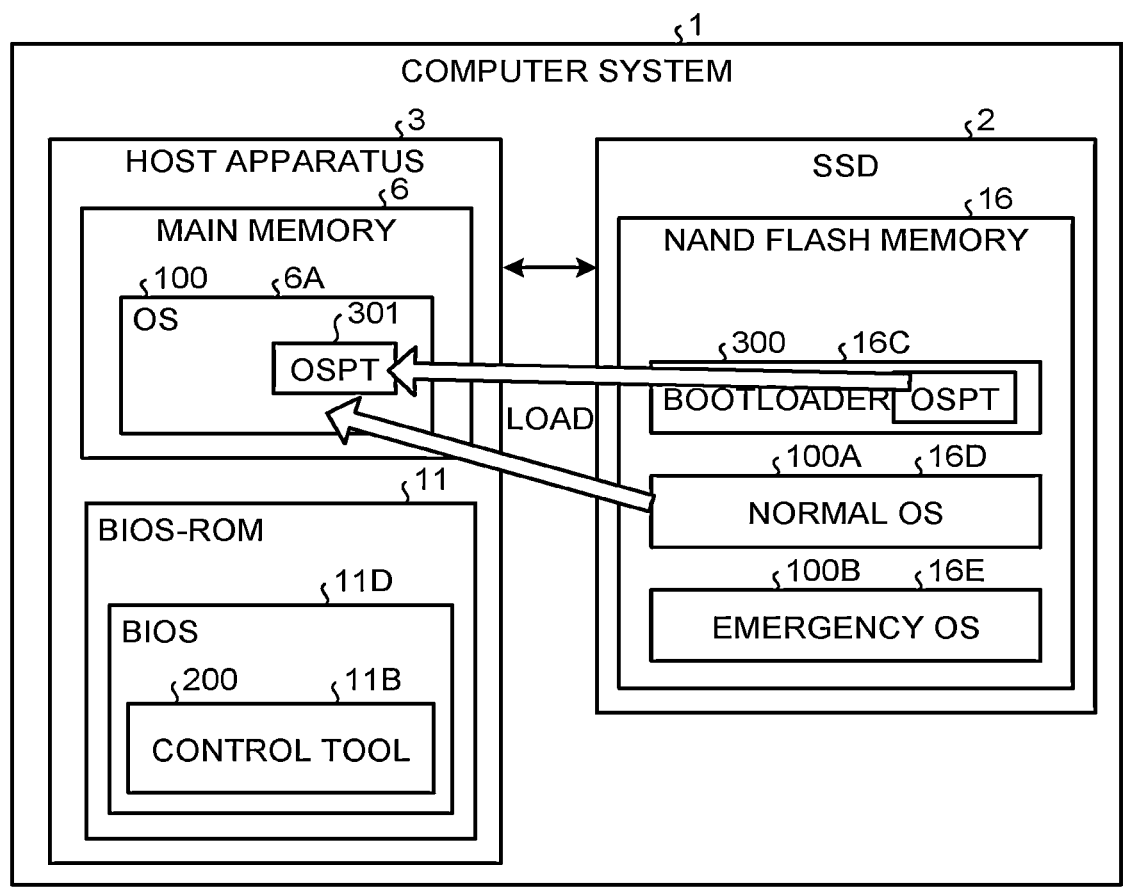
FIG. 10 is a block diagram illustrating a function configuration example of the computer system in a case where a normal OS and an emergency OS are stored in the SSD, the control tool is stored in the ROM.

As shown in FIG. 10, the control tool 200 may be stored in the ROM 11. For example, BIOS-ROM 11 have a BIOS area 11D and a emergency BIOS area 11E in which the emergency firmware (emergency BIOS) is stored and the control tool 200 11C. When the host 3 is booted, the BIOS 11D and the control tool 200 are booted and the BIOS 11D loads an OSPT stored in the NAND flash memory 16 into the main memory 6. The OSPT stored in the NAND flash memory preferably stores the start LBA address of the normal OS area 16D initially. The control tool 200 get a statistical information from SSD 2 and determines which one of the normal OS 100A and the emergency OS 100B is loaded on the basis of the statistical information and write the selected OS LBA pointer into a OSPT 301 in the main memory 6. For example, the statistical information may be read out by using SMART READ DATA (B0h(D0h)) described in INCITS ACS-2, IDENTIFY DEVICE (ECh) described in INCITS ACS-2, SCT Command Transport described in ACS-2, or a command unique to a vendor. The BIOS 11D loads the bootloader 300 in the NAND flash memory 16 into the area 6A, and the bootloader read the OSPT 301 in the main memory 6 and the bootloader loads one of the normal OS 100A and the emergency OS 100B into the area 6A in the host apparatus 3 on the basis of the OSPT 301 in the main memory 6.

Figure 11:
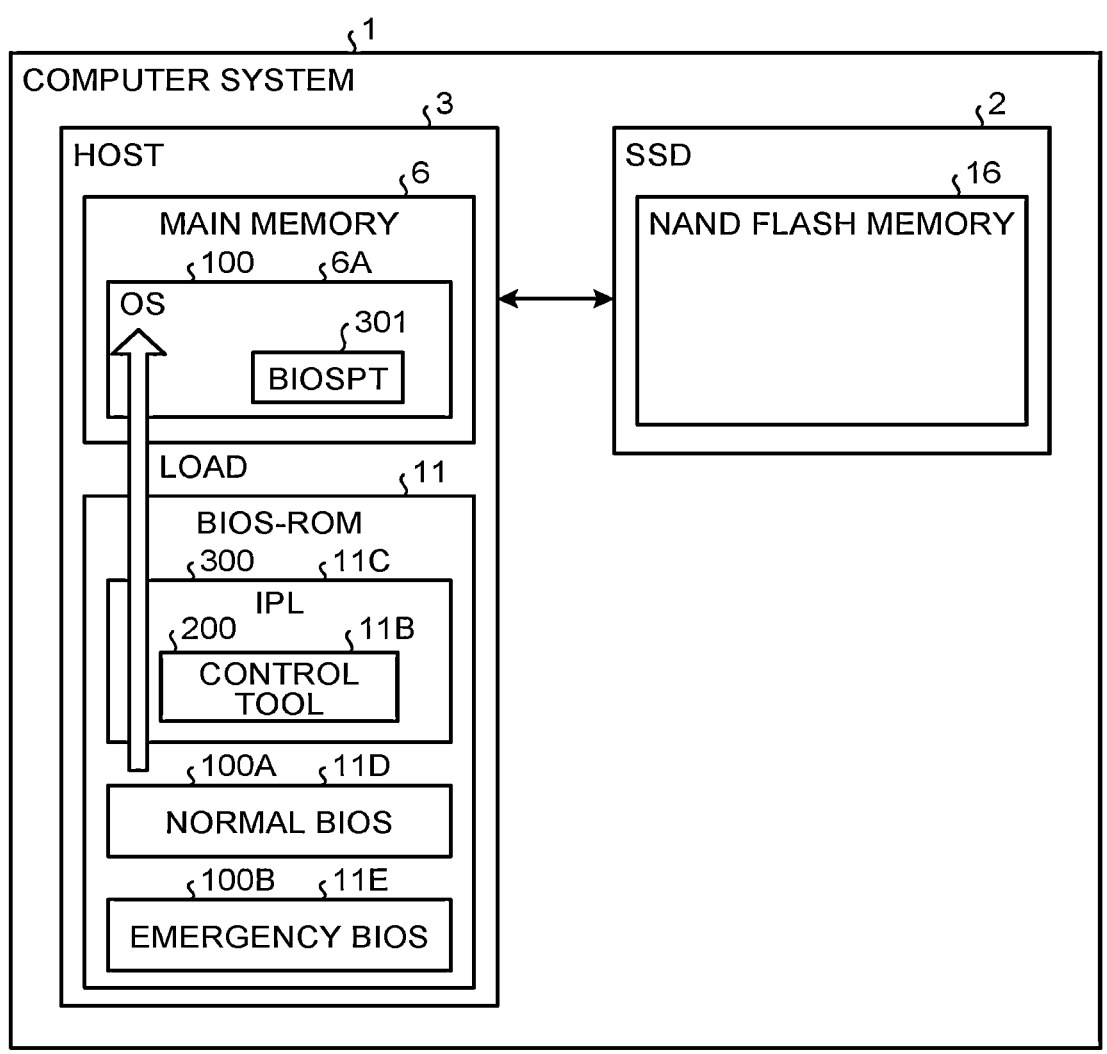
FIG. 11 is a block diagram illustrating a function configuration example of the computer system in a case where a normal BIOS, an emergency BIOS and the control tool are stored in the ROM.

As shown in FIG. 11, the firmware in ROM 11 may have normal firmware as the normal OS and emergency firmware as the emergency OS. For example, as described in FIG. 11, BIOS-ROM 11 have a normal BIOS area 11D in which the normal firmware (normal BIOS) is stored, a emergency BIOS area 11E in which the emergency firmware (emergency BIOS) is stored and a Initial Program Load area (a IPL area) 11C storing an Initial Program Load program (an IPL program) which load a BIOS firmware stored in the BIOS-ROM 11 100A into the area 6A in the host apparatus 3. The control tool 200 is included in the IPL 300. When IPL 300 is booted, the control tool 200 get a statistical information from SSD 2 and determines which one of the normal BIOS 100A and the emergency BIOS 100B is loaded into the area 6A on the basis of the statistical information and write the selected BIOS address pointer into a BIOSPT 301 like the OSPT 301 for OS. For example, the statistical information may be read out by using SMART READ DATA (B0h(D0h)) described in INCITS ACS-2, IDENTIFY DEVICE (ECh) described in INCITS ACS-2, SCT Command Transport described in ACS-2, or a command unique to a vendor. The IPL 300 load one of the normal BIOS 100A and the emergency BIOS 100B into the area 6A in the host apparatus 3 on the basis of the BIOS address pointer stored in a BIOSPT 301. The normal BIOS 100A is a BIOS used when the reliability of the SSD 2 is not degraded. With the normal BIOS, some data may be written to the SSD at the time of booting and some data may be written to the SSD in the background process unintentionally for users. The emergency BIOS 100B is a BIOS used when the reliability of the SSD 2 is degraded and does not perform writing to the SSD 2 (writing non-support). That means that the emergency BIOS performs only a read operation to the SSD at the time of booting and does not perform writing to the SSD in the background, which a user does not intend. The emergency BIOS 100B may be capable of performing writing to a nonvolatile memory device other than the SSD 2 when the reliability is degraded. In order to prevent a user from erroneously transmitting a write command and data from being written to the SSD 2, the emergency BIOS 100B may inhibit execution of a normal write command to the SSD 2 and, when data needs to be exceptionally written to the SSD 2, the emergency BIOS 100B may permit writing to the SSD 2 only by a command using a special command such as SCT Command Transport described in INCITS ACS-2 and a command unique to a vendor. The firmware in the ROM 11 may be unified as a single firmware including the functions of the normal firmware and the emergency firmware, and the firmware may operate as one of a normal firmware mode or an emergency firmware mode which is selected by the control tool 200 exclusively.

In terms of saving labor of a user required for setting up the emergency OS, for example as shown in FIG. 9, FIG. 10, FIG. 11 and FIG. 12, it is desirable that the computer system 1 is shipped in a state where the emergency OS is stored in the SSD 2, the nonvolatile memory device 20 or ROM 11, arrives in stores, and is handed to a user. On the other hand, in terms of enabling a user to select whether to install the emergency OS and enabling the provision of the latest emergency OS to a user, it is desirable that the emergency OS is capable of being stored in the SSD 2, the nonvolatile memory device 20 or the ROM 11 by downloading it from the WEB or installing it from an external storage medium such as a DVD-ROM and a USB memory.

Figure 13:
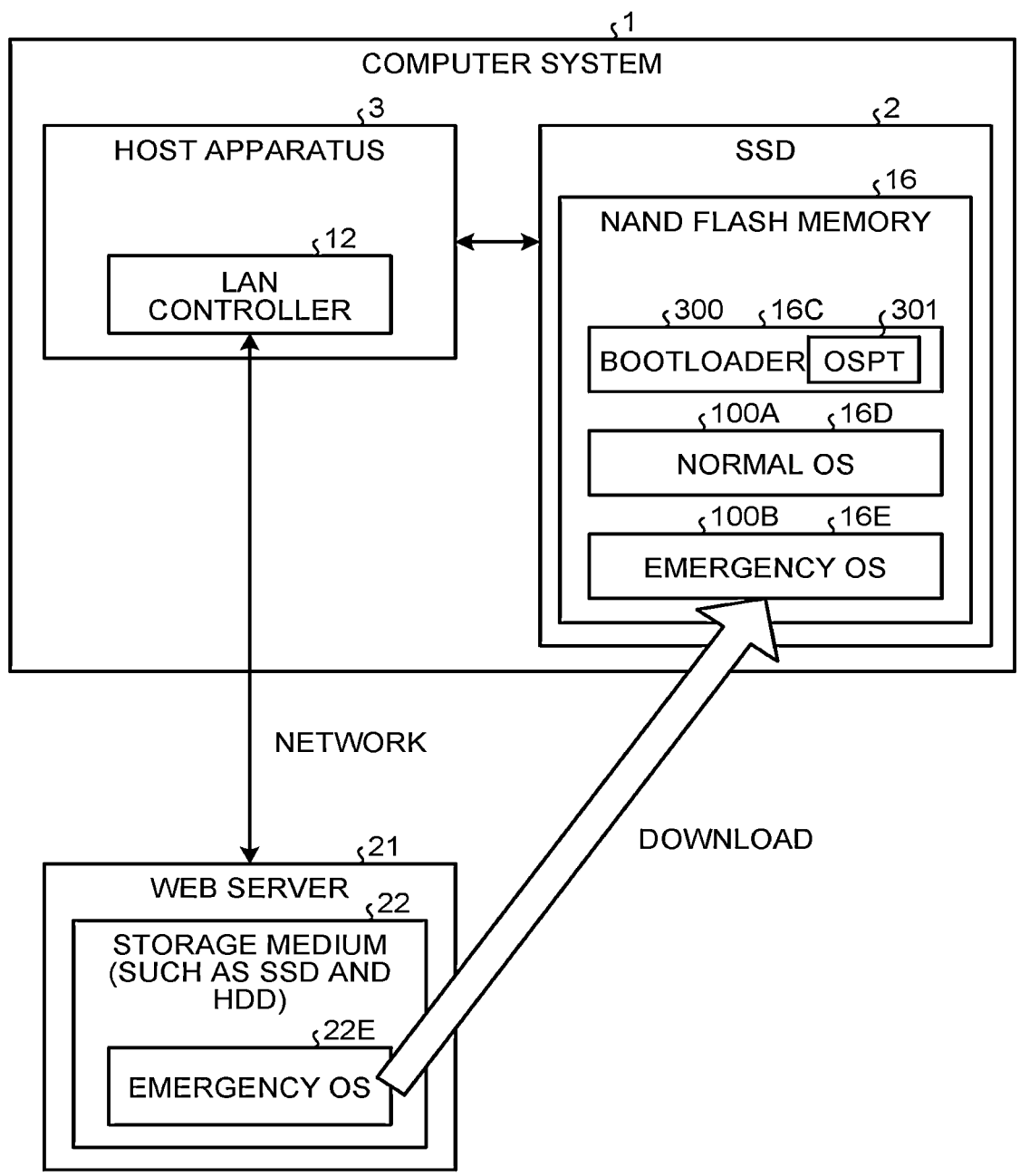
FIG. 13 is a block diagram illustrating a function configuration example of the computer system in a case of installing the emergency OS from a storage medium on the WEB.

FIG. 13 is an example of downloading from the WEB. The emergency OS is stored in an area 22E in the storage medium 22 on the WEB server 21 and the emergency OS is downloaded or installed in the area 16E in the NAND memory 16 of the SSD 2 via a network, such as the Internet, a local network, and a wireless LAN, for example, through the LAN controller 12. In the case of FIG. 12, the emergency OS is downloaded or installed in an area 20E in the nonvolatile memory device 20.

Figure 14:
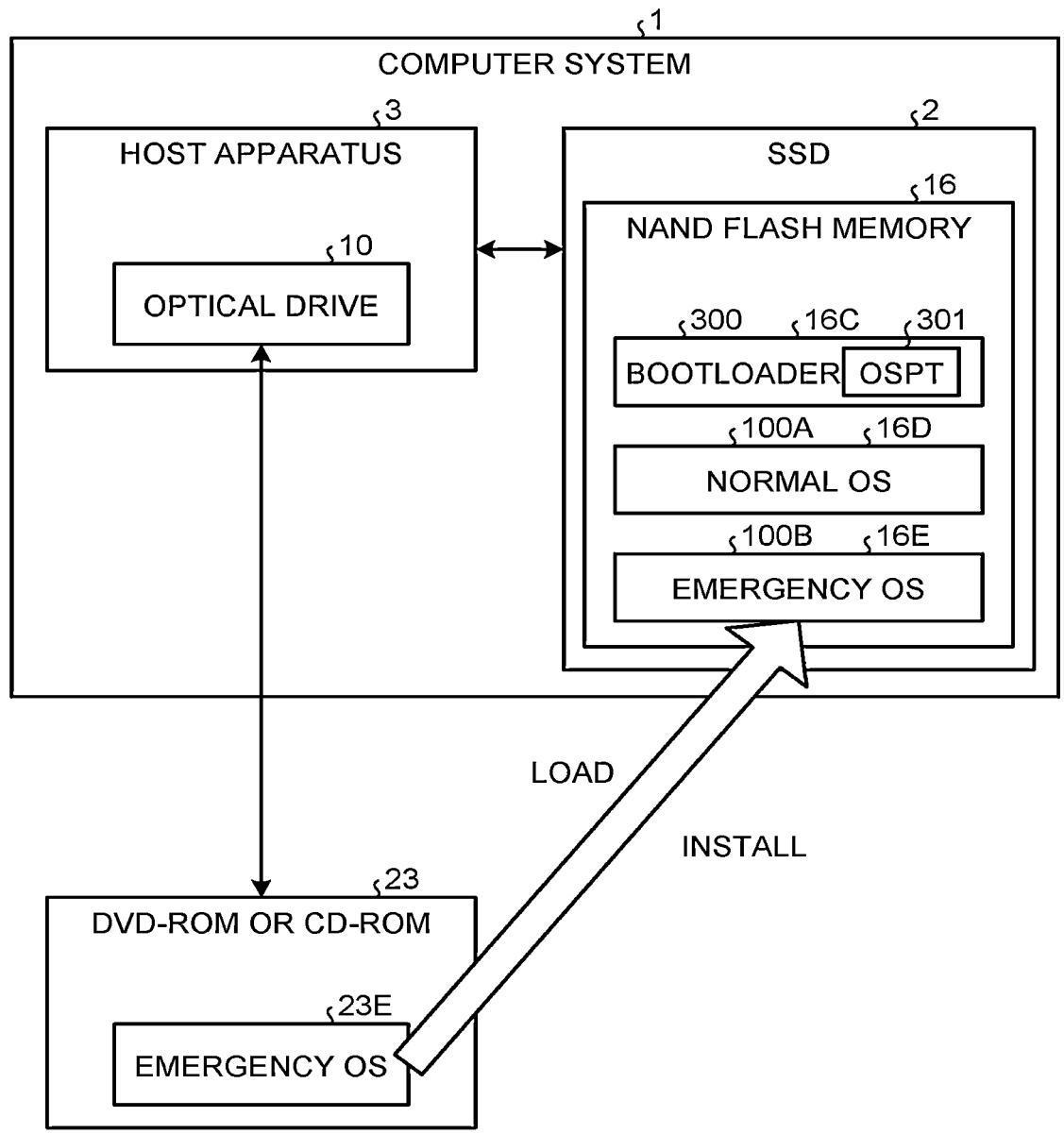
FIG. 14 is a block diagram illustrating a function configuration example of the computer system in a case of installing the emergency OS from an optical drive.
Figure 15:
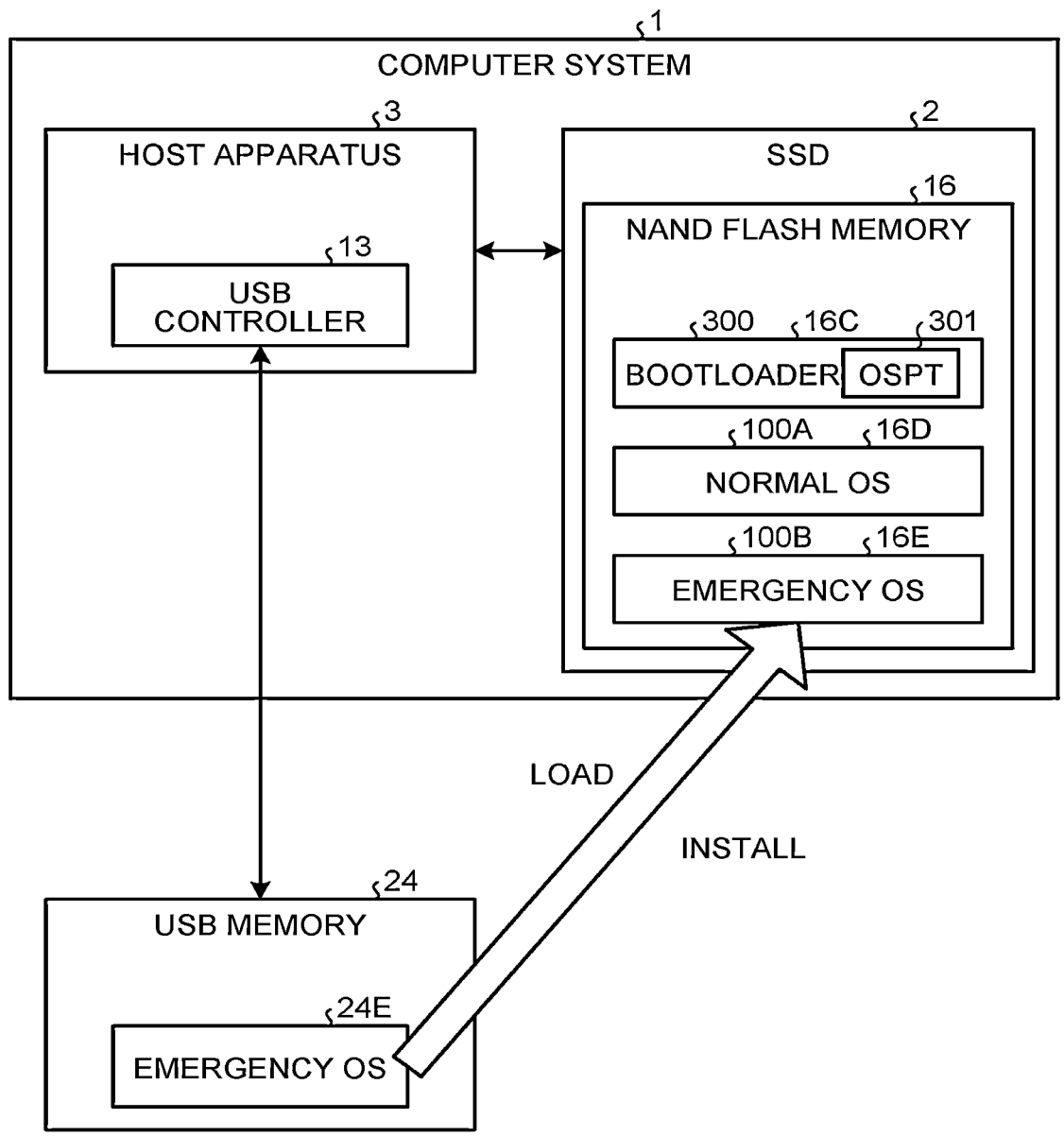
FIG. 15 is a block diagram illustrating a function configuration example of the computer system in a case of installing the emergency OS from an USB memory.

FIG. 14 is an example of installing from an optical medium such as a DVD-ROM and a CD-ROM. The emergency OS is stored in an area 23E in the optical medium 23 such as a DVD-ROM and a CD-ROM and is installed in the area 16E (or the area 20E) in the NAND memory 16 of the SSD 2 via the optical drive 10 by setting the optical medium 23 in the optical drive 10. FIG. 15 is an example of installing from a USB memory. The emergency OS is stored in an area 24E in the USB memory 24 and is installed in the area 16E (or the area 20E) in the NAND memory 16 of the SSD 2 via the USB controller 13 by connecting the USB memory 24 to the USB controller 13. Obviously, other external memories such as an SD card may be used instead of the USB memory 24. In terms of ease of availability by a user, the optical medium 23 or the USB memory 24 is desirably packed together with the SSD 2 as an accessory when shipping the SSD 2 and sold. On the other hand, the optical medium 23 or the USB memory 24 may be sold separately as a software product or may be attached to a magazine or a book as a supplement. The emergency OS and the control tool are desirably stored in the same external memory, such as the optical medium 23 and the USB memory 24, in terms of ease of installation.

Figure 16:
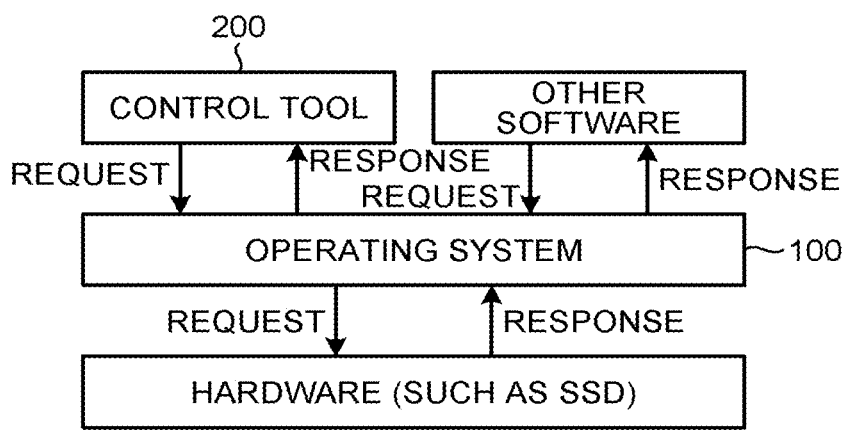
FIG. 16 is a block diagram illustrating a hierarchical function configuration example of a host.

FIG. 16 illustrates a hierarchical structure of the computer system 1 at the software level. The control tool 200 and other software (software other than the control tool 200) loaded into the main memory 6 do not normally communicate with the SSD 2 directly and communicate with the SSD 2 through the OS 100 loaded into the main memory 6. When the control tool 200 and other software need to transmit an instruction, such as a read request and a write request, to the SSD 2, the control tool 200 and other software transmit an access request in units of files to the OS 100. The OS 100 refers to a file management table included in the OS 100, specifies a logical address (LBA) in the SSD 2 corresponding to a file for which the access request is made, and transmits an instruction unique to the interface including corresponding LBA to the SSD 2. When a response is returned from the SSD 2, the OS 100 specifies software to which a response unique to the interface after translation is to be returned, and returns the response to the specified software.

Figure 17:
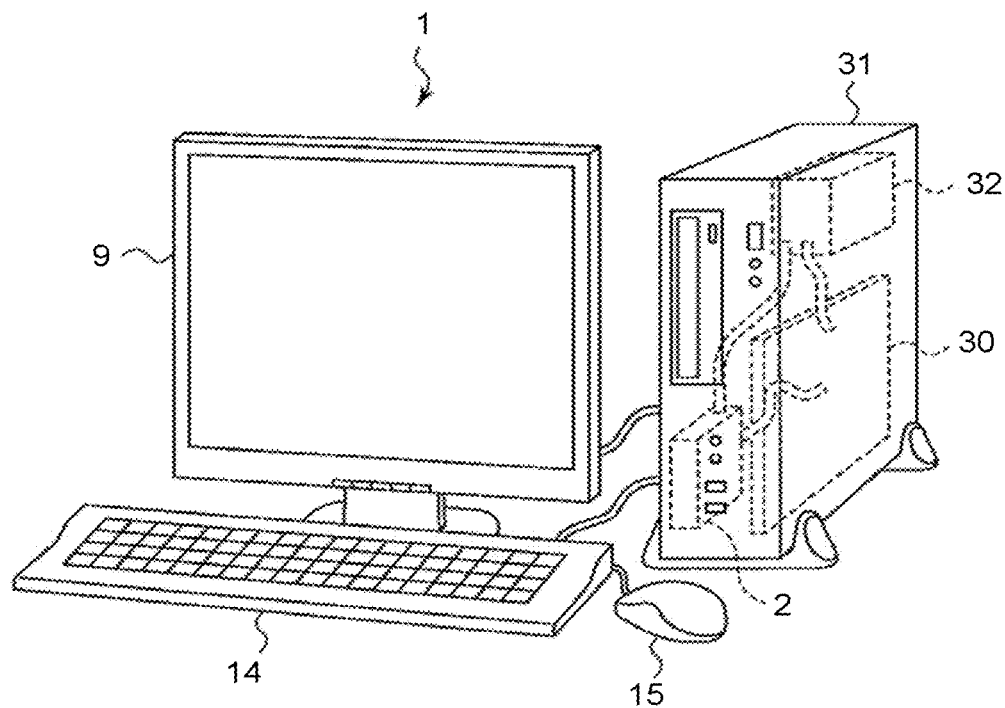
FIG. 17 is a diagram illustrating an appearance configuration of the computer system.

Next, the configuration example of the computer system 1 will be explained. The computer system 1 can be realized, for example, as a desktop computer or a notebook portable computer. FIG. 17 is a schematic diagram of a desktop computer that is the computer system 1. The desktop computer includes a computer body 31, the display 9, the keyboard 14, the mouse 15, and the like. The computer body 31 includes a mother board 30 on which main hardware is mounted, the SSD 2, a power unit 32, and the like. The SSD 2 is physically connected to the mother board 30 via a SATA cable and is electrically connected to the CPU 4 mounted on the mother board via the south bridge 7 mounted on the mother board 30. The power unit 32 generates various powers used in the desktop computer and supplies the power to the mother board 30, the SSD 2, and the like via the power cable.

Figure 18:
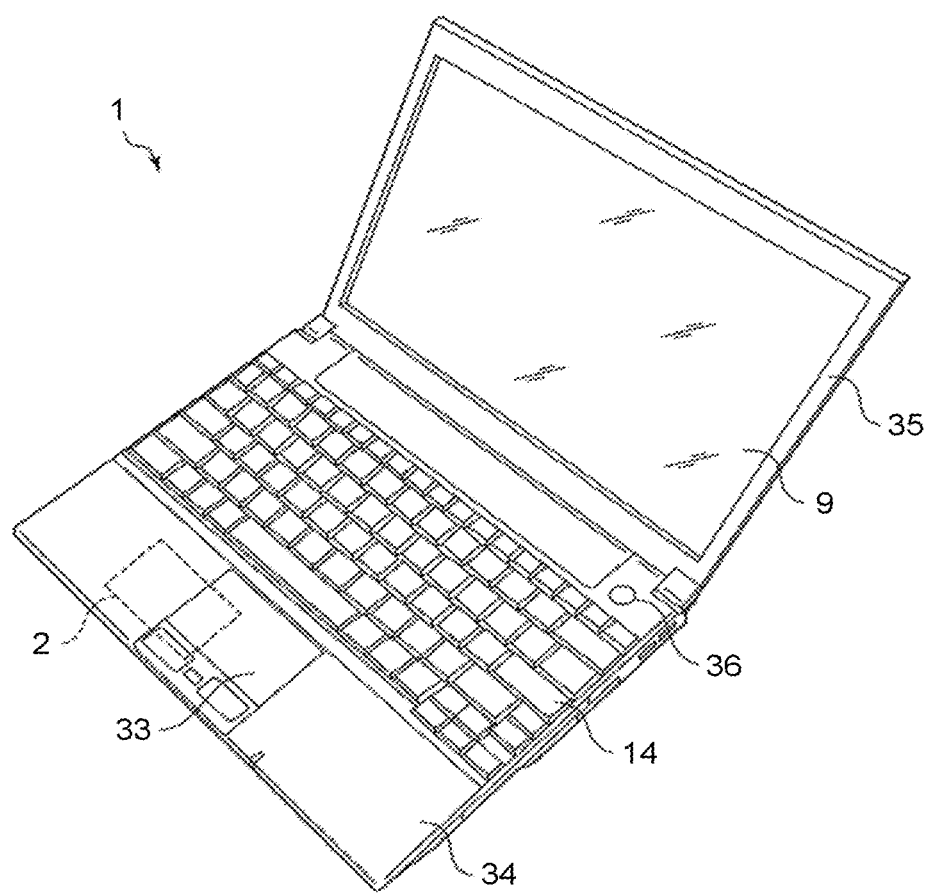
FIG. 18 is a diagram illustrating another appearance configuration of the computer system.

FIG. 18 is a schematic diagram of a portable computer that is the computer system 1. The portable computer is composed of a computer body 34, a display unit 35, and the like. The display apparatus 9 composed of, for example, an LCD (Liquid Crystal Display) is built in the display unit 35. The display unit 35 is attached to the computer body 34 to be rotatable between the open position, at which the upper surface of this body 34 is exposed, and the closed position, at which the upper surface of the body 34 is covered. The body 34 has a thin box-shaped casing, and a power switch 36, the keyboard 14, a touch pad 33, and the like are arranged on the upper surface thereof. Moreover, in the similar manner to the desktop computer, the body 34 also includes the SSD 2, a mother board, a power unit, and the like.

The information processing apparatus to which the present invention is applied may be an imaging apparatus such as a still camera and a video camera, a tablet computer, a smartphone, a game machine, a car navigation system, or the like other than the computer system 1.

Figure 19:
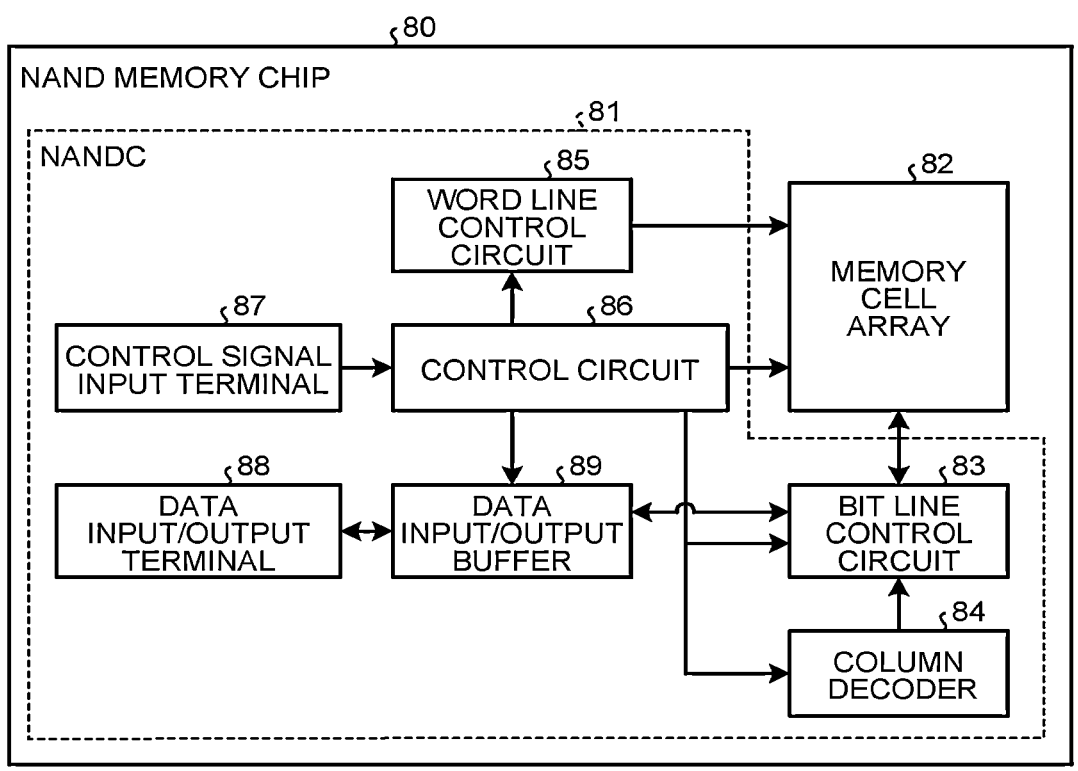
FIG. 19 is a block diagram illustrating an internal configuration example of a NAND memory chip.

Next, the NAND memory 16, which is the main component of the SSD 2, will be explained. FIG. 19 illustrates an internal configuration example of a NAND memory chip 80 configuring the NAND memory 16. The NAND memory 16 is composed of one or more NAND memory chips 80. The NAND memory chip 80 includes a memory cell array in which a plurality of memory cells is arrayed in a matrix manner. Memory transistors from which a memory cell array is configured are each composed of a MOSFET (Metal Oxide Semiconductor Field Effect Transistor) having a stacked gate structure formed on a semiconductor substrate. The stacked gate structure includes a charge storage layer (floating gate electrode) formed on the semiconductor substrate with a gate dielectric film therebetween and a control gate electrode formed on the floating gate electrode with an inter-gate dielectric film therebetween. In a memory cell transistor, a threshold voltage changes according to the number of electrons stored in the floating gate electrode and data is stored according to the difference in this threshold voltage. In the present embodiment, explanation will be made for a case where each memory cell employs a write system of a 4-value storage system of storing 2 bits/cell by using the upper page and the lower page, however, the nature of the present invention does not change even in the case where each memory cell employs a write system of a 2-value storage system of storing 1 bit/cell by using a single page, a write system of an 8-value storage system of storing 3 bits/cell by using the upper page, the middle page, and the lower page, or a write system of a multi-value storage system of storing 4 bits/cell or more. Moreover, a memory cell transistor is not limited to having a structure including a floating gate electrode and may have a structure, such as a MONOS (Metal-Oxide-Nitride-Oxide-Silicon) type, in which a threshold voltage can be adjusted by trapping electrons in a nitride interface as a charge storage layer. A MONOS type memory cell transistor may be configured to store 1 bit or may be configured to store multiple values in the similar manner to a MOSFET type memory cell transistor. Moreover, the nonvolatile storage medium may be a semiconductor storage medium in which memory cells are three-dimensionally arranged as described in U.S. Patent Application Publication No. 2010 0172189 and U.S. Patent Application Publication No. 2010 0254191. The nonvolatile storage medium may also be other kinds of nonvolatile storage medium such as ReRAM, a platter of a hard disk drive.

As shown in FIG. 19, the NAND memory chip 80 includes a memory cell array 82 formed by arranging memory cells that store data in a matrix manner. The memory cell array 82 includes a plurality of bit lines, a plurality of word lines, and a common source line, and memory cells, in which data is electrically rewritable, are arranged in a matrix manner at intersections of the bit lines and the word lines in the memory cell array 82. A bit line control circuit 83 for controlling the bit lines and a word line control circuit 85 for controlling the word lines are connected to this memory cell array 82. That means that the bit line control circuit 83 reads data in a memory cell in the memory cell array 82 via a bit line and writes data to a memory cell by applying a write control voltage to the memory cell in the memory cell array 82 via a bit line.

A column decoder 84, a data input/output buffer 89, and a data input/output terminal 88 are connected to the bit line control circuit 83. Data in a memory cell read from the memory cell array 82 is output to the outside from the data input/output terminal 88 through the bit line control circuit 83 and the data input/output buffer 89. Moreover, write data input to the data input/output terminal 88 from the outside is input to the bit line control circuit 83 by the column decoder 84 through the data input/output buffer 89 and is written to a specified memory cell.

Moreover, the memory cell array 82, the bit line control circuit 83, the column decoder 84, the data input/output buffer 89, and the word line control circuit 85 are connected to a control circuit 86. The control circuit 86 generates a control signal and a control voltage for controlling the memory cell array 82, the bit line control circuit 83, the column decoder 84, the data input/output buffer 89, and the word line control circuit 85 according to a control signal input to a control signal input terminal 87. In the NAND memory chip 80, a circuit portion other than the memory cell array 82 is called a NAND controller (NANDC) 81.

Figure 20:
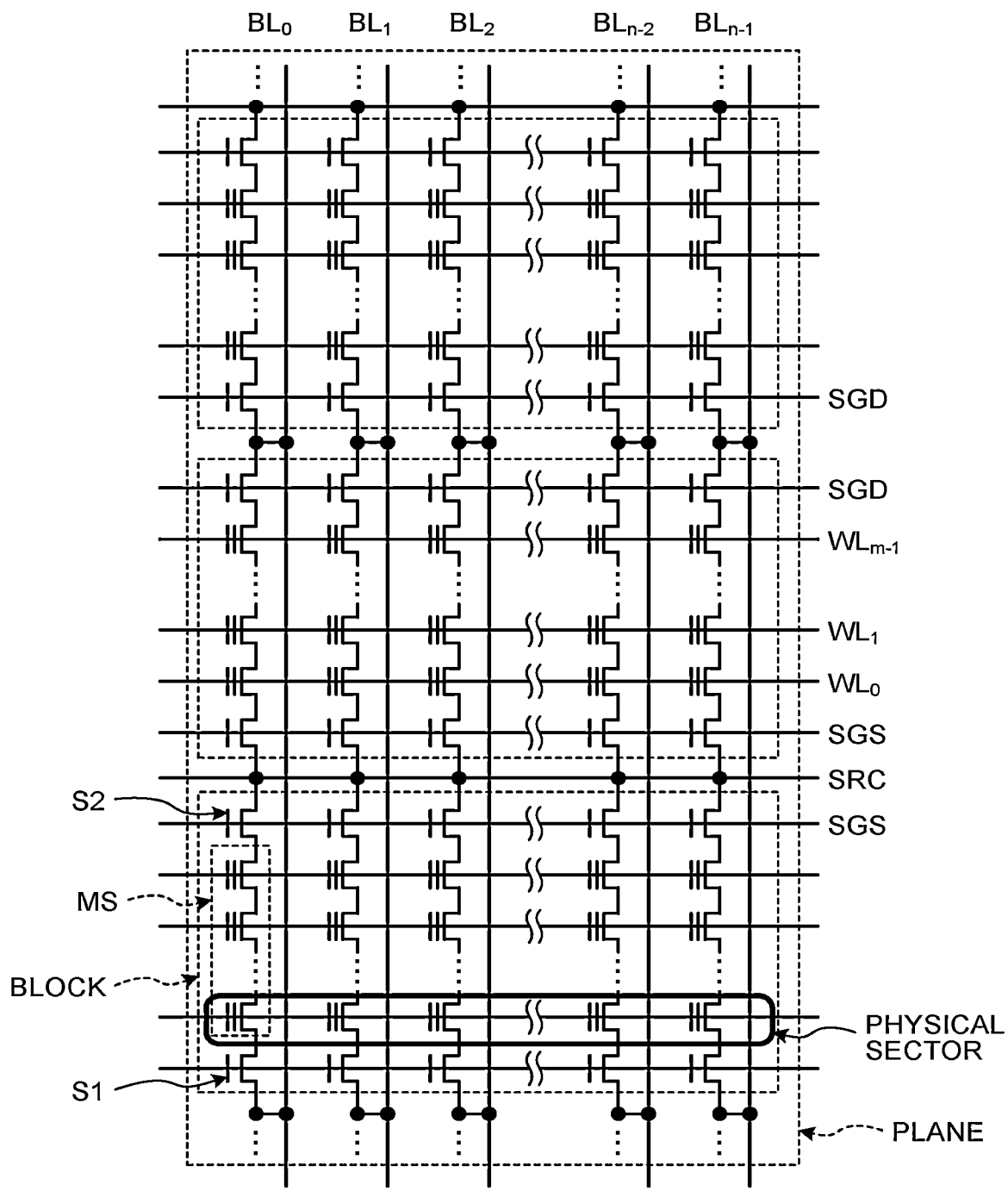
FIG. 20 is a circuit diagram illustrating a configuration example of one plane included in the NAND memory chip.
Figure 21:
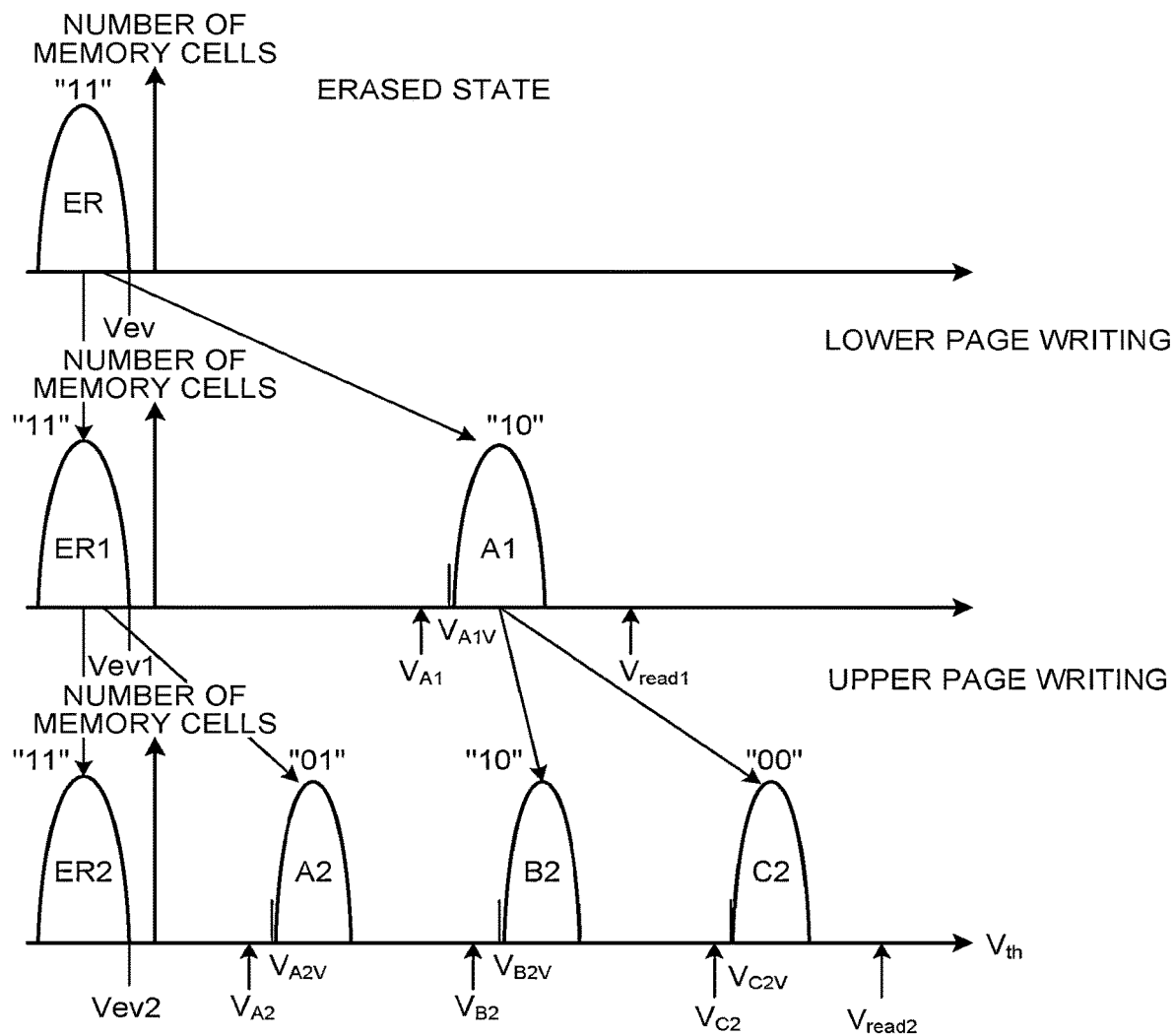
FIG. 21 is a diagram illustrating threshold distributions in a 4-value data storage system.

FIG. 20 illustrates a configuration of the memory cell array 82 shown in FIG. 21. The memory cell array 82 is a NAND cell type memory cell array and includes a plurality of NAND cells. One NAND cell includes a memory string MS formed of series-connected memory cells and select gates S1 and S2 connected to both ends thereof. The select gate S1 is connected to a bit line BL and the select gate S2 is connected to a source line SRC. Control gates of memory cells MC arranged on the same row are connected to any of word lines WL0 to WLm−1 in common. Moreover, the first select gates S1 are connected to a select line SGD in common and the second select gates S2 are connected to a select line SGS in common.

The memory cell array 82 includes one or more planes and a plane includes a plurality of blocks. Each block is composed of a plurality of NAND cells and data is erased in units of blocks.

Moreover, a plurality of memory cells connected to one word line forms one physical sector. Data is written and read for each physical sector (this physical sector is irrelevant to a logical sector of LBA which will be described later). In the case of a 2 bits/cell write system (4 values), for example, data for 2 pages is stored in one physical sector. On the other hand, in the case a 1 bit/cell write system (2 values), for example, data for 1 page is stored in one physical sector, and, in the case a 3 bits/cell write system (8 values), for example, data for 3 pages is stored in one physical sector.

In a read operation, a program verify operation, and a program operation, one word line is selected and one physical sector is selected according to a physical address received from a SSDC 41 which will be described later. Switching of a page in this physical sector is performed by a physical address. In the present embodiment, the NAND memory 16 employs a 2 bits/cell write system, so that the SSDC 41 determines that 2 pages, i.e., the upper page (Upper Page) and the lower page (Lower Page) are allocated to a physical sector as a physical page, and physical addresses are allocated to all of the pages.

The 4-value NAND memory that stores 2 bits/cell is configured such that the threshold voltage in one memory cell can obtain four types of distributions. FIG. 21 illustrates a relationship between 2 bits of 4-value data (data "11", "01", "10", and "00") stored in a memory cell in the 4-value NAND cell type flash memory and a threshold voltage distribution of memory cells. In FIG. 21, $V_{A1}$ is a voltage applied to a selected word line in the case of reading 2 pieces of data in a physical sector in which only the lower page is in a written state and the upper page is in an unwritten state, and $V_{A1V}$ indicates a verify voltage applied for checking whether writing has been completed in the case of performing writing on A1.

Moreover, $V_{A2}$, $V_{B2}$, and $V_{C2}$ are voltages applied to a selected word line in the case of reading 4 pieces of data in a physical sector in which the lower page and the upper page are in a written state and $V_{A2V}$, $V_{B2V}$, and $V_{C2V}$ indicate verify voltages applied for checking whether writing has been completed in the case of performing writing on each threshold voltage distribution. Moreover, Vread1 and Vread2 indicate read voltages that are applied to unselected memory cells among the NAND cells and render the unselected memory cells conductive regardless of the stored data in the case of reading data. Furthermore, Vev1 and Vev2 are erase verify voltages applied to a memory cell for checking whether erasing has been completed in the case of erasing data in the memory cell and has a negative value. The magnitude thereof is determined in consideration of the effect of interference of the adjacent memory cell. The magnitude relationship between the above voltages is as follows.

$$Vev1 < V_{A1} < V_{A1V} < Vread1$$

$$Vev2 < V_{A2} < V_{A2V} < V_{B2} < V_{B32V} < V_{C2} < V_{C2V} < Vread2$$

The erase verify voltages Vev1, Vev2, and Vev3 take negative values as described above, however, the voltage applied to a control gate of a memory cell MC in the actual erase verify operation is not a negative value but zero or a positive value. That means that, in the actual erase verify operation, a positive voltage is applied to the back gate of the memory cell MC and voltage of zero or a positive value smaller than the back gate voltage is applied to the control gate of the memory cell MC. In other words, the erase verify voltages VeV1, VeV2, and VeV3 are voltages having a value equivalent to a negative value.

In a threshold voltage distribution ER of a memory cell after block erasing, the upper limit thereof is also a negative value and data "11" is allocated. Memory cells having data "11", "01", "10", and "00", in which the lower page and the upper page are in a written state, have positive threshold voltage distributions ER2, A2, B2, and C2, respectively (the lower limits of A2, B2, and C2 are also positive values), and the threshold voltage distribution A2 of data "01" has the lowest voltage value, the threshold voltage distribution C2 of data "00" has the highest voltage value, and the voltage values of various threshold voltage distributions have a relationship of A2<B2<C2. A memory cell of data "10", in which the lower page is in a written state and the upper page is in an unwritten state, has a positive threshold voltage distribution A1 (the lower limit of A1 is also a positive value). The threshold voltage distributions shown in FIG. 21 are only an example and the present invention is not limited to this. For example, in FIG. 21, it is explained that all of the threshold voltage distributions A2, B2, and C2 are positive threshold voltage distributions, however, a case in which the threshold voltage distribution A2 is a negative voltage distribution and the threshold voltage distributions B2 and C2 are positive voltage distributions is also included in the range of the present invention. Moreover, even if the threshold voltage distributions ER1 and ER2 take a positive value, the present invention is not limited to this. Moreover, in the present embodiment, the correspondence relationship is such that data on ER2, A2, B2, and C2 correspond to "11", "01", "10", and "00", respectively, however, for example, other correspondence relationships, such as "11", "01", "00", and "10" may be employed.

2 bit data in one memory cell is composed of lower page data and upper page data and the lower page data and the upper page data are written in the memory cell by different write operations, that is, two write operations. When data is expressed as "*@", * represents the upper page data and @ represents the lower page data.

First, writing to the lower page data will be explained with reference to the first to second stages in FIG. 21. All the memory cells have the threshold voltage distribution ER in an erased state and store data "11". As shown in FIG. 21, when writing to the lower page data is performed, the threshold voltage distribution ER of the memory cells is divided into two threshold voltage distributions (ER1 and A1) according to the value ("1" or "0") of the lower page data. When the value of the lower page data is "1", the threshold voltage distribution ER in an erased state is maintained, so that ER1 is equal to ER, however, ER1 may be larger than ER.

On the other hand, when the value of the lower page data is "0", a high electric field is applied to a tunnel oxide film of a memory cell to inject electrons into a floating gate electrode, thereby increasing a threshold voltage Vth of the memory cell by a predetermined amount. Specifically, the verify potential $V_{A1V}$ is set and a write operation is repeated until the voltage becomes a threshold voltage equal to or larger than this verify voltage $V_{A1V}$. Consequently, the memory cell is changed to a written state (data "10"). If the voltage does not reach the threshold voltage even if a write operation is repeated a predetermined number of times (or if the number of memory cells, which do not reach the threshold voltage, is equal to or larger than a predetermined value), writing to the physical page becomes a "write error" (a "program error").

Next, writing to the upper page data will be explained with reference to the second to third stages in FIG. 21. Writing to the upper page data is performed based on write data (upper page data) input from the outside of the chip and the lower page data already written in a memory cell.

In other words, as shown in the second to third stages in FIG. 21, when the value of the upper page data is "1", a high electric field is controlled not to be applied to a tunnel oxide film of a memory cell, thereby preventing the threshold voltage Vth of the memory cell from increasing. Consequently, the memory cell of data "11" (threshold voltage distribution ER1 in an erased state) maintains data "11" without change (ER2) and the memory cell of data "10" (threshold voltage distribution A1) maintains data "10" without change (B2). However, in terms of ensuring a voltage margin between the distributions, it is desirable to adjust the lower limit of the threshold voltage distribution by using the positive verify voltage $V_{B2V}$ larger than the above-described verify voltage $V_{A1V}$ and whereby form the threshold voltage distribution B2 having a narrowed threshold voltage distribution width. If the voltage does not reach the threshold voltage even if the lower limit adjustment is repeated a predetermined number of times (or if the number of memory cells, which do not reach the threshold voltage, is equal to or larger than a predetermined value), writing to the physical page becomes a "write error" (a "program error").

On the other hand, when the value of the upper page data is "0", a high electric field is applied to a tunnel oxide film of a memory cell to inject electrons into a floating gate electrode, thereby increasing the threshold voltage Vth of the memory cell by a predetermined amount. Specifically, the verify potentials $V_{A2V}$ and $V_{C2V}$ are set and a write operation is repeated until the voltages become threshold voltages equal to or larger than this verify voltage $V_{A1V}$. Consequently, the memory cell of data "11" (the threshold voltage distribution ER1 in an erased state) is changed to data "01" of the threshold voltage distribution A2 and the memory cell of data "10" (A1) is changed to data "00" of the threshold voltage distribution C2. At this time, the lower limits of the threshold voltage distributions A2 and C2 are adjusted by using the verify voltages $V_{A2V}$ and $V_{C2V}$. If the voltage does not reach the threshold voltage even if a write operation is repeated a predetermined number of times (or if the number of memory cells, which do not reach the threshold voltage, is equal to or larger than a predetermined value), writing to the physical page becomes a "write error" (a "program error").

On the other hand, in an erase operation, an erase verify potential Vev is set and an erase operation is repeated until the voltage becomes a threshold voltage equal to or lower than this erase verify voltage Vev. Consequently, a memory cell is changed to a written state (data "00"). If the voltage does not reach the threshold voltage even if an erase operation is repeated a predetermined number of times (or if the number of memory cells, which do not reach the threshold voltage, is equal to or larger than a predetermined value), erasing to the physical page becomes an "erase error".

The above is an example of a data write system in a typical 4-value storage system. In a multi-bit storage system of storing 3 or more bits, only an operation of dividing a threshold voltage distribution into eight patterns or more is further added to the above operation according to the upper page data and a basic operation is the same.

Figure 22:
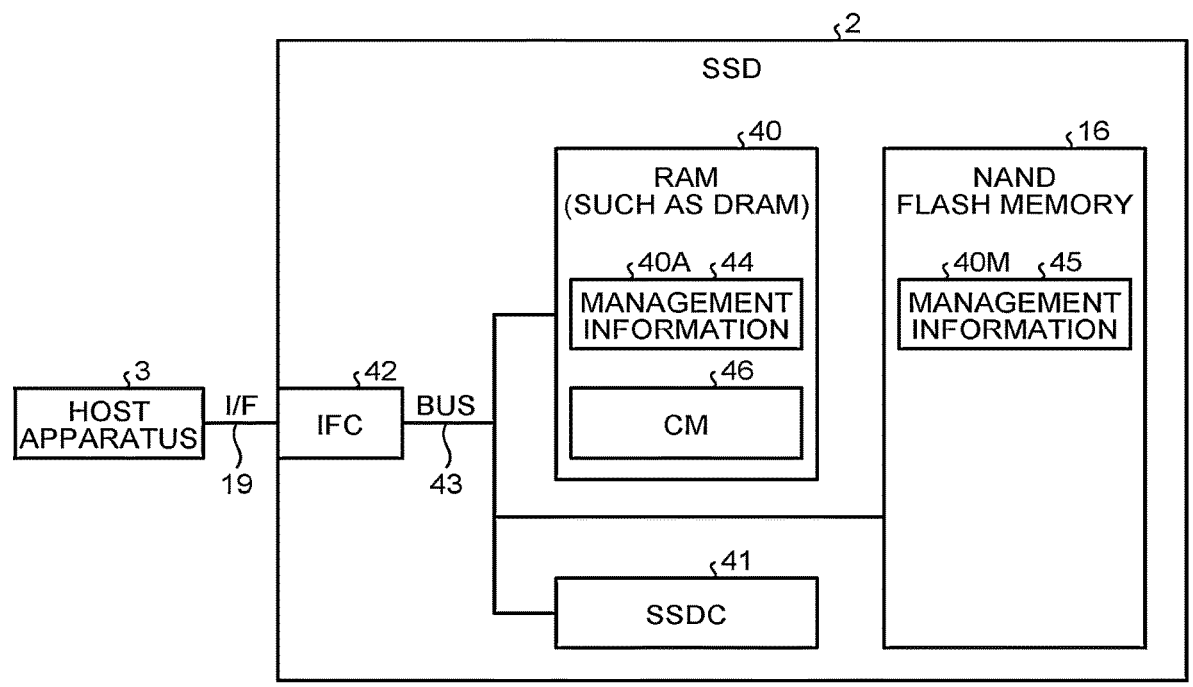
FIG. 22 is a functional block diagram illustrating an internal configuration example of the SSD.

Next, the configuration example of the SSD 2 will be explained. As shown in FIG. 22, the SSD 2 includes a NAND-type flash memory (hereinafter, abbreviated as NAND memory) 16, which is a nonvolatile semiconductor memory, an interface controller (IFC) 42 that performs transmission and reception of a signal to and from the host apparatus 3 via the ATA interface 19, a RAM (Random Access Memory) 40, which is a semiconductor memory and includes a cache memory (CM) 46 functioning as an intermediate buffer between the interface controller 42 and the NAND memory 16, an SSD controller (SSDC) 41 that performs management and control of the NAND memory 16 and the RAM 40 and control of the interface controller 42, and a bus 43 connecting these components.

As the RAM 40, a DRAM (Dynamic Random Access Memory), a SRAM (Static Random Access Memory), a FeRAM (Ferroelectric Random Access Memory), a MRAM (Magnetoresistive Random Access Memory), a PRAM (Phase Change Random Access Memory), a ReRAM (Resistance Random Access Memory), and the like can be employed. The RAM 40 may be included in the SSDC 41.

The NAND memory 16 is composed of a plurality of NAND memory chips 80, and stores user data specified by the host apparatus 3, stores a management table managing user data, and stores management information managed by the RAM 40 for backup. The NAND memory 16 includes the memory cell array 82, in which a plurality of memory cells is arrayed in a matrix manner, and each memory cell can perform multi-level recording by using an upper page and a lower page. The NAND memory 16 is composed of a plurality of memory chips and each memory chip is formed by arraying a plurality of blocks as a unit of data erasing. In the NAND memory 16, data writing and data reading are performed for each page. A block is composed of a plurality of pages.

The RAM 40 includes the cache memory (CM) 46 functioning as a data transfer cache between the host apparatus 3 and the NAND memory 16. Moreover, the RAM 40 functions as a management information storing memory and a work area memory. Management tables managed in an area 40A in the RAM 40 are obtained by loading various management tables stored in an area 40M in the NAND memory 16, for example, at the time of start-up of the SSD 2 and are saved in the area 40M in the NAND memory 16 periodically or at the time of turning off the power.

The function of the SSDC 41 is realized by a processor, which executes a system program (firmware) stored in the NAND memory 16, various hardware circuits, and the like, and the SSDC 41 performs, for example, data transfer control between the host apparatus 3 and the NAND memory 16 with respect to various commands, such as a write request, a cache flush request, and a read request, from the host apparatus 3, updating and management of various management tables stored in the RAM 40 and the NAND memory 16, ECC encoding of data to be written in the NAND memory 16, and ECC decoding of data read from the NAND memory 16.

When the host apparatus 3 issues a read request or a write request to the SSD 2, the host apparatus 3 inputs LBA (Logical Block Addressing) as a logical address via the ATA interface 19. LBA is a logical address in which serial numbers starting from zero are attached to logical sectors (size: e.g., 512 B). Moreover, when issuing a read request or a write request to the SSD 2, the host apparatus 3 inputs a logical sector size to be a target of the read request or the write request in addition to LBA.

The IFC 42 has a function of receiving a read request, a write request, other requests, and data from the host apparatus 3, transmitting the received request and data to the SSDC 41, and transmitting data to the RAM 40 under the control of the SSDC 41.

FIG. 23 illustrates a configuration of the management information used in the SSD 2. As described above, the management information is stored in the area 40M in the NAND memory 16 in a nonvolatile manner. The management information stored in the area 40M is loaded into the area 40A in the RAM 40 at the time of starting the SSD 2 and is used. Management information 44 in the RAM 40 is saved in the area 40M periodically or at the time of turning off the power. When the RAM 40 is a nonvolatile RAM, such as an MRAM, a FeRAM and a ReRAM, this management information 44 may be stored only in the RAM 40 and, in this case, this management information 44 is not stored in the NAND memory 16. In order to reduce the write amount to the NAND memory 16, it is desirable that data to be stored in management information 45 is data obtained by compressing data stored in the area 40A in the RAM 40. Moreover, in order to reduce the frequency of writing data in the NAND memory 16, it is desirable that update information (difference information) on the management information 44 stored in the area 40A in the RAM 40 is appended to the management information 45.

As shown in FIG. 23, the management information includes a free block table (FBT) 60, a bad block table (BBT) 61, an active block table (ABT) 62, a track table (logical-physical translation table in units of tracks) 63, a cluster table (logical-physical translation table in units of clusters) 64, and statistical information 65.

Figure 24:
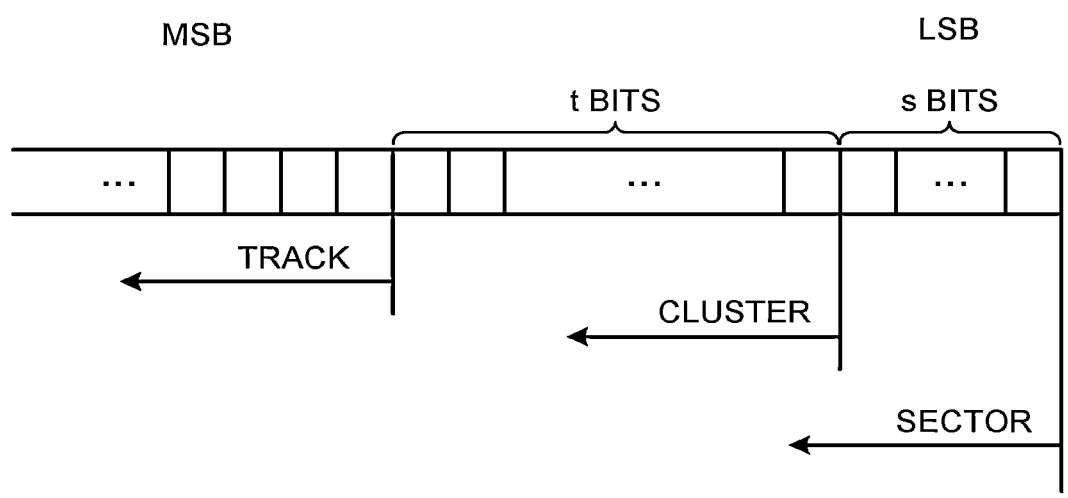
FIG. 24 is a diagram illustrating a relationship between LBA and a management unit of the SSD.

As shown in FIG. 24, LBA is a logical address in which serial numbers starting from zero are attached to logical sectors (size: e.g., 512 B). In the present embodiment, as a management unit of a logical address (LBA) of the SSD 2, a cluster address formed of a bit string equal to or higher in order than a low-order (s+1)th bit of LBA and a track address formed of a bit string equal to or higher in order than a low-order (s+t+1)th bit of LBA are defined. In other words, a logical sector is a minimum access unit from the host apparatus 3. A cluster is a management unit for managing "small data" in an SSD and the cluster size is set to be a size that is a natural number of times as large as the logical sector size. A track is a management unit for managing "large data" in an SSD and the track size is set to be a size twice or a larger natural number of times as large as the cluster size. Therefore, a track address is the quotient when dividing LBA by a track size and an intra-track address is the remainder when dividing LBA by a track size, and a cluster address is the quotient when dividing LBA by a cluster size and an intra-cluster address is the remainder when dividing LBA by a cluster size. In the following explanation, for convenience sake, the size of a track is equal to the size of data recordable in one physical block (when a redundant bit in ECC processing performed in the SSDC 41 is included in a physical block, this is excluded from the size) and the size of a cluster is equal to the size of data recordable in one physical page (when a redundant bit in ECC processing performed in the SSDC 41 is included in a physical page, this is excluded from the size).

The free block table (FBT) 60 manages IDs (physical block addresses) of physical blocks (free block: FB) in the NAND memory, which can be newly allocated for writing when performing writing to the NAND memory 16 and to which the use is not allocated. Moreover, the free block table 60 manages the number of times erasing (erase count) for each physical block ID and SSDC 41 increments the erase count on a physical block when the block is erased.

The bad block table (BBT) 61 manages IDs of bad blocks (BB) as physical blocks (physical blocks) that cannot be used as a memory area because of a large number of errors or the like. The BBT 61 may manage the erase count for each physical block ID in the similar manner to the FBT 60.

The active block table (ABT) 62 manages active blocks (AB) that are physical blocks to which the use is allocated. Moreover, the active block table 62 manages the erase count for each physical block ID and SSDC 41 increments the erase count on a physical block when the block is erased.

The track table 63 manages a correspondence relationship between a track address and a physical block ID in which track data corresponding to this track address is stored.

The cluster table 64 manages a correspondence relationship between a cluster address, a physical block ID in which cluster data corresponding to this cluster address is stored, and an intra-physical-block page address in which cluster data corresponding to this cluster address is stored.

The statistical information 65 stores various parameters (X01 to X25) relating to the reliability of the SSD 2.

The statistical information 65 includes the total number of bad blocks (statistical information X01), the total erase count (statistical information X02), the average erase count (statistical information X03), the cumulative number of write error occurrences in the NAND memory (statistical information X04), the cumulative number of erase error occurrences in the NAND memory (statistical information X05), the total number of read logical sectors (statistical information X06), the total number of write logical sectors (statistical information X07), the uncorrectable ECC error count (statistical information X08), the total number of n bit to m bit ECC correction units (statistical information X09), the number of R error occurrences in SATA communication (statistical information X10), the number of error occurrences in SATA communication (statistical information X11), the number of error occurrences in the RAM 40 (statistical information X12), the total operating time of the SSD 2 (statistical information X13), the cumulative time during which the temperature exceeds the highest value of a recommended operating temperature (statistical information X14), the cumulative time during which the temperature becomes lower than the lowest value of a recommended operating temperature (statistical information X15), the maximum response time to a command (statistical information X16), the average response time to a command (statistical information X17), the maximum response time of the NAND memory (statistical information X18), the average response time of the NAND (statistical information X19), the current temperature (statistical information X20), the highest temperature (statistical information X21), the lowest temperature (statistical information X22), the statistical information increase rate (statistical information X23), the NAND garbage collection (GC) failure flag (statistical information X24), End of Life flag (statistical information X25), and the like.

The total number of bad blocks (statistical information X01) is explained. The statistical information X01 is incremented by one every time one physical block of the NAND memory 16 in the SSD 2 is added to a bad block (every time one physical block of the NAND memory 16 in the SSD 2 is marked as a bad block). It is desirable that the statistical information X01 is reset to zero when the SSD 2 is manufactured (before inspection process) or when the SSD 2 is inspected. It is more desirable that a block, in which an error occurs in the inspection process or which have a small margin between threshold distributions, is added to a back block beforehand. The statistical information X01 may be directly calculated from the BBT 61 without storing it in the statistical information 65. The larger the statistical information X01 is, the more the reliability is degraded.

The total erase count (statistical information X02) is explained. The statistical information X02 indicates the cumulative erase count on all the blocks of the NAND memory 16 in the SSD 2. The statistical information X02 is incremented by one every time one physical block of the NAND memory 16 in the SSD 2 is erased. It is desirable that the statistical information X02 is reset to zero when the SSD 2 is manufactured (before inspection process) or when the SSD 2 is inspected. The statistical information X02 may be directly calculated from the FBT 60, the BBT 61, and the ABT 62 without storing it in the statistical information 65. The larger the statistical information X02 is, the more the reliability is degraded.

The average erase count (statistical information X03) is explained. The statistical information X03 indicates the average erase count per block on all the blocks of the NAND memory 16 in the SSD 2. Part of the blocks, such as a block storing the management information, may be excluded from a target for counting the statistical information X03. It is desirable that the statistical information X03 is reset to zero when the SSD 2 is manufactured (before inspection process) or when the SSD 2 is inspected. The statistical information X03 may be directly calculated from the FBT 60, the BBT 61, and the ABT 62 without storing it in the statistical information 65. The larger the statistical information X03 is, the more that the reliability is degraded.

The cumulative number of write error occurrences in the NAND memory (total write error count, total program error count) (statistical information X04) is explained. The statistical information X04 is incremented by one every time a write error occurs in units of one writing in the NAND memory 16 in the SSD 2 (or may be incremented in units of blocks). It is desirable that the statistical information X04 is reset to zero when the SSD 2 is manufactured (before inspection process) or when the SSD 2 is inspected. The larger the statistical information X04 is, the more the reliability is degraded.

The cumulative number of erase error occurrences in the NAND memory (total erase count) (statistical information X05) is explained. It is desirable that the statistical information X05 is reset to zero when the SSD 2 is manufactured (before inspection process). The statistical information X05 is incremented by one every time an erase error occurs in one block in the NAND memory 16 in the SSD 2. A plurality of blocks may be collectively defined as a unit of erasing and the statistical information X05 may be incremented by one every time an erase error occurs in units of one erasing. The larger the statistical information X05 is, the more the reliability is degraded.

The total number of read logical sectors (statistical information X06) is explained. The statistical information X06 is the total number of logical sectors of data that the IFC 42 transmitted to the host apparatus 3 as read data. It is desirable that the statistical information X06 is reset to zero when the SSD 2 is manufactured (before inspection process) or when the SSD 2 is inspected. The larger the statistical information X06 is, the more the reliability is degraded.

The total number of write logical sectors (statistical information X07) is explained. The statistical information X07 is the total number of logical sectors of data that the IFC 42 received from the host apparatus 3 as write data. It is desirable that the statistical information X07 is reset to zero when the SSD 2 is manufactured (before inspection process) or when the SSD 2 is inspected. The larger the statistical information X07 is, the more the reliability is degraded.

The total number of times an error cannot be corrected by ECC (uncorrectable ECC error count) (statistical information X08) is explained. When an error bit cannot be corrected by ECC correction, the statistical information X08 is incremented by one per reading unit. An estimated value of the number of error bits that cannot be corrected may be added or the number of blocks in which an error cannot be corrected may be added. It is desirable that the statistical information X08 is reset to zero when the SSD 2 is manufactured (before inspection process). The larger the statistical information X08 is, the more the reliability is degraded.

The total number of n bit to m bit ECC correction units (n-m bit ECC error correction count) (statistical information X09) is explained. There is a relationship of $0 \le n \le m \le$ maximum number of correctable bits, where n and m are natural numbers. When ECC correction is performed on an ECC correction unit (for example, physical page), if all the error bits are successfully corrected and the number of corrected error bits is n or more and m or less, the "total number of n bit to m bit ECC correction units" is incremented by one per ECC correction unit. When a maximum of 64 bits can be corrected per correction unit by ECC correction, for example, eight parameters are prepared, that is, the "total number of 1 bit to 8 bits ECC correction units", the "total number of 9 bits to 16 bits ECC correction units", the "total number of 17 bits to 24 bits ECC correction units", the "total number of 25 bits to 32 bits ECC correction units", the "total number of 33 bits to 40 bits ECC correction units", the "total number of 41 bits to 48 bits ECC correction units", the "total number of 49 bits to 56 bits ECC correction units", and the "total number of 57 bits to 64 bits ECC correction units". When ECC correction is normally performed, any one of the eight parameters is incremented by one for each ECC correction of one ECC correction unit. It is desirable that the statistical information X09 is reset to zero when the SSD 2 is manufactured (before inspection process) or when the SSD 2 is inspected. The larger the statistical information X09 is, the more the reliability is degraded.

The number of R error occurrences in SATA communication (statistical information X10) is explained. The statistical information X10 is incremented by one every time one R error (Reception Error, RERR) in the SATA standard occurs. When any error, such as a CRC error, occurs in a frame transferred between the host and the SSD, this is counted as an R error. As the statistical information X10, any counter of Phy Event counters of the SATA standard may be employed. It is desirable that the statistical information X10 is reset to zero when the SSD 2 is manufactured (before inspection process) or when the SSD 2 is inspected. The larger the statistical information X10 is, the more the reliability is degraded.

The number of error occurrences in SATA communication (statistical information X11) is explained. The statistical information X11 is incremented by one every time a different abnormality (other than an R error) in SATA communication occurs. For example, when the communication speed actually negotiated between the SSD 2 and the host apparatus 3 is a slower speed communication standard, such as 3 Gbps, in spite of the fact that the SATA interface 19, the IFC 42, and the SSDC 41 are designed to meet the SATA 6 Gbps, this is regarded as an error in SATA communication and the statistical information X11 is incremented by one. It is desirable that the statistical information X11 is reset to zero when the SSD 2 is manufactured (before inspection process) or when the SSD 2 is inspected. The larger this value is, the more the reliability is degraded.

The number of error occurrences in the RAM 40 (statistical information X12) is explained. For example, when an ECC circuit or an error detection circuit is mounted on the RAM 40 or on the SSDC 41, if the SSDC 41 detects a signal indicating that an error bit cannot be corrected by ECC or a signal indicating that an error bit is detected from the RAM 40, the statistical information X12 is incremented by one. It is desirable that the statistical information X12 is reset to zero when the SSD 2 is manufactured (before inspection process) or when the SSD 2 is inspected. The larger this value is, the more the reliability is degraded.

The total operating time of the SSD 2 (power on hours) (statistical information X13) is explained. The SSDC 41 counts clocks or receives time information from a clock circuit inside while the power of the SSD 2 is on, thereby incrementing the elapsed time. Alternatively, the SSDC 41 may receive the time information in the host apparatus 3 periodically from the host apparatus 3 and the difference in the time information may be incremented. It is desirable that the statistical information X13 is reset to zero when the SSD 2 is manufactured (before inspection process) or when the SSD 2 is inspected. The larger this value is, the more the reliability is degraded.

The cumulative time during which the temperature exceeds the highest value of a recommended operating temperature (statistical information X14) is explained. For example, when a thermometer is provided in the SSD 2, such as on the substrate of the SSD 2, in the SSDC 41, and in the NAND memory 16, the SSDC 41 periodically receives temperature information from the thermometer. When the received temperature exceeds the recommended operating temperature (for example, 100° C.), the SSDC 41 increments the amount of time during which the SSD 2 is operating at the estimated operating temperature or higher based on the clocks or the time information obtained from the clock inside or the host apparatus 3. It is desirable that the statistical information X14 is reset to zero when the SSD 2 is manufactured (before inspection process) or when the SSD 2 is inspected. The larger this value is, the more the reliability is degraded.

The cumulative time during which the temperature becomes lower than the lowest value of a recommended operating temperature (statistical information X15) is explained. When a thermometer is provided in the SSD 2, the SSDC 41 periodically receives temperature information from the thermometer. When the received temperature becomes lower than the recommended operating temperature (for example, −40° C.), the SSDC 41 increments the amount of time during which the SSD 2 is operating at the estimated operating temperature or higher based on the clocks or the time information obtained from the clock inside or the host apparatus 3. It is desirable that the statistical information X15 is reset to zero when the SSD 2 is manufactured (before inspection process) or when the SSD 2 is inspected. The larger this value is, the more the reliability is degraded.

The maximum response time to a command (maximum latency of a command) (statistical information X16) is explained. The statistical information X16 is a maximum value of the time (or the number of clocks) required until responding to the host apparatus 3 (or until completing command execution) after a command is received from the host apparatus 3. When the response time exceeding X16 occurs, this response time is overwritten on X16. The statistical information X16 may be stored for each command. It is desirable that X16 is reset to zero when the SSD 2 is manufactured (before inspection process), when the SSD 2 is inspected or when the SSD 2 is shipped.

The average response time to a command (average latency of a command) (statistical information X17) is explained. The statistical information X17 is the average of the time (or the number of clocks) required until responding to the host apparatus 3 (or until completing command execution) after a command is received from the host apparatus 3. For example, the statistical information X17 is obtained by storing a certain number of response time lists in the RAM 40 and calculating the average of the response time lists. The statistical information X17 may be stored for each command. It is desirable that X17 is reset to zero when the SSD 2 is manufactured (before inspection process), when the SSD 2 is inspected or when the SSD 2 is shipped.

The maximum response time of the NAND memory (maximum latency of the NAND memory) (statistical information X18) is explained. The statistical information X18 is a maximum value of the time (or the number of clocks) required from when the SSDC 41 instructs the NAND memory 16 to when the SSDC 41 receives a response (a command execution completion notification is received). When the response time exceeding X18 occurs, this response time is overwritten on X18. The statistical information X18 may be stored for each command. It is desirable that X18 is reset to zero when the SSD 2 is manufactured (before inspection process), when the SSD 2 is inspected or when the SSD 2 is shipped.

The average response time of the NAND (average latency of the NAND memory) (statistical information X19) is explained. The statistical information X19 is the average of the time (or the number of clocks) required from when the SSDC 41 instructs the NAND memory 16 to when the SSDC 41 receives a response (or a command execution completion notification is received). For example, the statistical information X19 is obtained by storing a certain number of response time lists in the RAM 40 and calculating the average of the response time lists. The statistical information X19 may be stored for each command. It is desirable that X19 is reset to zero when the SSD 2 is manufactured (before inspection process), when the SSD 2 is inspected or when the SSD 2 is shipped.

The current temperature (statistical information X20) is explained. When a thermometer is provided in the SSD 2, the SSDC 41 periodically receives temperature information from the thermometer. The SSDC 41 stores the temperature received last from the thermometer in the statistical information X20 as the current temperature. If this value is extremely large (for example, 85° C. or higher), this value is determined to adversely affect the reliability of the SSD 2, and if this value is extremely small (for example, −10° C. or lower), this value is determined to adversely affect the reliability of the SSD 2.

The highest temperature (statistical information X21) is explained. The SSDC 41 stores a maximum value of the current temperature X20 in the statistical information X21 as the highest temperature. If this value is extremely large (for example, 85° C. or higher), this value adversely affects the reliability of the SSD 2. When the SSDC 41 receives the current temperature higher than X21 from the thermometer, the SSDC 41 rewrites X21 to the current temperature. It is desirable that X21 is reset to the temperature (for example, −40° C.) sufficiently small compared with the operating temperature of the SSD 2 when the SSD 2 is manufactured (before inspection process), when the SSD 2 is inspected or when the SSD 2 is shipped.

The lowest temperature (statistical information X22) is explained. The SSDC 41 stores a minimum value of the current temperature X20 in the statistical information X22 as the lowest temperature. If this value is extremely small (for example, −40° C. or lower), this value adversely affects the reliability of the SSD 2. When the SSDC 41 receives the current temperature lower than X22 from the thermometer, the SSDC 41 rewrites X22 to the current temperature. It is desirable that X22 is reset to the temperature (for example, 120° C.) sufficiently large compared with the operating temperature of the SSD 2 when the SSD 2 is manufactured (before inspection process), when the SSD 2 is inspected or when the SSD 2 is shipped.

The statistical information increase rate (statistical information X23) is explained. Non-up-to-date information (for example, a value before the fixed time, a value when the SSD 2 is turned on last time, and a value when the SSD 2 is turned off last time) on the statistical information X01 to X19 is separately stored. The statistical information X23 is, for example, defined by any of the following equations.

statistical information increase rate=(latest statistical information)−(old information)

statistical information increase rate=((latest statistical information)−(old information))/(elapsed time after obtaining old information)

statistical information increase rate=((latest statistical information)−(old information))/(the number of NAND accesses after obtaining old information)

It is desirable that the statistical information X23 is reset to zero when the SSD 2 is manufactured (before inspection process) or when the SSD 2 is inspected. The larger this value is, the more the reliability is degraded.

The NAND garbage collection (GC) failure flag (statistical information X24) is explained. When the statistical information X24 is 1, free blocks sufficient for an operation cannot be obtained even by NAND organizing (NAND garbage collection (NAND GC)).

It is desirable that the statistical information X24 is reset to zero when the SSD 2 is manufactured (before inspection process) or when the SSD 2 is inspected. The larger this value is, the more the reliability is degraded.

The End of Life flag (EOL flag, EOLF) (statistical information X25) is explained. The EOL flag is calculated from the above-described parameters. For example, the EOL flag may be calculated from X01 like this:

EOLF=0 (if raw value of X01 is smaller than or equal to R MAX of X01)

EOLF=1 (if raw value of X01 is greater than R MAX of X01)

As the statistical information 65, all of the above-described parameters may be stored, or part thereof or only any one of them may be stored.

As the statistical information 65, desirably, the latest information is stored in the area 40A in the RAM 40 and is periodically backed up to the area 40M in the NAND memory 16. On the other hand, the statistical information 65 may be stored only in any one of the RAM 40 and the NAND memory 16, or the statistical information may be transmitted to the host apparatus 3 and stored in the host apparatus 3 or a memory device connected to the host apparatus 3.

(LBA Forward Lookup Translation)

Next, a procedure (LBA forward lookup translation) for specifying a physical address from LBA in the SSD 2 will be explained with reference to FIG. 25. When LBA is specified, the SSDC 41 calculates a track address, a cluster address, and an intra-cluster address from the LBA.

The SSDC 41 first searches the track table 63 and specifies a physical block ID (a physical block address) corresponding to the calculated track address (Steps S100 and S101). The SSDC 41 determines whether the specified physical block ID is valid (Step S102). When the physical block ID is not null, i.e., a valid value (Step S102: Yes), the SSDC 41 searches whether this physical block ID is stored in the ABT 62 (Step S103). When the physical block ID is stored in the ABT 62 (Step S104: Yes), the location shifted from the head location of the physical block specified by this physical block ID by an intra-track address is the physical location in the NAND memory 16 corresponding to the specified LBA (Step S105). In such a case, the cluster table 64 is not needed for specifying the physical location in the NAND memory 16 corresponding to the LBA and such LBA is called "LBA managed in units of tracks". In Step S104, when the physical block ID is not stored in the ABT 62 (Step S104: No), the specified LBA does not have a physical address and such a state is called an "unwritten state" (Step S106).

In Step S102, when a physical address corresponding to the specified track address is null, i.e., an invalid value (Step S102: No), the SSDC 41 calculates a cluster address from the LBA and searches the cluster table 64 to obtain a physical block ID and a corresponding intra-physical-block page address corresponding to the calculated cluster address from the cluster table 64 (Step S107). The location shifted from the head location of the physical page specified by the physical block ID and the intra-physical-block page address by an intra-cluster address is the physical location in the NAND memory 16 corresponding to the specified LBA. In such a case, the physical location in the NAND memory 16 corresponding to the LBA cannot be specified only by the track table 63 and the cluster table 64 needs to be referred to, and such LBA is called "LBA managed in units of clusters" (Step S108).

(Read Operation)

Figure 26:
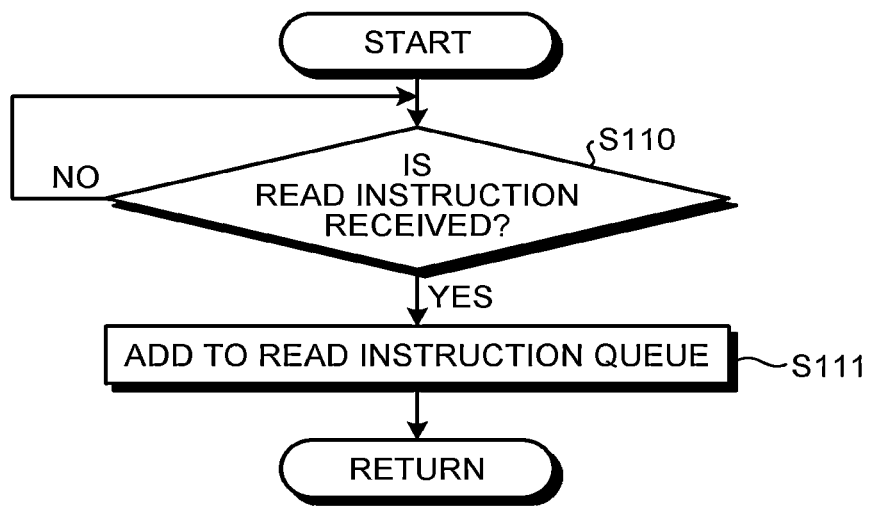
FIG. 26 is a flowchart illustrating a read operation example of the SSD.
Figure 27:
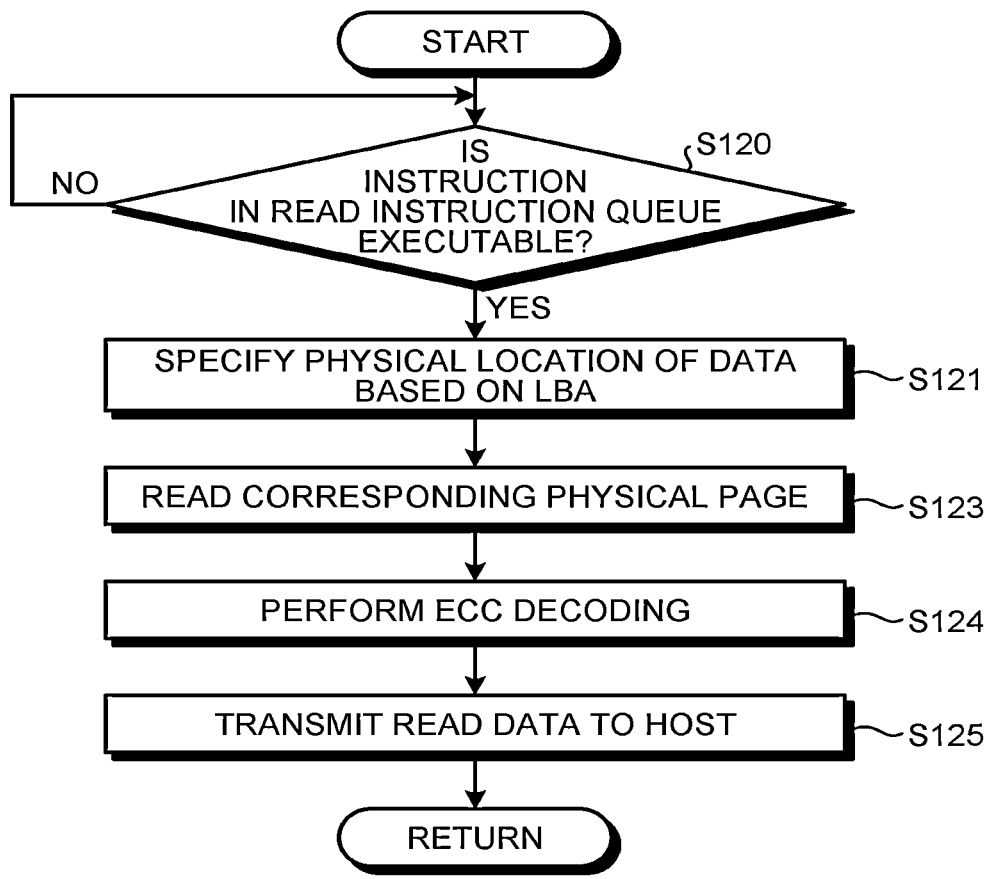
FIG. 27 is a flowchart illustrating a read operation example of the SSD.

Next, a read operation in the SSD 2 will be explained with reference to FIG. 26 and FIG. 27. The read operation explained in the present embodiment is a case with 60h READ FPDMA QUEUED described in INCITS ACS-2, however, other write commands, such as 25h READ DMA EXT, may be used and the difference in the type of read command does not affect the nature of the invention. When the SSD 2 receives a read instruction from the host apparatus 3 (Step S110), the SSDC 41 adds this read instruction to a read instruction queue in the RAM 40 (Step S111) and returns a notification indicating reception of the read instruction to the host apparatus 3.

On the other hand, when there is an instruction in the read instruction queue in the RAM 40, the SSDC 41 determines whether the read processing is executable (Step S120). When the SSDC 41 determines that the read processing is executable, the SSDC 41 specifies the current physical location of data from LBA received from the host apparatus 3 according to the LBA forward lookup translation procedure shown in FIG. 25 (Step S121). The SSDC 41 reads data from the physical page of the specified location (Step S123), performs ECC correction by using an ECC redundant bit in the read data (Step S124), transmits the corrected data to the host apparatus 3 via the IFC 42 (Step S125), and updates the statistical information 65. The SSDC 41 may write the data read from the NAND memory 16 in the RAM 40 before correcting it and the SSDC 41 may correct the data written in the RAM 40 and transmit it to the host apparatus 3, or the SSDC 41 may write corrected data in the RAM 40 after correcting it and the SSDC 41 may transmit the data written in the RAM 40 to the host apparatus 3.

In Step S124, the SSDC 41 attempts correct data by ECC, however, when the SSDC 41 cannot correct data, the SSDC 41 deletes a physical block including a page that cannot be decoded from the ABT 62 and registers it in the BBT 61, and increments the uncorrectable ECC error count (statistical information X08) in the statistical information 65. At this time, it is desirable to copy data in the block to a free block allocated from the FBT 60, register the physical block ID of the free block in the ABT 62, and rewrite the physical blocks in the track table 63 and the cluster table 64 from a copy-source physical block ID into a copy-destination physical block ID. The error block in which the uncorrectable ECC error happens may be added to the BBT 61.

(Write Operation)

Figure 28:
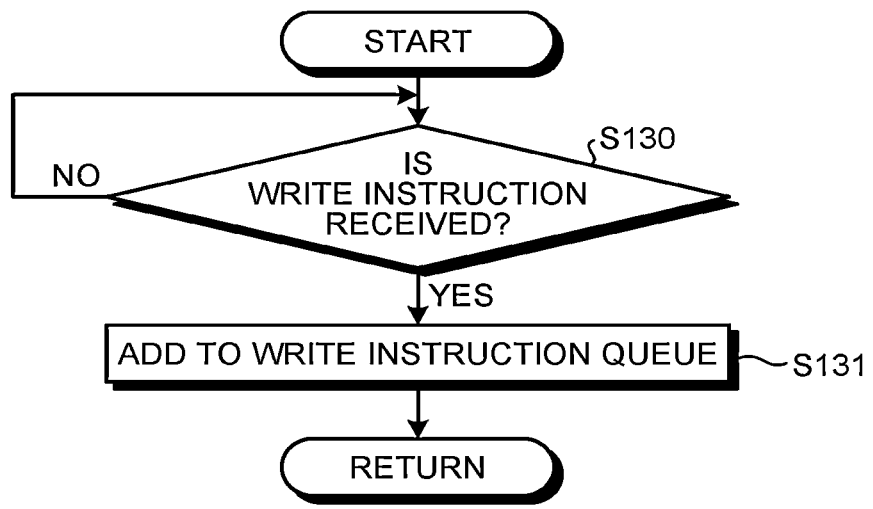
FIG. 28 is a flowchart illustrating a write operation example of the SSD.
Figure 29:
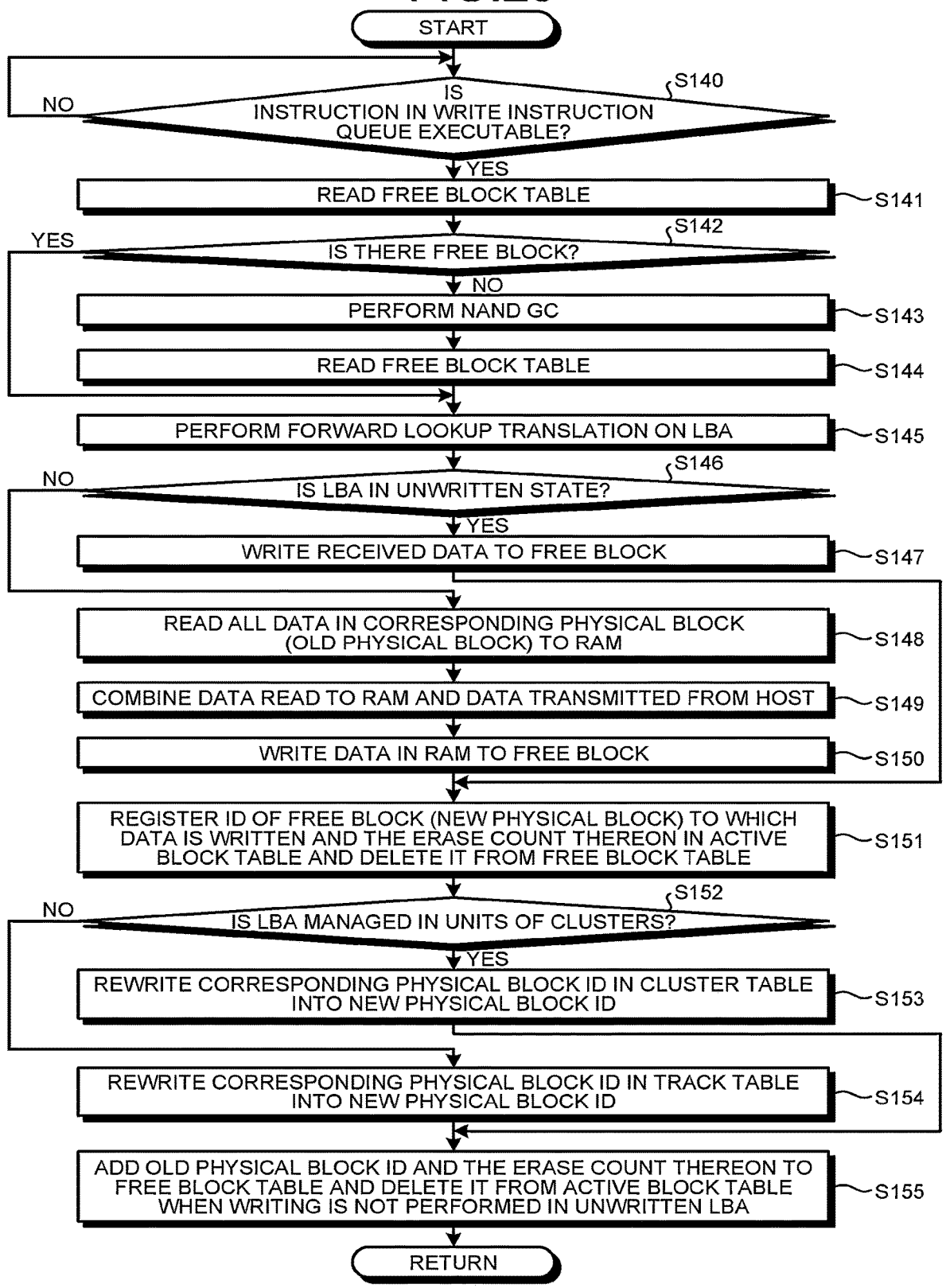
FIG. 29 is a flowchart illustrating a write operation example of the SSD.

Next, a write operation in the SSD 2 will be explained with reference to FIG. 28 and FIG. 29. The write operation explained in the present embodiment is a case with 61h WRITE FPDMA QUEUED described in INCITS ACS-2, however, other write commands, such as 35h WRITE DMA EXT, may be employed and the difference in the type of write command does not affect the nature of the invention. When the SSD 2 receives a write instruction from the host apparatus 3 (Step S130), the SSDC 41 adds this write instruction to a read instruction queue in the RAM 40 (Step S131) and returns a notification indicating reception of the write instruction to the host apparatus 3.

On the other hand, when there is an instruction in the write instruction queue in the RAM 40, the SSDC 41 determines whether write processing is executable (Step S140). When the SSDC 41 determines that write processing is executable, the SSDC 41 notifies the host apparatus 3 that writing can be performed, receives write data from the host apparatus 3, performs ECC encoding on the received data, and stores the encoded data in the cache memory 46 of the RAM 40. Data, which is not encoded, may be stored in the cache memory 46 and the data may be encoded when writing to the NAND memory 16.

Next, the SSDC 41 reads the FBT 60 (Step S141) and obtains a physical block ID of a free block from the FBT 60. When there is no free block (Step S142: No), the SSDC 41 performs NAND GC on the NAND memory 16, which will be described later (Step S143) and, after this NAND GC, reads the FBT 60 (Step S144) and obtains a physical block ID of a free block from the FBT 60. The SSDC 41 performs an erase operation on the free block whose physical block ID is obtained. When an erase error occurs, the physical block ID is added to the BBT 61 and is deleted from the FBT 60, and processing from S141 is restarted to obtain a free block again. Even with respect to a physical block in which an erase error occurs once, erasing can be normally performed without causing an erase error in some cases when an erase operation is performed again, therefore, in terms of preventing an unnecessary increase in the number of bad blocks, it is desirable to provide an item of the number of erase error occurrences for each block as the statistical information X05 in the FBT 60 or the ABT 62 for each block, increment this when an erase error of a block occurs, and register a block in the BBT 61 when the number of erase error occurrences for each block becomes equal to or larger than a predetermined value. In order to change only a physical block in which an erase error occurs continuously into a bad block, it is more desirable that the SSDC 41 provides an item of "the number of continuous erase error occurrences for each block" instead of "the number of erase error occurrences for each block", increments this when an erase error of a block occurs, resets this to zero when erasing can be performed with no error, and registers a block in the BBT 61 when "the number of continuous erase error occurrences for each block" becomes equal to or larger than a predetermined value.

Figure 25:
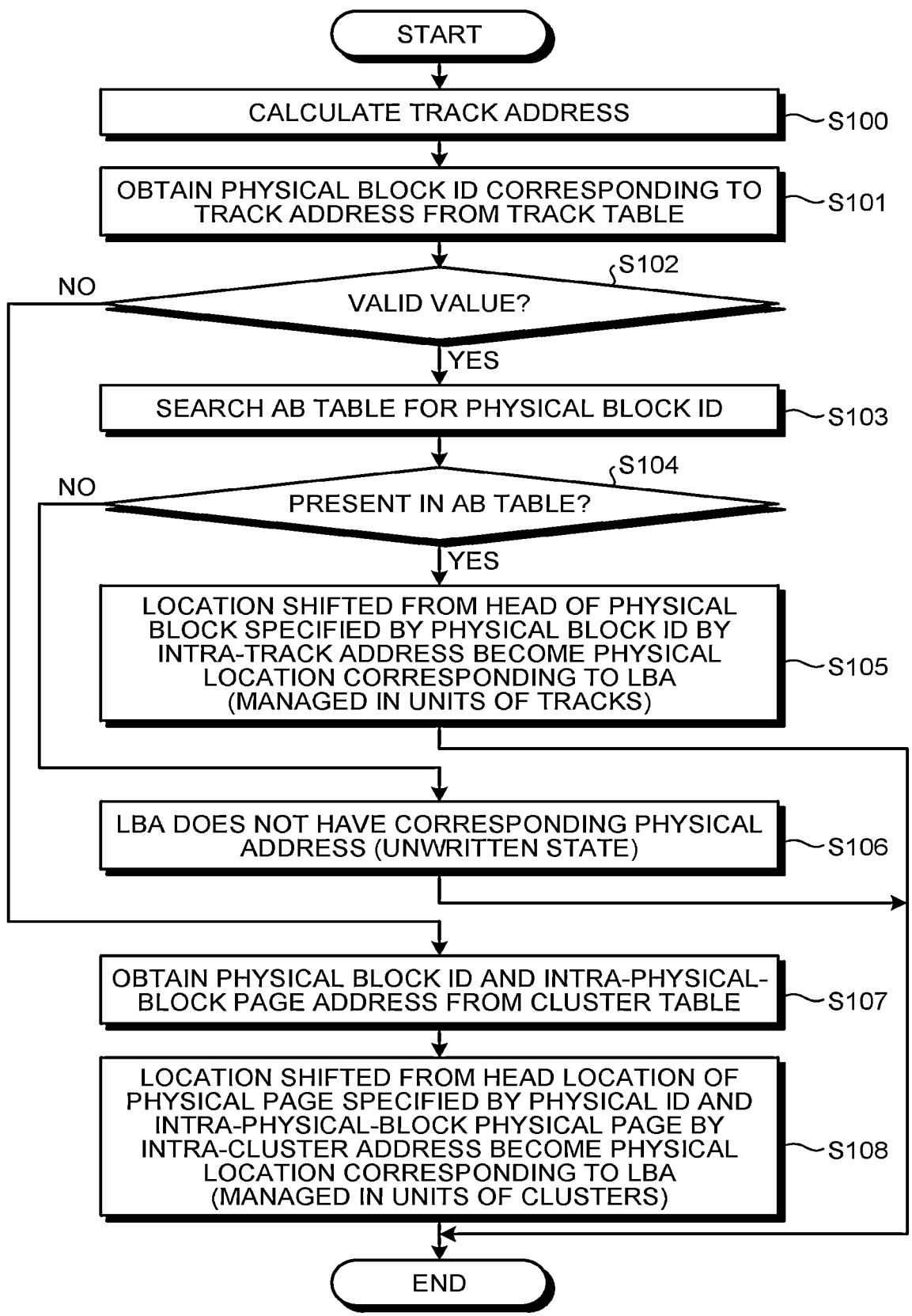
FIG. 25 is a flowchart illustrating a procedure of specifying a physical address from LBA.

Next, in order to search whether the LBA specified by the write instruction is in an unwritten state, the SSDC 41 determines whether valid data corresponding to the LAB has been stored in the NAND memory 16 according to the forward lookup translation procedure shown in FIG. 25 (Steps S145 and S146).

When the LBA is in an unwritten state (Step S146: Yes), the SSDC 41 writes the received data stored in the cache memory 46 to the free block (Step S147), registers the ID of the free block (new physical block) on which writing is performed and the erase count thereon in the ABT 62, and deletes the ID of the physical block on which writing is performed from the FBT 60 (Step S151). At this time, it is determined whether to manage the LBA in units of tracks or in units of clusters by dividing the LBA of the received data into sections (track sections) in units of tracks and determining whether the track sections are filled with data (Step S152). In other words, when the track sections are filled with data, the LBA is managed in units of tracks, and when not all of the track sections are filled with data, the LBA is managed in units of clusters. When the LBA is managed in units of clusters, the cluster table 64 is rewritten and the LBA is associated with a new physical block ID (Step S153), and, moreover, the track table 63 is rewritten and the LBA is associated with an invalid physical block ID (for example, null) (Step S153). When the LBA is managed in units of tracks, the track table is rewritten and the LBA is associated with a new physical block ID (Step S154).

On the other hand, in Step S146, when the LBA is not in an unwritten state, the SSDC 41 reads all the data in a corresponding physical block from the NAND memory 16 on the basis of the physical block ID obtained by the forward lookup translation, and writes the data in the RAM 40 (Step S148). Then, the SSDC 41 overwrites (combines) the data which is received from host and is stored in the cache memory 46 on the data, which is read from the NAND memory 16 and is written in the RAM 40, in the RAM 40 (Step S149) and writes the overwritten data in a free block (Step S150).

When a write error occurs in Step S150, the physical block ID is added to the BBT 61 and is deleted from the FBT 60, and processing from S141 is restarted to obtain a free block again. When SSDC 41 perform a write operation again on a physical block in which a write error occurs once, SSDC 41 may be able to write data successfully without causing a write error. Therefore, in terms of preventing an unnecessary increase in the number of bad blocks, it is desirable to provide an item of the number of write error occurrences for each block as the statistical information X04 in the FBT 60 or the ABT 62 for each block, increment this when a write error of a block occurs, and register a block in the BBT 61 when "the number of write error occurrences for each block" becomes equal to or larger than a predetermined value. In order to change only a physical block in which a write error occurs continuously into a bad block, it is more desirable that the SSDC 41 provides an item of "the number of continuous write error occurrences for each block" instead of "the number of write error occurrences for each block", increments this when a write error of a block occurs, resets this to zero when writing can be performed with no error, and registers a block in the BBT 61 when "the number of continuous write error occurrences for each block" becomes equal to or larger than a predetermined value.

The SSDC 41 registers the ID of the free block (new physical block) on which writing is performed and the erase count thereon in the ABT 62, and deletes the ID of the physical block on which writing is performed from the FBT 60 (Step S151). When the LBA is managed in units of clusters, the SSDC 41 rewrites an old physical block ID in the cluster table 64 into a new physical block ID (Steps S152 and S153). When the LBA is managed in units of tracks, the SSDC 41 rewrites an old physical block ID in the track table into a new physical block ID (Steps S152 and S154). Furthermore, the SSDC 41 adds the old physical block ID and the erase count thereon to the FBT 60 and deletes the old physical block ID and the erase count thereon from the ABT 62 (Step S155). The SSDC 41 reflects the content of the above write processing in the statistical information 65.

(NAND GC)

The capacitance of all the LBAs in the SSD 2 is designed to be smaller than the total capacitance of the NAND memory 16 of the SSD 2, so that a free block does not become insufficient so long as a write operation continues to be performed in units of tracks. On the other hand, when writing is made to unwritten LBA in units of clusters many times, a physical block whose capacitance is larger than a cluster is allocated to one write operation in units of clusters, so that physical blocks whose capacitance is larger than the data to be written are needed in the NAND memory 16 and therefore the number of free blocks may become insufficient. When the number of free blocks becomes insufficient, a free block can be newly obtained by NAND GC as described below.

The NAND GC (garbage collection of data in NAND flash memory) in the SSD 2 will be explained with reference to FIG. 30. Not all clusters stored in a physical block are always valid clusters and an invalid cluster other than a valid cluster is not associated with LBA. A valid cluster is a cluster in which the latest data is written and an invalid cluster is a cluster that is not to be referred as a result that data having the same LBA is written in a different location. A physical block has a free space in data for the amount of invalid clusters and a free block can be obtained by performing the NAND GC of collecting data in valid clusters and rewriting it in a different block.

First, a selected physical block ID=i is set to 0 and a free space cumulative amount S is set to 0 (Step S160). The SSDC 41 determines whether a physical block whose ID is i=0 is entered in the track table 63 (Step S161). When the physical block is entered in the track table, i is incremented by one (Step S162), and a similar determination is performed on a physical block having the ID of the next number (Step S161). In other words, when a physical block ID is included in the track table 63, data in this physical block is managed in units of tracks, so that the physical block is not included in a NAND GC target.

When a physical block whose ID is i is not managed in units of tracks (Step S161: No), the SSDC 41 next reads the cluster table 64 and obtains all of the addresses of the valid clusters included in the physical block whose ID is i (Step S163). Then, the SSDC 41 obtains the size z of the total capacitance of the obtained valid clusters (Step S164), and in the case where v<physical block size (Step S165), the SSDC 41 adds the ID of the present physical block to a NAND GC target block list (Step S166). Furthermore, the SSDC 41 adds the obtained cluster capacitance v of the present physical block to an obtained cluster cumulative amount S and updates the obtained cluster cumulative amount S (Step S167).

When v<physical block size is not satisfied in step S165 (S165:NO) or when the obtained cluster cumulative amount S has not reached a physical block size in Step S168 (S168:NO), the SSDC 41 increments i by one (Step S162) and performs the procedure in Steps S161 to S167 on a physical block having the ID of the next number in the similar manner to the above. Then, in Step S168, the SSDC 41 repeats the procedure in Steps S161 to S167 until the obtained cluster cumulative amount S reaches a physical block size.

When the obtained cluster cumulative amount S reaches a physical block size in Step S168 (S168:YES), the SSDC 41 reads data of all the valid clusters of all the physical blocks on the NAND GC target block list from the NAND memory 16 and writes it in the RAM 40 (Step S169). Moreover, the SSDC 41 performs erase processing on all the physical blocks on the NAND GC target block list (Step S170), and deletes all the physical blocks on which erase processing is performed from the ABT 62 and adds them to the FBT 60 (Step S171). At this time, the erase count is incremented. A target for an erase operation performed in Step S170 may be limited to a block that is a target for writing data in Step S172, which is desirable in terms of suppressing the erase count on a block.

When an erase error occurs, the physical block ID is added to the BBT 61 and is deleted from the FBT 60. When SSDC 41 erase a physical block again in which an erase error occurs once, SSDC 41 may be able to erase successfully without causing an erase error. Therefore, in terms of preventing an unnecessary increase in the number of bad blocks, it is desirable to provide an item of "the number of erase error occurrences for each block" in the FBT 60 or the ABT 62 for each block, increment this when an erase error of a block occurs, and register a block in the BBT 61 when the number of erase error occurrences for each block becomes equal to or larger than a predetermined value. In order to change only a physical block in which an erase error occurs continuously into a bad block, it is more desirable that the SSDC 41 provides an item of "the number of continuous erase error occurrences for each block" instead of "the number of erase error occurrences for each block", increments this when an erase error of a block occurs, resets this to zero when erasing can be performed with no error, and registers a block in the BBT 61 when "the number of continuous erase error occurrences for each block" becomes equal to or larger than a predetermined value.

Then, the SSDC 41 obtains a new free block from the FBT 60, writes data written in the RAM 40 to the obtained free block (Step S172), adds a physical block ID of the free block to which the data is written and the erase count on the block to the ABT 62, and deletes the block ID of the block to which the data is written from the FBT 60 (Step S173). Furthermore, the SSDC 41 updates cluster addresses, physical block IDs, and intra-physical-block page addresses in the cluster table 64 to correspond to the NAND GC of this time (Step S174). The SSDC 41 update the statistical information 65 based on the processing content of the above NAND GC.

When a write error occurs in Step S172, the physical block ID is added to the BBT 61 and is deleted from the FBT 60 and a free block is obtained again. When SSDC 41 write data into a physical block again in which a write error occurs once, SSDC 41 may be able to write the data successfully without causing a write error. Therefore, in terms of preventing an unnecessary increase in the number of bad blocks, it is desirable to provide an item of "the number of write error occurrences for each block" in the FBT 60 or the ABT 62 for each block, increment this when a write error of a block occurs, and register a block in the BBT 61 when "the number of write error occurrences for each block" becomes equal to or larger than a predetermined value. In order to change only a physical block in which a write error occurs continuously into a bad block, it is more desirable that the SSDC 41 provides an item of "the number of continuous write error occurrences for each block" instead of "the number of write error occurrences for each block", increments this when a write error of a block occurs, resets this to zero when writing can be performed with no error, and registers a block in the BBT 61 when "the number of continuous write error occurrences for each block" becomes equal to or larger than a predetermined value.

Figure 30:
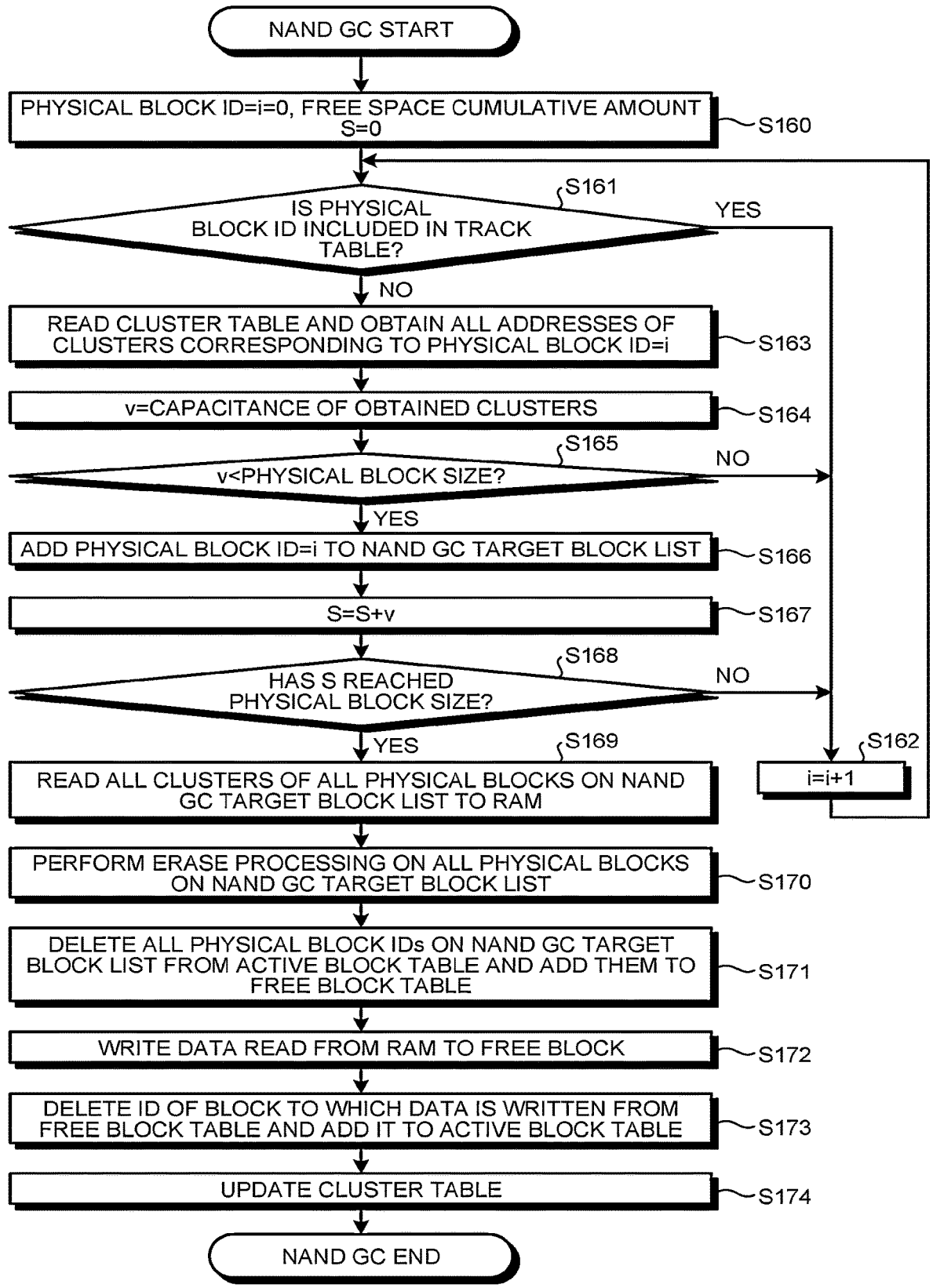
FIG. 30 is a flowchart illustrating an operation example of organizing a NAND memory of the SSD (NAND garbage collection).

In the procedure in FIG. 30, the NAND GC is performed by prioritizing putting data in a free block is performed, however, it is also possible to perform the NAND GC by prioritizing obtaining a free block by obtaining v by subtracting the capacitance of obtained clusters from a physical block size in Step S164, then determining whether v>0 is satisfied in Step S165, proceeding to Step S168 when v>0 is satisfied, and proceeding to Step S162 when v>0 is not satisfied.

Figure 31:
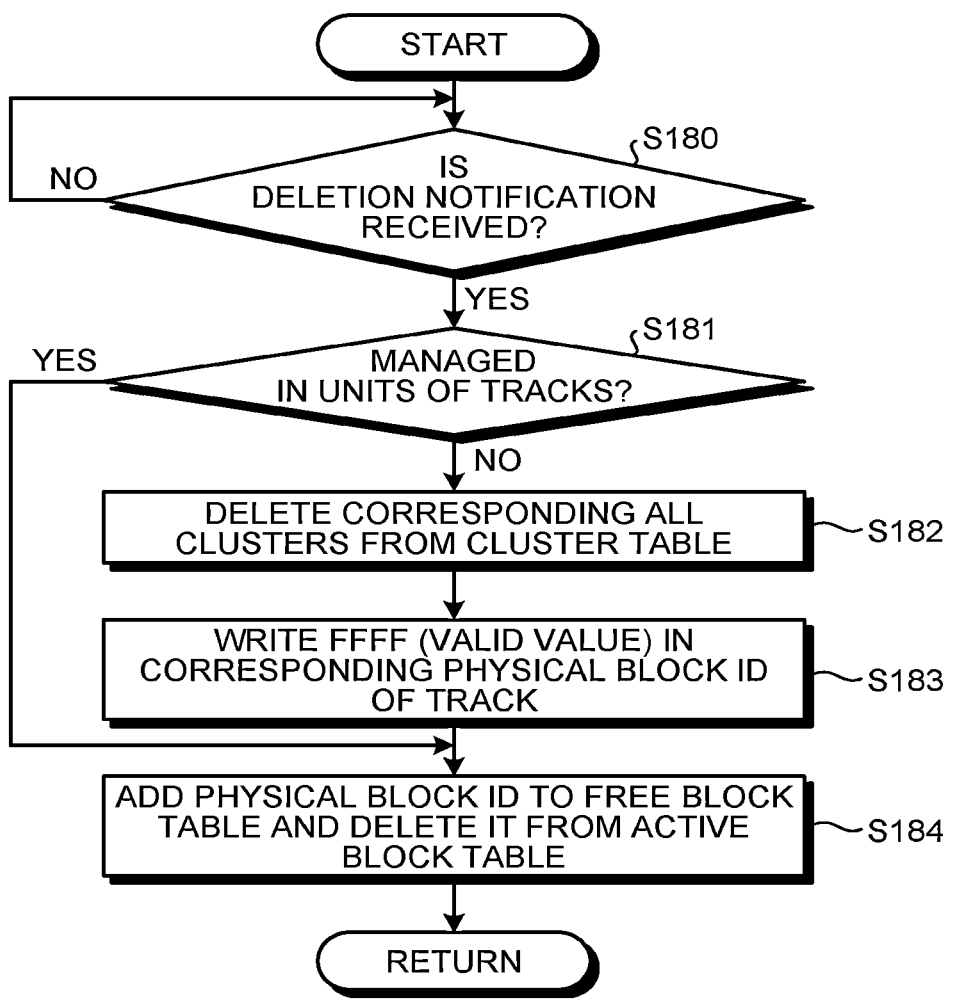
FIG. 31 is a flowchart illustrating an operation example of the SSD when a deletion notification is received.

Next, a deletion notification in the SSD 2 will be explained with reference to FIG. 31. The deletion notification is an instruction transmitted to an external memory device from the host apparatus 3 when data is deleted by the OS 100 in the host apparatus 3. Examples of the deletion notification, for example, include Data Set Management Command (known as trim (TRIM) command) described in INCITS ATA/ATAPI Command Set-2 (ACS-2). In this method, when data is deleted in the OS 100, a logical address area (LBA area) in which the deleted data is present is notified to an external memory device as an LBA Range Entry composed of a combination of LBA and the number of logical sectors, so that the area can be used as a free space even in the external memory device. The deletion notification enables the SSD 2 to obtain a new free block. The function of the TRIM command may be realized by other commands, such as SCT Command Transport described in INCITS ACS-2 and a vendor unique command, in addition to the Data Set Management Command. When the OS 100 is the emergency OS, in terms of reducing writing to the NAND memory, it is desirable to prohibit issuing of the deletion notification in the case of the emergency OS. On the other hand, the deletion notification may be permitted even in the case of the emergency OS because rewriting of at most about only the management information 45 is written to the NAND memory 16 and no user data (or little user data) is written to the NAND memory 16 in the deletion notification processing.

When the SSD 2 receives the deletion notification from the host apparatus 3 (Step S180), the SSDC 41 performs the LBA forward lookup translation on LBA included in the deletion notification according to the procedure shown in FIG. 25. When the LBA included in the deletion notification is managed in units of tracks (Step S181: Yes), the SSDC 41 adds a physical block ID to the FBT 60 and deletes it from the ABT 62 (Step S184). On the other hand, when the LBA included in the deletion notification is managed in units of clusters (Step S181: No), the SSDC 41 deletes all the clusters corresponding to the physical block from the cluster table 64 (Step S182), writes an appropriate valid value (for example, FFFF) in the physical block ID corresponding to the track corresponding to the LBA in the track table 63 (Step S183), and adds the physical block ID to the FBT 60 and deletes it from the ABT 62 (Step S184). In the SSD 2, a free block can be obtained also by the deletion notification processing in addition to the NAND GC.

Sufficient number of free blocks for writing operation can normally be obtained by such NAND GC. When sufficient number of free blocks for writing operation cannot be obtained even by the NAND GC, it is desirable to set the NAND GC failure flag (statistical information X24) in the statistical information 65 to 1 so as to be able to notify the host apparatus 3 that the SSD 2 could not obtain free blocks through acquisition of the statistical information 65 by the host apparatus 3. In terms of providing a time delay before the time when the SSD 2 actually stops operating (before the end of life) after the NAND GC failure flag is set to 1, it is desirable to control to set the NAND GC failure flag to 1 when the following condition is satisfied.

(number of free blocks obtained by performing NAND GC)<(number of free blocks needed for writing)+(margin)

The above NAND GC may be performed not only when a write request is received from the host apparatus 3 but also, for example, when a predetermined time has passed since an instruction is last received from the host or when a command for transitioning to a standby, idle, or sleep state is received from the host apparatus 3, or may be performed, for example, when the SSD 2 receives an instruction for starting the NAND GC from the host apparatus 3 via SCT Command Transport described in ACS-2 or other vendor commands. When the OS 100 is the emergency OS, in terms of reducing data written to the NAND memory, it is desirable not to perform the NAND GC even when a predetermined time has passed since an instruction is last received from the host apparatus 3 and even when a command for transitioning to a standby, idle, or sleep state is received from the host apparatus 3. Furthermore, when the OS 100 is the emergency OS, in terms of reducing data written to the NAND memory 16, it is desirable to prohibit issuing of an instruction for starting the NAND GC in the case of the emergency OS.

(Error Processing)

Figure 32:
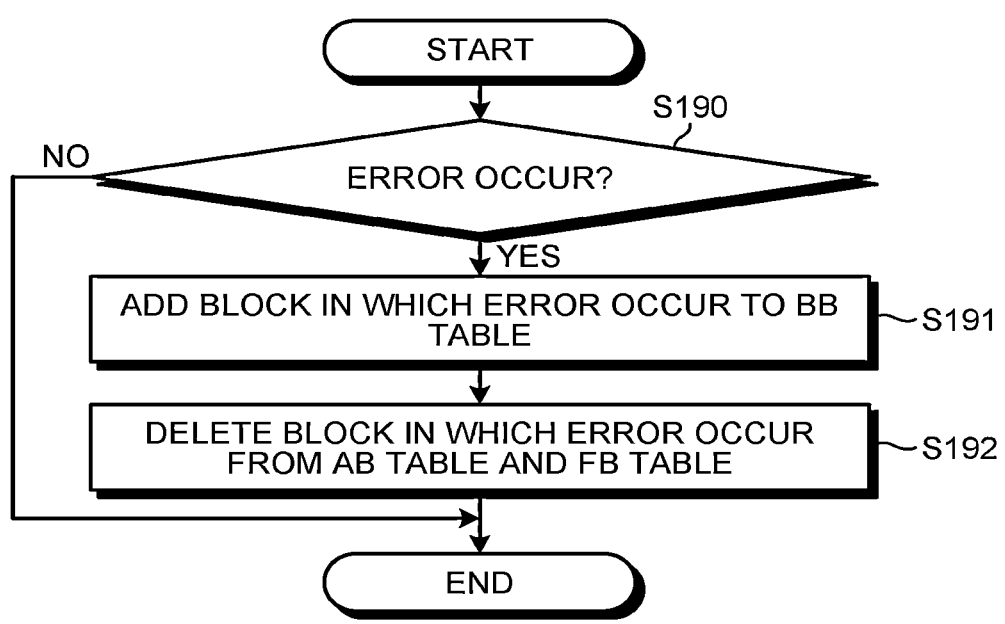
FIG. 32 is a flowchart illustrating an operation example of the SSD when an error occurs.

Next, the error processing relating to the NAND memory 16 in the SSD 2 will be explained with reference to FIG. 32. Various processing, such as processing for a write request from the host apparatus 3 and the NAND GC processing, is normally performed as above, however, there are a case where a write error occurs in a write operation (program operation) to the NAND memory 16, a case where an erase error occurs in an erase operation (erase operation) to the NAND memory 16, a case where an uncorrectable ECC error (failure of error correction processing) occurs in a read operation to the NAND memory 16, and the like, and exception processing for these cases is needed.

When any of the above errors occurs (Step S190), the SSDC 41 adds a physical block in which an error occurs to the BBT 61 (Step S191) and deletes the physical block in which an error occurs from the ABT 62 and the FBT 60 (Step S192) to prevent access to the physical block in which an error occurs thereafter. At this time, data in the physical block in which an error occurs may be copied to another physical block. The SSDC 41 updates the statistical information 65 based on the above error processing.

In the above, an example of the error processing relating to the read processing, write processing, and NAND processing is illustrated, however, the error processing is not limited to these examples, and the error processing can be applied to all the read processing, write processing, and error processing to the NAND memory 16.

(Control Tool)

As the SSD 2 is used, the reliability of each block of the NAND memory 16 is degraded and therefore the number of bad blocks increases and the sum of the number of free blocks and the number of active blocks decreases. As the SSD 2 is further used (as the SSD 2 is worn out), the number of free blocks sufficient to perform the write processing cannot be secured even if the NAND GC is performed, which indicates the end of life (EOL, end of lifespan) of the SSD 2. In the following, processing of the control tool 200 when the SSD 2 has reached the end of its lifespan is illustrated.

When the control tool 200 is activated, the control tool 200 resides in the main memory 6 and monitors the statistical information 65 in the SSD 2. In order to constantly monitor the statistical information 65 in the SSD 2, it is desirable that the control tool 200 is read from the area 16B (or the area 20B) when the normal OS 100A is read to the area 6A from the area 16D (or 20D) or immediately thereafter, for example, by registering a boot program of the control tool 200 in a startup program of the normal OS 100A. For example, when the OS 100 is Windows (registered trademark), the control tool 200 is set as a resident program at the time of booting, for example, by registering the control tool 200 in a startup menu of Windows (registered trademark), registering the control tool 200 as a service, or registering the control tool 200 in a registry of Windows (registered trademark), thereby enabling automatic activation of the control tool 200. The control tool 200 may also be read from the area 11B when the BIOS 11D is read to the area 6A from the BIOS-ROM 11.

Figure 33:
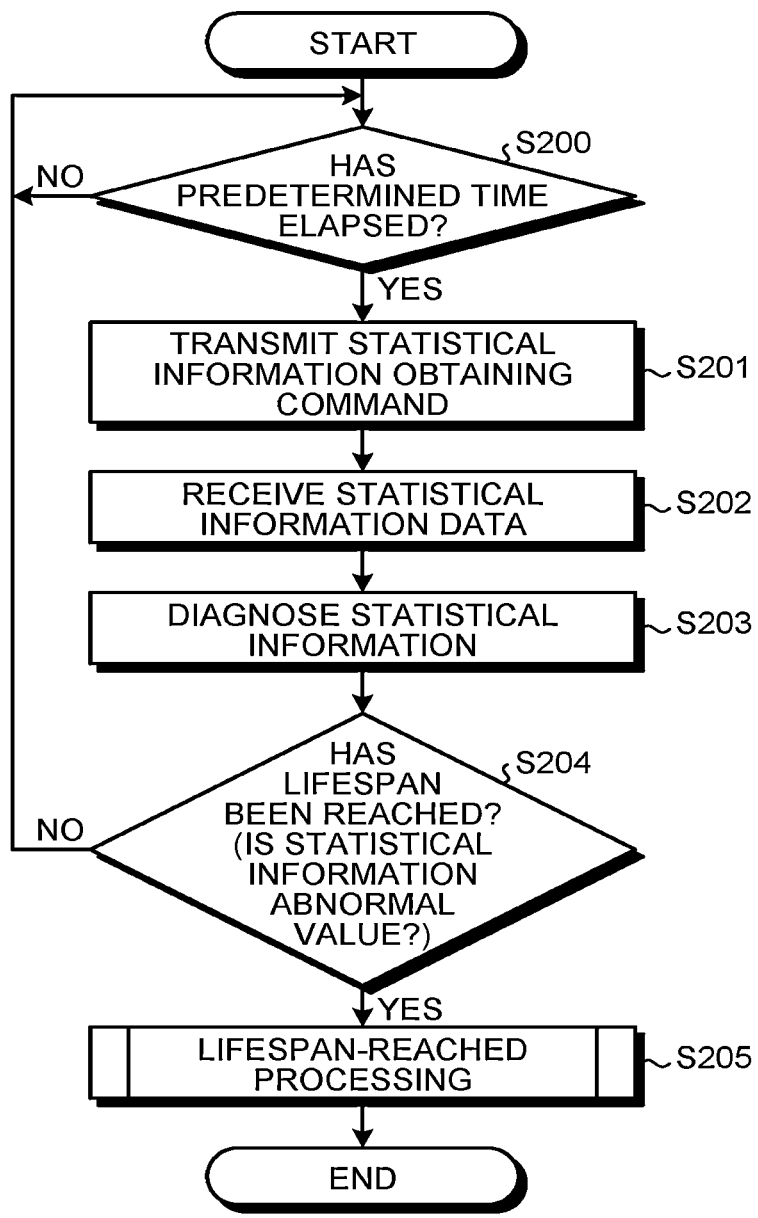
FIG. 33 is a flowchart illustrating an operation procedure of the control tool.

For example, as shown in FIG. 33, the control tool 200 obtains the statistical information 65 from the SSD 2 at regular time intervals (for example, every 1 minute). As a method of obtaining the statistical information, for example, it is possible to use SMART READ DATA (B0h(D0h)) that is a command of S.M.A.R.T (Self-Monitoring Analysis and Reporting Technology), which is a memory self-diagnosis function, described in INCITS ACS-2, IDENTIFY DEVICE (ECh) described in INCITS ACS-2, SCT Command Transport described in ACS-2, or a vendor unique command.

FIG. 34 illustrates an example table relating of the statistical information 65 (statistical information X01 to X19, X23, and X24) managed in the SSD 2. As shown in FIG. 34, when SMART READ DATA (B0h(D0h)) is used to read the statistical information 65, an attribute ID (attribute ID) is allocated to each of the components (X01 to X19, X23, X24, and the like) of the statistical information 65. The attribute ID may be allocated to only part of these components. SMAB is a predetermined value as a normalized best value for each component of the statistical information 65. SMAL is a lower limit of normalized value to guarantee the reliability of SSD and SSDC 41 calculates the SMAL as SMAL=SMAB*AMALR (0≤AMALR<1) (SMAL is an integer and is converted to an integer from a decimal fraction by any one of rounding off, rounding up of the numbers after the decimal point, or rounding down of the numbers after the decimal point). The SSDC 41 calculates an attribute value ("Value" in FIG. 34) of smart information as a normalized statistical value by the following equations and transmits it to the control tool 200. An attribute Threshold is "Threshold" in FIG. 34 and a raw value is "Raw Data" in FIG. 34.

attribute value=SMAL+SMAB×(1−AMALR)×(R MAX−raw value)/R MAX attribute Threshold=30 (fixed value)

R MAX=upper limit of raw value of statistical information with which reliability can be guaranteed
raw value=raw value of statistical information The normalized best value SMAB may be any natural number and, for example, SMAB=100 may be predetermined. AMALR may be any number satisfying 0≤AMALR<1 and, for example, AMALR=0.3 may be predetermined. Moreover, different RMAX, AMALR, and SMAB may be used for each of X01 to X19, X23, and X24. When SMAB and AMALR are predetermined as SMAB=100 and AMALR=0.3, the attribute value of each statistical information of SSD 2 immediately after shipping is 100 as the best value and the attribute value gradually decreases as the reliability is degraded. The attribute value reaches a value of 30 or lower when the reliability of SSD 2 cannot be guaranteed any more (when a raw value of the statistical information becomes equal to or larger than RMAX). B0h/DAh SMART RETURN STATUS described in ACS-2 may be used to notify to host 3 that the raw value of statistical information 65 exceeds its threshold, and the control tool 200 is able to determine whether the raw value exceeds its threshold from Output of the command.

Figure 35:
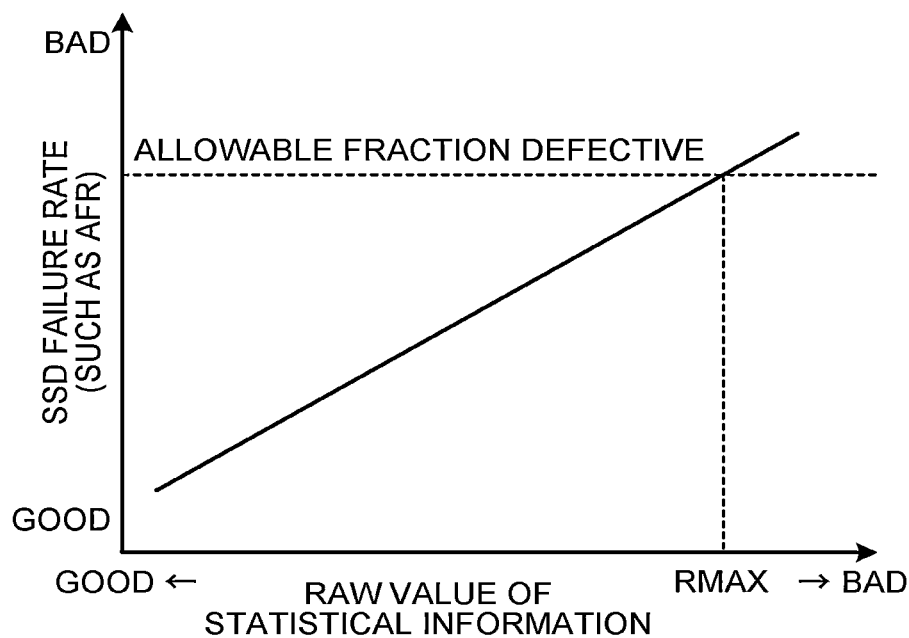
FIG. 35 is a graph illustrating a relationship between a raw value of the statistical information and a FR of the SSD.

RMAX is preferably predetermined to be equal to a raw value of the statistical information when the failure rate (FR) of SSD 2 exceeds an maximum FR after analyzing the correlative relationship between a raw value of the statistical information and the FR of the SSD 2. For example, as shown in FIG. 35, a vendor company of the SSD 2 can predetermine RMAX to be equal to a raw value of the statistical information when an annual failure rate (AFR) exceeds an maximum AFR which is described the specification document of the SSD 2 in the development stage of the SSD 2. The AFR can be calculated by using Weibull statistics method. For example, a vendor company of the SSD 2 may perform a wear-out test (or a burn-in test) in which erase operation, write operation, read operation and verify operation of the read data are repeatedly done at a high temperature to check data reliability of NAND memory 16 for a certain period of time onto a group of a large number of (for example, 100) SSDs 2 for the test and keep monitoring the statistical information at the same time in the development stage of the SSD 2, and predetermine the RMAX to be equal to a raw value of the statistical information at the time the AFR reaches a constant rate as RMAX. For example, a vendor company of the SSD 2 may perform a data retention test in which the worn-out SSD 2 is left unattached by the host 3 in a high-temperature condition for a certain period of time or longer, thereafter, the temperature of the SSD 2 is lowered, a read operation is performed on the SSD 2 by host 3, and, when read data cannot be corrected by ECC (or when data that cannot be corrected by ECC is a fixed number or larger), this is defined as a defect (failure) of the SSD 2 and a value obtained by dividing the number of defects by the number of the SSDs 2 on which an equivalent test is performed is employed as the FR. Then the vendor company may predetermine the RMAX to be equal to a raw value of the statistical information when the AFR significantly exceeds the allowable AFR. RMAX' may be predetermined by adding some margin to RMAX as defined below and may be used instead of RMAX.

$$R\text{ MAX}'=R\text{ MAX-margin}$$

"Worst" in FIG. 34 may be used as indexes for the control tool 200 to detect (diagnose) the EOL of the SSD 2. "Worst" is calculated by the SSDC 41 as the worst value of the attribute value. For example, in the case of X01 to X09 and X23, Worst is a minimum value of the attribute value, for example, after shipping (or after manufacturing) the SSD 2. A minimum value of the attribute value within a past predetermined period of time (within a sliding window) may be used as Worst Value. A minimum value of the attribute value within a past predetermined operation count (or within a certain data amount transaction) of communication or processing may be used as worst value.

"Raw Data" (Raw Value) in FIG. 34 may be used as indexes for the control tool 200 to detect (diagnose) the EOL of the SSD 2. A raw value of the statistical information (for example, X01 to X09, X23, X24 and X25) is transmitted to the control tool 200 from the SSD 2 as Raw Data. In this case, the control tool 200 already stores RMAX in the control tool 200 or obtains RMAX by separately reading it from the SSD 2 or reading it from other memory devices, compares RMAX with Raw Data, and, when the relationship becomes Raw Data>RMAX or Raw Data RMAX, determines that the SSD 2 has reached the end of its lifespan (that the SSD 2 has reached its EOL). For example, in the case of the NAND GC failure flag (statistical information X24), if this is 1, the control tool 200 determines that the SSD 2 has reached the its EOL. For example, in the case of the total number of bad blocks (statistical information X01), if this number exceeds a predetermined value, the control tool 200 determines that the SSD 2 has reached its EOL. A raw value of the statistical information does not necessarily need to be output as Raw Data and, for example, the SSDC 41 may transmit a value obtained by performing four arithmetic operations on a raw value of the statistical information to the control tool 200 as Raw Data and perform determination by comparing the value with a value obtained by performing four arithmetic operations on RMAX in the same manner. Alternatively, the SSDC 41 may transmit data obtained by encrypting (or encoding) a raw value of the statistical information to the control tool 200 as Raw Data, decrypt (or decode) this data, and perform determination by comparing the data after being decrypted with RMAX.

In the manner as described above, the control tool 200 determines whether the SSD 2 has reached its EOL (whether the SSD 2 is in an abnormal state) and, when determining that the SSD 2 has reached its EOL (or when determining that the SSD 2 is in an abnormal state), moves to lifespan-reached processing (EOL processing), which will be described later (Step S205). The statistical information 65 can take various forms other than the statistical information X01 to 19, X23, X24, and X25 and the present invention can be applied also to them. Moreover, while the relationship between X01 to 19, X23, X24, and X25 and the FR has a positive correlation, the present invention can also be applied also to the statistical information having a negative correlation with the FR. For example, the lowest temperature that the SSD 2 experiences after shipping may be used. In this case, a vendor company of the SSD 2 can predetermine the lower limit RMIN with which the reliability can be guaranteed instead of RMAX and the host 2 determine that the SSD 2 has reached its abnormal state (or its EOL) when the statistical information becomes lower than RMIN.

In FIG. 33, when S.M.A.R.T is used, the control tool 200 preferably obtains the statistical information at regular time intervals (for example, every 1 minute) (Step S200: Yes). The control tool 200 issues B0h/D0h SMART READ DATA described in ACS-2 that is a statistical information obtaining command (Step S201), receives data including the statistical information from the SSD 2 (Step S202), and diagnoses this received data (Step S203). A diagnostic method is as described above. In Step S204, when the control tool 200 detects (diagnoses) that the SSD 2 has reached its EOL (Step S204: Yes), the control tool moves to the lifespan-reached processing (EOL processing) (Step S205). Even if the SSD 2 has not reached its EOL, the control tool 200 may move to the processing in Step S205, for example, when the statistical information exceeds a predetermined RMAX or the statistical information indicates an abnormal value that cannot be taken in a normal operation.

Figure 36:
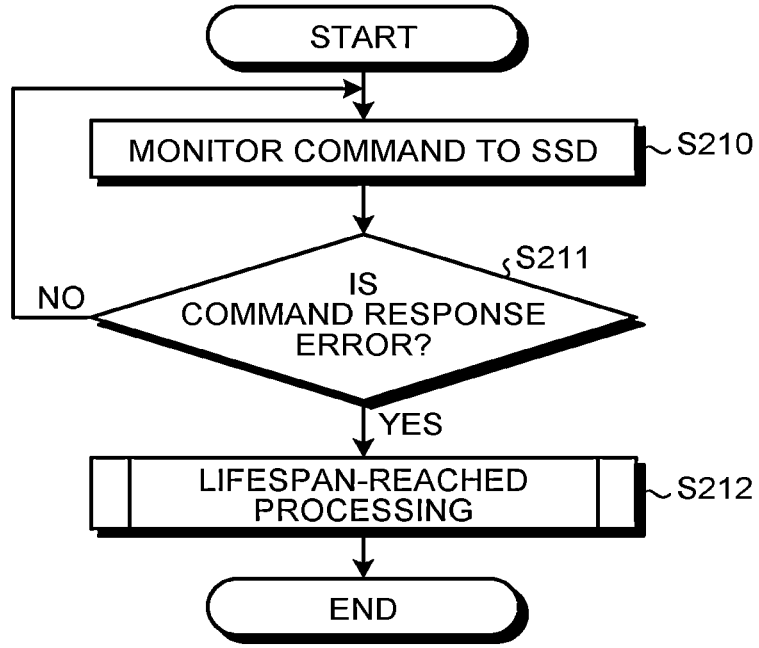
FIG. 36 is a flowchart illustrating another operation example of the control tool.

It is also possible to move to the lifespan-reached processing by using information other than the statistical information 65. For example, as shown in FIG. 36, the control tool 200 may obtain (monitor) response information (see FIG. 16), which the host 3 receives from the SSD 2, from the OS 100 (Step S210). When the host 3 receives an error response (an error message), the control tool 200 determines that the SSD 2 falls into an abnormal state and moves to the lifespan-reached processing (Step S212). The control tool 200 may monitor responses of any command. On the other hand, for example, The control tool 200 preferably monitors only a response of write commands which is transferred from the host 3 to the SSD 2 and whose response is transferred from the SSD 2 to the host 3, such as 61h WRITE FPDMA QUEUED and 35h WRITE DMA EXT described in ACS-2, in terms of reducing a load to the CPU 4. Especially, when the SSD 2 is an SSD using the invention described in United States Patent Application Publication No. 2009-0222617 presented as Patent Document 1, when the SSD 2 has reached the end of its lifespan, a response of a write command is returned as an error, therefore, it is possible to determine that the SSD 2 has reached the end of its lifespan without obtaining the statistical information. Needless to say, the present invention can of course be applied even if the SSD 2 is not an SSD using the invention in United States Patent Application Publication No. 2009-0222617 presented as Patent Document 1.

SSDC 41 may be configured not to return an error to a special write command (for example, SCT Command Transport described in ACS-2 and a command unique to a vendor) even in a ReadOnly mode state in Patent Document 1. Then some special writing operation, such as rewriting of a bootloader in the SSD 2 to be described later or writing of the emergency OS, can be performed by using the above-described special command even if the SSD 2 is in a state of returning an error to a normal write command. This is not needed for writing to a memory device other than the SSD 2. Alternatively, in the case where the normal OS is an OS that uses only a certain write command (a normal write command) (for example, 61h WRITE FPDMA QUEUED) as a write command, the SSDC 41 may be configured to return an error to the normal write command (for example, 61h WRITE FPDMA QUEUED) when the SSDC 41 enters a ReadOnly mode in Patent Document 1 and not to return an error to a different command (a special write command) (for example, 30h WRITE SECTOR(S)). Then writing of a bootloader, the emergency OS, and the like to the SSD 2 can be performed by using the special write command (for example, 30h WRITE SECTOR(S)).

The commands whose responses are monitored by the control tool 200 may be a command other than a write command. For example, the control tool may monitor responses (Outputs) and reports of B0H/D4H SMART EXECUTE OFF-LINE IMMEDIATE described in ACS-2 or responses of 90h EXECUTE DEVICE DIAGNOSTIC.

Figure 37:
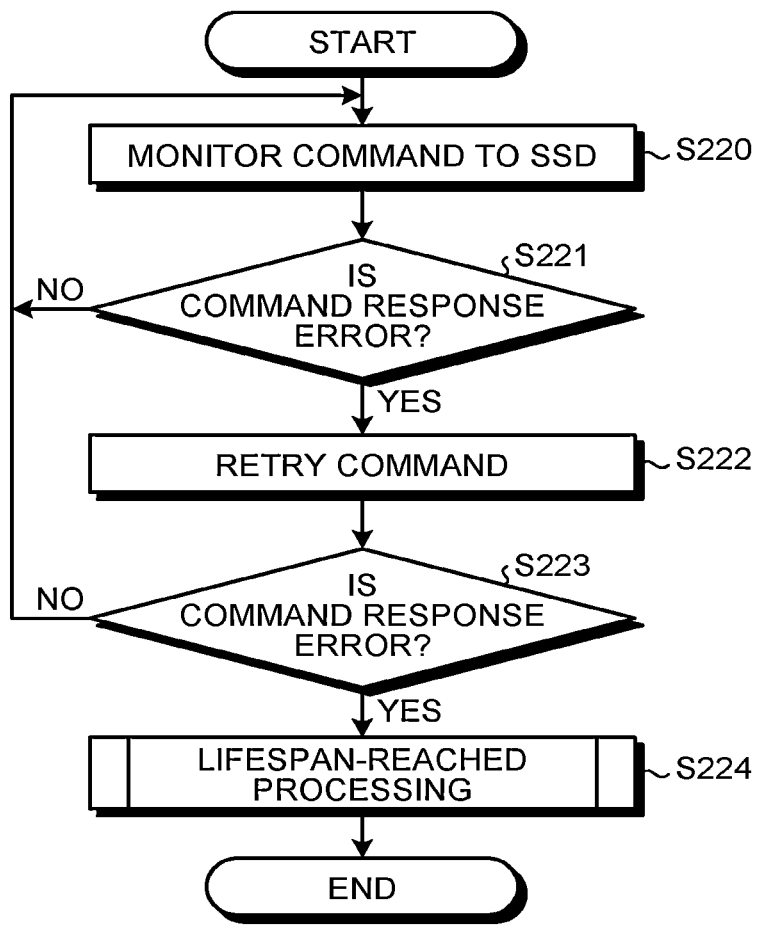
FIG. 37 is a flowchart illustrating another operation example of the control tool.

Furthermore, the control tool 200 preferably performs the lifespan-reached processing only when the command error occurs a plurality of times in terms of performing the lifespan-reached processing when a command error having a high possibility of recurrence occurs. That is because, if a certain command response is an error, the following response may not be an error when the same command is transmitted again, and in this case, there is a possibility that the SSD 2 has not reached its EOL. Furthermore, in terms of strictly determining the possibility of an error recurrence, it is desirable to perform the lifespan-reached processing when the command error occurs in succession a plurality of times. Alternatively, as shown in FIG. 37, when an error is returned as a command response while monitoring a command to the SSD 2 (Steps S220 and S221: Yes), the control tool 200 or the OS 100 may retry the same command to the SSD 2 (command retry) (Step S222) and, when the retried command is an error (Step S223: Yes), the lifespan-reached processing may be performed (Step S224).

(Lifespan-Reached Processing)

Next, the lifespan-reached processing (abnormal-state processing) will be explained. In the first embodiment, the lifespan-reached processing in the case where the normal OS and the emergency OS have already been stored in the SSD 2 is explained. As shown in FIG. 9 to FIG. 15, the normal OS 100A, the emergency OS 100B, and the bootloader 300 are, for example, written in the SSD 2 by a manufacturer of the computer system 1 before the computer system 1 is shipped, or written in the SSD 2 by a user installing them from an installation disk, such as a DVD-ROM, a USB memory, and an SSD, after the computer system 1 is shipped or by a user downloading an installation image from the WEB and installing them by using the downloaded installation image after the computer system 1 is shipped. In the NAND memory 16, as shown in FIG. 9, the bootloader 300 is written in the area 16C, the normal OS 100A is written in the area 16D, and the emergency OS 100B is written in the area 16E, and LBA is allocated to each of the area 16C, the area 16D, and the area 16E by the management information 44 stored in the RAM 40. LBA 16C is allocated to the area 16C, LBA 16D is allocated to the area 16D, and LBA 16E is allocated to the area 16E. LBA is allocated also to the above-described OS pointer information OSPT (pointer information indicating LBA of an OS to be read) stored in the bootloader 300 in the similar manner and LBA allocated to the OSPT is called LBAOSPT. LBAOSPT is included in the LBA 16C.

The control tool 200 rewrites the bootloader 300 so that the emergency OS 100B is read to the area 6A in the main memory 6 of the host apparatus 3 instead of the normal OS 100A when the computer system 1 is booted from the next time. When the normal OS 100A is used as the OS 100 for the CPU 4, the host apparatus 3 may perform a write operation on the SSD 2, which causes a possibility of further shortening the lifespan of the SSD 2 or destroying data written in the SSD 2 or data already written in the SSD 2. On the other hand, when the emergency OS 100B is read to the area 6A in the main memory 6 instead of the normal OS 100A and the CPU 4 uses the emergency OS 100B as operating by the present embodiment, the host 3 is inhibited from performing a write operation to the SSD 2, so that data in the SSD 2 can be read and user data stored in the SSD 2 can be backed up in a different storage medium before data in the SSD 2 is destroyed or the SSD 2 is rendered unreadable.

Figure 38:
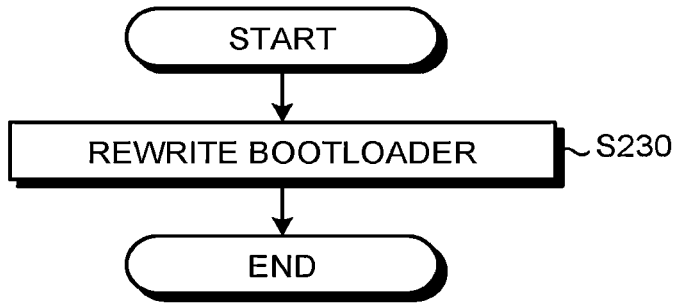
FIG. 38 is a flowchart illustrating lifespan-reached processing of the control tool.

For example, when the lifespan-reached processing is invoked in Step S205 in FIG. 33, as shown in FIG. 38, the control tool 200 rewrites the bootloader 300 so that the emergency OS 100B is read to the area 6A in the main memory 6 instead of the normal OS 100A when the computer system 1 is booted from the next time. For example, the control tool 200 writes the LBA 16E to LBAOSPT as write data. Consequently, when the computer system 1 is booted from the next time, the CPU 4 can read the emergency OS 100B by reading the OS pointer information OSPT and transmitting a read instruction to the LBA 16E that is LBA indicated by the OS pointer information OSPT. Before or after rewriting the bootloader 300, the control tool 200 may display a message "SSD has reached the end of its lifespan. Emergency OS is activated." through the display 9.

As shown in FIG. 10, if the control tool 200 is stored in ROM 11 and is loaded from ROM 11 before OS 100 is loaded from SSD 2, the control tool 200 may rewrite a bootloader which is stored in the main memory 6 and is which loaded from the bootloader 300 stored in NAND flash memory 16 when the host 3 is booted, and the control tool 200 need not to rewrite the bootloader 300 stored in NAND flash memory 16. Then the bootloader 300 read out one of the normal OS area 16D or the emergency BIOS area 16E to the area 6A in the main memory 6 based on the OSPT 301 in the main memory 6 as described above.

As shown in FIG. 11, if the control tool 200, the normal OS 100A (the normal BIOS 100A) and the emergency OS 100B (the emergency BIOS 100B) are stored in ROM 11 and is loaded from ROM 11 before OS 100 is loaded from SSD 2, the control tool 200 may rewrite a BIOSPT 301 which is stored in the main memory 6 when the host 3 is booted, and the control tool 200 need not to rewrite the bootloader 300 stored in NAND flash memory 16. Then the IPL read out one of the normal BIOS area 11D or the emergency BIOS area 11E to the area 6A in the main memory 6 based on the BIOSPT 301 in the main memory 6 as described above.

Figure 39:
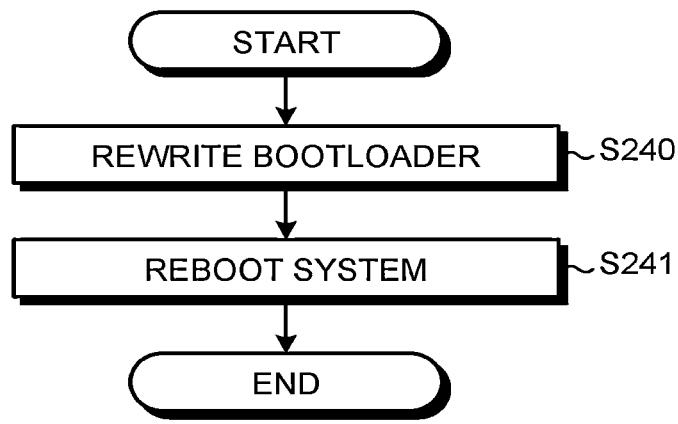
FIG. 39 is a flowchart illustrating another lifespan-reached processing of the control tool.

For example, in FIG. 38, only rewriting of the bootloader 300 is performed as the lifespan-reached processing. For example, in FIG. 39, the control tool 200 reboots the computer system 1 by transmitting a reset command to the computer system 1 or transmitting a reset command to the normal OS (Step S241) after rewriting the bootloader in Step S240.

Figure 40:
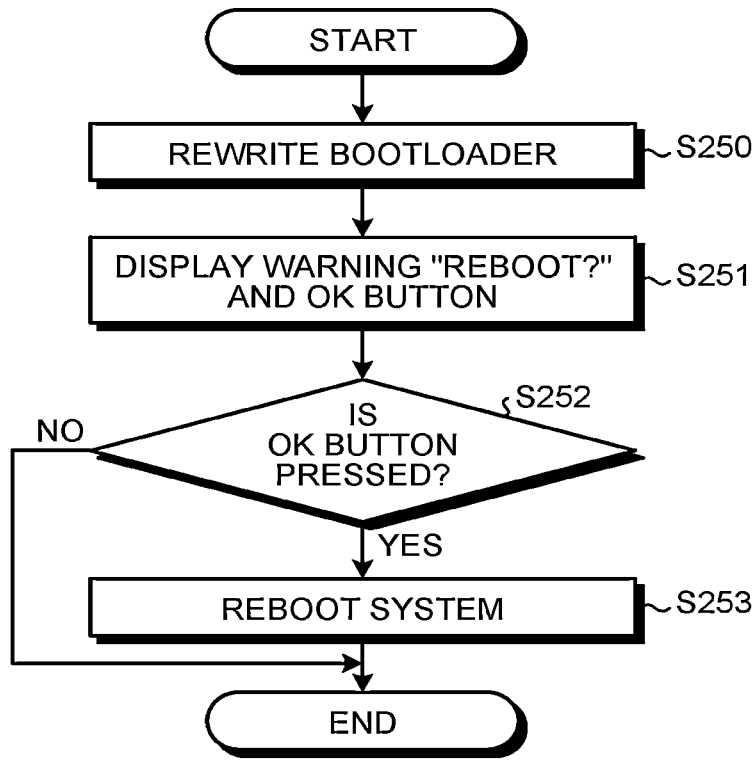
FIG. 40 is a flowchart illustrating another lifespan-reached processing of the control tool.

For example, as shown in FIG. 40, the control tool 200 displays a text "SSD has reached the end of its lifespan. Emergency OS is activated. Reboot now?" and an OK button through the display 9 (Step S251) after rewriting the bootloader in Step S250. When the OK button is pressed via the mouse 15 or the keyboard 14 (Step S252: Yes), the control tool 200 reboots the computer system 1 (Step S253). Moreover, instead of displaying the OK button, the control tool 200 may display a text "SSD has reached the end of its lifespan. Emergency OS is activated. Reboot now? y: Yes, n: No" on a command prompt screen and, when "y" is input and an enter key is pressed via the keyboard 14, the control tool 200 reboots the computer system 1.

Figure 41:
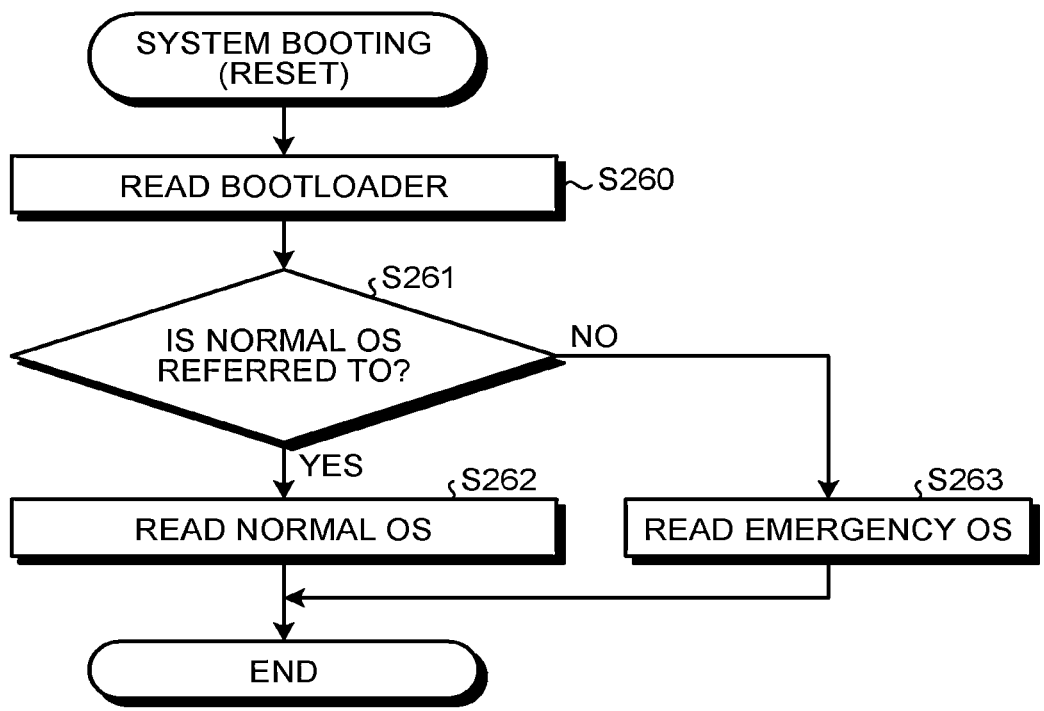
FIG. 41 is a flowchart illustrating an operation procedure at the time of booting the computer system.

FIG. 41 illustrates an operation procedure when the computer system 1 is rebooted. When the computer system 1 is rebooted, the CPU 4 reads the bootloader 300 and the OS pointer information OSPT from the SSD 2 by using the LBA corresponding to the area 16C and LBAOSPT (Step S260). Next, the CPU 4 performs required boot processing by using the bootloader 300 and analyzes the OS pointer information OSPT to specify LBA indicated by the OS pointer information OSPT. Then, the CPU 4 transmits a read instruction to the specified LBA to the SSD 2 to read the OS specified by the OS pointer information OSPT from the SSD 2. Therefore, when the LBA indicated by the OS pointer information OSPT specifies the area 16D, which is a memory area for the normal OS 100A (Step S261: Yes), the normal OA 100A is read from the area 16D and is written in the area 6A in the main memory 6 (Step S262), and, when the LBA indicated by the OS pointer information OSPT specifies the area 16E, which is a memory area for the emergency OS 100B (Step S261: No), the emergency OA 100B is read from the area 16E and is written in the area 6A in the main memory 6 (Step S263). In such a manner, when the OS pointer information OSPT in the bootloader 300 is rewritten to read the emergency OS 100B by the lifespan-reached processing by the control tool 200, the emergency OA 100B is read from the area 16E and is written in the area 6A in the main memory 6. AS a result, the emergency OA 100B is initiated.

In this way, when the statistical information has not exceeded the threshold, the bootloader loads the normal OS 100A, and when the statistical information has exceeded the threshold, the bootloader loads the emergency OS 100B.

(Backup Function)

In terms of facilitating backup of user data in the SSD 2 to other memory devices by a user, a user data backup function is desirably added to the emergency OS 100B. In a state where the SSD 2 is considered to have reached its EOL, it is considered that the data retention reliability of the SSD 2 are degraded, so that user data in the SSD 2 needs to be saved to other backup memory devices as soon as possible.

Figure 42:
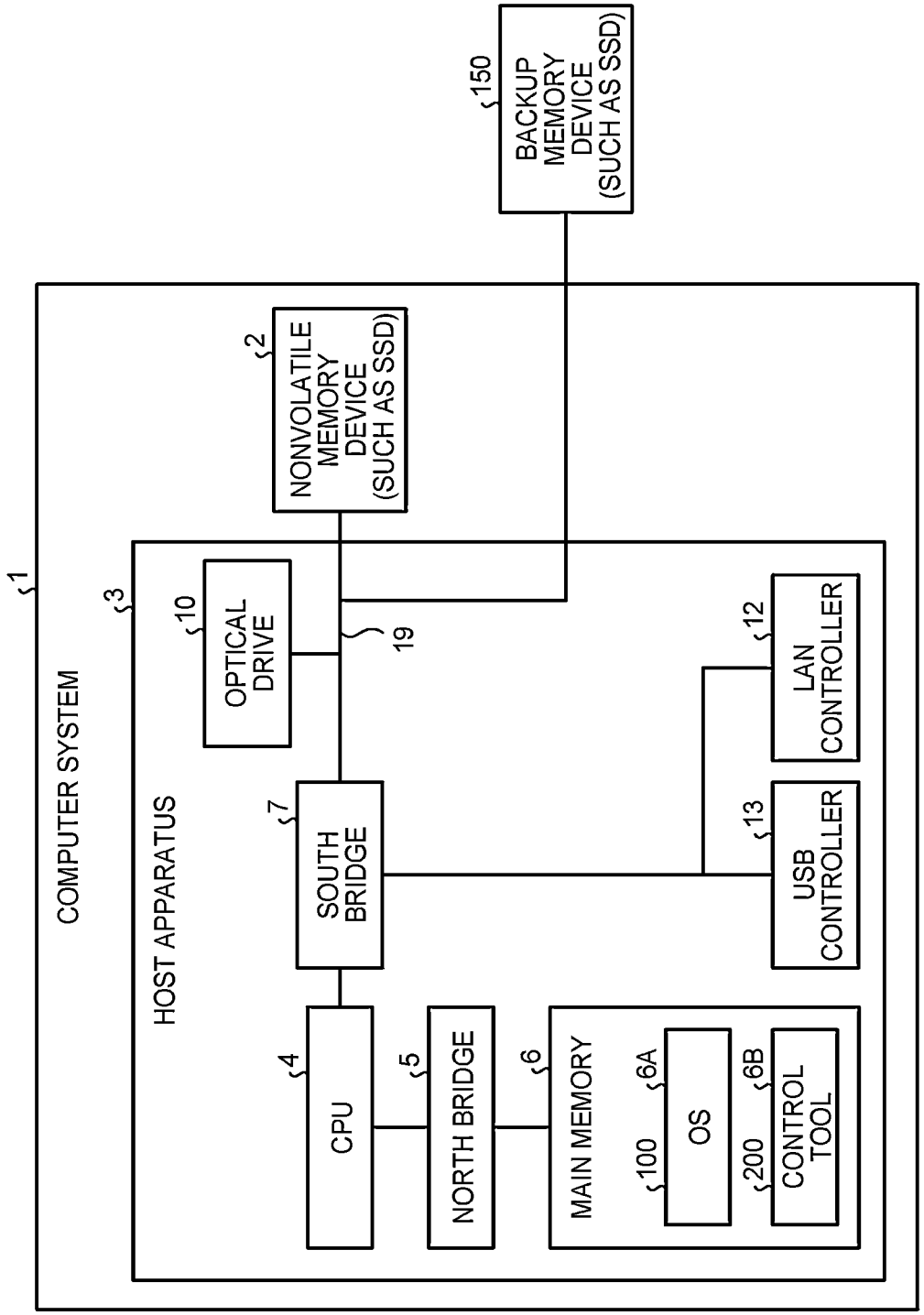
FIG. 42 is a diagram illustrating a configuration of the host in the case where the emergency OS is provided with a backup function.

FIG. 42 is a diagram illustrating a configuration of the host apparatus 3 in the case where the emergency OS 100B is provided with a backup function. A backup memory device (such as another SSD and hard disk drive) 150 is connected to the host apparatus 3 via the interface 19 (in the present embodiment, the SATA interface is employed). The backup memory device 150 does not need to be mounted at the time of shipping the computer system 1, and, for example, when a user uses a separately purchased SSD as the backup memory device 150, the user may connect the SATA port of the SSD to the mother board 30 (see FIG. 17) via a SATA cable and connect the power port of the SSD 2 to the power unit 32 via a power cable.

Figure 43:
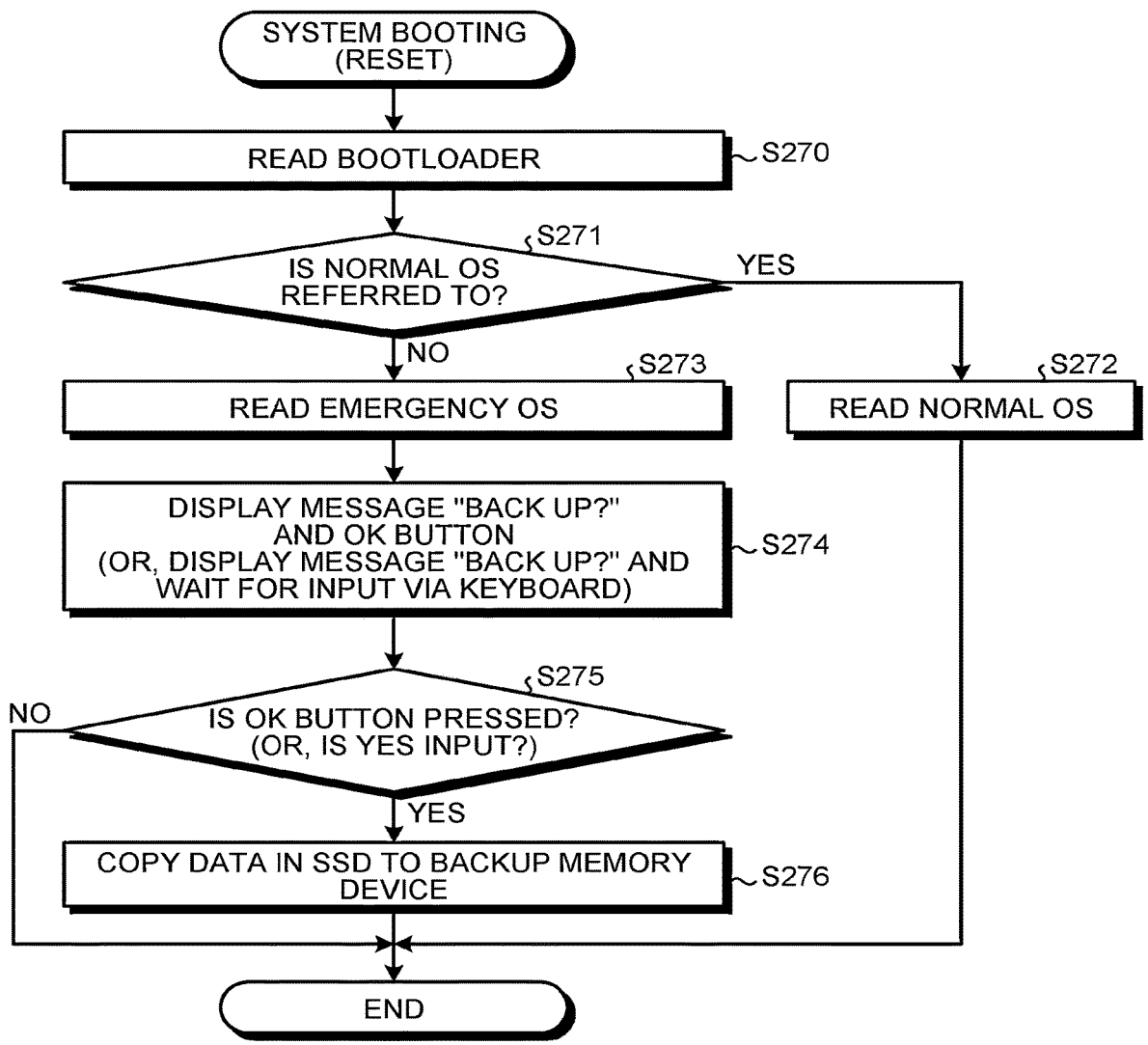
FIG. 43 is a flowchart illustrating an operation procedure including a backup operation at the time of booting the computer system.

FIG. 43 illustrates an example of a boot procedure of the emergency OS 100B when the backup function is added to the emergency OS 100B. The operations in Steps S270 to S273 in FIG. 43 are the same as the operations in Steps S260 to S263 in FIG. 41. In FIG. 43, Steps S274 to S276 are added to the boot procedure of the computer system 1 shown in FIG. 41. After booting the emergency OS 100B, for example, when a user selects the backup function from the program menu of the emergency OS 100B via the keyboard 14 or the mouse 15 or when the emergency OS 100B is booted, the processing in Step S274 and the following steps is automatically started. It is desirable to display a message "Back up now?" and an OK button on the display 9 before the backup processing so as to enable a user to arbitrarily select the timing of backup. When the OK button is selected via the mouse 15 or the keyboard 14, the processing proceeds to Yes in Step S275. Alternatively, a message "Back up? Yes: Y, No: N" may be displayed on the display 9 through a command prompt and the processing may proceed to Yes in Step S275 by pressing a Y button and the enter key from the keyboard 14. When the backup function is selected in such a manner (Step S275: Yes), the emergency OS 100B starts the backup processing.

As the content of the backup processing, for example, the emergency OS 100B writes data read from the SSD 2 to the same LBA (LBA in the backup memory device 150) as LBA (LBA in the SSD 2) of data read from the SSD 2 (LBA-by-LBA backup). For example, data of LBA=0h in the SSD 2 is copied to LBA=0h in the backup memory device 150 (Step S276). Moreover, data in LBA=234c5h in the SSD 2 is copied to LBA=234c5h in the backup memory device 150. Data copying is performed by transmitting, for example, 60h READ FPDMA QUEUED or 25h READ DMA EXT command described in ACS-2 to the SSD 2 with LBA and logical sector length specified, receiving read data from the SSD 2 and writing it in the main memory 6, transmitting, for example, 61h WRITE FPDMA QUEUED or 35h WRITE DMA EXT described in ACS-2 to the backup memory device 150 with LBA and logical sector length specified, and transmitting the data written in the main memory 6 to the backup memory device 150. The backup processing may be performed on the whole LBA area or may be performed on part of the LBA area.

Figure 44:
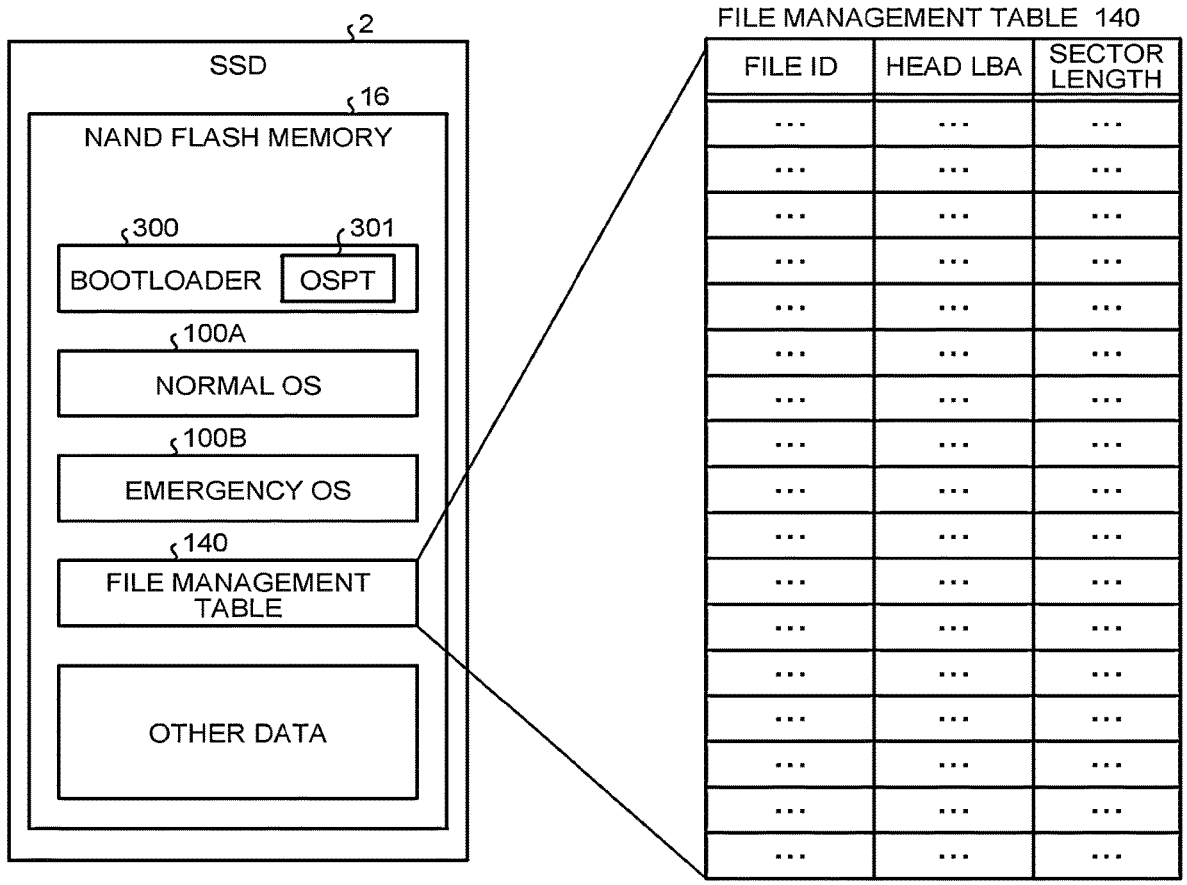
FIG. 44 is a diagram illustrating a storage content of the NAND memory and a storage content of a file management table.

In this backup processing, the emergency OS 100B may copy all the files in the SSD 2 to the backup memory device 150. In many OSs, a user does not access data by directly specifying LBA and accesses data by using a file ID (file name). For example, as shown in FIG. 44, the SSD 2 stores a file management table 140 (metadata 140) that associates the file ID with LBA and logical sector length. LBA is allocated also to the file management table 140 by the management information 44. The normal OS 100A translates the file ID received from other software shown in FIG. 16 into LBA on the basis of the file management table 140 and transmits it to the SSD 2, and translates LBA received from the SSD 2 into the file ID on the basis of the file management table 140 and transmits it to the other software. In the backup processing, the emergency OS 100B reads the file management table 140 from the SSD 2, transmits a command (such as 60h READ FPDMA QUEUED and 25h READ DMA EXT command) that reads data on corresponding LBA in the file management table 140 to the SSD 2 with respect to each file ID, receives read data from the SSD 2, and writes it in the main memory 6. Furthermore, the emergency OS 100B reads a file management table (not shown) in the backup memory device 150, writes data written in the main memory 6 to LBA to which the file ID has not been allocated, obtains all LBAs of all the files of the SSD 2 to associate written LBA with file names, reads all the data on the obtained LBAs, writes the read data in the backup memory device 150, and rewrites the file management table (not shown) in the backup memory device 150 to associate the written LBA with the file ID. The backup processing may be performed on all the files or may be performed on part of the files.

Moreover, when writing backup data in the backup memory device 150, data read from the SSD 2 may be compressed (encoded) and written. Moreover, it is also possible to read the management information in the SSD 2, such as the file management table 140, obtain information on an area and a file, which are being used, generates a ROM image for data in the SSD 2 on the basis of the obtained information, and store the generated ROM image in the backup memory device 150.

Figure 45:
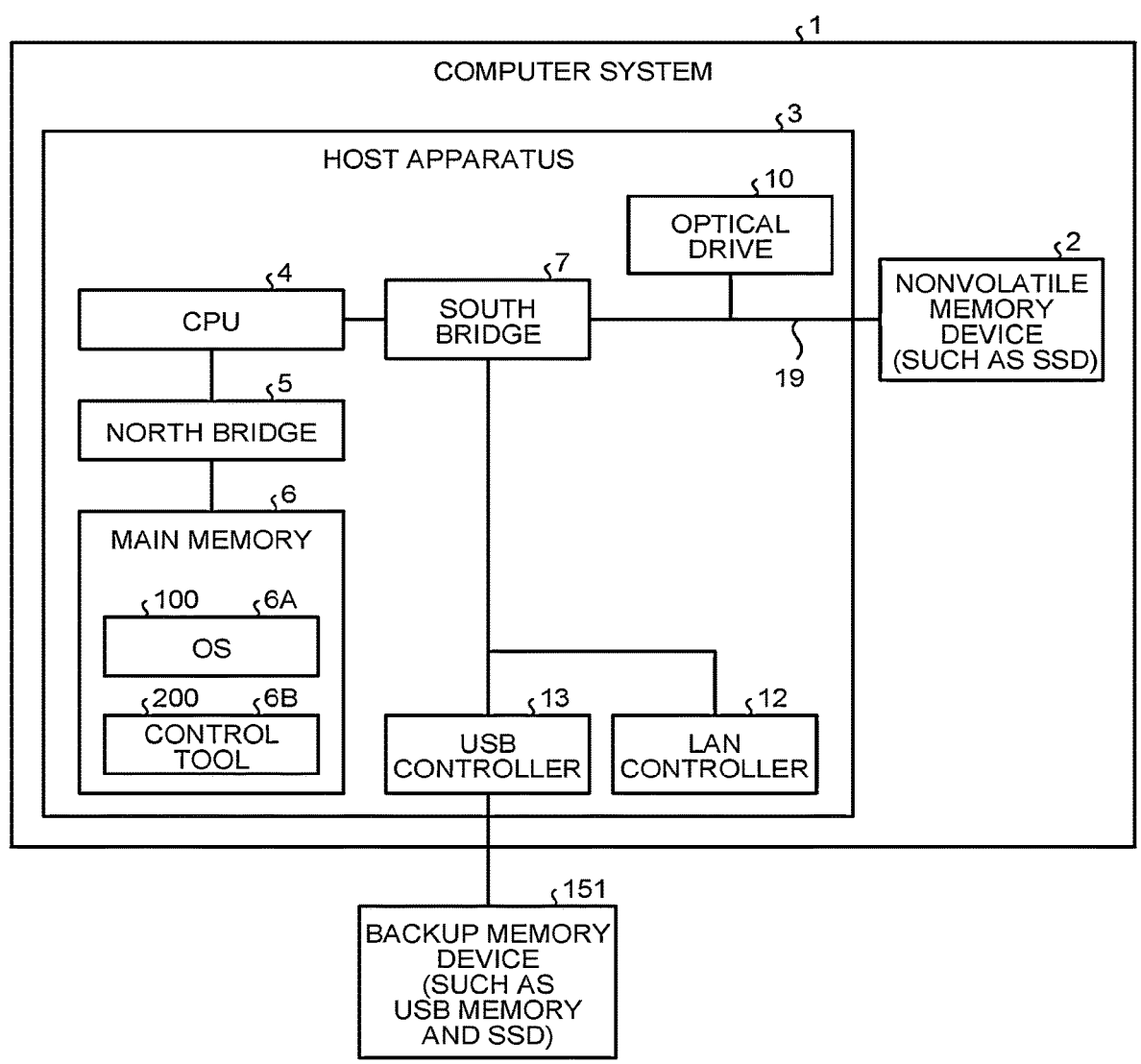
FIG. 45 is a diagram illustrating a function configuration example of the computer system in a case where a USB storage is used as a backup memory device.
Figure 46:
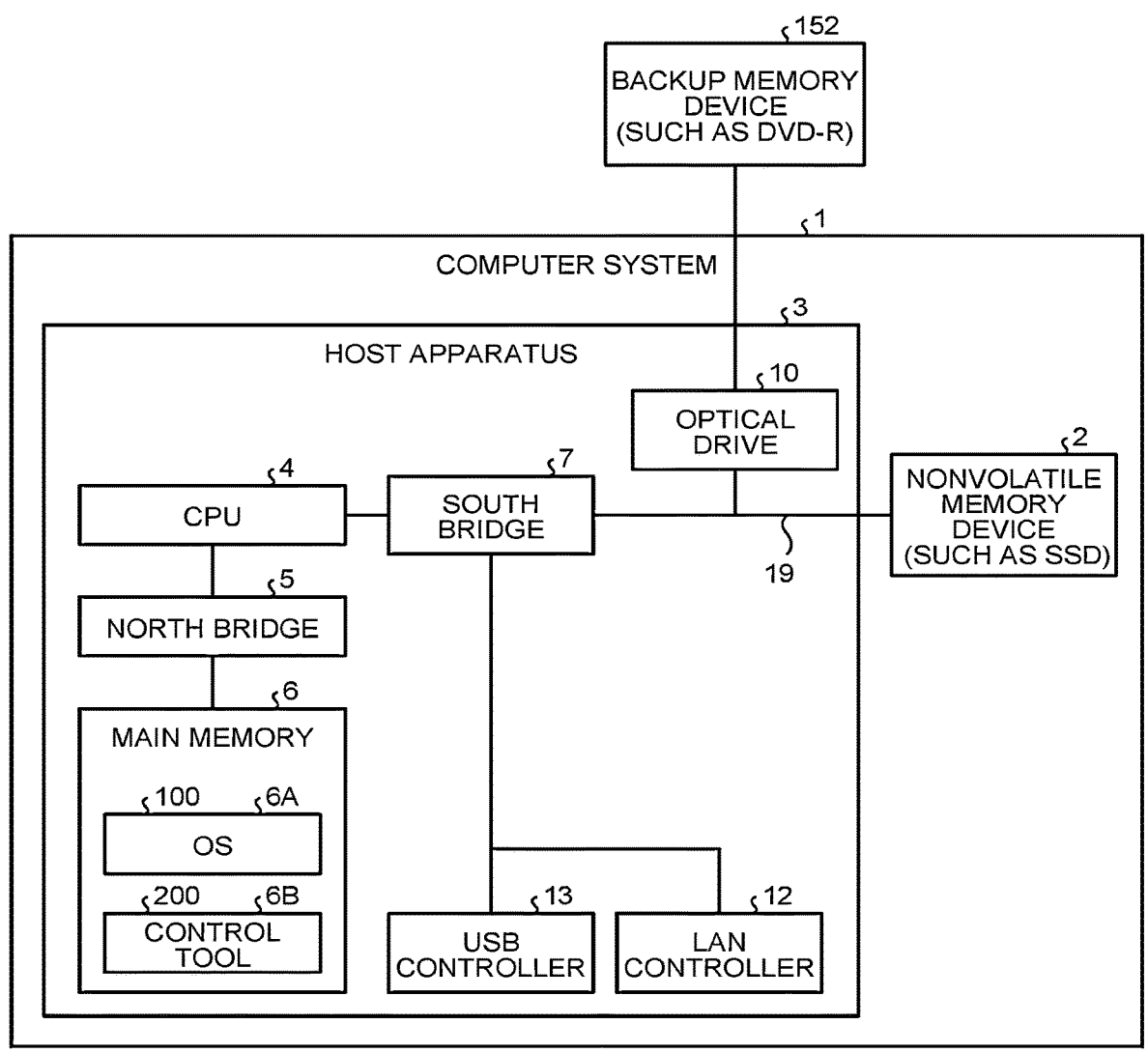
FIG. 46 is a diagram illustrating a function configuration example of the computer system in a case where an optical storage medium is used as the backup memory device.
Figure 47:
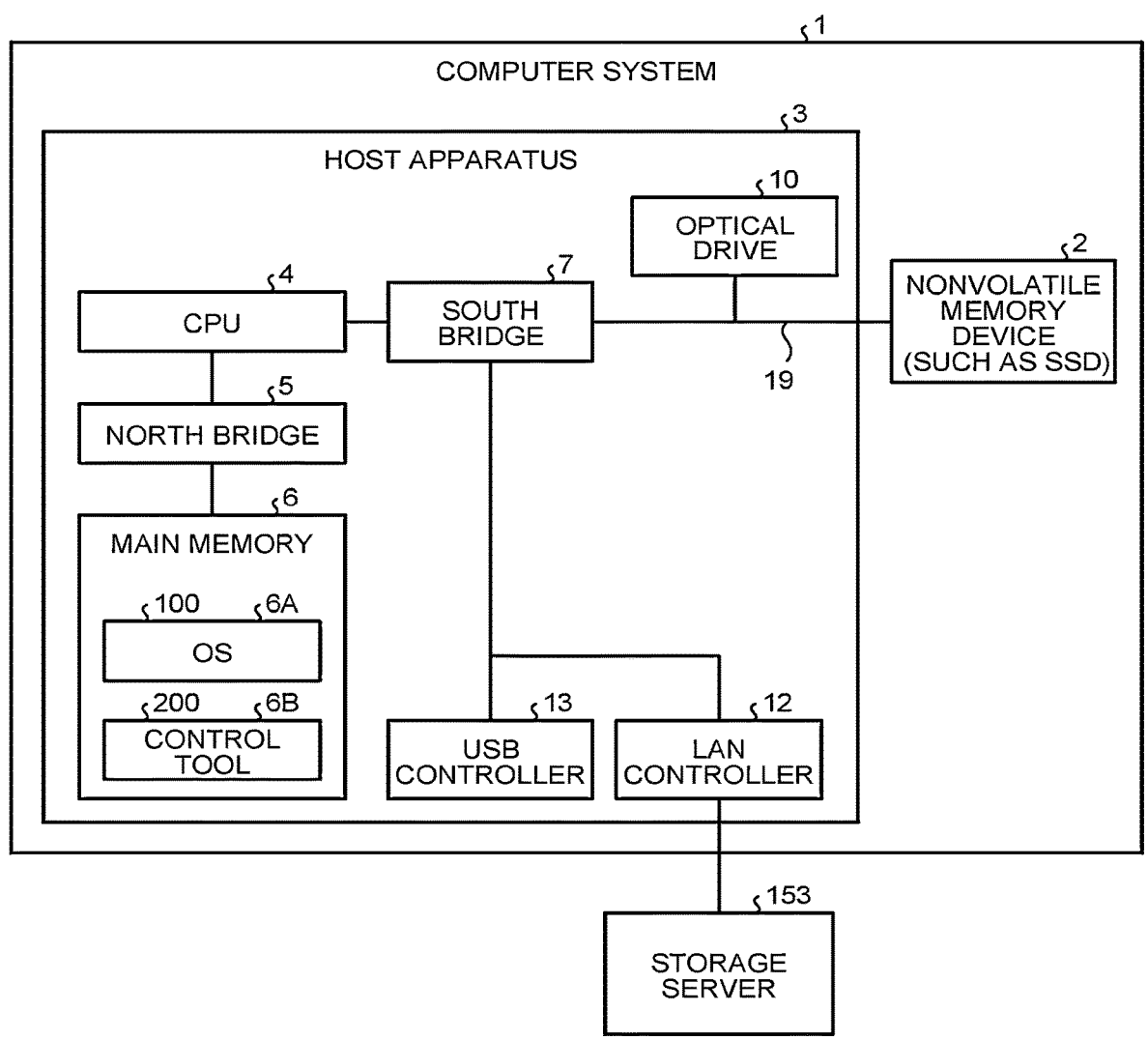
FIG. 47 is a diagram illustrating a function configuration example of the computer system in a case where a storage server is used as the backup memory device.

In the above explanation, a case where the backup memory device is a SATA device connected by a SATA interface is used. Other backup memory devices may be used. For example, an USB storage device 151, such as a USB memory and a SSD supporting a USB interface, may be used as the backup memory device as shown in FIG. 45, a writable optical drive 152, such as a DVD-R, a DVD-RW, and a Blu-ray (registered trademark) Disc, may be used as the backup memory device as shown in FIG. 46, or a network storage server 153 (a cloud storage server) connected via the Internet or LAN, may be used as the backup memory device as shown in FIG. 47. Moreover, the backup function can be applied also to the case of other embodiments.

As shown in FIG. 9, the memory area 16E for the emergency OS 100B is associated with LBA in the management information 44. On the other hand, in order to prevent inadvertent rewriting of data in the area 16E by a user, the emergency OS may be recorded in the memory area 16E without allocating LBA at the time of shipping the SSD 2, and, at the time of the lifespan-reached processing, the SSDC 41 may rewrite the management information 44 and allocate LBA to the area 16E by the control tool 200 transmitting SCT Command Transport or a command unique to a vendor to the SSD 2. Alternatively, the SSDC 41 may rewrite the management information 44 so that the area 16E is not allocated to LBA by the control tool 200 transmitting SCT Command Transport or a command unique to a vendor including an LBA Range of the area 16E, to which the LBA is allocated, to the SSD 2 and, at the time of the lifespan-reached processing, the SSDC 41 may rewrite the management information 44 and allocate LBA to the area 16E by the control tool 200 transmitting SCT Command Transport or a command unique to a vendor to the SSD 2.

In such a manner, according to the first embodiment, the control tool 200 determines whether the SSD 2 has reached the end of its lifespan and whether the SSD 2 is in a normal state, and, when determining that the SSD 2 has reached the end of its lifespan (its EOL) or the SSD 2 is in an abnormal state, the control tool 200 rewrites the bootloader 300 or BIOSPT 301 so that the emergency OS, which supports only a read operation among read and write operations, is booted to cause the emergency OS to be booted when the computer system 1 is rebooted, thereby inhibiting a write operation to the SSD 2 or preventing a write operation to the SSD 2 from being performed easily, therefore reliability degradation of the SSD 2 is suppressed and data to be written in the SSD 2 and data already written in the SSD are prevented from being destroyed, which enables a user to easily read user data from the SSD 2 and back up user data in other memory devices.

Second Embodiment

In the first embodiment, a case where both the normal OS 100A and the emergency OS 100B are stored in the NAND memory 16 of the SSD 2 is explained. In the second embodiment, a case where the normal OS 100A is stored in the SSD 2 and the emergency OS 100B is not stored in the SSD 2 will be explained. In the second embodiment, before or after rewrite processing (see Step S240 in FIG. 39) of the bootloader 300 in the lifespan-reached processing shown in Step S224 in FIG. 37, the control tool 200 installs the emergency OS 100B in the area 16E in the NAND memory 16 of the SSD 2 from the external memory device 20 (see FIG. 12) different from the SSD 2. In terms of preventing destruction of emergency OS data due to inadvertent rewriting of the area 16E, in which the emergency OS is stored, in the SSD 2 by a user and in terms of preventing decrease of a free space of the SSD 2 by securing the area 16E, it is desirable to employ the second embodiment.

Moreover, for example, as shown in FIG. 13, before or after rewriting the bootloader 300, the control tool 200 downloads data or an installation program of the emergency OS 100B from the WEB server 21 and installs the emergency OS 100B in the area 16E in the NAND memory 16 of the SSD 2 on the basis of the download data. Alternatively, the control tool 200 may display to a user the address of the WEB server, in which the data or the installation program of the emergency OS is stored, through the display 9.

Alternatively, as shown in FIG. 14 and FIG. 15, before or after rewriting the bootloader 300, the control tool 200 may install the emergency OS 100B in the area 16E in the NAND memory 16 of the SSD 2 from the external storage medium (optical medium such as DVD-ROM, USB memory, SD card, SSD, or the like) 23 or 24. Alternatively, before or after rewriting the bootloader 300, the control tool 200 may display to a user a message to set an external storage medium (optical medium such as DVD-ROM, USB memory, SD card, SSD, or the like), in which the installation program of the emergency OS 100B is stored, through the display 9.

When installing the emergency OS 100B in the NAND memory 16, writing to the NAND memory 16 is made, therefore, in terms of preventing reliability degradation of the NAND memory 16 and data destruction, it is desirable that the amount of data of the emergency OS is significantly smaller than the capacitance of the NAND memory 16.

Third Embodiment

In the third embodiment, the lifespan-reached processing in a case where the normal OS 100A and the emergency OS 100B are stored in the nonvolatile memory device 20 different from the SSD 2 will be explained. As shown in FIG. 12, the present invention can be applied also to a case where the normal OS 100A and the emergency OS 100B are stored in the nonvolatile memory device 20 different from the SSD 2 and are not stored in the SSD 2 and a case where one of them is stored in the SSD 2 and the other of them is stored in the nonvolatile memory device 20. In this case, the control tool 200 needs to rewrite the bootloader in the nonvolatile memory device 20 in addition to the bootloader in the SSD 2 in some cases.

When the normal OS 100A and the emergency OS 100B are stored in the nonvolatile memory device 20 different from the SSD 2, the control tool 200 rewrites the bootloader 300 stored in the nonvolatile memory device 20 and does not rewrite the bootloader in the SSD 2.

When the normal OS 100A is stored in the SSD 2 and the emergency OS 100B is stored in the nonvolatile memory device 20, the control tool 200 desirably rewrites both bootloaders in the SSD 2 and the nonvolatile memory device 20. When the computer system 1 is booted in a state where the nonvolatile memory device 20 is removed from the host apparatus 3, in terms of preventing inadvertent write access to the SSD 2, it is desirable that the bootloader is configured so that the normal OS is not booted.

When the emergency OS 100B is stored in the SSD 2 and the normal OS 100A is stored in the nonvolatile memory device 20, it is desirable to rewrite both the bootloaders in the SSD 2 and the nonvolatile memory device 20. On the other hand, only the bootloader in the nonvolatile memory device 20 may be rewritten. In this case, even when the computer system 1 is booted in a state where the nonvolatile memory device 20 is removed from the host apparatus 3, the emergency OS can be booted from the area 16E in the NAND memory 16 of the SSD 2 by reading the bootloader 300 in the SSD 2.

Fourth Embodiment

In the fourth embodiment, a case where the normal OS 100A is installed in the SSD 2 and the emergency OS is not installed in the SSD 2 will be explained. In terms of suppressing access to the SSD 2 with degraded reliability as much as possible, the emergency OS 100B is desirably booted from a memory device different from the SSD 2. The control tool 200 in the present embodiment has a function of generating an emergency boot disk, in which the emergency OS is installed, in the lifespan-reached processing.

As an emergency boot disk, various nonvolatile memory devices, such as a USB memory, an SD card, an optical medium such as a CD and a DVD, an SSD, and a hard disk drive, can be employed. In the present embodiment, a case where a USB memory is used from among them as an emergency boot disk is explained.

The data (image data) including emergency OS data for generating an emergency boot disk is stored, for example, in the SSD 2, other SSDs, an USB memory, an SD card, an optical medium such as a DVD-ROM drive, and a storage medium of the WEB server. In the present embodiment, a case where the SSD 2 is used as a storage medium for storing image data for installing the emergency OS is introduced. In other words, installation source image data is stored in the SSD 2 itself with degraded reliability in the present embodiment.

When installing the emergency OS, reading of the image data is made from the SSD 2 and the same image data is not read again after the installation is once performed. Moreover, it is desirable that the control tool 200 has a function of enabling a user to arbitrary generate an emergency boot disk in a stage before the SSD 2 reaches its EOL.

Figure 48:
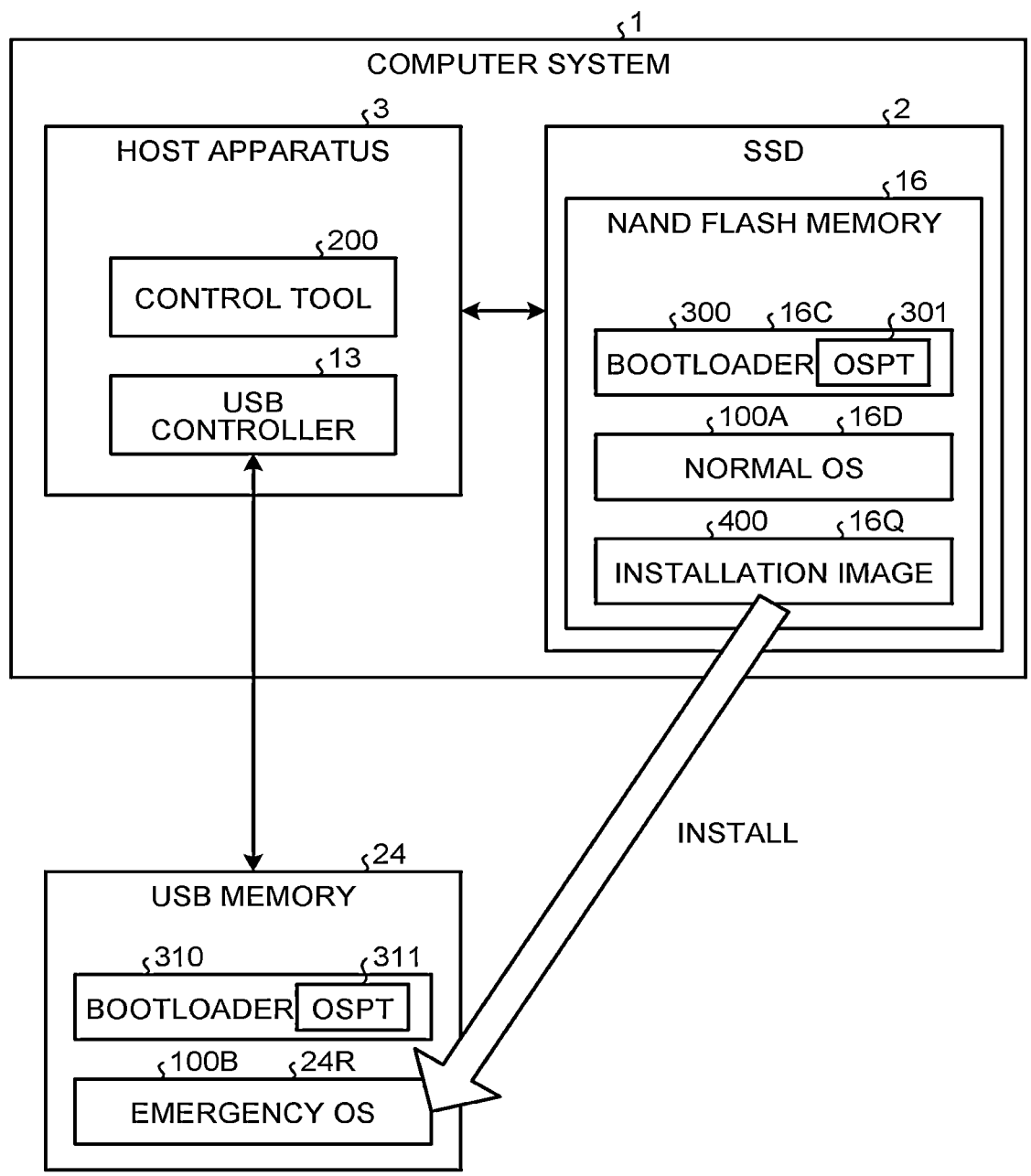
FIG. 48 is a diagram illustrating a concept of data movement when generating an emergency boot disk.
Figure 49:
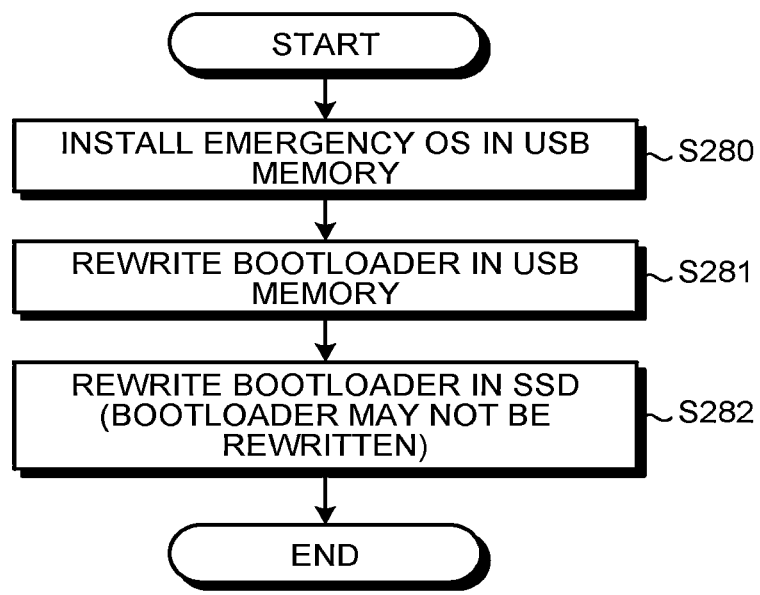
FIG. 49 is a flowchart illustrating an operation procedure when generating an emergency boot disk.

FIG. 48 illustrates a conceptual diagram of data movement when generating an emergency boot disk. Moreover, FIG. 49 illustrates an operation procedure of the control tool 200 when generating an emergency boot disk. When starting the lifespan-reached processing, it is desirable that the control tool 200 checks whether a USB memory is connected to the USB controller 13 of the host apparatus 3 and, when the USB memory is not connected, displays to a user a message "USB memory for booting emergency OS is generated. Please connect USB memory." through the display 9.

As shown in FIG. 48, when the USB memory 24 is connected, the control tool 200 extracts the emergency OS data from installation image data 400 stored in an area 16Q in the NAND memory 16 of the SSD 2 (when the emergency OS data is compressed, encrypted or encoded, this is extracted, decrypted or decoded), and copies (installs) it to an area 24R in the USB memory 24 (Step S280). Next, the control tool 200 rewrites a bootloader 310 so as to refer to the area 24R for the emergency OS 100B so that the emergency OS 100B installed in the USB memory 24 is read when the bootloader 310 stored in the USB memory 24 is read (Step S281). Specifically, the control tool 200, for example, writes LBA corresponding to the memory area 24R to OS pointer information OSPT 311 in the bootloader 310.

When both the USB memory 24 and the SSD 2 are connected to the host apparatus 3, it is desirable that the bootloader 310 are rewritten or the setting of the BIOS-ROM 11 is changed in such a way that the bootloader 310 in the USB memory 24 is preferentially booted (Step S282). Step S282 may not be performed.

When the USB memory 24 is not connected to the host apparatus 3, in terms of preventing that the normal OS 100A is booted from the SSD 2 and inadvertent write access to the SSD 2 is made, in Step S282, it is desirable to rewrite the bootloader 300 in the SSD 2 in such a way that the normal OS 100A is not booted from the SSD 2. For example, the normal OS 100A can be prevented from being loaded even if the bootloader 300 in the SSD 2 is read by writing LBA other than the area 16D for the normal OS 100A or invalid LBA in the OS pointer information OSPT 301 in the bootloader 300. Alternatively, data on the normal OS 100A may be rewritten.

In such a manner, when the SSD 2 has reached its EOL or the SSD 2 enters an abnormal state, it is possible to generate the boot disk for booting an OS capable of reading data in the SSD 2 and backing up data in the SSD 2 in other nonvolatile memory devices while suppressing reliability degradation of the SSD 2 and data destruction in the SSD 2.

Figure 50:
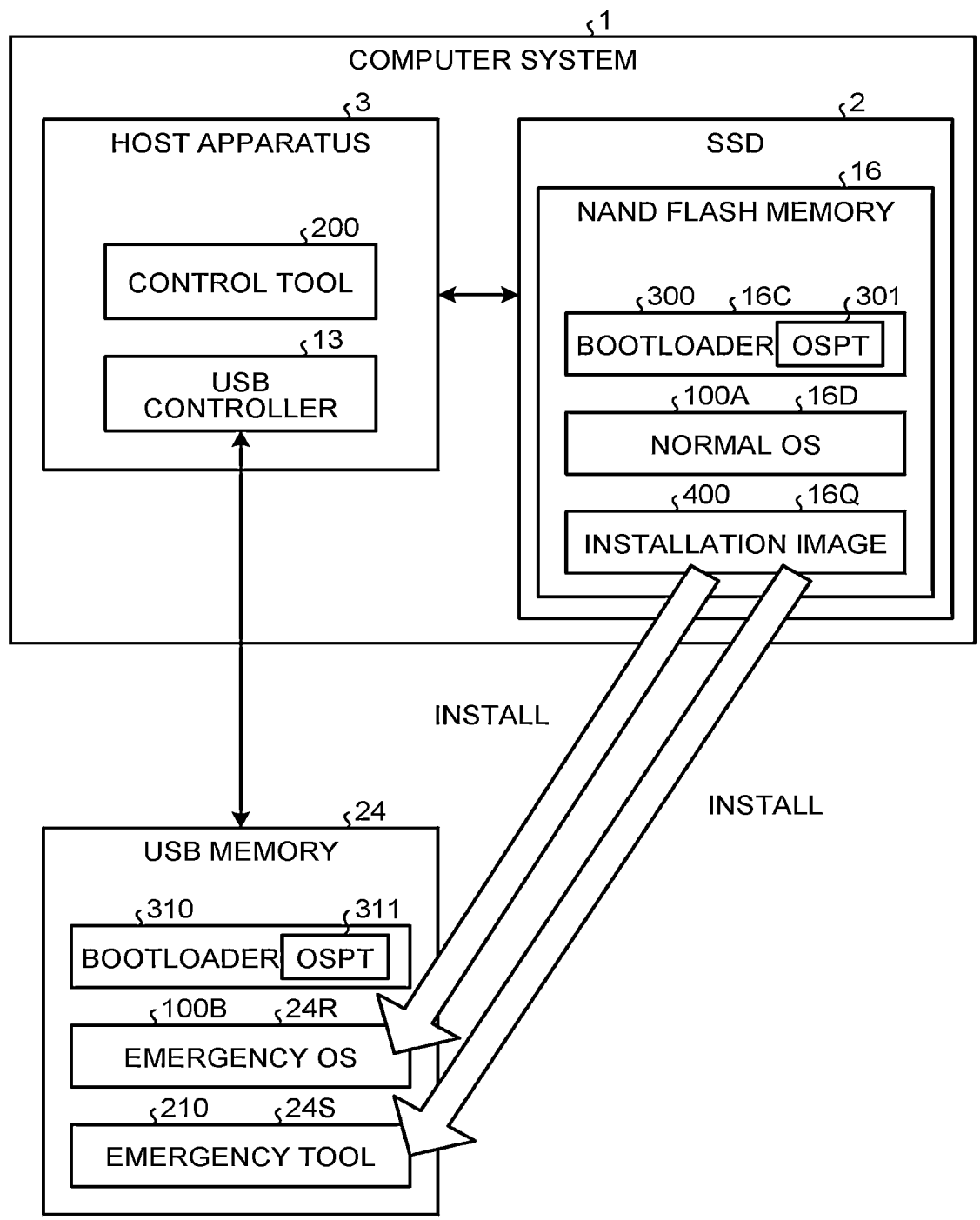
FIG. 50 is a diagram illustrating a concept of data movement when generating an emergency boot disk including an emergency tool.

Moreover, as shown in FIG. 50, it is also possible to use an OS, such as MS-DOS (trademark), Linux (trademark), Windows (registered trademark), and PE (trademark), as the emergency OS 100B and install an emergency tool 210 having a function of backing up data in the SSD 2 in an area 24S in the USB memory 24 simultaneously with installing the emergency OS in the USB memory 24 to enable the emergency tool 210 to be executed from the emergency OS 100B. The emergency tool 210 desirably has a backup function similar to that explained in the first embodiment.

Figure 51:
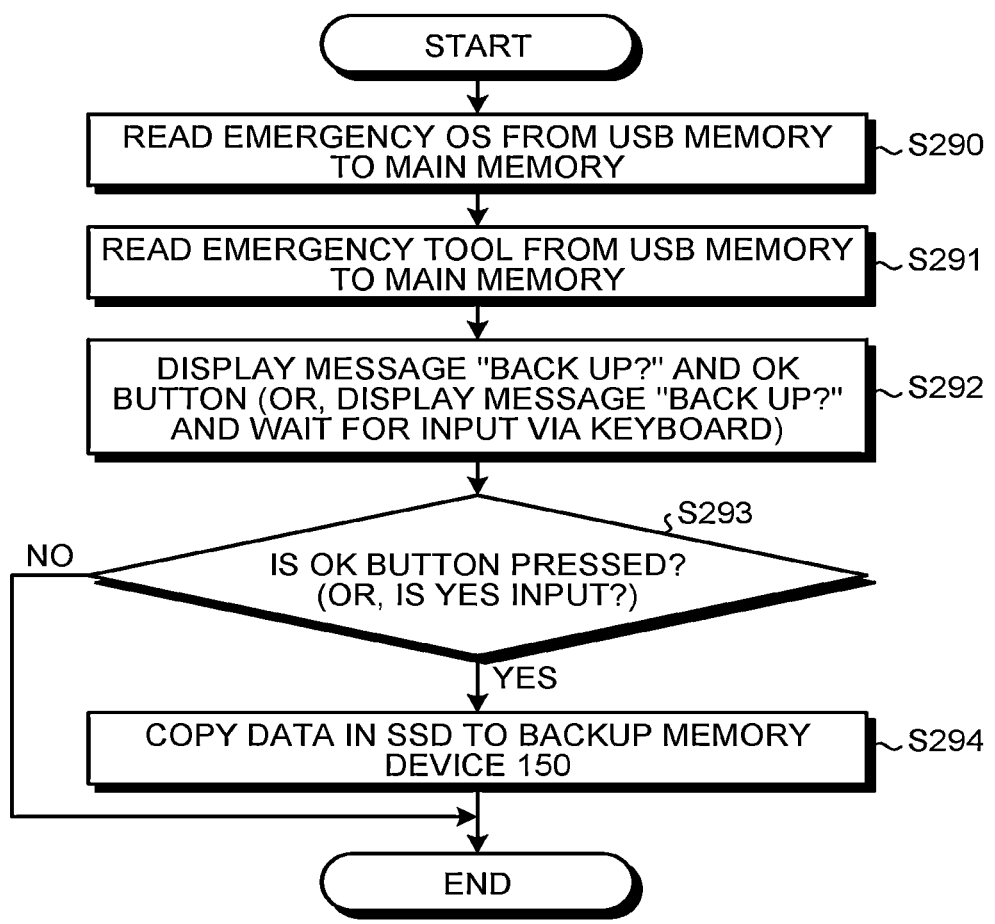
FIG. 51 is a flowchart illustrating an operation procedure when generating an emergency boot disk including an emergency tool.

FIG. 51 illustrates an operation at the time of booting the host apparatus 3. At the time of booting the host apparatus 3, the emergency OS 100B is read from the USB memory 24 and is written to the main memory 6, so that the emergency OS 100B is booted from the USB memory 24 (Step S290). Next, the emergency tool 210 is read from the USB memory 24 and is written to the main memory 6, so that the emergency tool 210 is activated from the USB memory 24 (Step S291). It is desirable that the emergency tool 210 is automatically activated after the emergency OS 100B is booted, for example, by registering the emergency tool 210 in a start-up of the emergency OS 100B.

Figure 52:
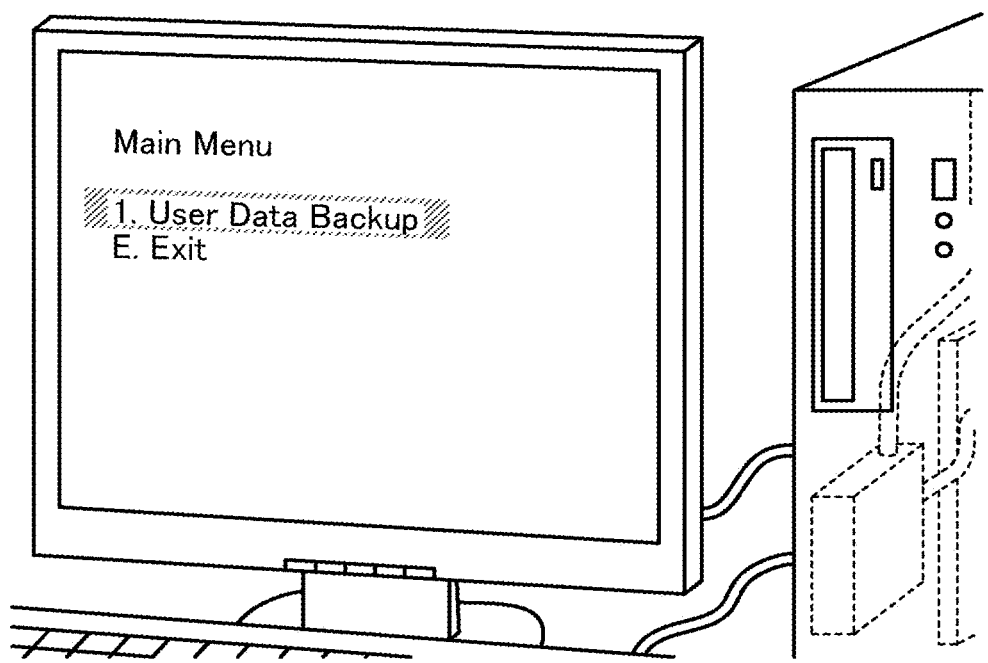
FIG. 52 is a diagram illustrating a screen example to guide a user to backup processing.

As shown in FIG. 52, it is desirable that the emergency OS 100B, for example, displays a backup menu as one of the menu items that can be selected by a user, a message "Back up?" and an OK button, or a message "Back up?" to enter a state of waiting for input via the keyboard 14, through the display 19 for a user to arbitrarily set the backup function to an activable state (Step S292). The emergency OS 100B may automatically start backup.

When backup function activation is selected by the keyboard 14 or the mouse 15 (Step S293), the emergency tool 210 is activated. The emergency tool 210 copies data stored in the SSD 2 to the backup memory device 150 (Step S293). As a backup method, a method similar to that explained in the first embodiment may be employed and, for example, LBA-by-LBA backup or file-by-file backup may be used.

Fifth Embodiment

The above embodiments enable a user to easily read user data from the SSD 2 and back up the user data in other memory devices while suppressing reliability degradation of the SSD 2 and data destruction of the SSD 2. The fifth embodiment provides a method of further suppressing reliability degradation of the SSD 2. The SSD 2 is provided with a function of performing refresh processing in the background in some cases to repair data destructed due to aging and read disturb. With this function, processing of periodically reading blocks of the NAND memory 16 and writing data of a block, in which the number of data errors is large, to a different block is performed. Consequently, the effect of aging and read disturb can be reduced, however, on the other hand, extra erasing and writing to a block may be made, so that reliability degradation of the SSD 2 may be accelerated.

In the present embodiment, the control tool 200 or the emergency OS 100B instructs the SSDC 41 to stop performing the refresh by using a refresh control command (SCT Command Transport described in ACS-2, a command unique to a vendor, or other commands). In response to the refresh control command, the SSDC 41 stops the refresh processing or sets the refresh execution interval (for example, 1 minute) longer (for example, 2 minutes). In the case of causing the SSDC 41 to set the refresh execution interval longer, it is desirable that the refresh execution interval is explicitly specified in the refresh control command.

Figure 53:
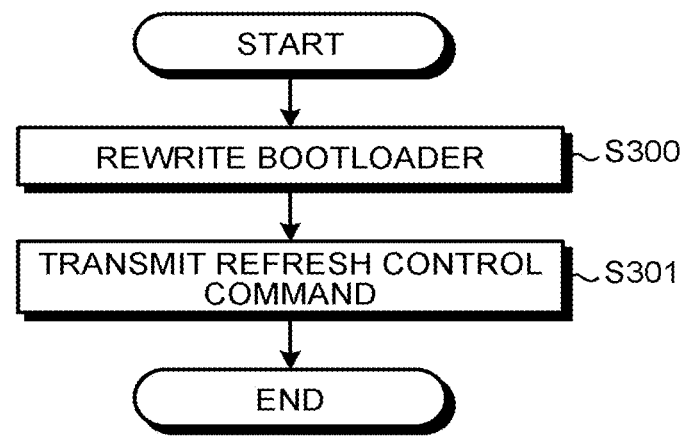
FIG. 53 is a flowchart illustrating another operation procedure of the control tool.

FIG. 53 illustrates an operation when the control tool 200 issues the refresh control command. In this case, the control tool 200 issues the refresh control command in the lifespan-reached processing shown in Step S205 in FIG. 33. The control tool 200 performs rewriting of the bootloader 300 explained in FIG. 38 (Step S300) and thereafter transmits the refresh control command to the SSD 2 (Step S301).

Figure 54:
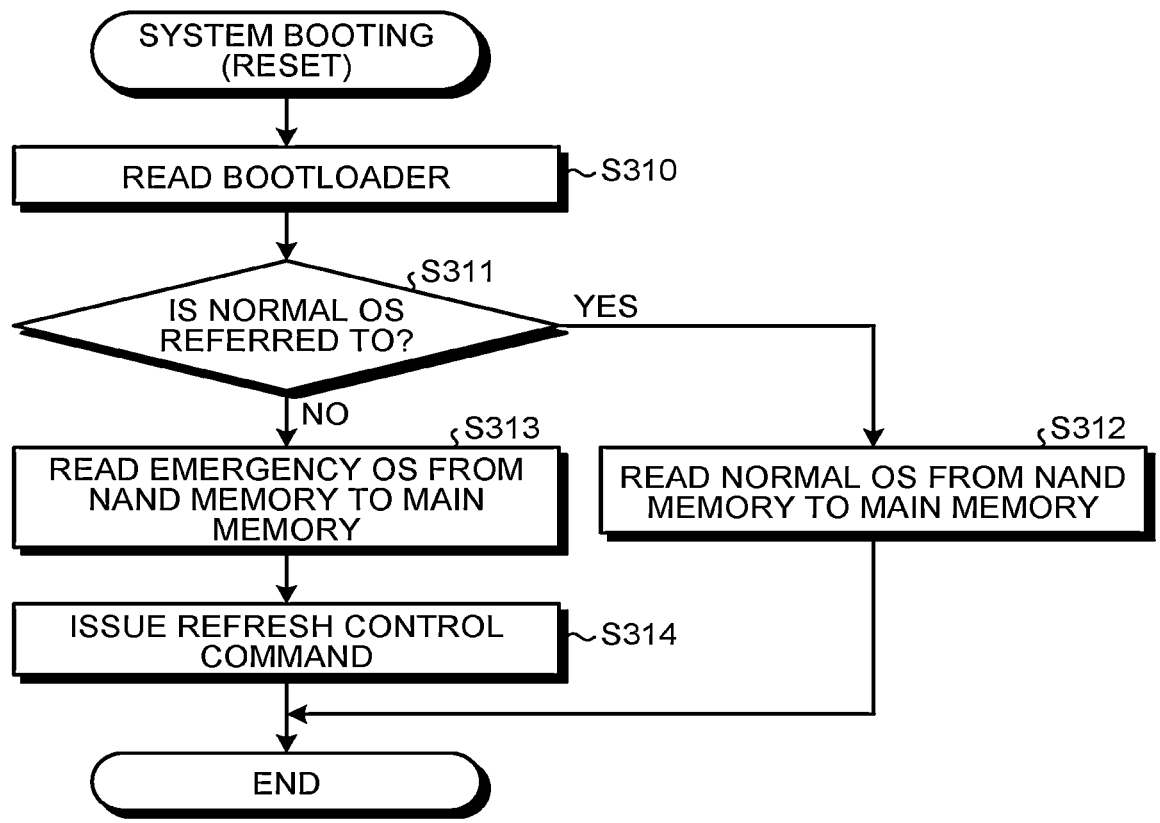
FIG. 54 is a flowchart illustrating another operation procedure at the time of booting the computer system.

FIG. 54 illustrates an operation when the emergency OS 100B issues the refresh control command. In this case, as explained in FIG. 41, at the time of booting the system, the CPU 4 reads the bootloader 300 including the OS pointer information OSPT from the NAND memory 16 of the SSD 2 (Step S310) and specifies LBA indicated by the OS pointer information OSPT. Then, the CPU 4 reads the OS specified by the OS pointer information OSPT from the SSD 2 by transmitting a read instruction to the specified LBA to the SSD 2. When the LBA indicated by the OS pointer information OSPT specifies the area 16D that is a memory area for the normal OS 100A (Step S311: Yes), the normal OA 100A is read from the area 16D and is written in the area 6A in the main memory 6 (Step S312) and, when the LBA indicated by the OS pointer information OSPT specifies the area 16E that is a memory area for the emergency OS 100B (Step S311: No), the emergency OA 100B is read from the area 16E and is written in the area 6A in the main memory 6 (Step S313). When the emergency OA 100B is booted, the emergency OA 100B transmits the refresh control command to the SSD 2 (Step S314).

In such a manner, in the fifth embodiment, the control tool controls to inhibit or prohibit the write processing in the background in the SSD 2, such as the refresh processing, in the lifespan-reached processing, so that the reliability degradation of the SSD can be suppressed.

Sixth Embodiment

In the first embodiment, the control tool 200 periodically obtains the statistical information as shown in FIG. 33 and performs the lifespan-reached processing when the SSD 2 has reached (approached) its EOL or immediately after the SSD 2 has reached its EOL. The control tool 200 may predict the lifespan of the SSD 2 on the basis of the obtained statistical information and notify a user thereof through the display 9, which will be explained below.

When the control tool 200 periodically obtains the statistical information according to the processing procedure shown in FIG. 33, the control tool 200 appends the obtained data to the main memory 6, for example, in the format shown in FIG. 55 as time-series data on the statistical information. The statistical information time-series data may be periodically backed up in a nonvolatile memory device such as the SSD 2. Moreover, with respect to the statistical information time-series data, old data may be erased every time the latest data is appended.

Figure 56:
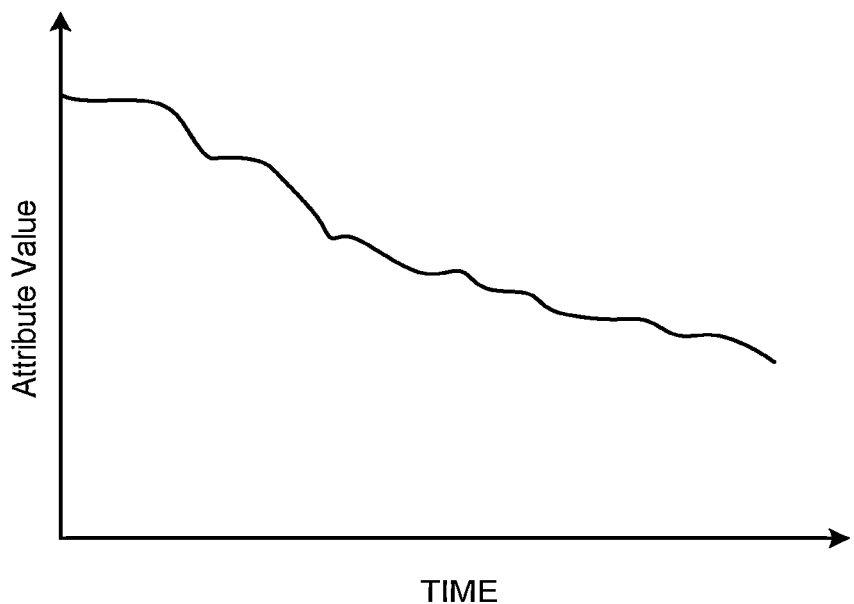
FIG. 56 is a diagram illustrating temporal change of the statistical information.

Moreover, the control tool 200 may graphically display the statistical information time-series data in the main memory 6 to a user through the display 9, for example, in the display format shown in FIG. 56.

Figure 57:
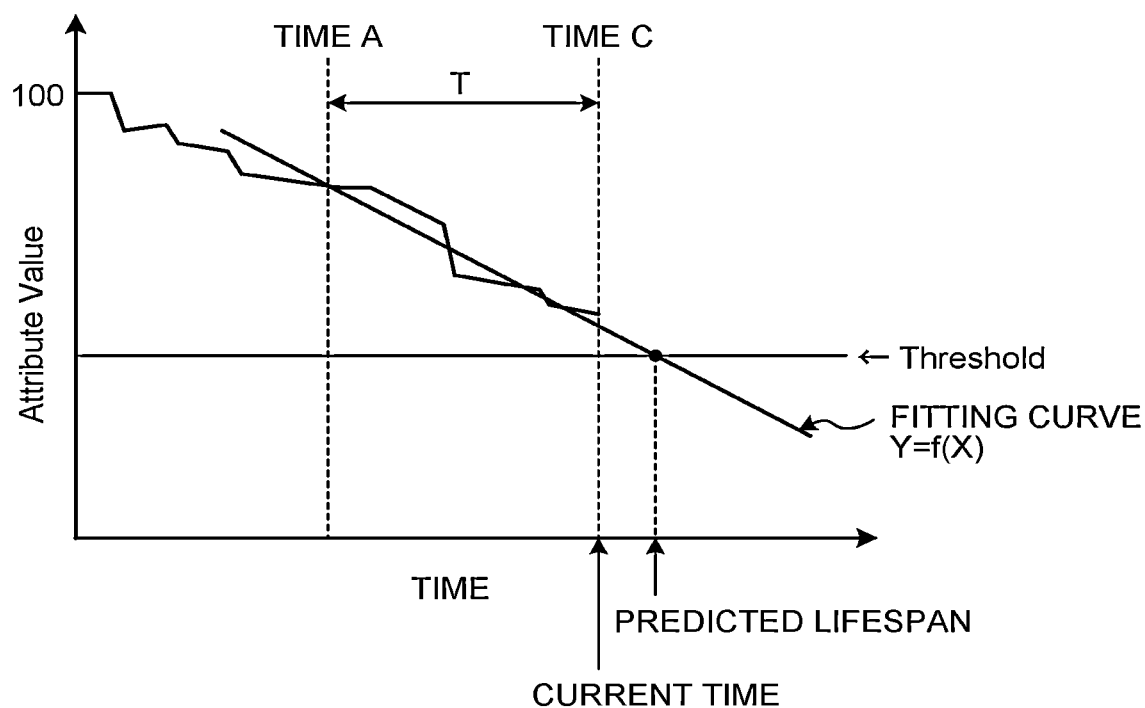
FIG. 57 is a diagram conceptually illustrating processing of obtaining a predicted lifespan on the basis of temporal change of the statistical information.

In the present embodiment, the lifespan prediction for the SSD 2 is performed based on this statistical information time-series data. As shown in FIG. 57, the control tool 200 obtains a fitting function $Y=f(X)$ by using all of data at $(X,Y)$ in the period from the time A at a predetermined time period T before the current time to the time C as the current time, where a variable Y is Attribute Value of a certain Attribute ID and a variable X is the time. In other words, a predicted value of Y is obtained from X by using the fitting function $f(X)$. There are various methods for deriving f. For example, f may be determined by defining $f(X)=aX+b$ using a parameter a and a parameter b and obtaining a and b by using the least-squares method for all of data at $(X,Y)$ in the period from the time A to the time C.

Then, $f^{-1}(Y)$, which is an inverse function of $f(X)$, is obtained. When $f(X)=aX+b$, $f^{-1}(Y)=(Y-b)/a$ is obtained. The predicted lifespan reached time of the SSD 2 is $f^{-1}$ (Y=Threshold). It is also possible to obtain a fitting function $X=g(Y)$ with respect to all the data at $(X,Y)$ from the time A to the time C and set the predicted lifespan reached time of the SSD 2 as g (Y=Threshold). Moreover, $f(X)$ and $g(Y)$ may be fit to the function, such as a quadratic function, other than a linear function.

In the present embodiment, the lifespan is predicted by using Attribute Value $(=Y)$ and Threshold of S.M.A.R.T, however, it is also possible to obtain $f(X)$ and $g(Y)$ by using Raw Value, which is raw data, as Y and set the predicted lifespan reached time as $f^{-1}(Y=RMAX)$ or $g(Y=RMAX)$, or $f^{-1}(Y=RMIN)$ or $g(Y=RMIN)$. Moreover, the lifespan may be predicted based on the statistical information obtained by using a method other than the SMART information.

Figure 58:
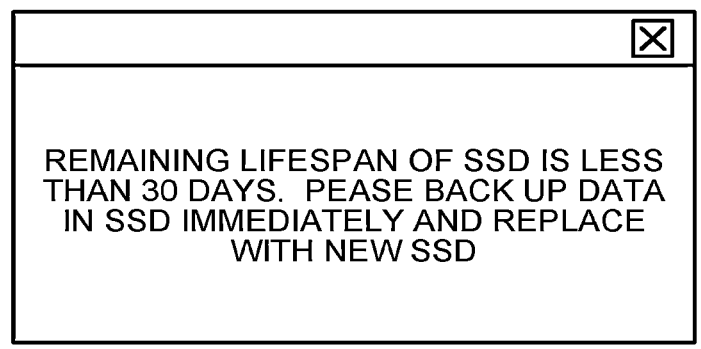
FIG. 58 is a diagram illustrating a guide screen example to a user when the SSD has reached the end of its lifespan.

The control tool 200 notifies a user of the predicted lifespan reached time obtained in such a manner through the display 9. As a notification method, for example, a text such as "predicted lifespan reached time: 09/09/1999" may be displayed or, as shown in FIG. 58, a warning screen such as "Remaining lifespan of SSD is less than 30 days. Pease back up data in SSD immediately and replace with new SSD" may be displayed. Alternatively, the color of an icon displayed on the display may be changed such as by changing the color of an icon of the control tool 200 when the remaining lifespan of an SSD becomes less than a predetermined number of days.

Seventh Embodiment

In the first embodiment, as shown in FIG. 42, a function of backing up data in the SSD 2 in the backup memory device 150 when the normal OS 100A and the emergency OS 100B are stored in the NAND memory 16 of the SSD 2 is explained. When the control tool 200 rewrites the bootloader 300 (Step S230 in FIG. 38) as the lifespan-reached processing (Step S205 in FIG. 33) and uses the LBA-by-LBA backup described above as a backup function, it is desirable that the bootloader which was copied to the backup memory device 150 by the backup processing is restored to a state of the bootloader 300 of the SSD 2 before the lifespan-reached processing so that the normal OS 100A is normally booted when the computer system 1 is turned after the SSD 2 as an old system drive is disconnected from the host apparatus 3 and the backup memory device 150 as a new system drive is connected to the host apparatus 3. In the present embodiment, a method of rewriting the bootloader in the backup memory device 150 at the time of a backup operation is explained.

Figure 59:
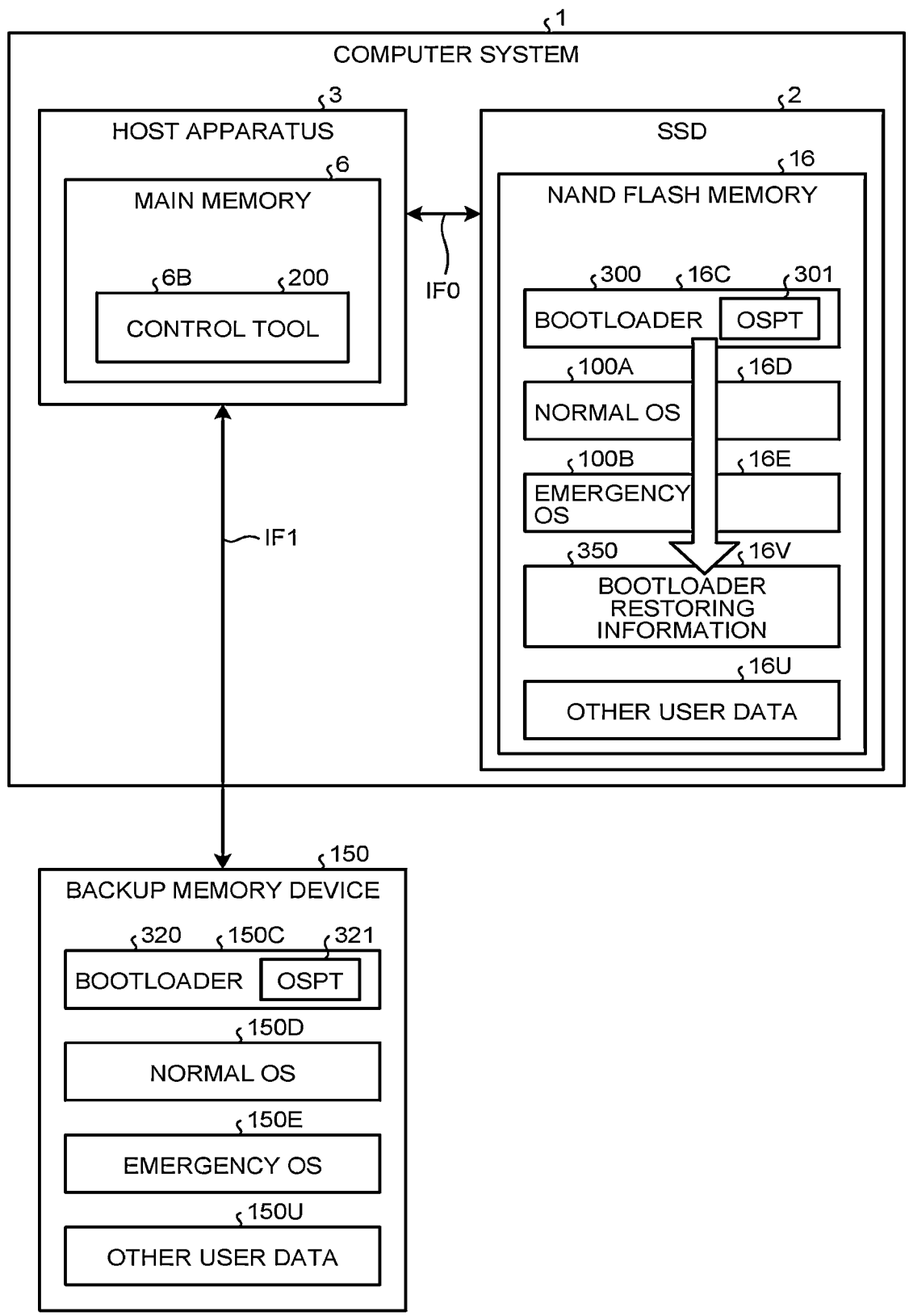
FIG. 59 is a block diagram illustrating a function configuration example of the computer system when performing restoring processing on a bootloader.

FIG. 59 illustrates a function configuration of the computer system 1 and the backup memory device 150 before or after a backup operation. In a restoring bootloader area 16V in the NAND memory 16 of the SSD 2, bootloader restoring information 350 for restoring the bootloader 300 to a state before rewriting by the control tool 200 is stored. The area 16V may be allocated by the control tool 200 at the time of the lifespan-reached processing, allocated at the time of activating the control tool 200, or allocated when the control tool 200 is installed in the SSD 2. LBA is allocated to the allocated area 16V by the management information 45 (see FIG. 22) in the SSD 2.

Figure 60:
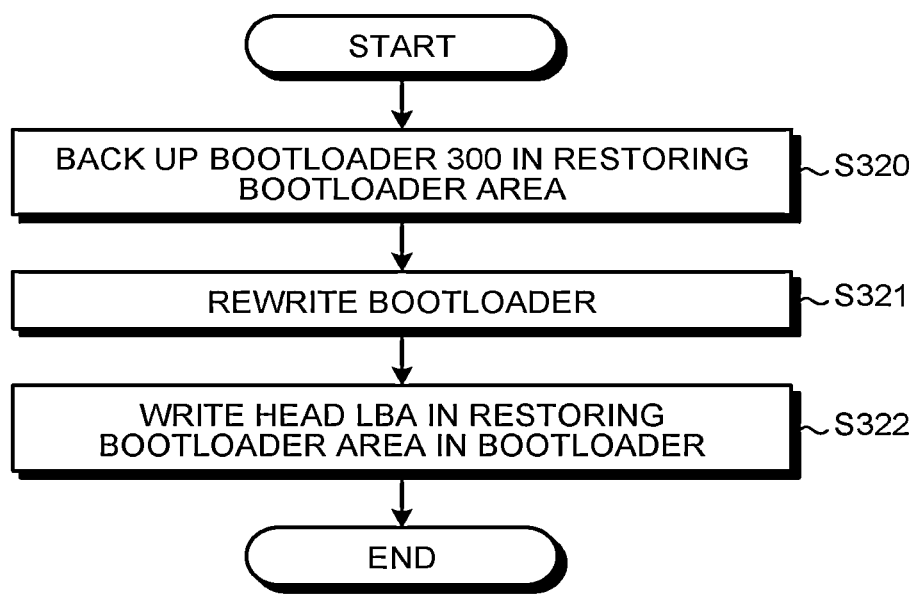
FIG. 60 is a flowchart illustrating an operation procedure of the restoring processing on the bootloader in the lifespan-reached processing.

FIG. 60 illustrates an operation procedure of the lifespan-reached processing according to the present embodiment. In the lifespan-reached processing, the backup memory device 150 may not be connected to the host apparatus 3. In the lifespan-reached processing, i.e., before changing the bootloader 300, the control tool 200 writes backup information of the bootloader 300, i.e., the bootloader restoring information 350 in the restoring bootloader area 16V (Step S320). As the information to be written in the area 16V, for example, all of the data (image) on the bootloader 300 stored in the area 16C may be directly copied or difference information between the data of boot loader 300 and the new data which will be written into the area 16C may be recorded in the area 16V.

Figures 61, 62:
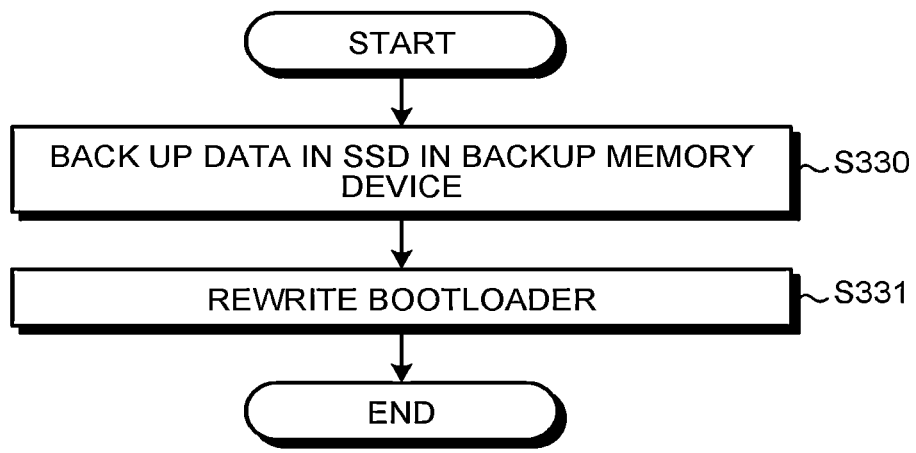
FIG. 61 is a diagram illustrating a rewrite difference log of the bootloader.
FIG. 62 is a flowchart illustrating a backup operation procedure by the emergency OS.

In the case of recording the difference information in the area 16V, for example as shown in FIG. 61, it is possible to use a rewrite difference log, in which a correspondence relationship between data before rewriting and rewritten LBA is recorded, as the difference information. When the rewrite difference log is employed, the control tool 200 writes rewritten LBA in the bootloader 300 stored in the area 16C to "rewritten LBA" of the rewritten difference log and writes data before rewriting of the same LBA to "data before rewriting" of the rewrite difference log. For example, when a logical sector, which is a minimum unit of LBA, is 512 bytes, one element of the "data before rewriting" of the rewrite difference log may be data of 512 bytes or data other than 512 bytes obtained by compressing or performing reversible transformation on the data before rewriting. When the bootloader 300 is restored from a new bootloader to an old bootloader by using the rewrite difference log, the bootloader 300 is restored to an old bootloader by writing the "data before rewriting" to LBA indicated by the "rewritten LBA" of the rewrite difference log with respect to the area 16C.

Thereafter, the control tool 200 rewrites the bootloader 300 so that the emergency OS 100B is read to the main memory 6 instead of the normal OS 100A when the computer system 1 is booted from the next time in the similar manner to that explained in the first embodiment (Step S321).

In order to facilitate searching the restoring bootloader area 16V at the time of a backup operation which will be described later, it is desirable that the control tool 200 writes the head LBA (the start LBA) of the restoring bootloader area 16V in the bootloader area 16C in advance (Step S322).

It is not necessarily needed to write the head LBA of the restoring bootloader area 16V in the bootloader area 16C, and the area 16V may be specified by writing a specific data pattern in the head of the area 16V in advance and searching for this specific data pattern at the time of backup which will be described later, may be specified by fixedly associating the area 16V with predetermined specific LBA and accessing the specific LBA at the time of backup which will be described later, or may be specified by other methods.

After Step S321, the computer system 1 may be rebooted in the similar manner to the first embodiment or the refresh control command of the SSD 2 may be transmitted in the similar manner to the fifth embodiment. Moreover, the restoring bootloader area 16V may be stored in a memory device other than the SSD 2.

FIG. 62 illustrates a backup operation by the emergency OS 100B. At the time of backup, when the backup memory device 150 is not connected to the host apparatus 3, a user connects the backup memory device 150 to the host apparatus 3. At this time, the control tool 200 may display a message "Please connect backup device" to a user on the display 9.

The emergency OS loaded into the area 6A in the main memory 6 from the area 16E in the NAND memory 16 copies data in the SSD 2 to the backup memory device 150 in the similar manner to the first embodiment (Step S330). For example, as a backup method, when LBA-by-LBA backup is employed and all the LBA areas of the SSD 2 are copied to the backup memory device 150, the normal OS 100A stored in the area 16D is copied to an area 150D in the backup memory device 150 and other user data stored in an area 16U is copied to an area 150U. The bootloader 300 stored in the bootloader area 16C may be copied to an area 100C in the backup memory device 150 or may not be copied. The emergency OS 100B stored in the area 16E may be copied to an area 150E in the backup memory device 150 or may not be copied. Moreover, the bootloader restoring information 350 stored in the restoring bootloader area 16V may not be copied to the backup memory device 150.

The emergency OS 100B generates a bootloader 320 to be stored in the backup memory device 150 on the basis of the bootloader restoring information 350 and data on the bootloader 300 and writes the generated bootloader 320 to an area 150C of the backup memory device 150 so that the normal OS 100A is loaded into the area 6A in the main memory 6 when the bootloader 320 is loaded at the time of booting the computer system 1 from the next time (Step S331).

In the backup processing of the bootloader in Step S320 in FIG. 60, when data (image) on the bootloader 300 stored in the area 16C is directly copied to the restoring bootloader area 16V, in Step S331 in FIG. 62, the bootloader restoring information 350 in the restoring bootloader area 16V may be directly copied to the area 150C in the backup memory device 150.

Moreover, in the backup processing of the bootloader in Step S320 in FIG. 60, in the case where the rewrite difference information in the bootloader area 16C is recorded in the restoring bootloader area 16V, specifically, in the case where the rewrite difference information on the old and new bootloader data when the bootloader area 16C is rewritten from the old bootloader data to the new bootloader data is recorded in the restoring bootloader area 16V, in Step S331 in FIG. 62, the emergency OS 100B reads data (new bootloader data) in the bootloader area 16C and the bootloader restoring information 350, which is difference data stored in the restoring bootloader area 16V, to the main memory 6, restores the new bootloader data to the old bootloader data on the basis of the bootloader restoring information 350, and writes the restored old bootloader data to the area 150C in the backup memory device 150.

After performing the above backup processing, when the computer system 1 is booted in a state where the SSD 2 that has reached the end of its lifespan is separated from the host apparatus 3 by removing the SSD 2 from an IF0 and the backup memory device 150 is connected to the host apparatus 3 by connecting the backup memory device 150 to an IF1, the host apparatus 3 reads the bootloader 320 in the backup memory device 150 and the host apparatus 3 loads the area 150D in the backup memory device 150 to the area 6A in the main memory 6 on the basis of the information on the bootloader 320, so that the normal OS is booted. When the backup memory device 150 corresponds to the interface IF0, the backup memory device 150 may be replaced by the SSD 2 and the backup memory device 150 may be connected to the interface IF0. When the backup memory device 150 does not correspond to the interface IF0, the backup memory device 150 may be replaced by the SSD 2 and the backup memory device 150 may be connected to the interface IF0 via an interface converter.

In such a manner, even when the SSD 2 has reached its EOL, the computer system 1 can restore user data and the normal OS stored in the SSD 2 in the backup memory device, and a user can replace the SSD 2 with the backup memory device 150 without performing extra setting and reinstalling the normal OS and use the backup memory device 150 as a system drive instead of the SSD 2.

Eighth Embodiment

In the present embodiment, when the host apparatus to which the SSD 2 is connected is booted after the SSD 2 is restored to a normal state (healthy state) from an abnormal state (lifespan reached state), the normal OS is controlled to be booted instead of the emergency OS.

As the statistical information, for example, in the case of employing a parameter that indicates that the reliability becomes worse as the value thereof becomes larger and has characteristics capable of restoring to a normal value again even after increasing to a value adversely affecting the reliability, such as the current temperature X20 and the highest temperature X21, for example, RMAX=85° C. is employed as RMAX with respect to these statistical information, and the control tool 200 rewrites the bootloader 300 when the condition, in which the temperature falls outside an operation guarantee temperature such as when (value of statistical information)>RMAX or (value of statistical information)≥RMAX, is satisfied, so that the emergency OS 100B is controlled to be read to the main memory 6 instead of the normal OS 100A when the computer system 1 is booted from the next time.

The emergency OS 100B monitors a value of the statistical information after being booted, and rewrites the bootloader 300 when (value of statistical information)≤(RMAX−MAX margin) or (value of statistical information)< (RMAX−MAX margin) is satisfied and the statistical information returns to a normal value again, thereby performing bootloader restoring processing of causing the normal OS 100A to be read to the main memory 6 instead of the emergency OS 100B when the computer system 1 is booted from the next time.

The MAX margin is a value of zero or larger, however, it is desirable that the MAX margin is a value larger than zero for preventing rewriting of the bootloader 300 from being made frequently. When the statistical information is the current temperature or the highest temperature, for example, the MAX margin is set to be equal to 5° C. When the SMART information is used for obtaining the statistical information and determining the conditions, Attribute Value and Threshold may be used or Raw Value and RMAX may be used. Moreover, when the statistical information is restored to a normal state from an abnormal state during boot up of the normal OS, the above bootloader restoring processing may be performed by the control tool 200.

As the statistical information, in the case of using a parameter that indicates that the reliability becomes worse as the value thereof becomes smaller and has characteristics capable of restoring to a normal value again even after decreasing to a value adversely affecting the reliability, such as the current temperature X20 and the lowest temperature X22, RMIN=−10° C. is employed as RMIN, and the control tool 200 rewrites the bootloader 300 when the condition, in which the temperature falls outside, for example, an operation guarantee temperature such as when (value of statistical information)<RMIN or (value of statistical information) ≤RMIN, is satisfied, so that the emergency OS 100B is controlled to be read to the main memory 6 instead of the normal OS 100A when the computer system 1 is booted from the next time.

The emergency OS 100B monitors a value of the statistical information after being booted, and rewrites the bootloader 300 when (value of statistical information)≥(RMIN+MIN margin) or (value of statistical information)>(RMIN+MIN margin) is satisfied and the statistical information returns to a normal value again, thereby performing the bootloader restoring processing of causing the normal OS 100A to be read to the main memory 6 instead of the emergency OS 100B when the computer system 1 is booted from the next time.

The MIN margin is a value of zero or larger, however, it is desirable that the MIN margin is a value larger than zero for preventing rewriting of the bootloader 300 from being made frequently. When the statistical information is the current temperature or the lowest temperature, for example, the MIN margin is set to be equal to 5° C. When the SMART information is used for obtaining the statistical information and determining the conditions, Attribute Value and Threshold may be used or Raw Value and RMIN may be used.

Figure 63:
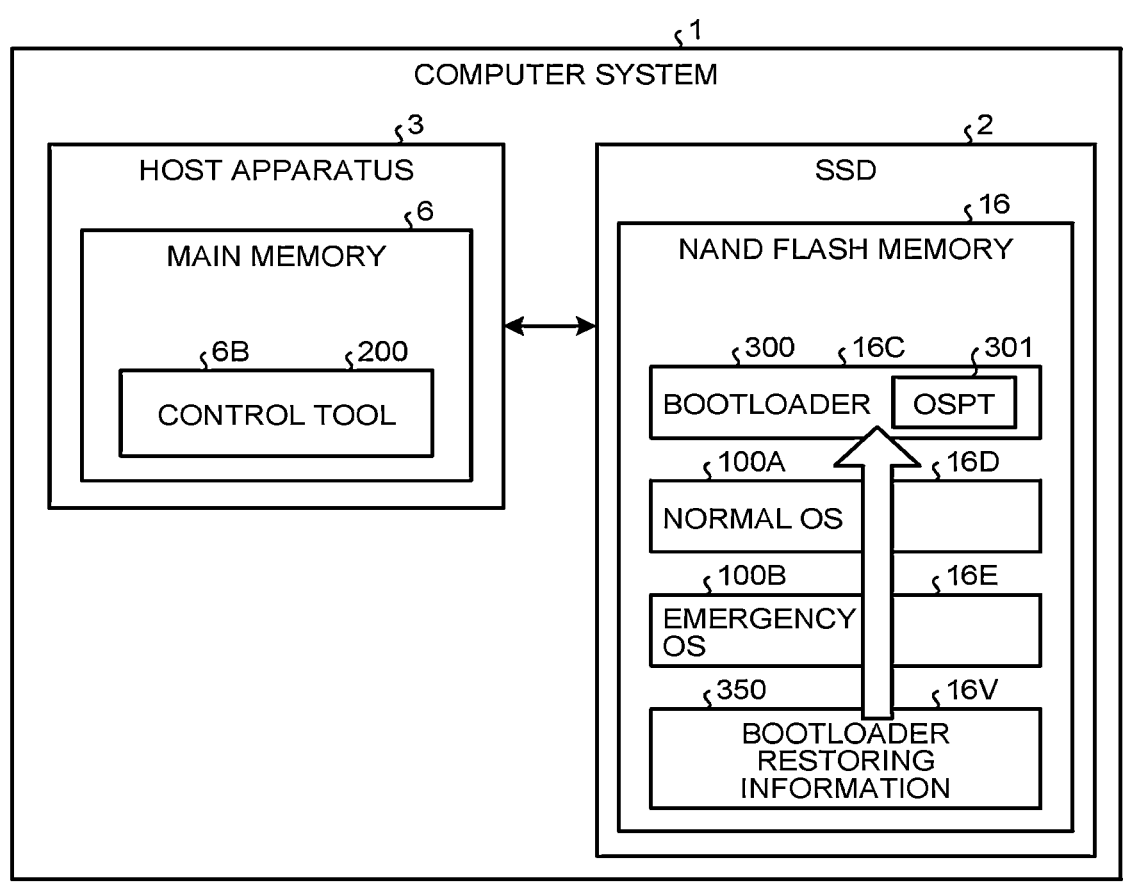
FIG. 63 is a block diagram illustrating a function configuration example of the computer system when performing the restoring processing on the bootloader.

Next, the operation of the control tool 200 in the lifespan-reached processing will be explained in detail. When the bootloader 300 is restored to a normal state (healthy state) from an abnormal state (lifespan reached state), it is desirable that the bootloader 300 is restored to a bootloader before being rewritten in the lifespan-reached processing by the above bootloader restoring processing. FIG. 63 illustrates a function configuration of the computer system 1 before and after the bootloader restoring processing. In the restoring bootloader area 16V in the NAND memory 16 of the SSD 2, the bootloader restoring information 350 for restoring the bootloader 300 to a state before rewriting by the control tool 200 is stored. The area 16V may be allocated by the control tool 200 at the time of the lifespan-reached processing, allocated at the time of activating the control tool 200, or allocated when the control tool 200 is installed in the SSD 2. LBA is allocated to the allocated area 16V by the management information 45 (see FIG. 22) in the SSD 2. Moreover, the area 16V in the present embodiment may be used for restoring a bootloader at the time of backup as an area same as the area 16V shown in FIG. 59 or may be an area different from the area 16V shown in FIG. 59.

The procedure of the lifespan-reached processing is similar to that shown in FIG. 60. Specifically, the control tool 200 writes backup information for the bootloader 300, i.e., the bootloader restoring information 350 in the restoring bootloader area 16V in the lifespan-reached processing (Step S320). As the information to be written in the area 16V, for example, data (image) on the bootloader 300 stored in the area 16C may be directly copied or rewrite difference information on the bootloader may be recorded. Thereafter, the control tool 200 rewrites the bootloader 300 so that the emergency OS 100B is read to the main memory 6 instead of the normal OS 100A when the computer system 1 is booted from the next time (Step S321).

Furthermore, in order to facilitate searching the restoring bootloader area 16V at the time of a backup operation which will be described later, it is desirable that the control tool 200 writes the head LBA of the restoring bootloader area 16V in the bootloader area 16C in advance (Step S322). It is not necessarily needed to write the head LBA of the restoring bootloader area 16V in the bootloader area 16C, and the area 16V may be specified by writing a specific data pattern in the head of the area 16V and searching for this specific data pattern at the time of backup which will be described later, may be specified by fixedly associating the area 16V with predetermined specific LBA and accessing the specific LBA at the time of backup which will be described later, or may be specified by other methods.

After Step S321, the computer system 1 may be rebooted in the similar manner to the first embodiment or the refresh control command of the SSD 2 may be transmitted in the similar manner to the fifth embodiment. Moreover, the restoring bootloader area 16V may be stored in a memory device other than the SSD 2.

Figure 64:
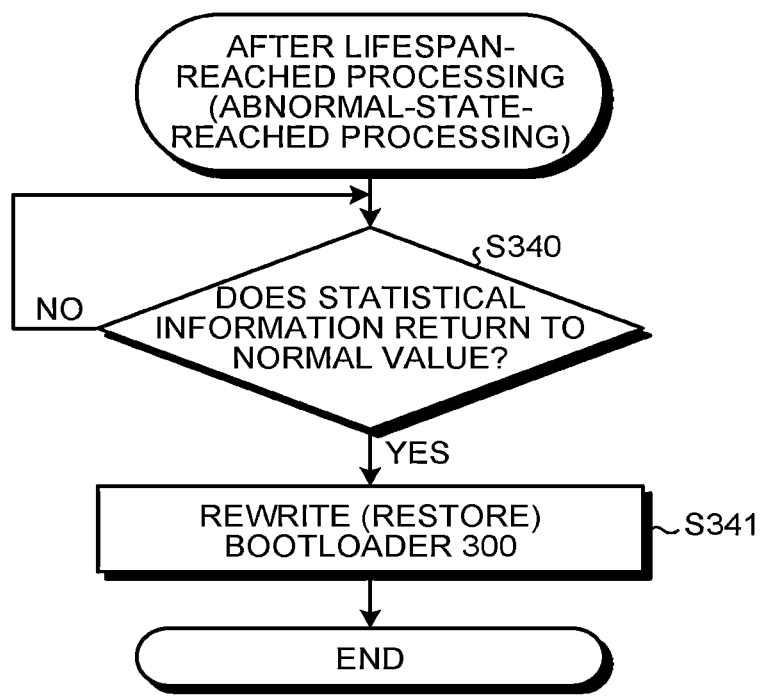
FIG. 64 is a flowchart illustrating an operation procedure of the bootloader restoring processing by the emergency OS.

FIG. 64 illustrates the bootloader restoring processing by the emergency OS 100B. After the lifespan-reached processing (after abnormal-state processing), when the computer system 1 is booted by using the emergency OS, the emergency OS 100B monitors the statistical information by using, for example, SMART READ DATA described above and determines whether the statistical information returns to a normal value (Step S340). When the statistical information returns to a normal value on the basis of the above-described determination reference (Step S340: Yes), the emergency OS 100B generates a bootloader that processes to load the normal OS 100A into the area 6A in the main memory 6 on the basis of the bootloader restoring information 350 stored in the restoring bootloader area 16V and data on the bootloader 300 stored in the bootloader area 16C and writes the generated bootloader to the bootloader area 16C (Step S341). Consequently, when the bootloader 300 is loaded at the time of booting the computer system 1 from the next time, the normal OS 100A is loaded into the area 6A in the main memory 6.

In the backup processing of the bootloader in Step S320 in FIG. 60, when data (image) on the bootloader 300 stored in the area 16C is directly copied to the restoring bootloader area 16V, in Step S341 in FIG. 64, the bootloader restoring information 350 in the restoring bootloader area 16V may be directly copied to the area 150C in the backup memory device 150.

Moreover, in the backup processing of the bootloader in Step S320 in FIG. 60, in the case where the rewrite difference information in the bootloader area 16C is recorded in the restoring bootloader area 16V, specifically, in the case where the rewrite difference information on the old and new bootloader data when the bootloader area 16C is rewritten from the old bootloader data to the new bootloader data is recorded in the restoring bootloader area 16V, in Step S341 in FIG. 64, the emergency OS 100B reads data (new bootloader data) in the bootloader area 16C and the bootloader restoring information 350, which is difference data stored in the restoring bootloader area 16V, to the main memory 6, restores the new bootloader data to the old bootloader data on the basis of the bootloader restoring information 350, and writes the restored old bootloader data to the area 150C in the backup memory device 150.

Figure 65:
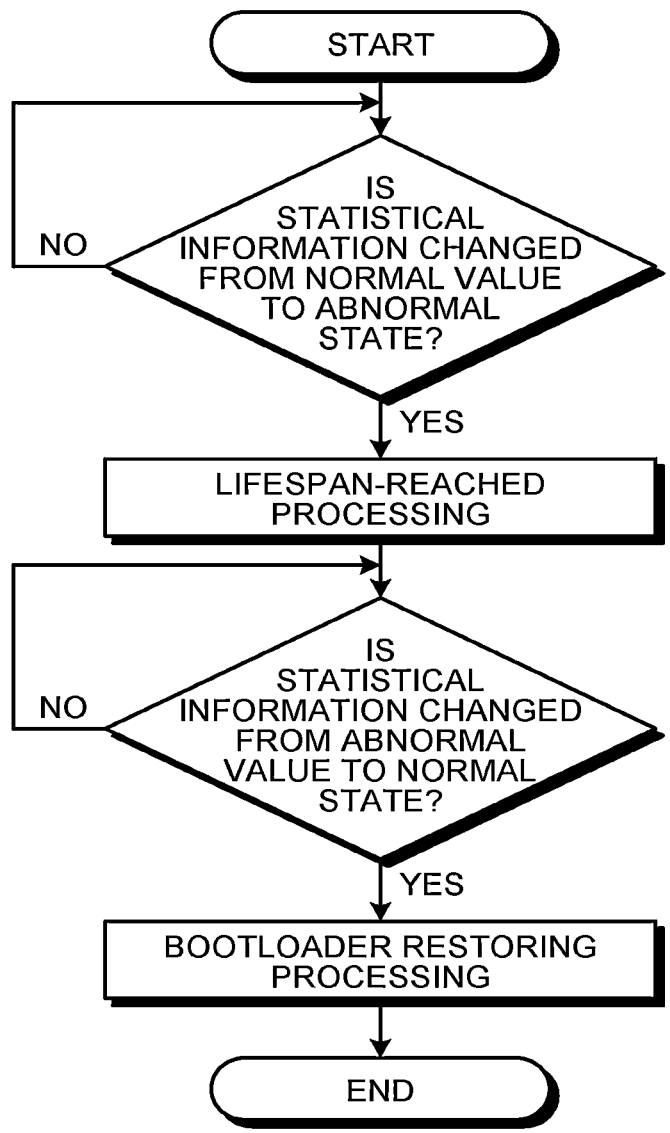
FIG. 65 is a flowchart illustrating an entire operation procedure in an eighth embodiment.

In such a manner, in the present embodiment, as shown in FIG. 65, when the statistical information suggests that the SSD 2 changes to an abnormal state from a normal state, the abnormal-state-reached processing of operating to boot the abnormal-state OS is performed, and, when the statistical information suggests that the SSD 2 returned to a normal state from an abnormal state, the bootloader restoring processing of operating to boot the normal OS is performed.

In such a manner, even when the SSD 2 temporarily enters an abnormal state, after the SSD 2 is restored to a normal state (healthy state), the computer system 1 boots the normal OS, so that a user can use the SSD 2 in the same way as that before the lifespan-reached processing without performing extra setting and reinstalling the normal OS.

Ninth Embodiment

Figure 66:
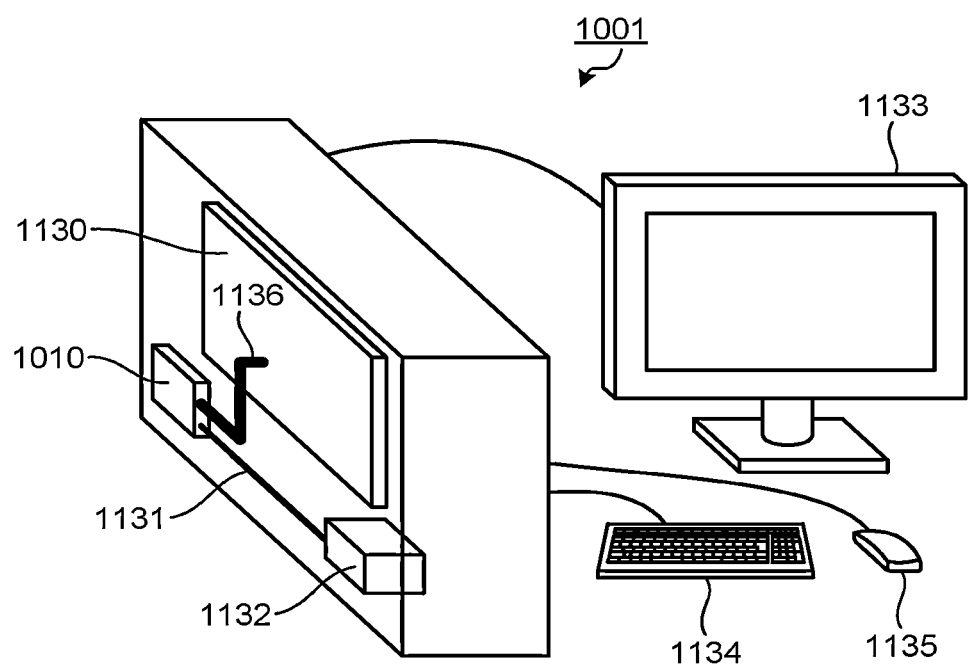
FIG. 66 is a diagram illustrating an appearance configuration of a computer system.

FIG. 66 illustrates an appearance configuration of a computer system 1001 that is an information processing apparatus on which an external memory device is mounted. FIG. 66 illustrates the configuration of the general desktop personal computer 1001. An SSD 1010, which is an external memory device, is connected to a power circuit 1132 via a power cable 1131 to supply power. The SSD 1010 is physically connected to a mother board 1130 via a SATA (Serial Advanced Technology Attachment) cable 1136 so as to be able to communicate with the mother board 1130. Communication via the SATA cable 1136 conforms to the SATA standard. A CPU and the like (not shown) are mounted on the mother board 1130. A display 1133, a keyboard 1134, a mouse 1135, and the like are connected to the mother board 1130. The computer system is not limited to a desktop personal computer and a laptop or notebook personal computer is also applicable.

An equipment system (host 1100), on which an external memory device is mounted, may be an imaging apparatus such as a still camera and a video camera, a game machine, a car navigation system, or the like. Instead of the SSD 1010, it is possible to use other external memory devices such as a hard disk drive (HDD) and a hybrid hard disk drive (hybrid HDD). Moreover, the connection standard used between the SSD and the computer may be other interface standards other than the SATA standard, such as the USB (Universal Serial Bus) standard, PCI Express standard, or Serial Attached SCSI (SAS) standard.

Figure 67:
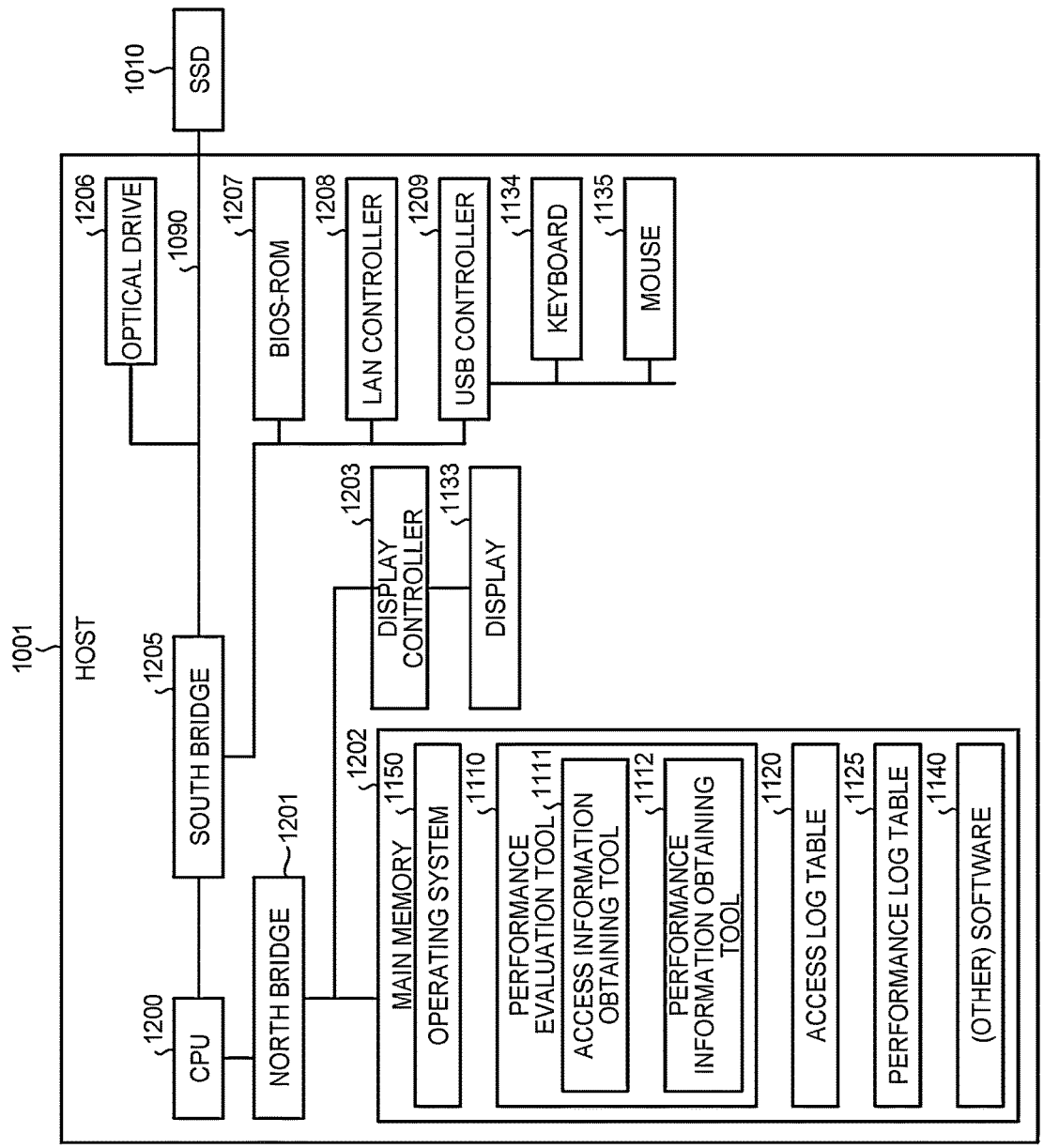
FIG. 67 is a block diagram illustrating a function configuration example of a host in a ninth embodiment.

FIG. 67 illustrates a system configuration example of the host 1100 on which the SSD 1010 is mounted. The host 1100 includes a CPU 1200, a north bridge 1201, a main memory 1202 such as a DRAM, SRAM and an MRAM, a display controller 1203, the display 1133, a south bridge 1205, an optical drive 1206, a BIOS-ROM 1207, a LAN controller 1208, a USB controller 1209, the keyboard 1134, the mouse 1135, and the like.

The CPU 1200 is a processor provided for controlling an operation of the host 1100, and executes an operating system (OS) loaded in the main memory 1202 from the SSD 1010. Furthermore, when the optical drive 1206 is capable of executing at least one of read processing and write processing on a loaded optical disk, the CPU 1200 executes the processing.

Moreover, the CPU 1200 executes a system BIOS (Basic Input Output System) stored in the BIOS-ROM 1207. The system BIOS is a program for controlling the hardware in the host 1100.

The north bridge 1201 is a bridge device connected to a local bus of the CPU 1200. A memory controller for performing access control of the main memory 1202 is built in the north bridge 1201. Moreover, the north bridge 1201 has a function of, for example, performing communication with the display controller 1203.

The main memory 1202 temporarily stores therein a program and data and functions as a work area of the CPU 1200. The main memory 1202, for example, consists of a DRAM, SRAM or an MRAM. The display controller 1203 is a video reproduction controller for controlling the display 1133 of the computer system.

The south bridge 1205 is a bridge device connected to a local bus of the CPU 1200. The south bridge 1205 controls the SSD 1010, which is a memory device for storing various types of software and data, through an ATA interface 1090.

The host 1100 accesses the SSD 1010 in units of logical sectors. A write command (write request), a read command (read request), a flush command, and the like are input to the SSD 1010 through the ATA interface 1090.

The south bridge 1205 has a function of performing access control of the BIOS-ROM 1207, the optical drive 1206, the LAN controller 1208, and the USB controller 1209. The keyboard 1134 and the mouse 1135 are connected to the USB controller 209.

In FIG. 67, an OS 1150, a performance evaluation tool 1110, an access log table 1120, a performance log table 1125, and software (such as word-processing software, numerical software, game software, and image editing software) 1140 are stored in the SSD 1010 when the power of the computer system is off. When the power of the host is on or these functions are invoked, they are loaded into the main memory 1202 from the SSD 1010. The software 1140 is software other than the performance evaluation tool 1110 and uses the SSD 1010. The performance evaluation tool 1110 is software that performs performance evaluation of the SSD 1010 and includes an access information obtaining tool 1111 and a performance information obtaining tool 1112.

Figure 68:
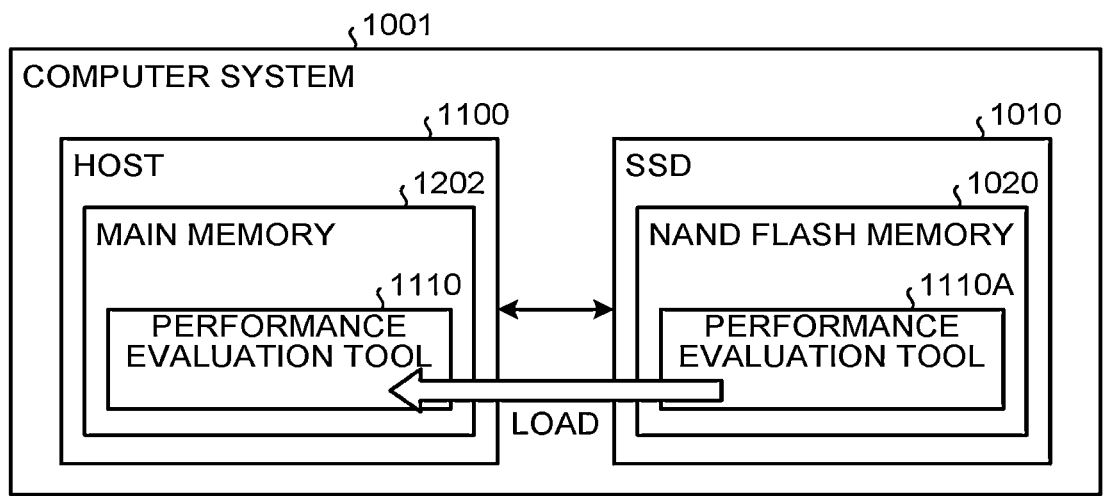
FIG. 68 is a block diagram illustrating a function configuration example of the computer system in a case where a performance evaluation tool is stored in an SSD.

As shown in FIG. 68, for example, when the power of the host 1100 is off, the performance evaluation tool 1110 is stored in a NAND memory 1020 of the SSD 1010 as a performance evaluation tool 1110A, however, when the host 1100 is started or a program is started, the performance evaluation tool 1110A is loaded into the main memory 1202 from the NAND memory 1020. On the other hand, when a plurality of external memory devices is connected to the host 1100, as show in FIG. 69, the performance evaluation tool 1110 may be stored as a performance evaluation tool 1110B in an external memory device 1300 different from the SSD 1010 and the performance evaluation tool 1110B may be loaded into the main memory 1202 from the external memory device 1300 at the time of starting the host 1100 or a program. Especially, when the external memory device 1300 is used as a system drive for storing the OS 1150 and the SSD 1010 is used as a data drive for storing user data such as documents, still image data, and moving image data, it is desirable to store the performance evaluation tool 1110 in the external memory device 1300 as a system drive in terms of clearly distinguishing the roles of the drive 1010 and the drive 1300 from each other, such as in the case of using the external memory device 1300, which is a system drive, as a drive for mainly storing an OS and an application program and using the SSD 1010, which is a data drive, as a drive for storing user data.

Figure 69:
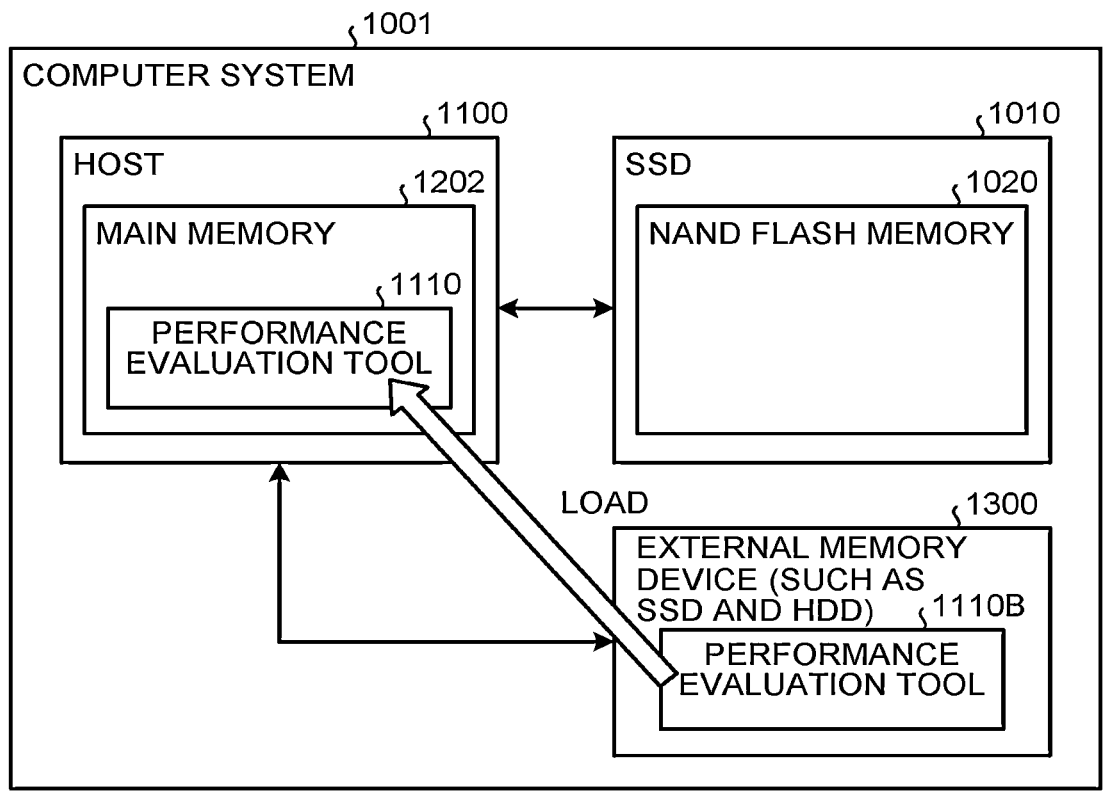
FIG. 69 is a block diagram illustrating a function configuration example of the computer system in a case where the performance evaluation tool is stored in another external memory device.

In terms of saving labor of a user required for setting up the performance evaluation tool, for example as shown in FIG. 68 and FIG. 69, it is desirable that the computer system 1001 is shipped in a state where the performance evaluation tool is stored in the SSD 1010 or the external memory device 1300, arrives in stores, and is handed to a user. On the other hand, in terms of enabling a user to select whether to install the performance evaluation tool and enabling the provision of the latest performance evaluation tool to a user, it is desirable that the performance evaluation tool is capable of being stored in the SSD 1010 or the external memory device 1300 by downloading it from the WEB or installing it from an external storage medium such as a DVD-ROM and a USB memory.

Figure 70:
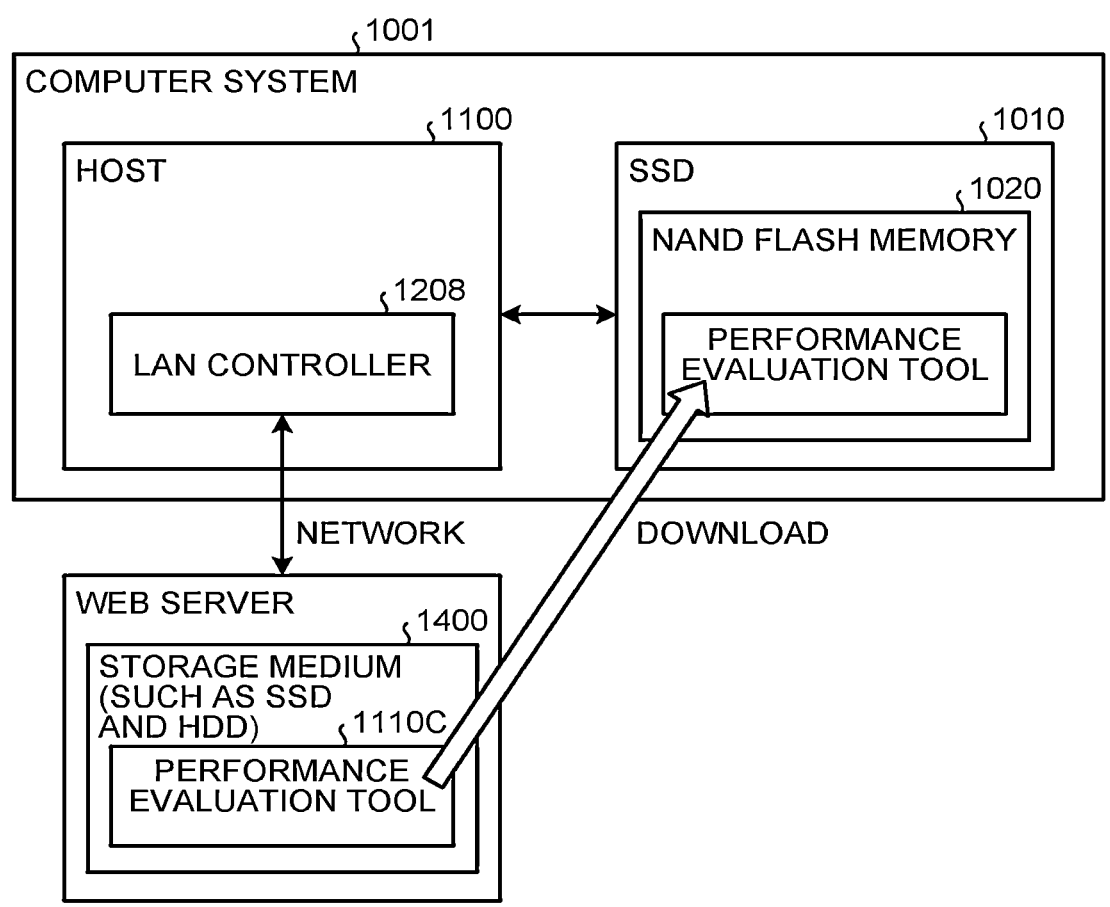
FIG. 70 is a block diagram illustrating a function configuration example of the computer system in a case where the performance evaluation tool is installed from the WEB.

FIG. 70 illustrates an example of a case of downloading the performance evaluation tool from the WEB. In FIG. 70, a performance evaluation tool 1110C is stored in a storage medium 1400 on a WEB server and the performance evaluation tool 1110C is downloaded to the SSD 1010 or the external memory device 1300 via a network, such as the Internet, a local network, and a wireless LAN, for example, through the LAN controller 1208.

Figure 71:
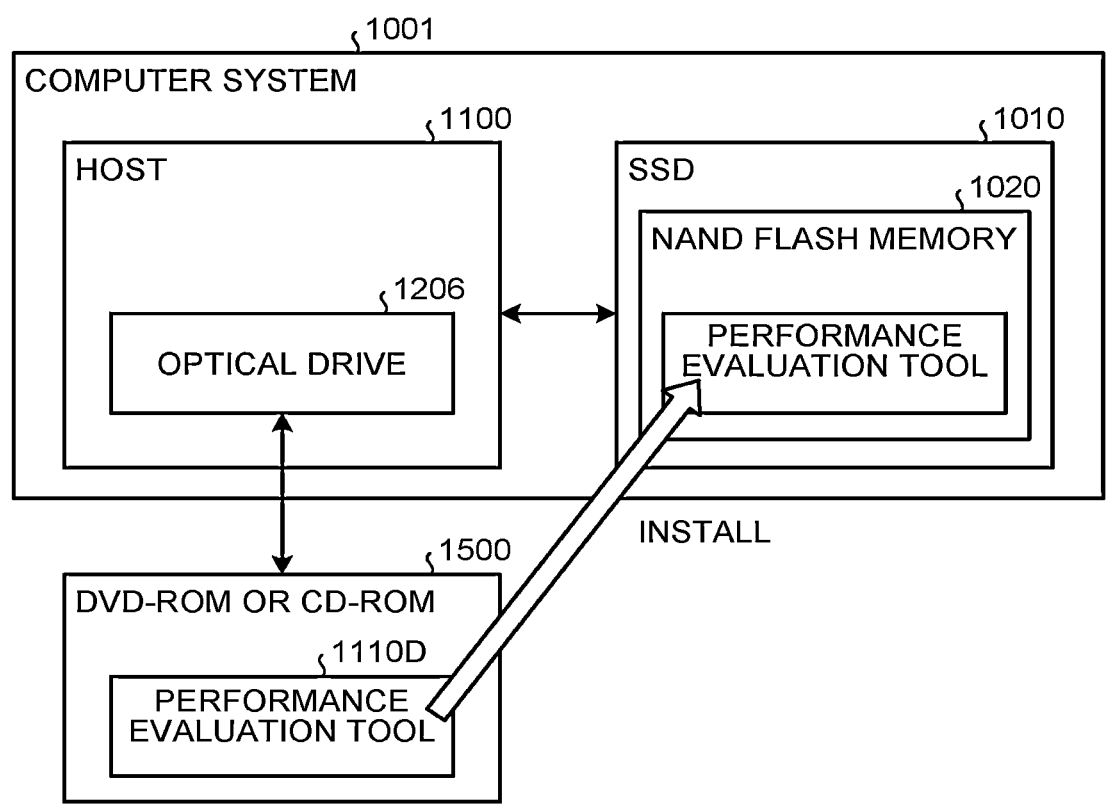
FIG. 71 is a block diagram illustrating a function configuration example of the computer system in a case where the performance evaluation tool is installed from an optical drive.

FIG. 71 illustrates an example of a case of installing the performance evaluation tool from an optical medium such as a DVD-ROM and a CD-ROM. A performance evaluation tool 1110D is stored in an optical medium 1500 such as a DVD-ROM and a CD-ROM and is installed in the SSD 1010 or the external memory device 1300 through the optical drive 1206 by setting the optical medium 1500 in the optical drive 1206.

Figure 72:
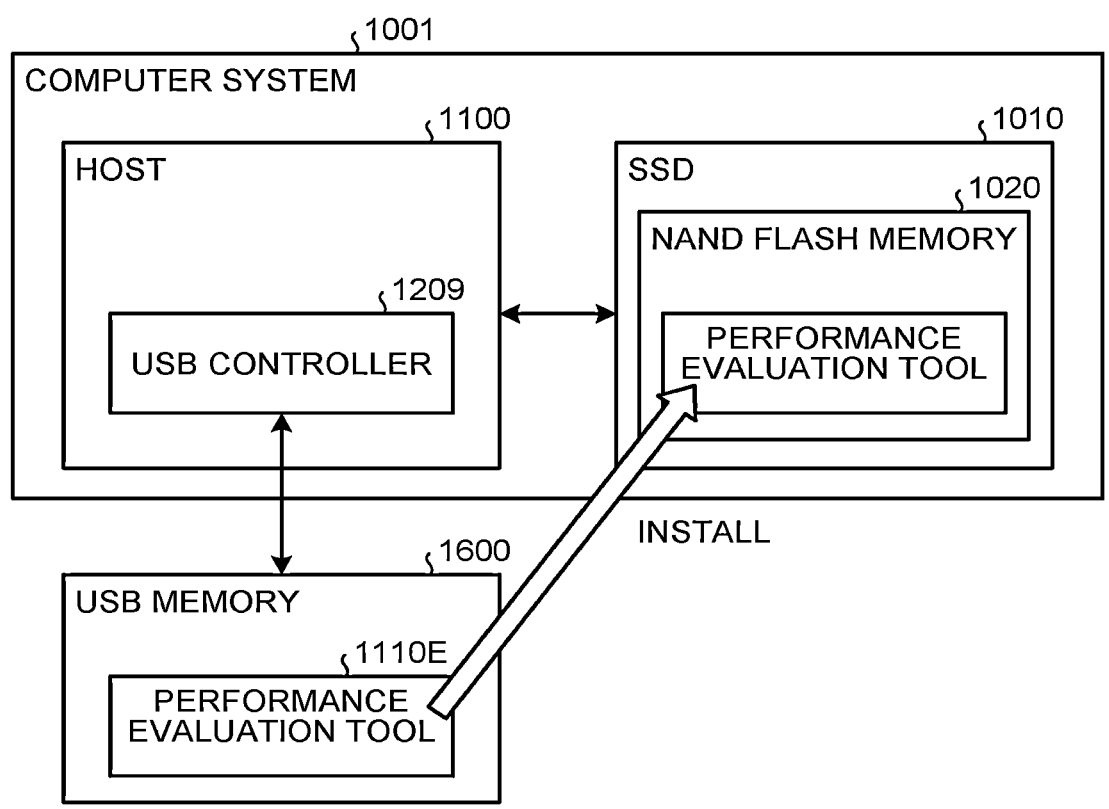
FIG. 72 is a block diagram illustrating a function configuration example of the computer system in a case where the performance evaluation tool is installed from a USB memory.

FIG. 72 illustrates an example of a case of installing the performance evaluation tool from a USB memory. A performance evaluation tool 1110E is stored in a USB memory 1600 and is installed in the SSD 1010 or the external memory device 1300 through the USB controller 1209 by connecting the USB memory 1600 to the USB controller 1209. Obviously, other external memories such as an SD card may be used instead of the USB memory 1600. In terms of ease of availability of the performance evaluation tool by a user, the optical medium 1500 or the USB memory 1600 is desirably packed together with the SSD 1010 as an accessory when shipping the SSD 1010. On the other hand, the optical medium 1500 or the USB memory 1600 may be sold separately as a software product or may be attached to a magazine or a book as a supplement.

The access information obtaining tool 1111 sequentially records commands when the OS 1150 or the software 1140 other than the performance evaluation tool 1110 normally accesses the SSD 1010 in the access log table 1120 as access logs. The performance information obtaining tool 1112 calculates performance information on the SSD 1010 by using access logs recorded in the access log table 1120 and records this calculation result in the performance log table 1125 as a performance information log.

Figure 73:
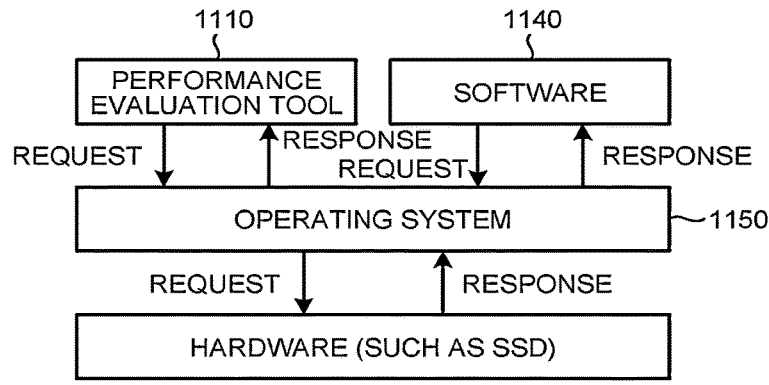
FIG. 73 is a block diagram illustrating a hierarchical function configuration example of a host.

FIG. 73 illustrates a hierarchical structure of various elements of the host 1100. The performance evaluation tool 1110 and the software 1140 communicate with the SSD 1010 via the OS 1150. Specifically, when the performance evaluation tool 1110 or the software 1140 needs to access the SSD 1010, the performance evaluation tool 1110 and the software 1140 transfer an instruction, a response, and data via the OS 1150.

Figure 74:
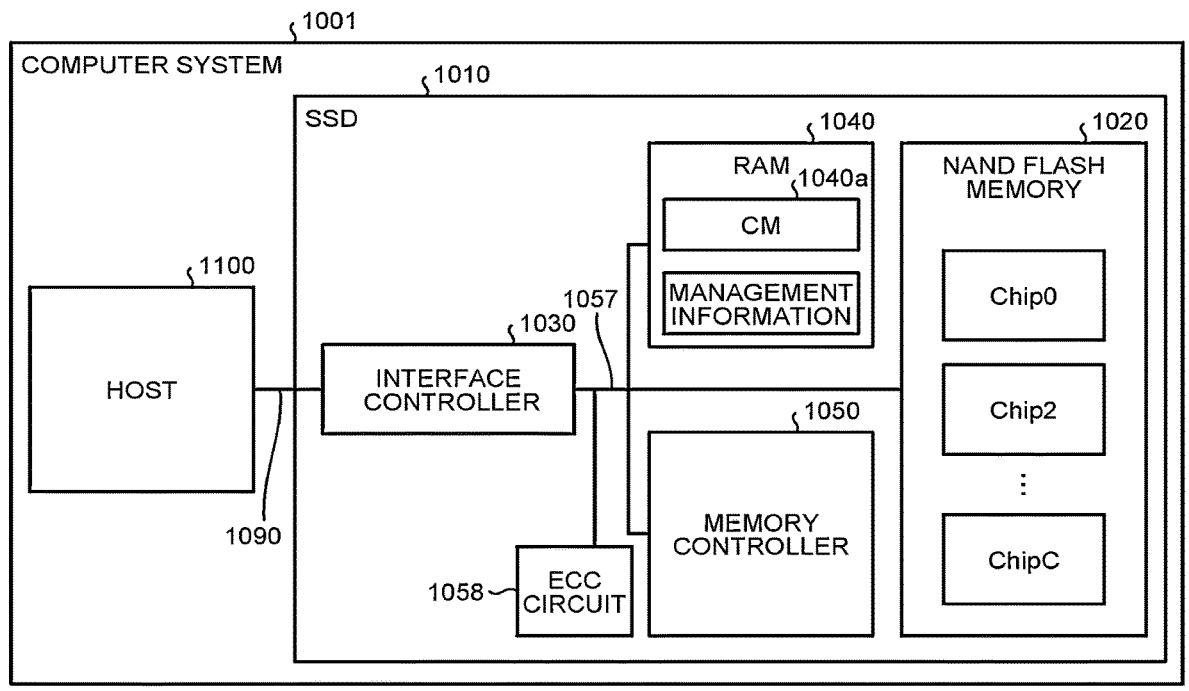
FIG. 74 is a block diagram illustrating a function configuration example of the SSD.

FIG. 74 illustrates the internal configuration example of the SSD 1010. The SSD 1010 includes the NAND-type flash memory (hereinafter, NAND memory) 1020, which is a nonvolatile semiconductor memory, an interface controller 1030 that communicates with the host 1100 via the ATA interface 1090, a RAM (Random Access Memory) 1040, which is a volatile semiconductor memory and includes a cache memory (CM) 1040a functioning as an intermediate buffer between the interface controller 1030 and the NAND memory 1020, a memory controller 1050 that performs management and control of the NAND memory 1020 and the RAM 1040 and control of the interface controller 1030, an ECC circuit 1058 that performs error correction processing of data read from the NAND memory 1020, and a bus 1057 connecting these components.

As the RAM 1040, a DRAM (Dynamic Random Access Memory), a SRAM (Static Random Access Memory), a FeRAM (Ferroelectric Random Access Memory), a MRAM (Magnetoresistive Random Access Memory), a PRAM (Phase Charge Random Access Memory), and the like can be employed.

The NAND memory 1020 stores therein user data specified by the host 1100, stores a management table managing user data, and stores management information managed by the RAM 1040 for backup. The NAND memory 1020 includes a plurality of memory chips and each memory chip includes a plurality of blocks as a unit for data erasing. A physical block includes a plurality of physical pages. A physical page is as a unit for data writing and data reading.

Memory transistors from which a memory cell array of the NAND memory 1020 is configured are each composed of a MOSFET (Metal Oxide Semiconductor Field Effect Transistor) having a stacked gate structure formed on a semiconductor substrate. The stacked gate structure includes a charge storage layer (floating gate electrode) formed on the semiconductor substrate via a gate dielectric film and a control gate electrode formed on the floating gate electrode via an inter-gate dielectric film. In a memory cell transistor, a threshold voltage changes according to the number of electrons stored in the floating gate electrode and data is stored according to the difference in this threshold voltage. A memory cell transistor may be configured to store 1 bit or may be configured to store multiple values (data of 2 bits or more). A memory cell transistor is not limited to having a structure including a floating gate electrode and may have a structure, such as a MONOS (Metal-Oxide-Nitride-Oxide-Silicon) type, in which a threshold voltage can be adjusted by trapping electrons in a nitride interface as a charge storage layer. A MONOS type memory cell transistor may be configured to store 1 bit or may be configured to store multiple values in the similar manner to a MOSFET type memory cell transistor. Moreover, memory cells may be three-dimensionally arranged memory cells as described in U.S. Patent Application Publication No. 2010 0172189 and U.S. Patent Application Publication No. 2010 0254191.

The RAM 1040 includes the cache memory (CM) 1040a functioning as a data transfer cache between the host 1100 and the NAND memory 1020. Moreover, the RAM 1040 functions as a management information storing memory and a work area memory. Management tables managed in the RAM 1040 are obtained by loading various management tables stored in the NAND memory 1020, for example, at the time of start-up and are saved in the NAND memory 1020 periodically or at the time of turning off the power.

The function of the memory controller 1050 is realized by a processor, which executes a system program (firmware) stored in the NAND memory 1020, various hardware circuits, and the like, and the memory controller 1050 performs, for example, data transfer control between the host 1100 and the NAND memory 1020 with respect to various commands, such as a write request, a cache flush request, and a read request, from the host 1100 and updating and management of various management tables stored in the RAM 1040 and the NAND memory 1020. The interface controller 1030 transmits and receives an instruction and data to and from the host 1100 via the ATA interface 1090 under the control of the memory controller 1050.

When the host 1100 issues a read request or a write request to the SSD 1010, the host 1100 inputs LBA (Logical Block Addressing) as a logical address via the ATA interface 1090. LBA is a logical address in which serial numbers starting from zero are attached to logical sectors (size: e.g., 512 B). Moreover, when issuing a read request or a write request to the SSD 1010, the host 1100 inputs a logical sector size to be a target of the read request or the write request in addition to LBA.

When an instruction is input from the host 1100, the interface controller 1030 receives the instruction and transmits the received instruction to the memory controller 1050. The memory controller 1050 processes the received instruction. As described above, the instruction includes LBA and the host 1100 specifies the location of data in an external memory device by using the LBA. The memory controller 1050 translates the LBA, which is a logical address received from the host 1100, into a physical address by referring to the management information in the RAM 1040. The physical location of a memory cell in the NAND memory 1020 is specified by the translated physical address.

FIG. 75 illustrates the configuration of the management information used in the SSD 1010. As described above, the management information is stored in the NAND memory 1020 in a nonvolatile manner. The management information stored in the NAND memory 1020 is loaded into the RAM 1040 at the time of starting the SSD 1010 and is used. The management information in the RAM 1040 is saved in the NAND memory 1020 periodically or at the time of turning off the power. When the RAM 1040 is a nonvolatile RAM, such as a MRAM and a FeRAM, the management information may be stored only in the RAM 1040 and, in this case, the management information is not stored in the NAND memory 1020.

As shown in FIG. 75, the management information includes a free block table 1021, an active block table 1022, a track table (logical-physical translation table managed in units of tracks) 1023, and a cluster table (logical-physical translation table in units of clusters) 1024.

Figure 76:
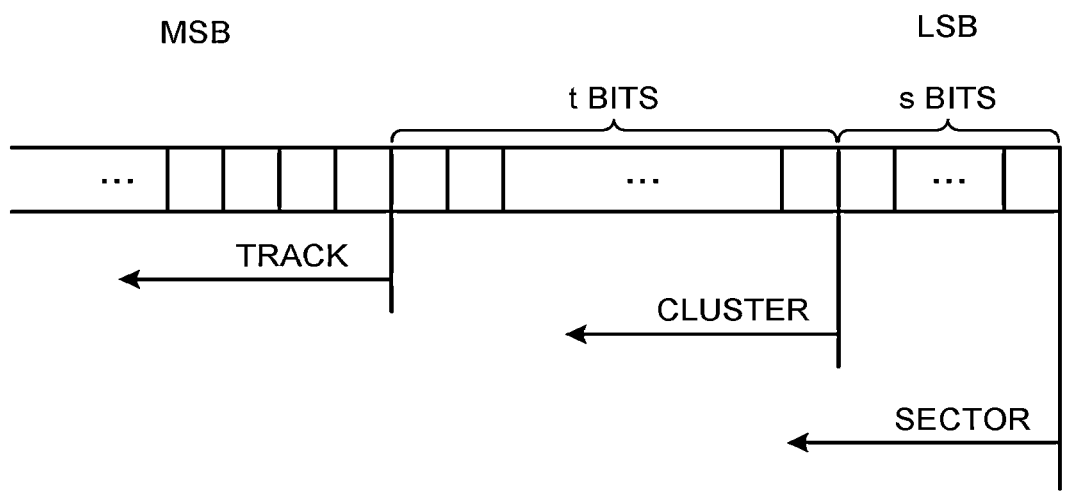
FIG. 76 is a diagram illustrating a relation between LBA and a management unit of the SSD.

As shown in FIG. 76, LBA is a logical address in which serial numbers starting from zero are attached to logical sectors (size: e.g., 512 B). In the present embodiment, as a management unit of a logical address (LBA) of the SSD 1010, a cluster address formed of a bit string equal to or higher in order than a low-order (s+1)th bit of LBA and a track address formed of a bit string equal to or higher in order than a low-order (s+t+1)th bit of LBA are defined. In other words, a logical sector is a minimum access unit from the host 1100. A cluster is a management unit for managing "small data" in an SSD and the cluster size is set to be a size that is a natural number of times as large as the logical sector size. A track is a management unit for managing "large data" in an SSD and the track size is set to be a size twice or larger natural number of times as large as the cluster size. Therefore, a track address is the quotient when dividing LBA by a track size and an intra-track address is the remainder when dividing LBA by a track size, and a cluster address is the quotient when dividing LBA by a cluster size and an intra-cluster address is the remainder when dividing LBA by a cluster size. In the following explanation, for convenience sake, the size of a track is equal to the size of data recordable in one physical block (when a redundant bit for error correction performed in the ECC circuit 1058 is included in a physical block, the size of the redundant bit is excluded) and the size of a cluster is equal to the size of data recordable in one physical page (when a redundant bit for error correction performed in the ECC circuit 1058 is included in a physical page, the size of the redundant bit is excluded).

The free block table (FB table) 1021 manages IDs of physical blocks (free block: FB) in the NAND memory, which can be newly allocated for writing when performing writing to the NAND memory 1020 and to which the use is not allocated. Moreover, the free block table 1021 manages the erase count for each physical block ID.

The active block table (AB table) 1022 manages active blocks (AB) that are physical blocks to which the use is allocated. Moreover, the active block table 1022 manages the erase count (erase count) for each physical block ID.

The track table 1023 manages a correspondence relation between a track address and a physical block ID in which track data corresponding to the track address is stored.

The cluster table 1024 manages a correspondence relation between a cluster address, a physical block ID in which cluster data corresponding to the cluster address is stored, and an intra-physical-block page address in which cluster data corresponding to this cluster address is stored.

Next, a procedure (LBA forward lookup translation) for specifying a physical address from LBA in the SSD 1010 will be explained with reference to FIG. 77. When LBA is specified, the memory controller 1050 calculates a track address, a cluster address, and an intra-cluster address from the LBA.

The memory controller 1050 first searches the track table 1023 and specifies a physical block ID corresponding to the calculated track address (Steps S1100 and S1101). The memory controller 1050 determines whether the specified physical block ID is valid (Step S1102). When the physical block ID is not null, i.e., a valid value (Yes in Step S1102), the memory controller 1050 searches whether this physical block ID is entered in the active block table 1022 (Step S1103). When the physical block ID is entered in the active block table 1022 (Yes in Step S1104), the location shifted from the head location of the physical block specified by the physical block ID by an intra-track address becomes the physical location in the NAND memory 1020 corresponding to the specified LBA (Step S1105). In such a case, the cluster table 1024 is not needed for specifying the physical location in the NAND memory 1020 corresponding to the LBA and such LBA is called "LBA managed in units of tracks". In Step S1104, when the physical block ID is not entered in the active block table 1022 (No in Step S1104), the specified LBA does not have a physical address and such a state is called an "unwritten state" (Step S1106).

In Step S1102, when a physical address corresponding to the specified track address is null, i.e., an invalid value (No in Step S1102), the memory controller 1050 calculates a cluster address from the LBA and searches the cluster table 1024 to obtain a physical block ID and a corresponding intra-physical-block page address corresponding to the calculated cluster address (Step S1107). The location shifted from the head location of the physical page specified by the physical block ID and the intra-physical-block page address by an intra-cluster address becomes the physical location in the NAND memory 1020 corresponding to the specified LBA. In such a case, the physical location in the NAND memory 1020 corresponding to the LBA cannot be specified only by the track table 1023 and the cluster table 1024 needs to be referred to, and such LBA is called "LBA managed in units of clusters" (Step S1108).

Figure 78:
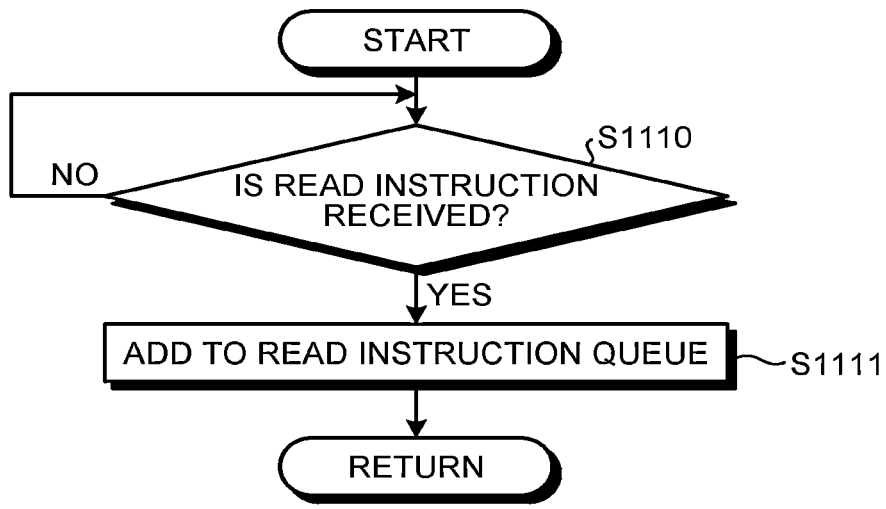
FIG. 78 is a flowchart illustrating a read operation example of the SSD.
Figure 79:
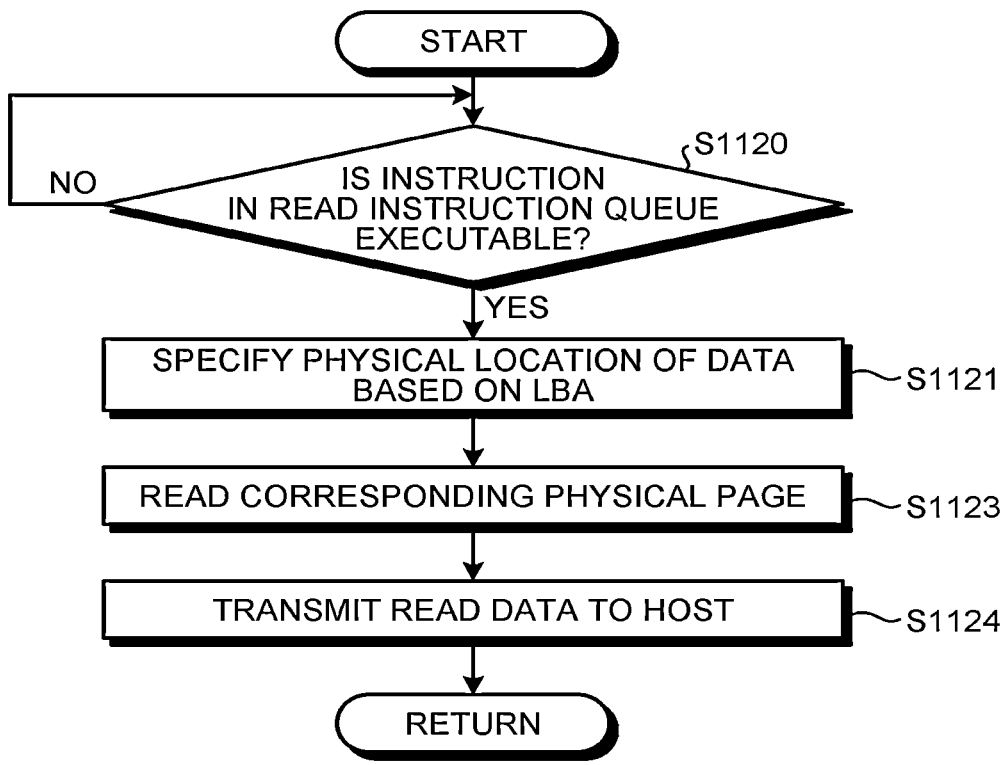
FIG. 79 is a flowchart illustrating a read operation example of the SSD.

Next, a read operation in the SSD 1010 will be explained with reference to FIG. 78 and FIG. 79. When the SSD 1010 receives a read instruction from the host 1100 (Step S1110), the memory controller 1050 adds this read instruction to a read instruction queue in the RAM 1040 (Step S1111) and returns a notification indicating reception of the read instruction to the host 1100.

On the other hand, when there is an instruction in the read instruction queue in the RAM 1040, the memory controller 1050 determines whether read processing can be performed (Step S1120). When the memory controller 1050 determines that read processing can be performed, the memory controller 1050 specifies the physical location of data on the basis of LBA received from the host 1100 according to the LBA forward lookup translation procedure shown in FIG. 77 (Step S1121). The memory controller 1050 reads data from the physical page of the specified location (Step S1123) and transmits the read data to the host 1100 via the interface controller 1030 (Step S1124). The data read from the NAND memory 1020 may be once written in the RAM 1040 and then, the data written in the RAM 1040 may be transmitted to the host 1100.

Figure 80:
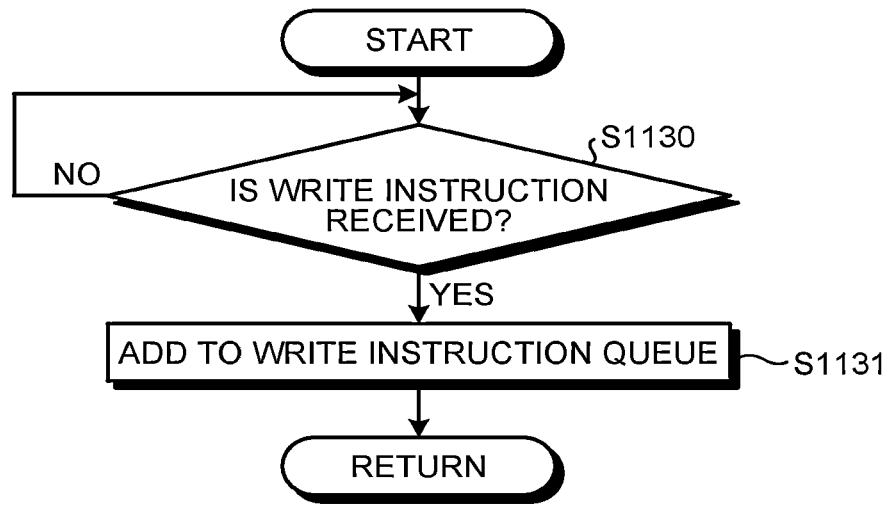
FIG. 80 is a flowchart illustrating a write operation example of the SSD.
Figure 81:
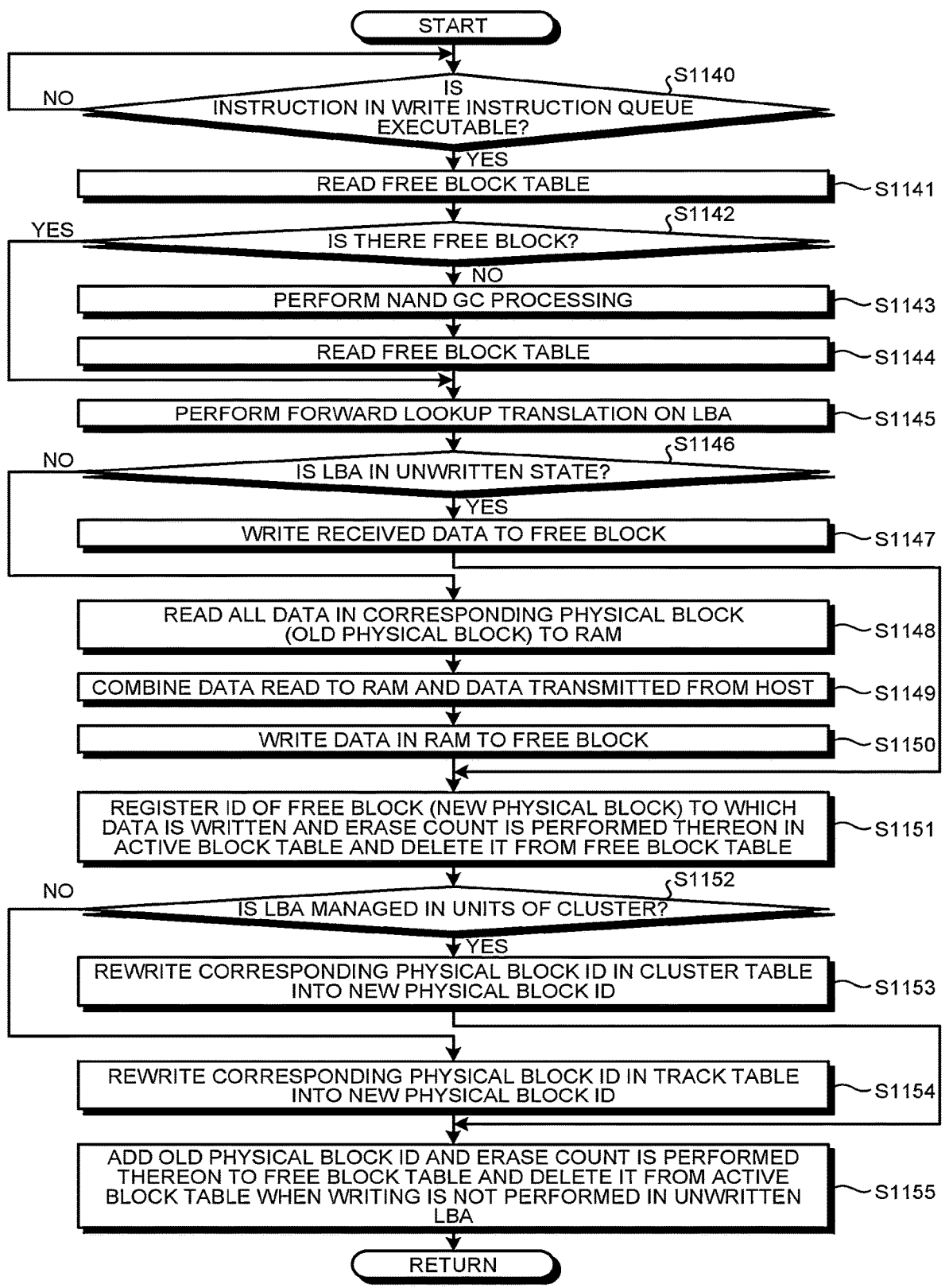
FIG. 81 is a flowchart illustrating a write operation example of the SSD.

Next, a write operation in the SSD 1010 will be explained with reference to FIG. 80 and FIG. 81. When the SSD 1010 receives a write instruction from the host 1100 (Step S1130), the memory controller 1050 adds this write instruction to a write instruction queue in the RAM 1040 (Step S1131) and returns a notification indicating reception of the write instruction to the host 1100.

On the other hand, when there is an instruction in the write instruction queue in the RAM 1040, the memory controller 1050 determines whether write processing can be performed (Step S1140). When the memory controller 1050 determines that write processing can be performed, the memory controller 1050 notifies the host 1100 that write processing can be performed, receives write data from the host 1100, and stores the received data in the cache memory 1040a of the RAM 1040. Next, the memory controller 1050 reads the free block table 1021 (Step S1141) and obtains a physical block ID of a free block from the free block table 1021. When there is no free block (Step S1142), the memory controller 1050 performs organizing processing (NAND organizing processing) on the NAND memory 1020, which will be described later (Step S1143), and thereafter reads the free block table 1021 (Step S1144) and obtains a physical block ID of a free block from the free block table 1021.

Figure 77:
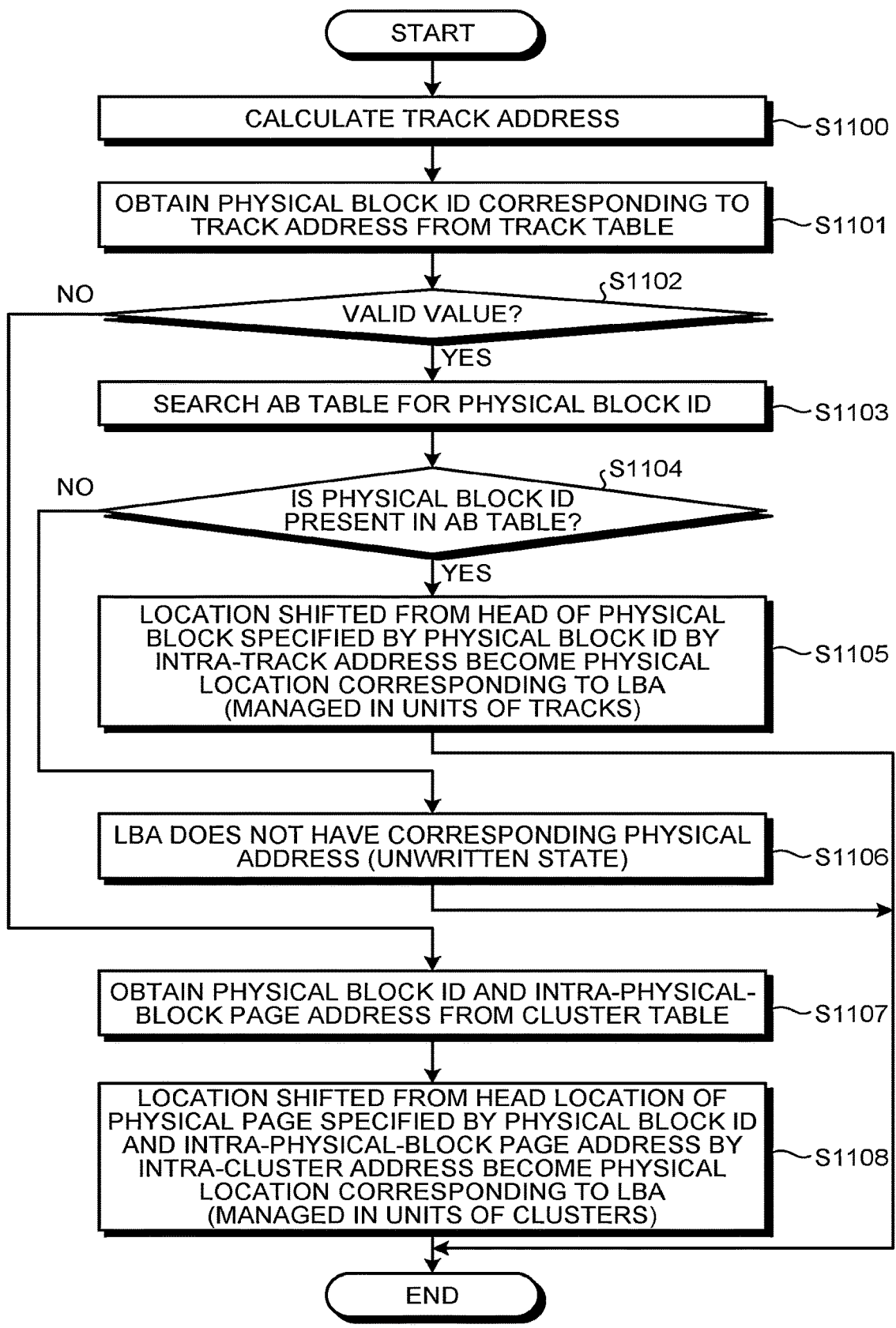
FIG. 77 is a flowchart illustrating a procedure for specifying a physical address from LBA.

Next, in order to search whether the LAB specified by the write instruction is in an unwritten state, the memory controller 1050 determines whether valid data corresponding to the LAB has been stored in the NAND memory 1020 according to the forward lookup translation procedure shown in FIG. 77 (Steps S1145 and S1146).

When the LBA is in an unwritten state (Yes in Step S1146), the memory controller 1050 writes the received data stored in the cache memory 1040a to the free block (Step S1147), registers the ID of the free block (new physical block) to which data is written and the erase count thereon in the active block table 1022, and deletes the ID of the physical block to which data is written from the free block table 1021 (Step S1151). At this time, it is determined whether to manage the LBA in units of tracks or in units of clusters by dividing the LBA of the received data by sections (track sections) in units of tracks and determining whether the track sections are filled with data (Step S1152). In other words, when the track sections are filled with data, the LBA is managed in units of tracks, and when not all of the track sections are filled with data, the LBA is managed in units of clusters. When the LBA is managed in units of clusters, the cluster table 1024 is rewritten and the LBA is associated with a new physical block ID (Step S1153), and, moreover, the track table 1023 is rewritten and the LBA is associated with an invalid physical block ID (for example, null) (Step S1153). When the LBA is managed in units of tracks, the track table is rewritten and the LBA is associated with a new physical block ID (Step S1154).

On the other hand, in Step S1146, when the LBA is not in an unwritten state, the memory controller 1050 reads all data in a corresponding physical block from the NAND memory 1020 on the basis of the physical block ID obtained by a forward lookup translation, and writes the data in the RAM 1040 (Step S1148). Then, the memory controller 1050 combines the data stored in the cache memory 1040a and the data, which is read from the NAND memory 1020 and is written in the RAM 1040, in the RAM 1040 (Step S1149) and writes the combined data in a free block (Step S1150). The memory controller 1050 registers the ID of the free block (new physical block) in which the data is written and the erase count thereon in the active block table 1022, and deletes the ID of the physical block in which the data is written from the free block table (Step S1151). When the LBA is managed in units of clusters, the memory controller 1050 rewrites an old physical block ID in the cluster table 1024 into a new physical block ID (Steps S1152 and S1153). When the LBA is managed in units of tracks, the memory controller 1050 rewrites an old physical block ID in the track table into a new physical block ID (Steps S1152 and S1154). Furthermore, the memory controller 1050 adds the old physical block ID and the erase count thereon to the free block table 1021 and deletes the old physical block ID and the erase count thereon from the active block table 1022 (Step S1155).

The capacitance of the whole LBA in the SSD 1010 is designed to be smaller than the total capacitance of the NAND memory 1020 of the SSD 1010, so that a free block does not become insufficient so long as a write operation is performed in units of tracks. On the other hand, when writing is made to unwritten LBA in units of clusters many times, a physical block whose capacitance is larger than a cluster is used for one write operation in units of clusters, so that physical blocks whose capacitance is larger than the data to be written are needed in the NAND memory 1020 and therefore a free block may become insufficient. When a free block becomes insufficient, a new free block can be obtained by organizing the NAND memory 1020 (NAND garbage collection (NAND GC)) as described below.

Whether user data is managed by a management method in units of clusters or in units of tracks depends on a write pattern from the host 1100. For example, when sequential writing of a size equal to or larger than a track size is performed from the host 1100 to the SSD 1010, write data is distributed to continuous LBA regions larger than a track size, so that the user data is managed in units of tracks. On the other hand, for example, when random writing of a cluster size is performed from the host 1100 to the SSD 1010, write data is fragmented over discontinuous LBA regions belonging to different tracks, so that the user data is managed in units of clusters.

Next, the NAND GC processing in the SSD 1010 will be explained with reference to FIG. 82. Not all clusters stored in a physical block are always valid clusters and an invalid cluster, i.e., a cluster other than a valid cluster, is not associated with LBA. A valid cluster is a cluster in which the latest data is written and an invalid cluster is a cluster that is not to be referred as a result that data having the same LBA is written in a different location. A physical block has a free space in data for the amount of invalid clusters and a free block can be obtained by performing the NAND organizing processing of collecting data in valid clusters and rewriting it in a different block.

First, a physical block ID (=i) is set to 0 and a free space cumulative amount S is set to 0 (Step S1160). The memory controller 1050 determines whether a physical block whose ID is i=0 is entered in the track table 1023 (Step S1161). When the physical block is entered in the track table, i is incremented by one (Step S1162), and a similar determination is performed on a physical block having the ID of the next number (Step S1161). In other words, when a physical block ID is included in the track table 1023, data in this physical block is managed in units of tracks, so that the physical block is not included in a NAND organizing processing target.

When a physical block whose ID is i is not managed in units of tracks (No in Step S1161), the memory controller 1050 refers to the cluster table 1024 and obtains all of the addresses of the valid clusters included in the physical block whose ID is i (Step S1163). Then, the memory controller 1050 obtains the size z of the total capacitance of the obtained valid clusters (Step S1164). In the case where v<physical block size (Step S1165), the memory controller 1050 adds the ID of the present physical block to a NAND GC processing target block list (Step S1166). Furthermore, the memory controller 1050 adds the obtained cluster capacitance v of the present physical block to an obtained cluster cumulative amount S and updates the obtained cluster cumulative amount S (Step S1167).

In Step S1165, in the case where v physical block size or the obtained cluster cumulative amount S has not reached a physical block size in Step S1168, the memory controller 1050 increments i by one (Step S1162) and performs the procedure in Steps S1161 to S1167 on a physical block having the ID of the next number in the similar manner to the above. Then, in Step S1168, the memory controller 1050 repeats the procedure in Steps S1161 to S1167 until the obtained cluster cumulative amount S reaches a physical block size.

Then, in Step S1168, when the obtained cluster cumulative amount S reaches a physical block size, the memory controller 1050 reads data of all the clusters of all the physical blocks on the NAND GC processing target block list from the NAND memory 1020 and writes it in the RAM 1040 (Step S1169). Moreover, the memory controller 1050 performs erase processing on all the physical blocks on the NAND GC processing target block list (Step S1170), and deletes all the physical blocks on which erase processing is performed from the active block table 1022 and adds them to the free block table 1021 (at this time, the erase count is incremented, Step S1171). Then, the memory controller 1050 obtains a new free block from the free block table 1021, writes data written in the RAM 1040 to the obtained free block (Step S1172), adds a physical block ID of the free block to which the data is written and the erase count on the block to the active block table 1022, and deletes the block ID of the block to which the data is written from the free block table 1021 (Step S1173). Furthermore, the memory controller 1050 updates cluster addresses, physical block IDs, and intra-physical-block page addresses in the cluster table 1024 to correspond to the NAND GC processing of this time (Step S1174).

Figure 82:
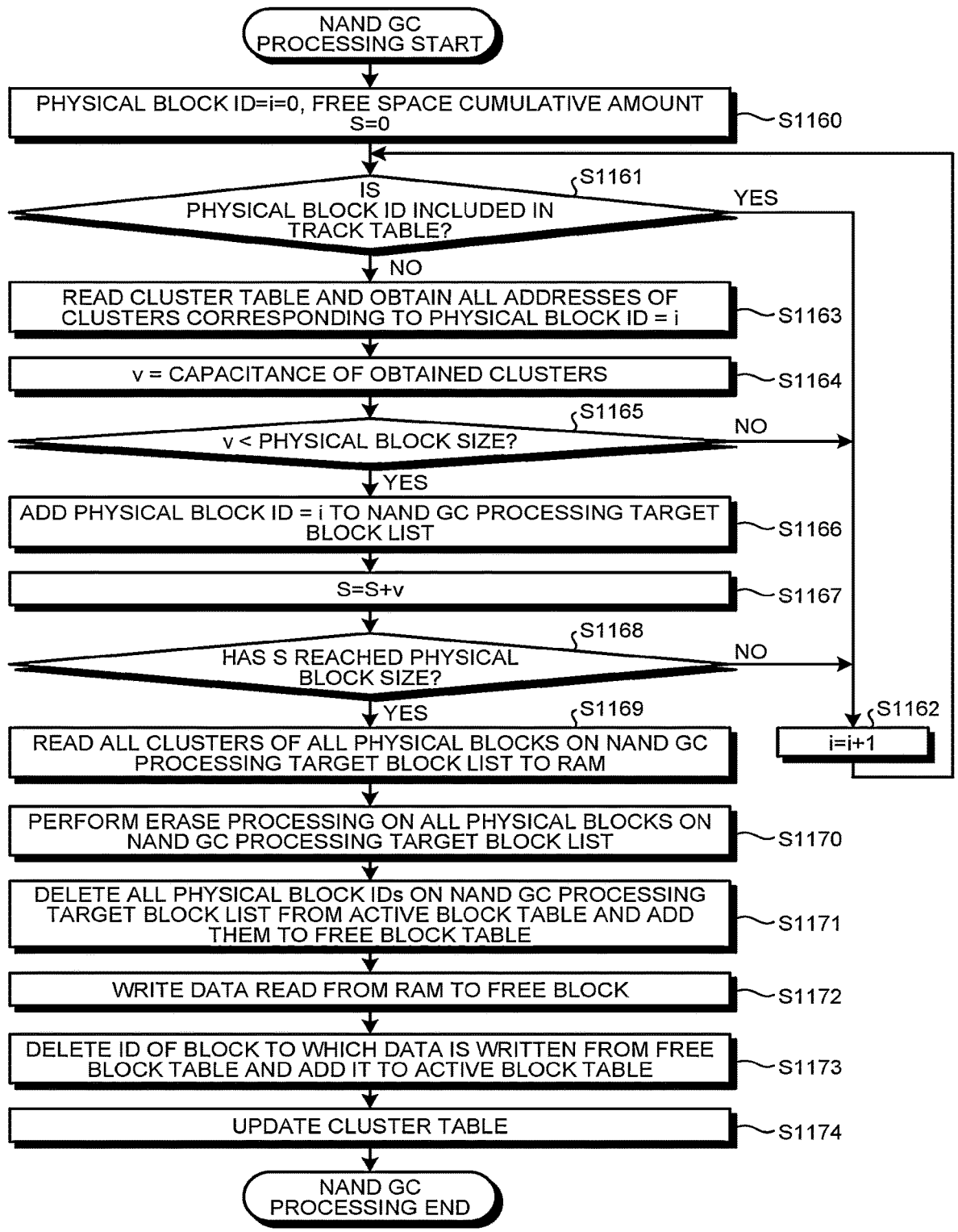
FIG. 82 is a flowchart illustrating an operation example of organizing processing of a NAND memory of the SSD.

In the procedure in FIG. 82, the NAND GC is processed by putting priority on putting data in a free block. On the other hand, the NAND GC may be processed by putting priority on obtaining a free block by the following manner. For example, the size v is obtained by subtracting the capacitance of obtained clusters from a physical block size in Step S1164 and then it is determined whether v>0 in Step S1165, and when v>0, the processing proceeds to Step S1168, and when v≤0, the processing proceeds to Step S1162.

As described above, the NAND GC processing is accompanied by many read operations, write operations, and erase operations of physical blocks in the NAND memory 1020 and therefore requires a long time. Thus, if writing is performed in a state where the number of free blocks becomes insufficient, the NAND GC processing is performed, which decreases the write processing speed viewed from the host 1100. In this manner, the internal state of an SSD changes momentarily and is therefore easily affected by access from outside.

Figure 83:
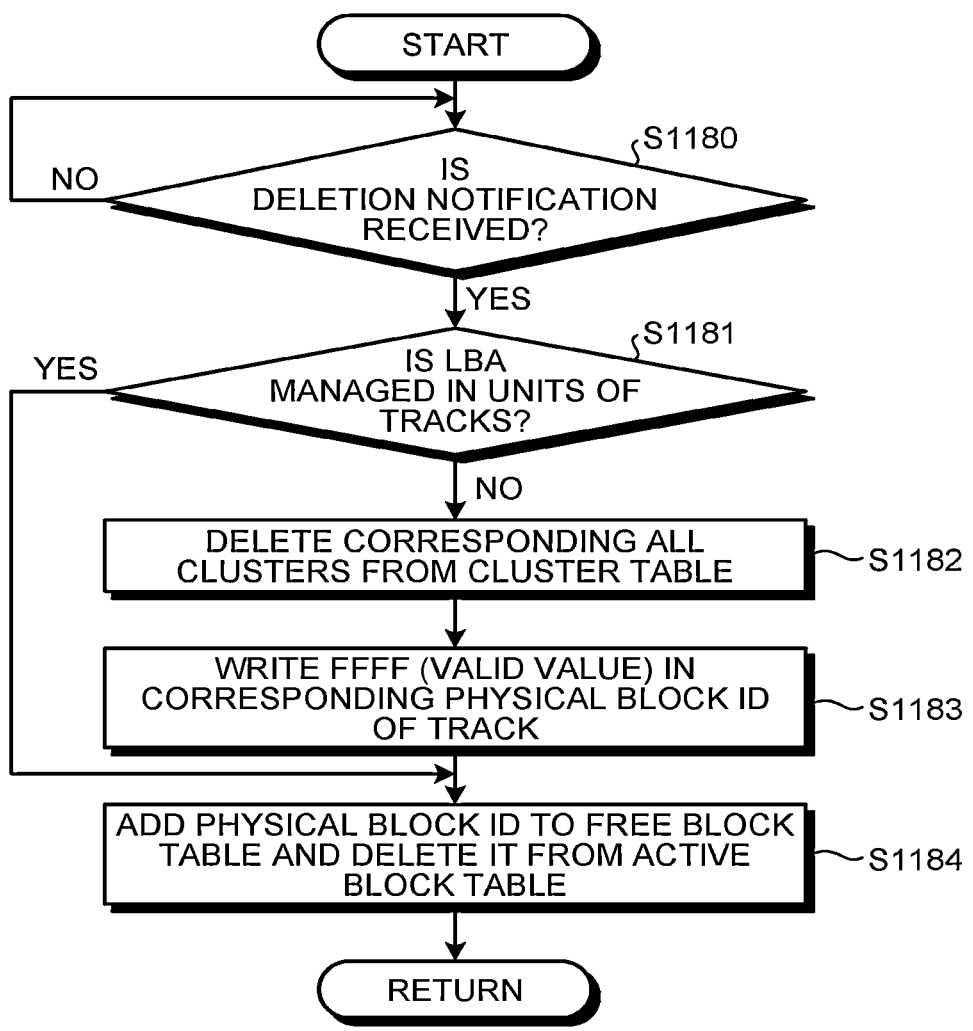
FIG. 83 is a flowchart illustrating an operation example of the SSD when a deletion notification is received.

Next, a deletion notification in the SSD 1010 will be explained with reference to FIG. 83. The deletion notification is an instruction transmitted to an external memory device from the host 1100 when data is deleted in the OS 1150 in the host 1100. Examples of the deletion notification, for example, include Data Set Management Command (known as TRIM command) described in INCITS ATA/ATAPI Command Set-2 (ACS-2). In this method, when data is deleted in the OS 1150, a logical address region (LBA region) in which the deleted data is present is notified to an external memory device as an LBA Range Entry composed of a combination of LBA and the number of logical sectors, so that the region can be thereafter used as a free space even in the external memory device. The deletion notification enables the SSD 1010 to obtain a new free block. The function of the TRIM command can be realized by other commands, such as SCT Command Transport described in INCITS ACS-2, a vendor unique command and the like, instead of the Data Set Management Command.

When the SSD 1010 receives the deletion notification from the host 1100 (Step S1180), the memory controller 1050 performs an LBA forward lookup translation on LBA included in the deletion notification according to the procedure shown in FIG. 77. When the LBA included in the deletion notification is managed in units of tracks (Yes in Step S1181), the memory controller 1050 adds a physical block ID to the free block table 1021 and deletes it from the active block table 1022 (Step S1184). On the other hand, when the LBA included in the deletion notification is managed in units of clusters (No in Step S1181), the memory controller 1050 deletes all the clusters corresponding to the physical block from the cluster table 1024 (Step S1182), writes an appropriate valid value (for example, FFFF) in the physical block ID corresponding to the track corresponding to the LBA in the track table 1023 (Step S1183), and adds the physical block ID to the free block table 1021 and deletes it from the active block table 1022 (Step S1184). In the SSD 1010, a free block can be obtained also by deletion notification processing in addition to the NAND GC processing.

Figure 84:
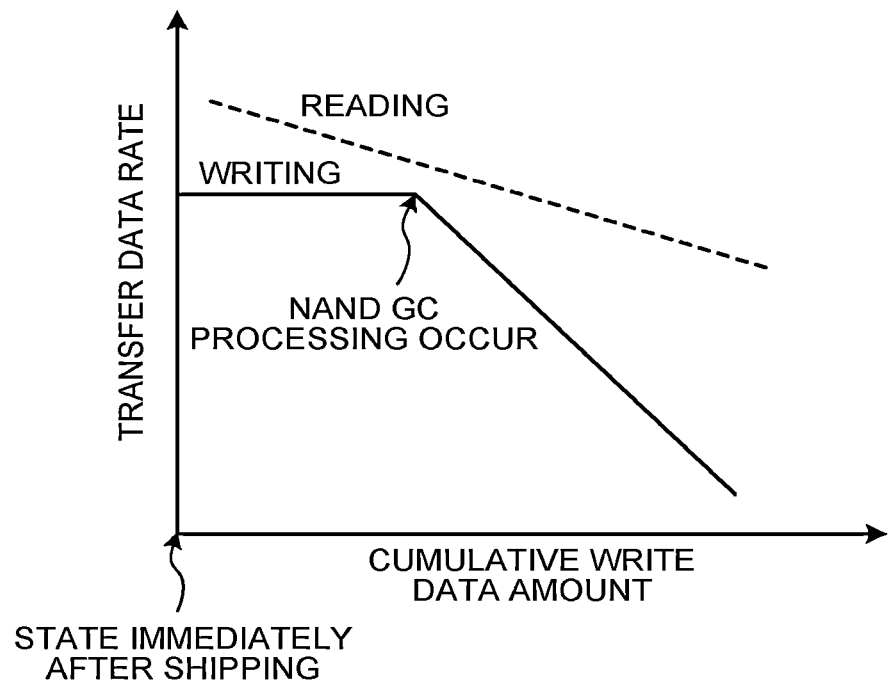
FIG. 84 is a diagram illustrating degradation of the transfer data rate of the SSD over time.

Next, performance degradation of the SSD 1010 will be explained. FIG. 84 is a conceptual diagram of performance degradation of the SSD 1010. First, performance degradation of a write operation is described (solid line in FIG. 84). Immediately after shipping from the factory, no data is written in the SSD 1010 and all LBAs are in an unwritten state, so that almost all physical blocks are free blocks. In such a state, when there is a write instruction to the SSD 10 from the host 1100, the memory controller 1050 can write data to a free block immediately. However, a write amount increases as a user uses the SSD 1010, so that the number of free blocks decreases. Especially, when writing of data of less than a track size occurs many times, the data is managed in units of clusters, so that a physical block whose capacitance is larger than a cluster is used for one write operation in units of clusters. Therefore, when data is managed in units of clusters, physical blocks whose capacitance is larger than data to be written are needed in the NAND memory 1020, so that the number of free blocks may become insufficient. The probability of causing the NAND GC processing to be performed increases as the remaining number of free blocks decreases. Moreover, the number of active blocks that need to be read in the NAND GC processing for obtaining one free block increases as user data stored in the SSD 1010 increases. Thus, the time required for the NAND GC processing also increases.

The time required for writing is approximately represented by the following equation (in practice, management table processing time and the like are also added thereto).

(write time)=(write time to physical block)+(NAND GC processing probability)×(NAND GC processing time)

Because both the NAND GC processing probability and the NAND GC processing time increase as the cumulative write data amount increases, the write performance decreases at an accelerating pace. On the other hand, in a write performance degraded state, for example, when sequential writing is performed, the ratio of data managed in units of tracks increases and thus the number of free blocks increases, thereby restoring the write performance. Moreover, in a write performance degraded state, when the deletion notification is issued for an LBA region that is not in an unwritten state, an active block corresponding to the LBA region that is not in an unwritten state is released to be a free block, so that the write performance is restored.

Figure 85:
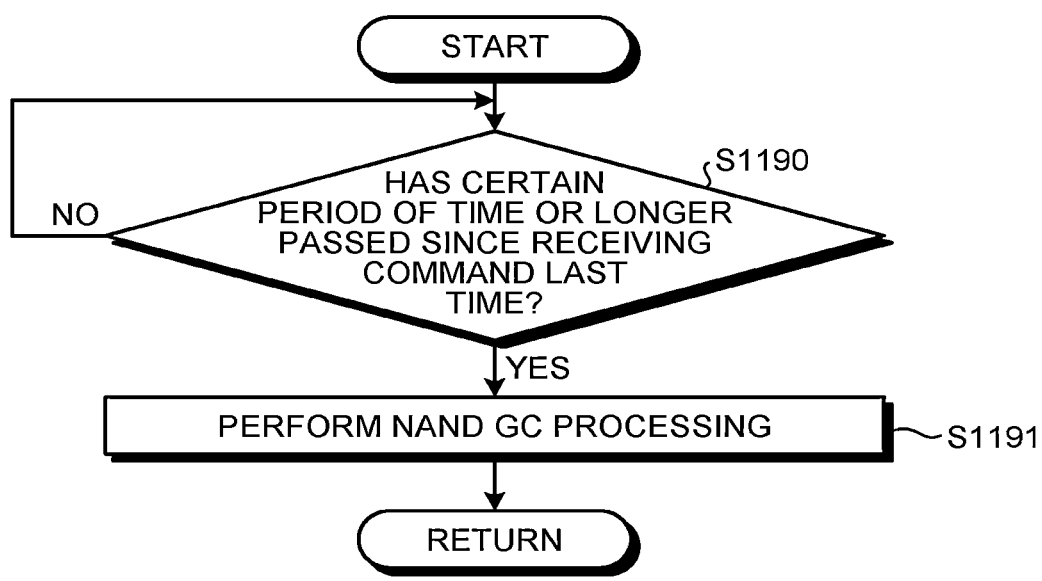
FIG. 85 is a flowchart illustrating an operation example of automatic NAND organizing processing in the SSD.

FIG. 85 illustrates a NAND GC processing procedure performed by the SSD 1010 itself when access frequency from the host 1100 is low. When the SSD 1010 has not received a command from the host 1100 for a certain period of time (for example, 10 seconds) or longer (in an idle state) or when the SSD 1010 has not received a command (media access command), with which the host 1100 needs to access the NAND memory 1020, for a certain period of time or longer (Step S1190), the NAND GC processing is performed (Step S1191) to obtain a free block beforehand, thereby enabling the prevention of degradation of the write performance (automatic NAND GC processing). Performance degradation can be efficiently prevented by increasing the frequency of causing the automatic NAND GC processing to be performed, however, this results in increasing the erase count on the NAND memory 1020, which becomes a factor in decreasing the reliability of the SSD 1010. Thus, the time until starting the NAND GC processing needs to be appropriately adjusted in consideration of the trade-off relationship between performance and reliability.

Next, performance degradation of a read operation will be described (dotted line in FIG. 84). When reading user data managed in units of tracks, a forward lookup translation is performed by searching the track table 1023 and the number of search target elements is as small as (total capacitance)÷(track size). On the other hand, in the case of user data managed in units of clusters, a forward lookup translation need to be performed by searching the cluster table 1024 in addition to the track table 1023, so that the number of search target elements is a maximum of (total capacitance)÷(cluster size). A cluster size is normally substantially smaller than a track size, so that the number of search target elements in the cluster table 1024 is significantly larger than the number of search target elements in the track table 1023, thereby increasing the search time. Consequently, the time required for reading increases. For example, when 1 track is composed of 4096 clusters, the number of elements in the cluster table 1024 is 4096 times the number of elements in the track table 1023. As above, the read performance degrades as writing of data managed in units of clusters to the SSD 1010 increases. On the other hand, in a read performance degraded state, for example, when sequential writing is performed, data managed in units of tracks increases, so that the read performance is restored.

Figure 86:
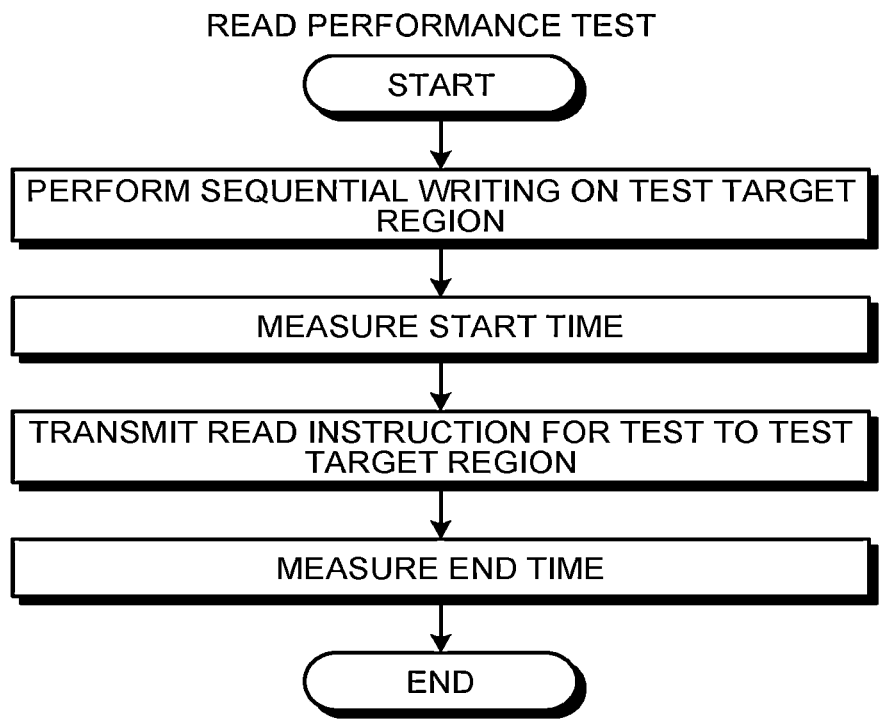
FIG. 86 is a process chart illustrating an operation example of a read performance test as a comparison example.

FIG. 86 is an example, shown as a comparison example, of a performance test for a general read operation. In the read performance test, the host 1100 performs sequential writing of a test data pattern for reading to a test target LBA region. After writing, the host 1100 measures the start time and stores the measured start time in the main memory 1202 of the host 1100. Furthermore, the host 1100 causes the SSD 1010 to read a write pattern by transmitting a read instruction for a test to the test target LBA region to the SSD 1010, and ends reading after receiving the read data. Then, the host 1100 measures the time at which reading ends and stores the measured end time in the main memory 1202 of the host 1100. Thereafter, the CPU 1200 obtains the test execution time by subtracting the start time from the end time and obtains the read transfer data rate by dividing the read data amount for the test by the test execution time.

Figure 87:
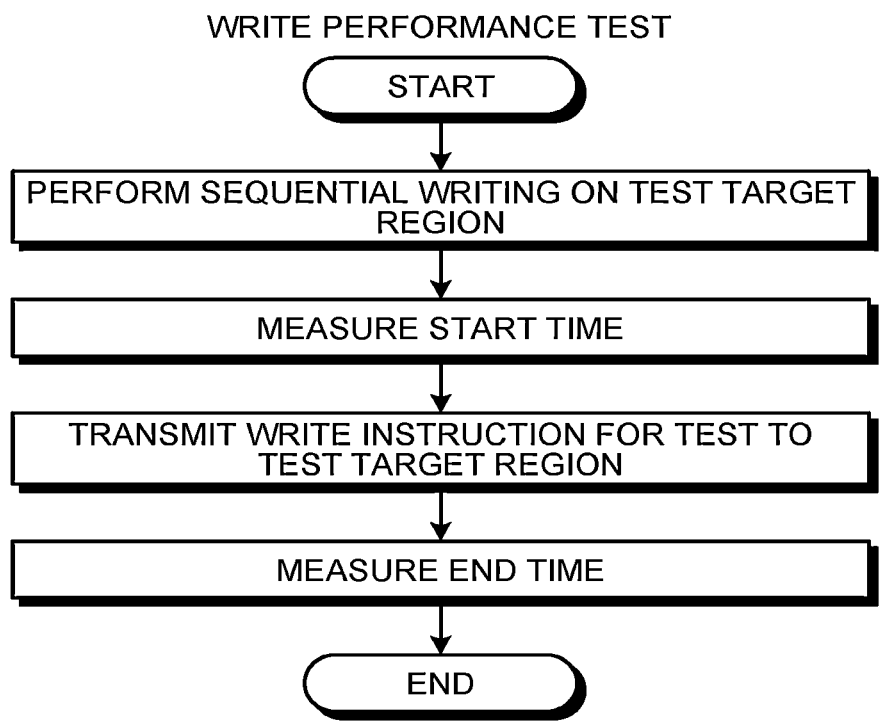
FIG. 87 is a process chart illustrating an operation example of a write performance test as a comparison example.

FIG. 87 is an example, shown as a comparison example, of a performance test for a general write operation. In the write performance test, the host 1100 performs sequential writing of a preconditioning data pattern to a test target LBA region (in some tests, preconditioning pattern data is not written). After writing, the host 1100 measures the start time and stores the measured start time in the main memory 1202 of the host 1100. Furthermore, the host 1100 causes the SSD 1010 to write a write pattern by transmitting a write instruction for a test to the test target LBA region to the SSD 1010 and ends writing after receiving a write end notification from the host 1100. Then, the host 1100 measures the time at which writing ends and stores the measured end time in the main memory 1202 of the host 1100. Thereafter, the CPU 1200 obtains the test execution time by subtracting the start time from the end time and obtains the write transfer data rate by dividing the write data amount for the test by the test execution time.

In this manner, in the above performance measurement, a large amount of writing is performed on the SSD 1010, so that the measurement itself affects the internal state of the SSD and therefore the internal state deviates from the internal state while in actual use by a user due to the measurement, thereby deviating the measurement result from the speed that a user experiences. For example, when a sequential write access is made to the SSD 1010 from the host 1100 for performance measurement, management information in the SSD 1010 is rewritten, so that data managed in units of clusters is changed to data managed in units of tracks or the number of free blocks decreases. This causes the final calculated performance of the SSD in both the write performance test and the read performance test to deviate from the performance that a user experiences, which is the performance before the measurement. In practice, many performance measurement tools have specifications in which sequential writing of several gigabytes or more of data is performed on an SSD in various measurements, so that the performance measured by these tools largely deviates from the performance that a user experiences.

Figure 88:
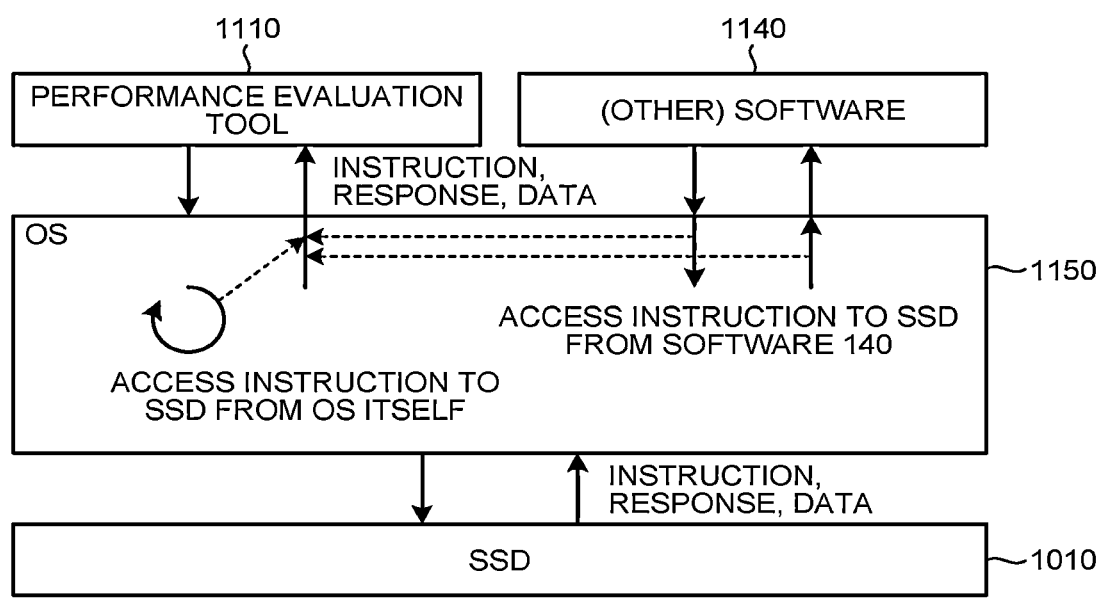
FIG. 88 is a diagram illustrating an operational concept for obtaining access information by the performance evaluation tool.

The main portions in the present embodiment are explained below. In the present embodiment, performance measurement is performed by using the performance evaluation tool 1110 in the main memory 1202 shown in FIG. 67. As described above, the performance evaluation tool 1110 includes the access information obtaining tool 1111 and the performance information obtaining tool 1112. As shown in FIG. 73, the performance evaluation tool 1110 transfers information to and from the OS 1150 and, moreover, transfers an instruction, a response, and data to and from hardware via the OS 1150 similarly to the general software 1140. On the other hand, as shown in FIG. 88, when the software 1140 other than the performance evaluation tool 1110 transfers a command (instruction, response, and data) to and from the SSD 1010 via the OS 1150, the performance evaluation tool 1110 receives at least logs of the instruction and the response from the OS 1150. Obviously, the performance evaluation tool 1110 may receive logs of the instruction, the response, and the data.

Furthermore, when the OS 1150 transfers a command (instruction, response, and data) to and from the SSD 1010 by a request from the OS 1150 itself, the performance evaluation tool 1110 receives logs of the instruction and the response from the OS 1150. Obviously, the performance evaluation tool 1110 may receive logs of the data as well as the instruction and the response.

Moreover, when the performance evaluation tool 1110 itself transfers an instruction, a response, and data to and from the SSD 1010 via the OS 1150, the performance evaluation tool 1110 may receive logs of the instruction and the response from the OS 1150 (obviously, the performance evaluation tool 1110 may receive logs of the instruction, the response, and the data), however, in the present embodiment, for ease of understanding, the performance evaluation tool 1110 does not obtain a log obtained when transferring an instruction, a response, and data between the performance evaluation tool 1110 itself and the SSD 1010 from the OS 1150.

When the OS 1150 or the software 1140 accesses the SSD 1010, the access information obtaining tool 1111 of the performance evaluation tool 1110 receives a log of a command for this access from the OS 1150 or from the software 1140 via the OS 1150. As shown in FIG. 89, an access log that the access information obtaining tool 1111 of the performance evaluation tool 1110 receives includes time information (time stamps including coarse time stamps and fine time stamps), command direction information, thread identification information (queue ID), command content information, transfer length information (data length information), LBA information, and the like.

The coarse time stamp is information obtained by obtaining the time at which an instruction, a response, or data is transferred to and from the SSD 1010, for example, in units of seconds. The time may be obtained by the OS 1150 and may be obtained from a BIOS or the like. Instead of the time at which an instruction, a response, or data is transferred, the time at which a log thereof is transferred may be used.

The fine time stamp is information obtained by obtaining the time at which an instruction, a response, or data is transferred to and from the SSD 1010 in units of less than a second, for example, μ-seconds. The above time may be obtained by the OS 1150 or may be obtained from a BIOS or the like. Instead of the time at which an instruction, a response, or data is transferred, the time at which a log thereof is transferred may be used. Digits representing a value equal to or larger than a second are truncated. The time may be managed in units of μ-seconds without truncating any digits and the item of the coarse time information may be omitted.

The command direction information is information indicating whether a command is an instruction (request transmission) to the SSD 1010 or a response (completion notification) from the SSD 1010. For example, in the case of the SATA standard, in a 60h READ FPDMA QUEUED command described in INCITS ACS-2, when Register Host to Device (RegHD) of the 60h READ FPDMA QUEUED command is transmitted from the host 1100 to the SSD 1010, the access information obtaining tool 1111 of the performance evaluation tool 1110 receives a log from the OS 1150 as an instruction (request transmission), and, when Set Device Bits (SDB) of the 60h READ FPDMA QUEUED command is received from the SSD 1010, the access information obtaining tool 1111 of the performance evaluation tool 1110 receives a log of the completion notification from the OS 1150 to indicate that the command is completed. When all of the requested data specified in the RegHD is received from SSD 1010 to host 1100, the access information obtaining tool 1111 may receive the completion notification before the SDB is received.

Moreover, in a 61h WRITE FPDMA QUEUED command of the SATA standard, when RegHD of the 61h WRITE FPDMA QUEUED command is transmitted from the host 1100 to the SSD 1010, the access information obtaining tool 1111 of the performance evaluation tool 1110 receives a log from the OS 1150 as an instruction (request transmission), and, when SDB of the 61h WRITE FPDMA QUEUED command is received from the SSD 1010, the access information obtaining tool 1111 of the performance evaluation tool 1110 receives a log of the completion notification from the OS 1150 to indicate that the command is completed. When all of the requested data specified in the RegHD is sent from host 1100 to SSD 1010, the access information obtaining tool 1111 may receive the completion notification before the SDB is received.

Except for the abnormal time at which a command does not end, a command necessarily includes a pair of an instruction (request transmission) and a response (completion notification). The request transmission indicates a command start and a response (completion notification) indicates a command end, so that the difference between them indicates the time required for executing a command.

When a request to the SSD 1010 is performed by a plurality of threads, the thread identification information (queue ID) is an ID for distinguishing between the threads. This thread may be a thread managed in the OS 1150 or a thread managed in the interface with the SSD 1010. A thread managed in the interface with the SSD 1010 is for example, Native Command Queuing (NCQ) of the SATA standard, and 0 to 31 are allocated to the queue ID in this case.

The command content information is, for example, information identifying whether a command is Write or Read. For example, in the case of the SATA standard, it is possible to classify information on a read command and a write command more finely such as 60h READ FPDMA QUEUED, 25h READ DMA EXT, C8h READ DMA, and the like described in INCITS ACS-2. In the present embodiment, for ease of understanding, the information is obtained only for identifying whether a command is Write or Read. Although a log of a command other than Write and Read may be obtained, only a log of a command of Write and Read is obtained in the present embodiment. In the case of the completion notification, an invalid value (null) may be written.

The transfer length information is information specifying the length to be read (or to be written) from a head LBA specified by a command and corresponds to a logical sector count in the SATA standard. For example, when the transfer length is 8h logical sectors in a write command to LBA=0h, continuous regions from LBA=0h to LBA=7h are the write target and the write data amount thereof is 8h logical sectors=4 KiB. In the case of the completion notification, an invalid value (NULL) may be written.

The LBA information is information on a head LBA specified by a command.

Access logs that the access information obtaining tool 1111 of the performance evaluation tool 1110 receives from the OS 1150 are sequentially stored in the access log table 1120 in the main memory 1202 shown in FIG. 67 (additionally recording method or ring buffer method). The access log table 1120, for example, has a form as shown in FIG. 89 and includes the time stamp (including coarse time stamp and fine time stamp), command direction information, thread identification information (queue ID), command content information, transfer length information, LBA information, and the like. As shown in FIG. 90, the access log table 1120 may be composed of two divided logs, i.e., a request transmission log and a completion notification log. In FIG. 90, the LBA information is omitted.

Figure 91:
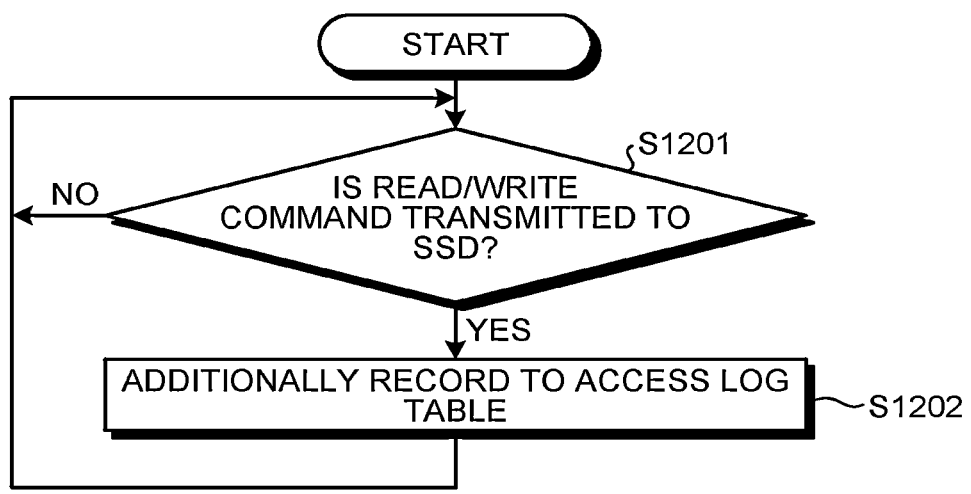
FIG. 91 is a flowchart illustrating an operation example of obtaining access information by an access information obtaining tool.
Figure 92:
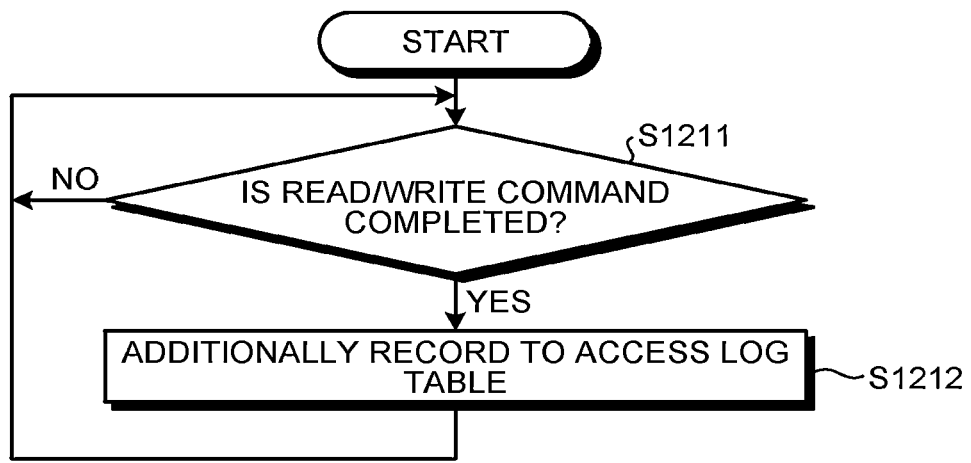
FIG. 92 is a flowchart illustrating an operation example of obtaining access information by the access information obtaining tool.

FIG. 91 and FIG. 92 illustrate procedures of additionally recording a log to the access log table 1120 by the access information obtaining tool 1111. When the access information obtaining tool 1111 detects that a read command or a write command is transmitted to the SSD 1010 (FIG. 91: Step S1201), the access information obtaining tool 1111 additionally records an access log corresponding to this command to the access log table 1120 (Step S1202). Moreover, when the access information obtaining tool 1111 detects that a response to a read command or a response to a write command is received from the SSD 1010 (FIG. 92: Step S1211), the access information obtaining tool 1111 additionally records an access log corresponding to this command response to the access log table 1120 (Step S1212).

Access logs stored in the access log table 1120 are translated into performance log information by the performance information obtaining tool 1112 of the performance evaluation tool 1110 to be additionally recorded to the performance log table 1125 stored in the main memory 1202 shown in FIG. 67. The performance log information is calculated periodically (for example, every 10 seconds) and is additionally recorded to the performance log table 1125 as the performance information of a predetermined period. FIG. 93 illustrates an example of the performance log table 1125 that includes the time information, total transfer data rate, read transfer data rate, write transfer data rate, and the like as recording elements. In FIG. 93, the transfer data rate is recorded as performance information. On the other hand, other performances, such as the processing command rate, response time, processing time, and relative score described above, may be recorded.

In the case, the time stamp is managed in units of seconds or longer. The completion time of a last completed command in a command group, which is a performance calculation target included in the access log table 1120, may be used as the time stamp of the performance log table. This time stamp may be managed in units of less than a second. Instead of the completion time of the last completed command, the instruction request time in a command to which an instruction request is first transmitted may be used or the starting time and the end time in a time range of a performance calculation target may be used as the time stamp of the performance log table.

The total transfer data rate (MiB/s) is the transfer data rate of data read from the SSD 1010 to the host 1100 or data written to the SSD 1010 from the host 1100. In FIG. 93, the unit of the total transfer data rate is MiB/s representing the data amount (unit: MiB) transferred per second. When data is not transferred at all in a performance calculation target period, an invalid value (NULL) is written or this row is not added.

The read transfer data rate (Mi/s) is the transfer data rate of data read from the SSD 1010 to the host 1100. In FIG. 93, the unit of the read transfer data rate is MiB/s representing the data amount (unit: MiB) transferred per second. When data reading is not completed at all in a performance calculation target period, an invalid value (NULL) is written.

The write transfer data rate (MiB/s) is the transfer data rate of data written to the SSD 1010 from the host 1100. In FIG. 93, the unit of the write transfer data rate is MiB/s representing the data amount (unit: MiB) transferred per second. When data writing is not completed at all in a performance calculation target period, an invalid value (NULL) is written.

Figure 94:
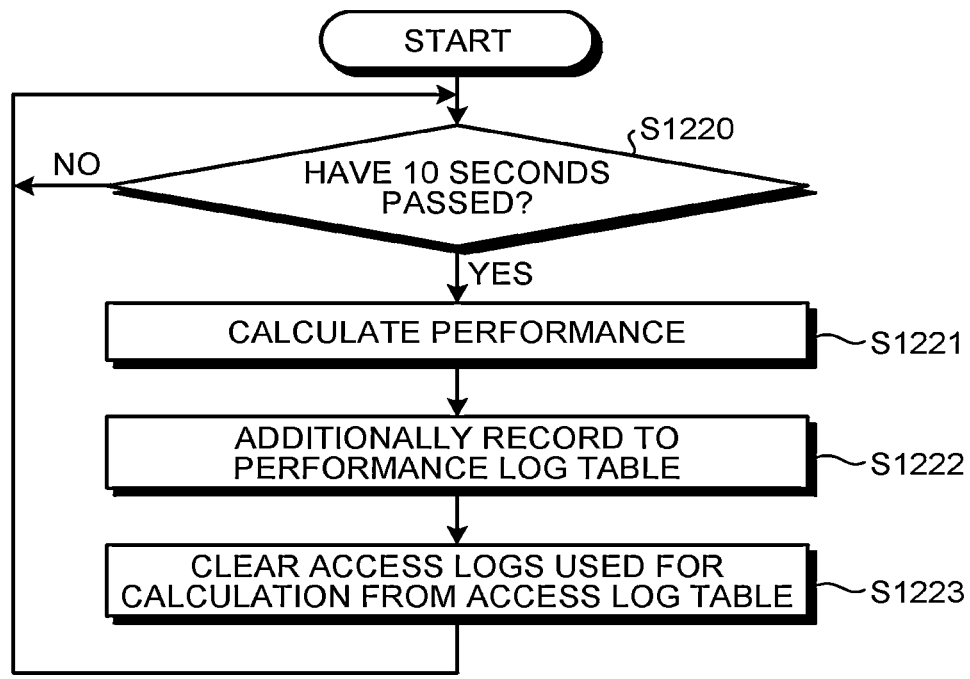
FIG. 94 is a flowchart illustrating an operation example of obtaining performance information by a performance information obtaining tool.
Figure 95:
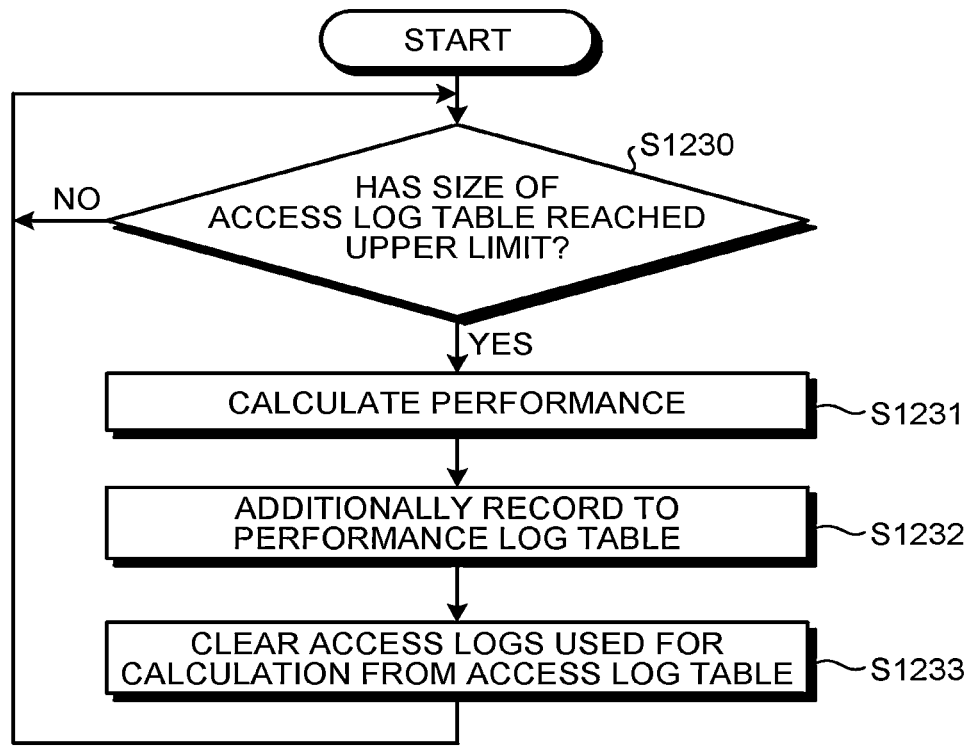
FIG. 95 is a flowchart illustrating an operation example of obtaining performance information by the performance information obtaining tool.

Access logs are translated into a performance log by the performance information obtaining tool 1112 by the procedures shown in FIG. 94 and FIG. 95. Any one of the procedures shown in FIG. 94 and FIG. 95 may be employed or both the procedures shown in FIG. 94 and FIG. 95 may be employed.

In the procedure shown in FIG. 94, the performance information obtaining tool 1112 calculates the performance by using access logs stored in the access log table 1120 every predetermined performance calculation period, and additionally records the calculated performance to the access log table 1120. Specifically, when the predetermined performance calculation period (for example, 10 seconds) passes (Step S1220), the performance information obtaining tool 1112 calculates the performance log information, such as the time information, total transfer data rate, read transfer data rate, and write transfer data rate, by using access logs stored in the access log table 1120 (Step S1221) and additionally records the calculated performance log information to the performance log table 1125 (Step S1222). When the performance log information is additionally recorded to the performance log table 1125, the performance information obtaining tool 1112 erases the access logs used for calculating the performance from the access log table 1120 (Step S1223).

In the procedure shown in FIG. 95, the upper limit of the size of the access log table 1120 is determined. When the size of the access log table 1120 reaches the upper limit, the performance information obtaining tool 1112 calculates the performance by using access logs stored in the access log table 1120 and additionally records the calculated performance to the performance log table 1125. Specifically, when the size of the access log table 1120 reaches the upper limit (Step S1230), the performance information obtaining tool 1112 calculates the performance log information, such as the time information, total transfer data rate, read transfer data rate, and write transfer data rate, by using logs stored in the access log table 1120 (Step S1231) and additionally records the calculated performance log information to the performance log table 1125 (Step S1232). When the performance log information is additionally recorded to the performance log table 1125, the performance information obtaining tool 1112 erases the access logs used for calculating the performance from the access log table 1120 (Step S1233).

In any of the procedures in FIG. 94 and FIG. 95, commands used for calculating the performance are erased from the access log table 1120, so that the access log table 1120 having a large data size is sequentially translated into the performance log table 1125 having a small data size.

When the procedures shown in FIG. 94 and FIG. 95 are used concurrently, it is possible to employ, for example, the following method. Specifically, the performance information obtaining tool 1112 calculates a performance log every predetermined performance calculation period until reaching the upper limit of the size of the access log table 1120, and, when the upper limit of the size of the access log table 1120 is reached, the performance information obtaining tool 1112 calculates a performance log by using all the access logs stored in the access log table 1120 and erases the access logs stored in the access log table 1120 for the first time at this point. Moreover, when erasing the access logs, only part of the access log table 1120 may be erased instead of erasing all the elements in the access log table 1120. In this case, for example, it is desirable to erase elements sequentially from an older element in the access log table 1120.

Figure 96:
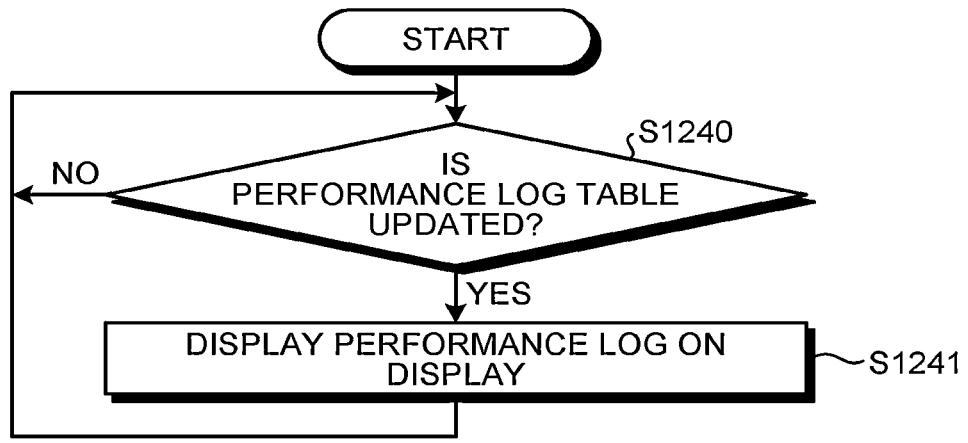
FIG. 96 is a flowchart illustrating a display operation example of a performance log by the performance information obtaining tool.
Figure 97:
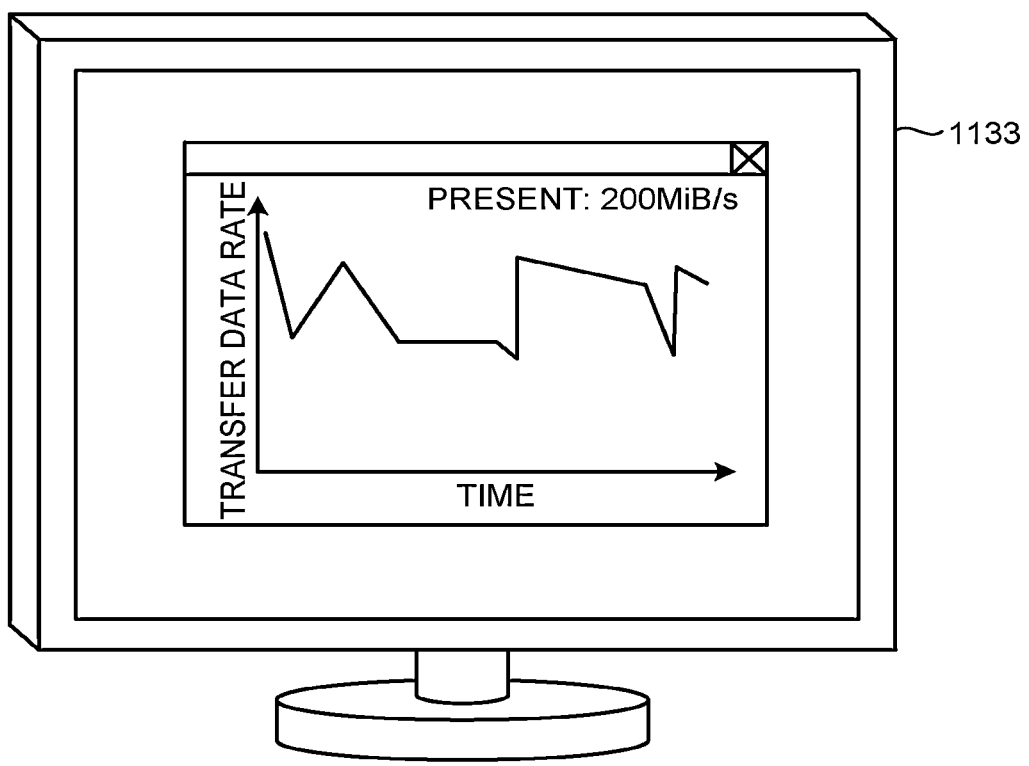
FIG. 97 is a diagram illustrating a display example of a performance log.
Figure 98:
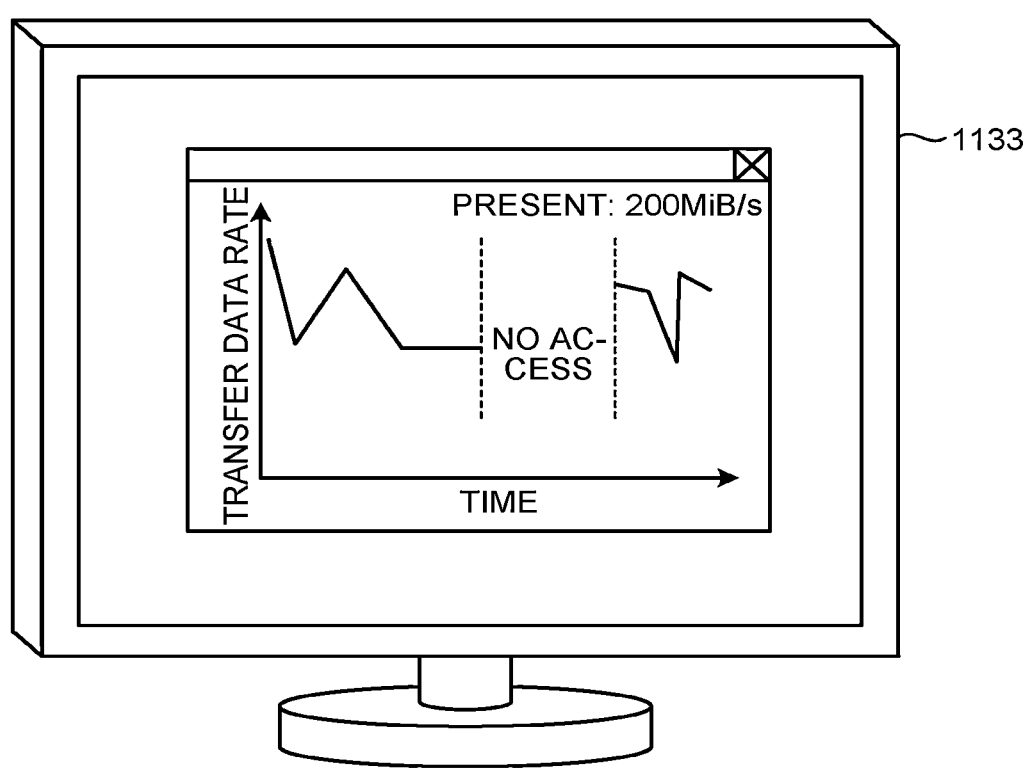
FIG. 98 is a diagram illustrating another display example of a performance log.

Performance logs recorded in the performance log table 1125 in such a manner are monitored by the performance information obtaining tool 1112. FIG. 96 illustrates a monitoring procedure of the performance log table 1125. The performance information obtaining tool 1112 determines whether the performance log table 1125 is updated (Step S1240). When the performance log table 1125 is updated, the performance information obtaining tool 1112 displays a historical data of the performance log table 1125 on the display 1133 (Step S1241). FIG. 97 illustrates an example of the performance log information displayed on the display 1133. In this case, the total transfer data rate is displayed in real time with the time as a horizontal axis. When there is no read/write access to the SSD 1010 for a certain period of time or longer, as shown in FIG. 98, it is desirable to hide the graph for the period or clearly display that there is no access during the period.

Figure 99:
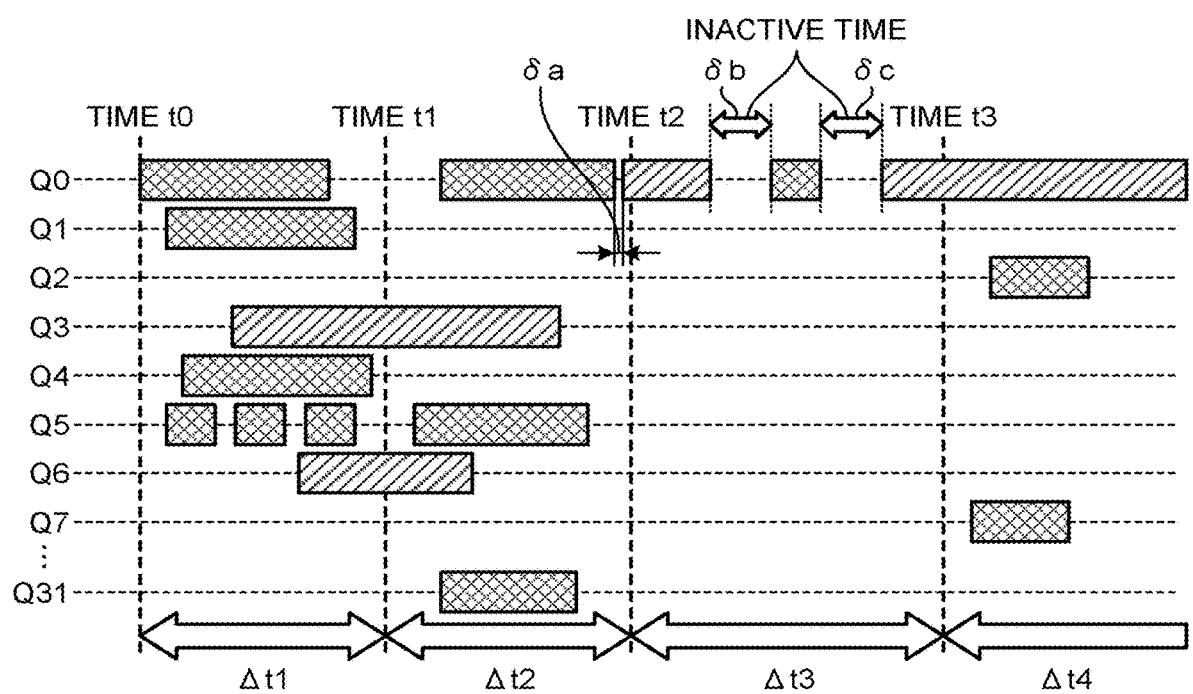
FIG. 99 is a diagram illustrating a command state when a plurality of threads is operated and command inactive time when comprehensively evaluating a plurality of threads.

Next, translation from access logs into a performance log performed by the performance information obtaining tool 1112 will be explained in detail. In this example, a case of calculating the total transfer data rate is illustrated. In the case of the read transfer data rate, only a read command log (read request log and read completion log) is used and, in the case of the write transfer data rate, only a write command log (write request log and write completion log) is used. As shown in FIG. 99, the SSD 1010 is accessed by a plurality of threads in many cases. FIG. 99 illustrates a case with the maximum number of threads, i.e., 32 threads.

Figure 100A:
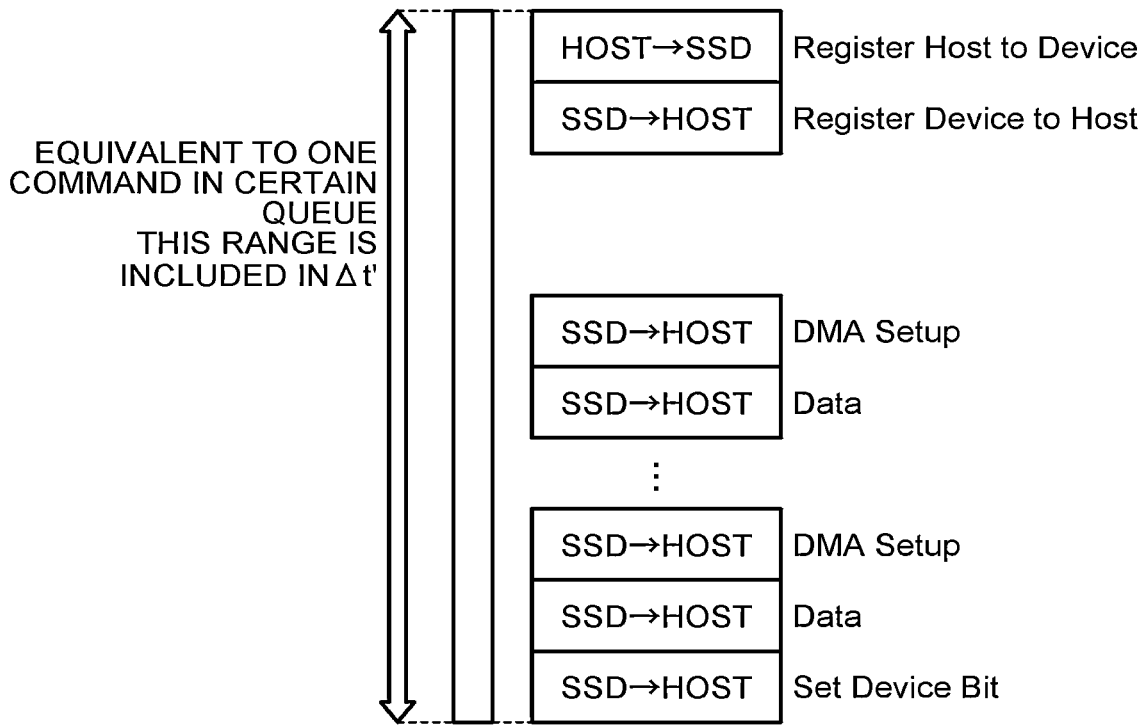
FIG. 100A and FIG. 100B are respectively a diagram illustrating a First Party DMA Read (fp DMA Read) command.
Figure 100B:
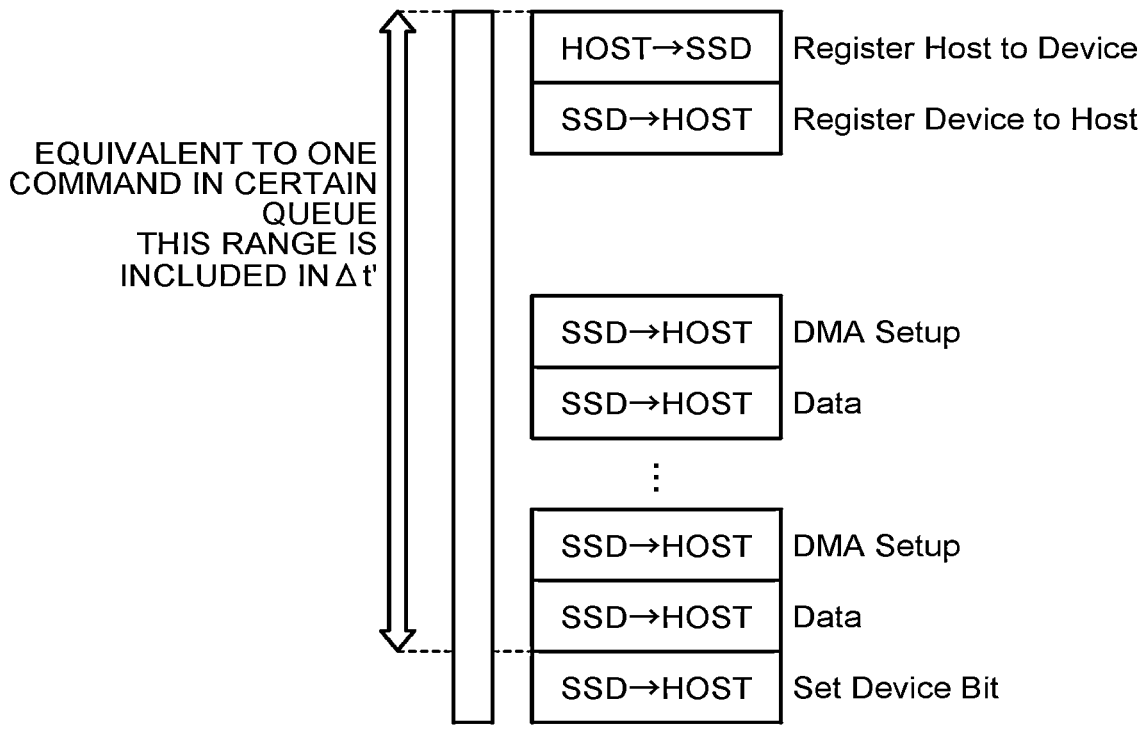

In FIG. 99, cross-hatched bars and hatched bars indicate an active state of a command in various threads, and the left end of a bar indicates the request time (start time) of a command and the right end of a bar indicates the completion time (end time) of a command. For example, in the case of a First Party DMA Read (fp DMA Read) command, which is a Read command of Native Command Queuing (NCQ) in the SATA standard, as shown in FIG. 100A, the start time of the command is the time at which a Register Host to Device (RegHD) FIS (Frame Instruction Structure) of the command is transmitted from the host 1100 to the SSD 1010, and the end time of the command is the time at which the host 1100 receives a Set Device Bit (SDB) FIS from the SSD 1010. The end time of the command may be the time at which the host 1100 finishes receiving all of the requested data specified in the RegHD from SSD 1010 before the SDB is received (FIG. 100B).

Figure 101A:
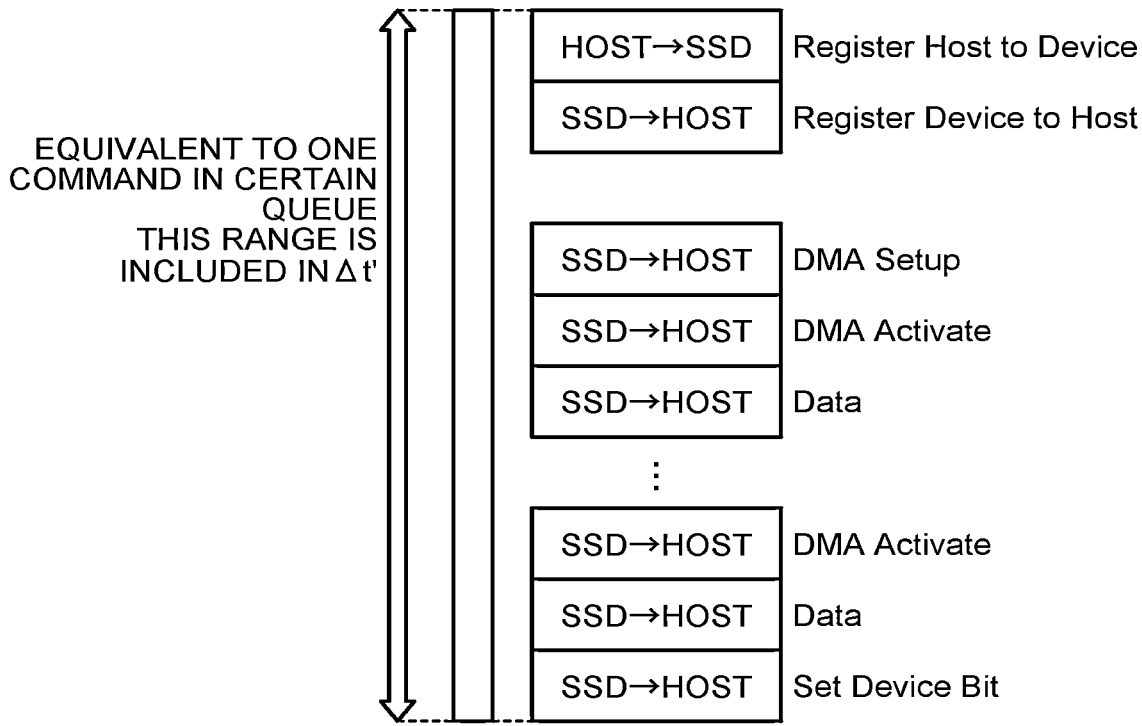
FIG. 101A and FIG. 101B are respectively a diagram illustrating a First Party DMA Write (fp DMA Write) command.
Figure 101B:
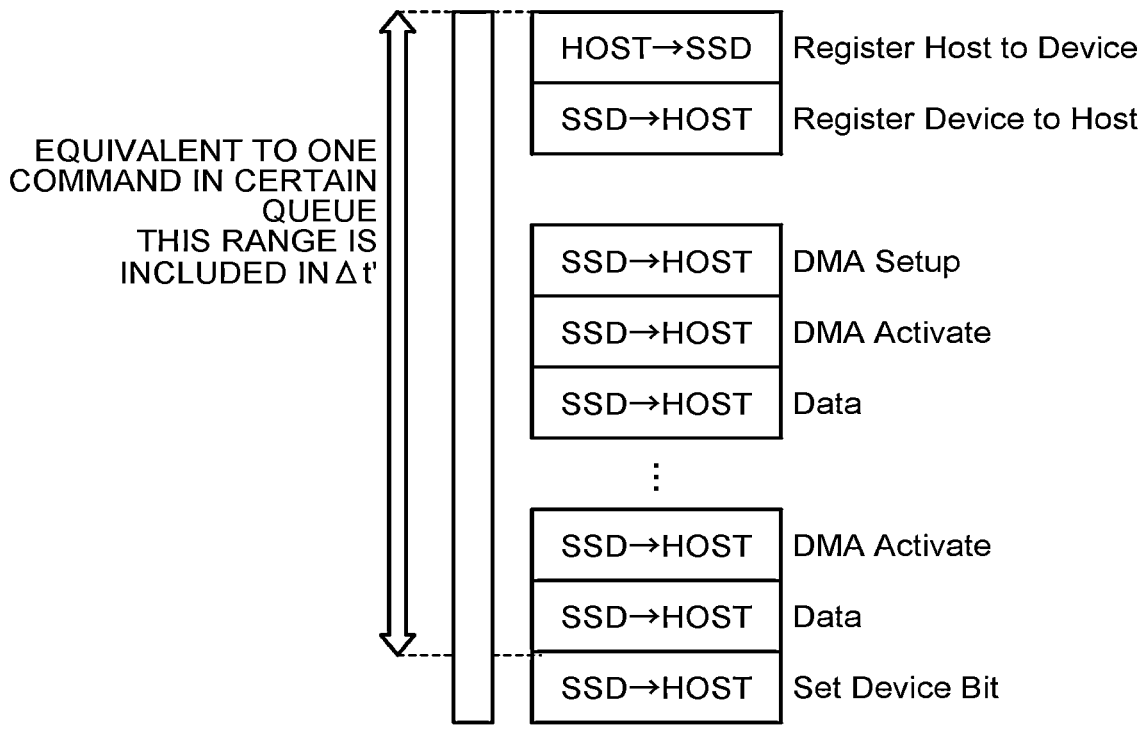

Moreover, in the case of a First Party DMA write (fp DMA Write) command, which is a Write command of NCQ, as shown in FIG. 101A, the start time of the command is the time at which a Register Host to Device (RegHD) FIS of the command is transmitted from the host 1100 to the SSD 1010, and the end time of the command is the time at which the host 1100 receives a Set Device Bit (SDB) FIS from the SSD 1010. The end time of the command may be the time at which the host 1100 finishes sending all of the requested data specified in the RegHD to SSD 10 before the SDB is received (FIG. 101B).

Figure 102A:
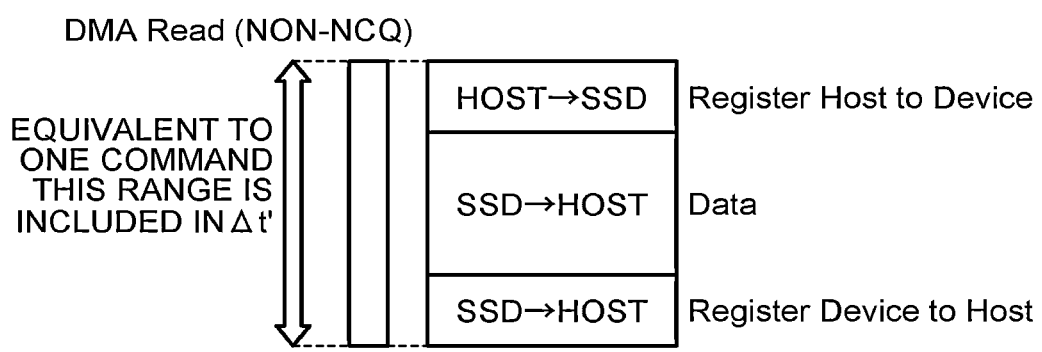
FIG. 102A and FIG. 102B respectively are a diagram illustrating a non-NCQ DMA Read command.
Figure 102B:
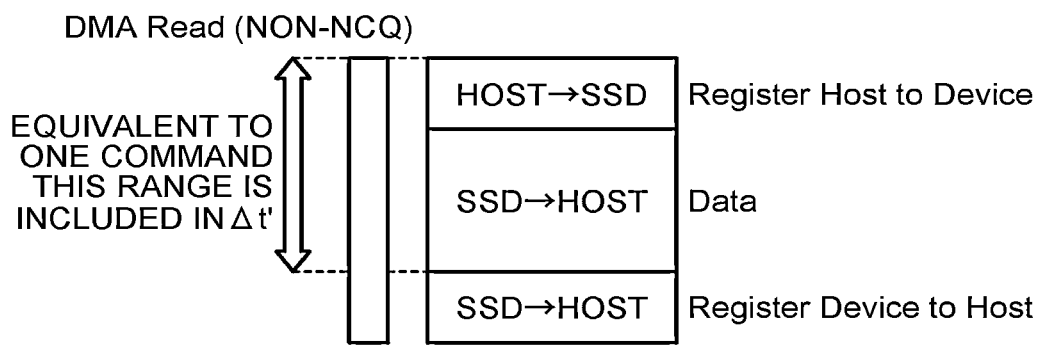

The present invention can be applied even to a non-NCQ command, and, for example, in the case of a DMA Read command, as shown in FIG. 102A, the start time of the command is the time at which a Register Host to Device FIS of the command is transmitted from the host 100 to the SSD 1010, and the end time of the command is the time at which the host 1100 receives a Register Device to Host from the SSD 1010. The end time of the command may be the time at which the host 1100 finishes receiving all of the requested data specified in the RegHD from SSD 10 before the SDB is received (FIG. 102B).

Figure 103A:
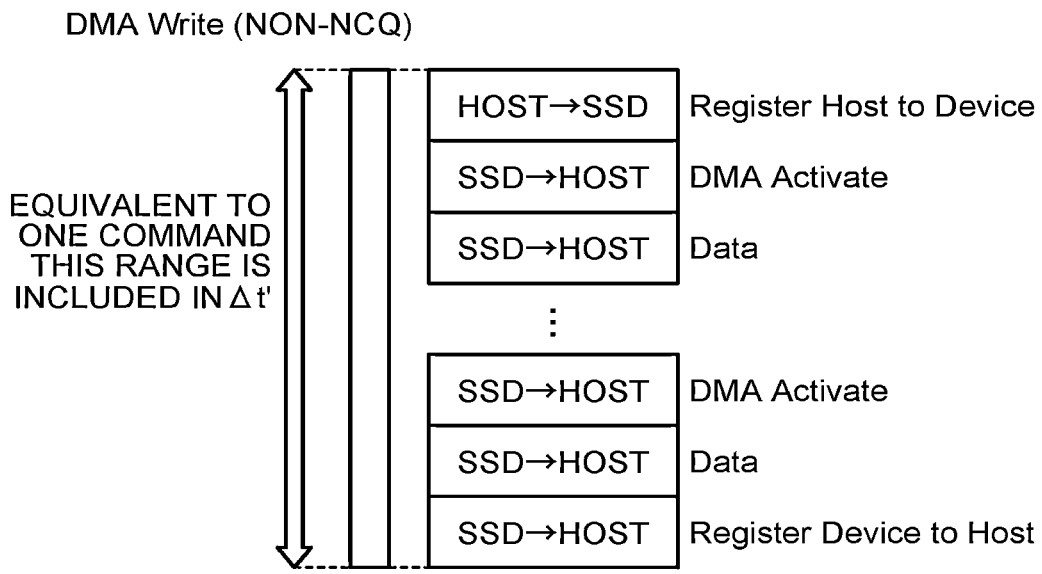
FIG. 103A and FIG. 103B are respectively a diagram illustrating a non-NCQ DMA Write command.
Figure 103B:
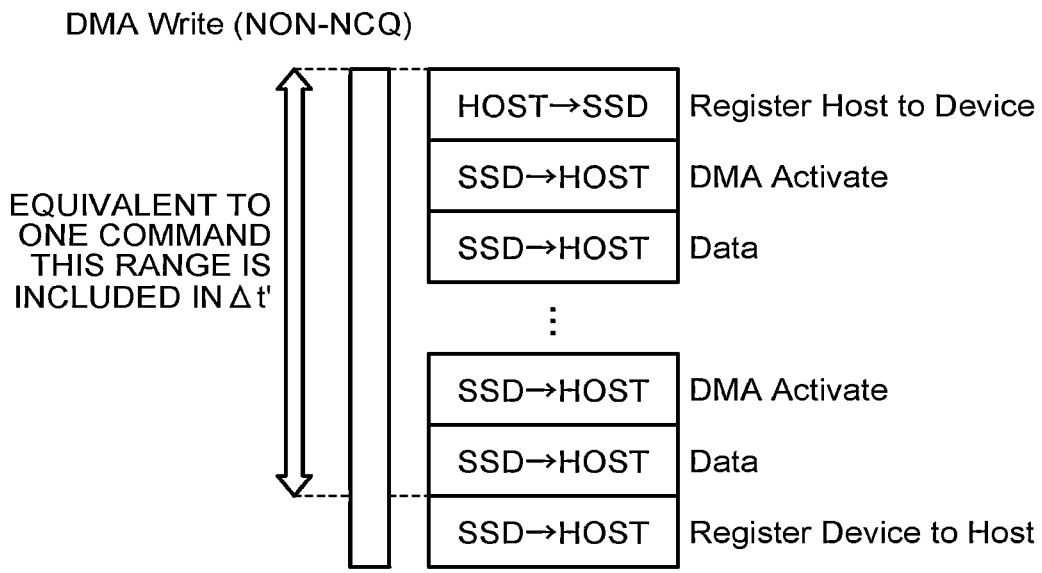

Moreover, in the case of a DMA Write command, which is a non-NCQ Write command, as shown in FIG. 103A, the start time of the command is the time at which a Register Host to Device FIS of the command is transmitted from the host 1100 to the SSD 1010, and the end time of the command is the time at which the host 1100 receives a Register Device to Host FIS from the SSD 1010. The end time of the command may be the time at which the host 1100 finishes sending all of the requested data specified in the RegHD to SSD 1010 before the SDB is received (FIG. 103B). Moreover, in the present embodiment, a case with the SATA is described, however, obviously, the present invention can be applied also to other interfaces such as SAS and USB.

In FIG. 99, the times t0, t1, t2, and t3 indicate the time at which the performance information is calculated. Not all the commands are completed before the performance information is calculated, and there is a command, which exists across time regions Δt1, Δt2, Δt3, and Δt4 divided by the times t0, t1, t2, and t3, such as a bar indicated by hatching. Moreover, in each of the time regions Δt1, Δt2, Δt3, and Δt4, a command to the SSD 1010 is not always active. A command being active indicates that a command is being executed in the SSD 1010. The period in which a command is inactive, for example, indicates a period in which the CPU 1200 in the host 1100 is waiting for operations and a period of waiting for a user's operation. The period in which a command is inactive, for example, an idle state, a standby state and a sleep state of SSD 1010.

Figure 104:
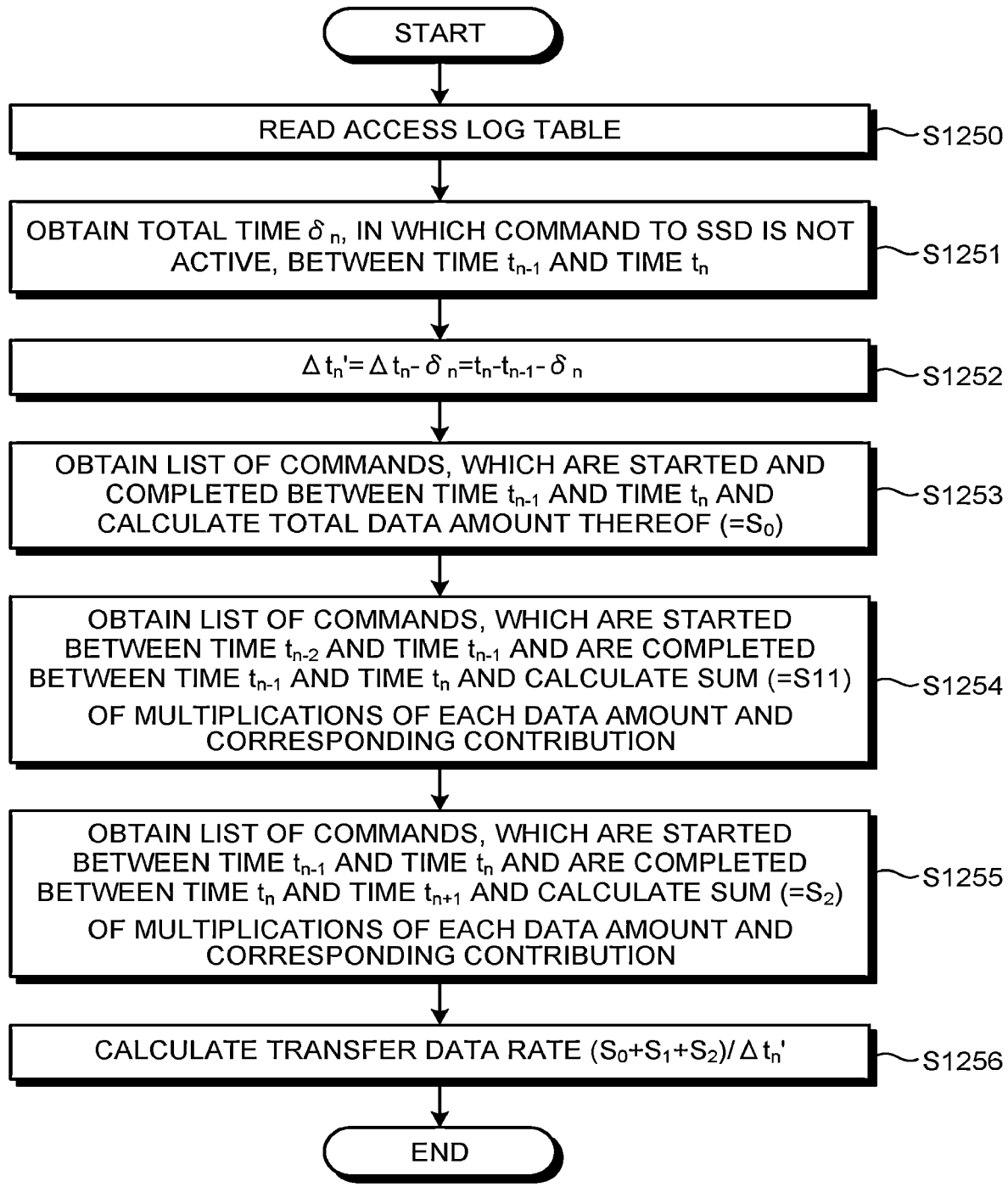
FIG. 104 is a process chart illustrating a calculation procedure of the transfer data rate by the performance information obtaining tool.

FIG. 104 illustrates an example of a calculation procedure of the transfer data rate as the performance information. In this procedure, the transfer data rate is calculated including a plurality of threads. In other words, the transfer data rate is calculated by comprehensively judging a plurality of threads. Moreover, this procedure illustrates a calculation procedure of the transfer data rate between a time tn−1 to a time tn and such a procedure is repeated every performance calculation period. When the start of calculation is triggered, the performance information obtaining tool 112 reads the access log table 1120 (Step S1250). The performance information obtaining tool 1112 obtains a sum δn of time (command inactive time), in which any command to the SSD 1010 is not active, between the time tn−1 and the time tn on the basis of the time information recorded in the access log table 1120 (Step S1251). In the following, the sum δn is called inactive total time. In an example shown in FIG. 99, a command is active in any of a plurality of threads between the time t0 and the time t1 and therefore δn=0. Between the time t1 and the time t2, δa exists as the command inactive time and therefore δn=δa. Between the time t2 and the time t3, δb and δc exist as the command inactive time and therefore δn=δb+δc.

Next, the performance information obtaining tool 1112 subtracts the start time tn−1 in the performance measurement target period from the end time tn in the performance measurement target period to obtain a performance measurement target period Δtn. Furthermore, the performance information obtaining tool 1112 subtracts the inactive total time δn from the performance measurement target period Δtn to obtain an effective performance measurement target period Δtn' (=Δtn−δn) (Step S252). Thus, this procedure enables the performance information obtaining tool 1112 to exclude factors other than the SSD 1010, such as the operation time of the CPU 1200 in the host 1100 and a period of waiting for a response from a user, from the performance measurement by subtracting the inactive total time δn.

Next, the performance information obtaining tool 1112 obtains a list of commands, which are started and completed between the time tn−1 and the time tn, on the basis of recorded information in the access log table 1120 and calculates the total data amount (=S0) by summing transfer lengths thereof (Step S1253). Moreover, the performance information obtaining tool 1112 obtains a list of commands, which are started between the time tn−2 and the time tn−1 as the last period and are completed between the time tn−1 and the time tn as the current period, on the basis of recorded information in the access log table 1120 and calculates the sum (=S1) of multiplications of the data amount of each command and a contribution defined by the following equation (Step S1254).

(contribution)=(command active time between time
 $tn$−1 and time $tn$)/(command active time
 between time $tn$−2 and time $tn$)

Figure 105:
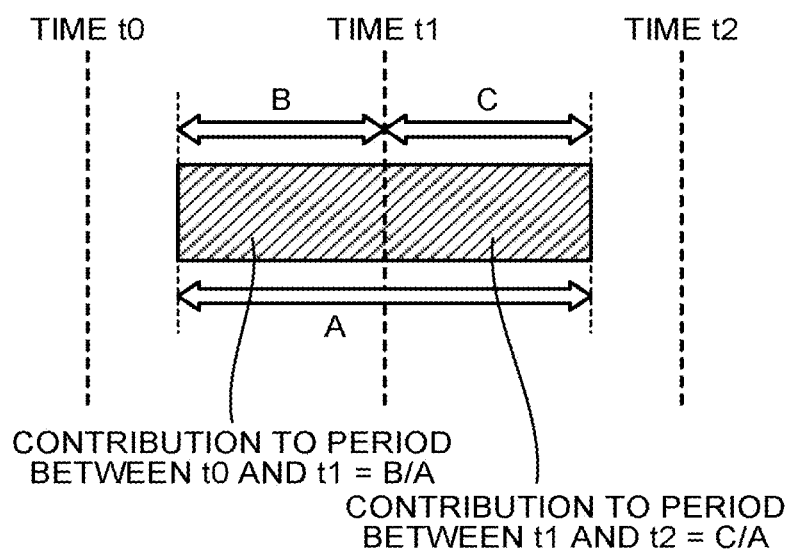
FIG. 105 is a diagram for explaining a contribution.

FIG. 105 illustrates a command that exists across two periods (t0 to t1 and t1 to t2), in which B is the command active time between the time t0 and the time t1, C is the command active time between the time t1 and the time t2, and A is the command active time between the time t0 and the time t2. With respect to this command, the contribution in the period between the time t0 and the time t1 is B/A and the contribution in the period between the time t1 and the time t2 is C/A. In this manner, the data amount of a command, which is started in the last period and is completed in the current period, in the current period is calculated by prorating the total data amount of the command by using the active time in each period.

Next, the performance information obtaining tool 1112 obtains a list of commands, which are started between the time tn−1 and the time tn as the current period and are completed between the time tn and the time tn+1 as the next period, on the basis of recorded information in the access log table 1120 and calculates the sum (S=2) of multiplications of the data amount of each command and the above-described contribution (Step S1255).

Furthermore, the performance information obtaining tool 1112 calculates the transfer data rate by the following equation (Step S1256).

(transfer data rate)=$(S0+S1+S2)/\Delta tn'$

In the procedure in FIG. 104, the transfer data rate is calculated by referring to one period (tn−2 to tn−1 and tn to tn+1) before and after the performance measurement target period (tn−1 to tn). When a command that ends in the performance measurement target period (tn−1 to tn) is started n periods (n is a natural number) before the performance measurement target period, the transfer data rate may be calculated by referring to the periods from the performance measurement target period (tn−1 to tn) to the period that is n periods before the performance measurement target period (tn−1 to tn) by prorating in a similar manner to that shown in FIG. 105. Similarly, when a command that starts in the performance measurement target period (tn−1 to tn) ends n periods (n is a natural number) after the performance measurement target period, the transfer data rate may be calculated by referring to the periods from the performance measurement target period (tn−1 to tn) to the period that is n periods after the performance measurement target period (tn−1 to tn).

Figure 106:
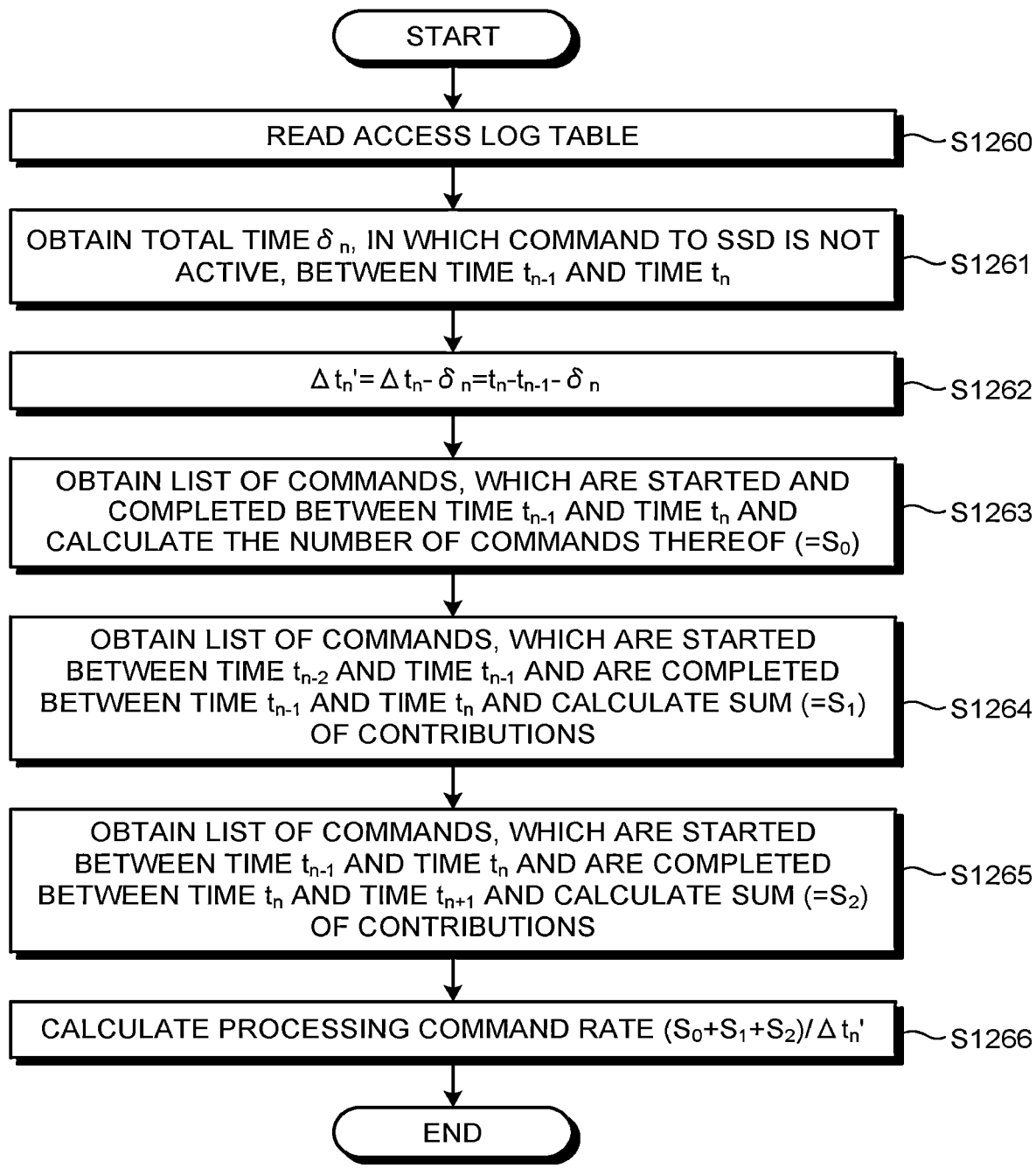
FIG. 106 is a process chart illustrating a calculation procedure of the processing command rate by the performance information obtaining tool.

FIG. 106 illustrates an example of a calculation procedure of the processing command rate as the performance information. As described above, the processing command rate is the number of instructions transferred to and from the SSD 1010 per unit time. The processing content in FIG. 106 is the same as the case where the data amount of one command in the calculation of the transfer data rate shown in FIG. 104 is set to 1. When the start of calculation is triggered, the performance information obtaining tool 1112 reads the access log table 1120 (Step S1260). The performance information obtaining tool 1112 obtains the sum δn of time (command inactive time), in which any command to the SSD 1010 is not active, between the time tn−1 and the time tn on the basis of the time information recorded in the access log table 1120 (Step S1261).

Next, the performance information obtaining tool 1112 subtracts the start time tn−1 in the performance measurement target period from the end time tn in the performance measurement target period to obtain the performance measurement target period Δtn. Furthermore, the performance information obtaining tool 1112 subtracts the inactive total time δn from the performance measurement target period Δtn to obtain the effective performance measurement target period Δtn' (=Δtn−δn) (Step S1262). Next, the performance information obtaining tool 1112 obtains a list of commands, which are started and completed between the time tn−1 and the time tn, on the basis of recorded information in the access log table 1120 and calculates the number of commands (=S0) by counting the commands in the list (Step S1263). Moreover, the performance information obtaining tool 1112 obtains a list of commands, which are started between the time tn−2 and the time tn−1 as the last period and are completed between the time tn−1 and the time tn as the current period, on the basis of recorded information in the access log table 1120 and calculates the contribution of each command to the current period in a manner similar to the above to calculate the sum (=S1) of the contributions (Step S1264). Next, the performance information obtaining tool 1112 performs a similar calculation for commands, which are started between the time tn−1 and the time tn as the current period and are completed between the time tn and the time tn+1 as the next period, on the basis of recorded information in the access log table 1120 to calculate the sum (S=2) of the contributions (Step S1265). Furthermore, the performance information obtaining tool 1112 calculates the processing command rate according to the following equation (Step S1266).

(processing command rate)=$(S0+S1+S2)/\Delta tn'$

Figure 107:
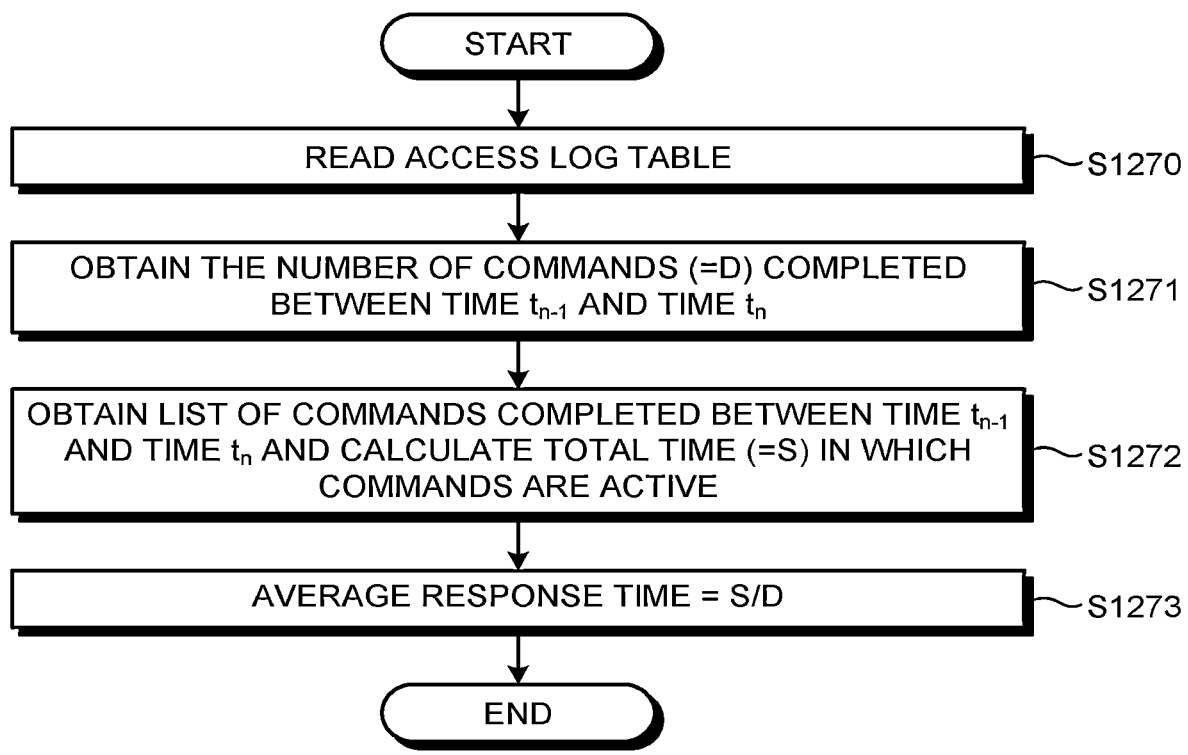
FIG. 107 is a process chart illustrating a calculation procedure of the average response time by the performance information obtaining tool.

FIG. 107 illustrates an example of a calculation procedure of the average response time as the performance information. When the start of calculation is triggered, the performance information obtaining tool 1112 reads the access log table 1120 (Step S1270). The performance information obtaining tool 1112 obtains the number of commands (=D), which are completed during the performance measurement target period between the time tn−1 and the time tn, on the basis of recorded information in the access log table 1120 (Step S1271), calculates the total time (=S) during which the commands, which are completed between the time tn−1 and the time tn, are active (Step S1272), and divides S by D, thereby deriving the average response time (Step S1273).

In the case of employing the maximum response time as other performance information, the maximum response time is obtained by the performance information obtaining tool 1112 obtaining the maximum command active time among commands completed between the time tn−1 and the time tn by referring to the access log table 1120. Moreover, the application processing time can be calculated by using the active time of an application or various threads of the application instead of a command in the calculation of the command response time. In the calculation of the application processing time, for example, when there is no access to an SSD, such as when waiting for a CPU to finish processing or waiting for input from a user, it is desirable to calculate the application processing time by subtracting the time during which there is no access to the SSD from the application execution time. Moreover, the relative score can be obtained by performing addition, subtraction, multiplication, and division on the result of above-described various scores or various parameters in a calculation process of various scores.

Figure 108:
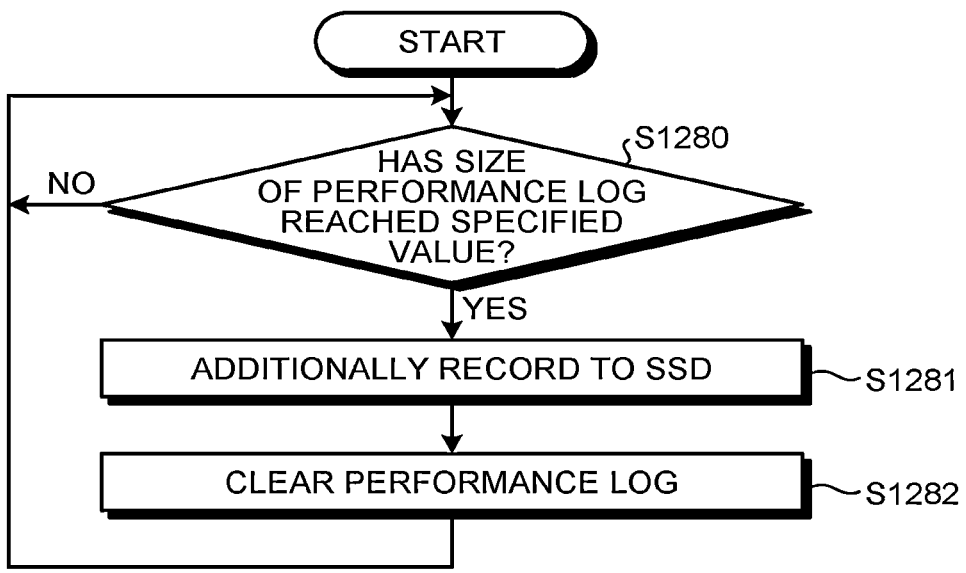
FIG. 108 is a flowchart illustrating a backup procedure of performance information by the performance information obtaining tool.

As described above, performance logs are additionally recorded to the main memory 1202 of the host 1100. If performance logs are only stored in the main memory 1202, information thereon is lost when the power of the host 1100 is turned off. Therefore, as shown in FIG. 108, the performance information obtaining tool 1112 may determine whether the size of performance logs has reached a certain specified value (Step S1280). When the size of the performance logs has reached the certain specified value (Yes in Step S1280), the performance information obtaining tool 1112 records the performance logs in the SSD 1010 or other external memory devices (such as HDD and USB memory) (Step S1281) and thereafter, deletes the performance logs stored in the main memory 1202 (Step S1282). After recording the performance logs in the SSD 1010, the performance logs stored in the main memory 1202 may be left without deleting them. When the power of the host 1100 is turned off and is then turned on, the performance evaluation tool 1110 reads performance logs stored in the SSD 1010 or other external memory devices to the main memory 1202 again.

Figure 109:
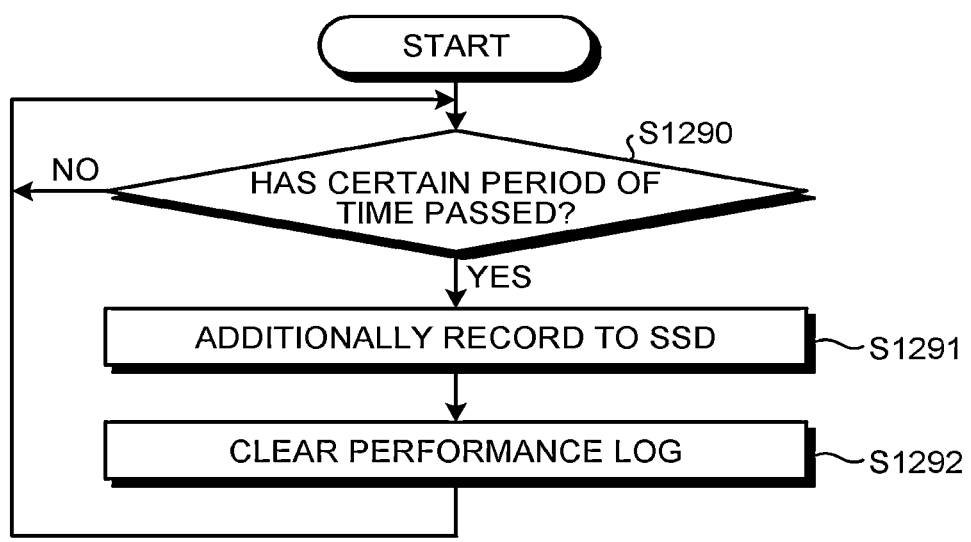
FIG. 109 is a flowchart illustrating a backup procedure of performance information by the performance information obtaining tool.

A method as shown in FIG. 109 may be applied. Specifically, the performance information obtaining tool 1112 determines whether a certain period of time (for example, 10 minutes) has passed since a performance log is stored last time (Step S1290). When the certain period of time has passed, the performance information obtaining tool 1112 records performance logs in the SSD 1010 or other external memory devices (such as HDD and USB memory) (Step S1291) and thereafter, deletes the performance logs stored in the main memory 1202 (Step S1292). In this case also, after recording the performance logs in the SSD 1010, the performance logs stored in the main memory 1202 may be left without deleting them.

In the performance calculation procedure shown in FIG. 104, the performance is calculated comprehensively for all threads (such as a tag in NCQ of the ATA standard and a thread in the OS). On the other hand, the performance information may be calculated for each thread. Especially, when access to the NAND memory 1020 can be controlled independently for each thread such as part of the SSD, the performance information is desirably obtained for each thread. In the following, a case of calculating the total transfer data rate for each thread is illustrated as the performance information for each thread. Other performance indexes, such as the read transfer data rate, write transfer data rate, processing command rate, response time, processing time, and relative score may be calculated in the following manner as the performance information.

Figures 110, 111:
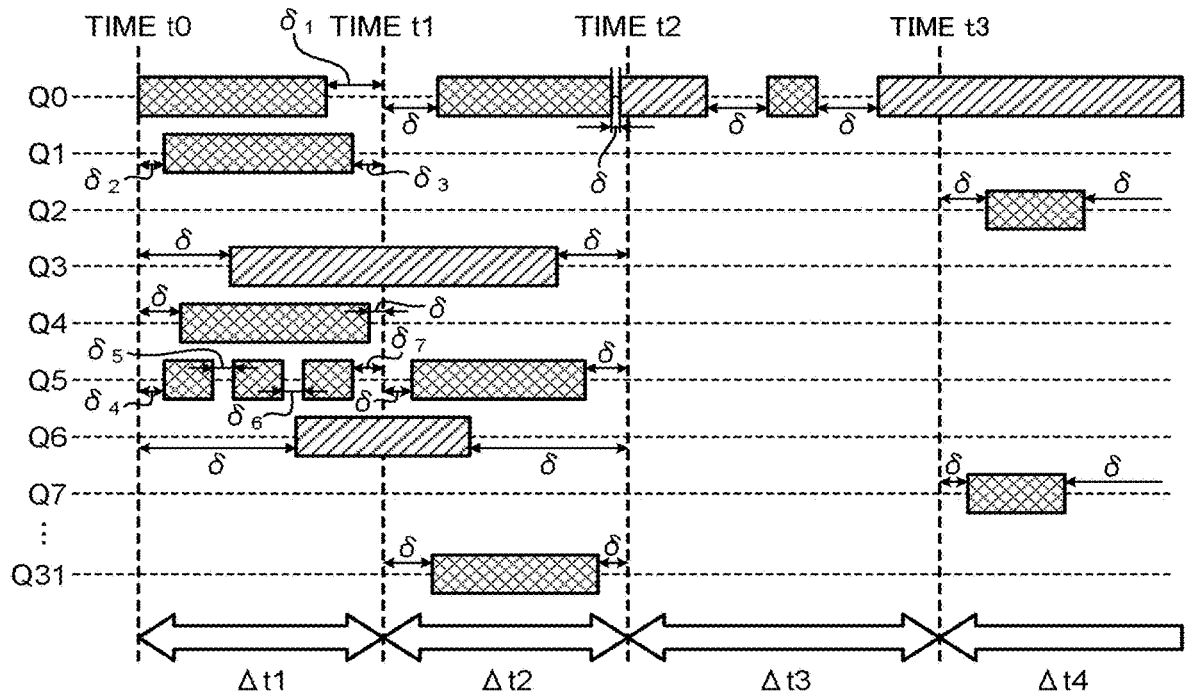
FIG. 110 is a diagram illustrating a command state when a plurality of threads is operated and command inactive time when evaluating a plurality of threads for each thread.
FIG. 111 is a diagram illustrating an example of a performance log table when evaluating a plurality of threads for each thread.

FIG. 110 is an example of a case of calculating the performance information for each tag in NCQ of the ATA standard. On the other hand, the performance information can be calculated for each thread, such as the performance information for each thread number in the OS 1150 and the performance information for each thread in other interface standards, in addition to NCQ. In FIG. 110, Q0, Q1, . . . , and Q31 correspond to the tag number=0, 1, . . . , and 31 in NCQ of the ATA standard, respectively, so that the number of threads (queues) is totally 32. In the similar manner to FIG. 99, cross-hatched bars and hatched bars each indicate an active state of a command in a thread, and the left end of a bar indicates the start time of a command (for example, the time at which RegHD of a command is transmitted) and the right end of a bar indicates the end time of a command (for example, the time at which SDB of a command is received). The times t0, t1, t2, and t3 indicate the time at which the performance information is calculated. A hatched bar indicates a command, which exists across time regions divided by the times t0, t1, t2, and t3. Moreover, as described above, in each of the time regions $\Delta t1$, $\Delta t2$, $\Delta t3$, and $\Delta t4$, a command to the SSD 1010 is not always active, and there is the period $\delta$ in which a command is inactive, for example, a period in which the CPU 1200 in the host 1100 is waiting for operations and a period of waiting for a user's operation.

In the procedure shown in FIG. 104, the performance is calculated by comprehensively judging all the threads, so that an inactive period is a period in which no command to the SSD 1010 is active in a plurality of threads (see $\delta a$, $\delta b$, and $\delta c$ in FIG. 99). When the performance information is calculated individually for each thread, as shown in FIG. 110, any period with no bar for each thread is an inactive period $\delta$ ($\delta 1$, $\delta 2$, . . . ) in which a command is not being executed. Therefore, for example, the effective performance measurement target period $\Delta tn'$ of the thread Q0 in a period between the time t0 and time t1 can be obtained by calculating $\Delta t1-\delta 1$. Moreover, the effective performance measurement target period $\Delta tn'$ of the thread Q1 in a period between the time t0 and time t1 can be obtained by calculating $\Delta t1-(\delta 2+\delta 3)$. Moreover, the effective performance measurement target period $\Delta tn'$ of the thread Q5 in a period between the time t0 and time t1 can be obtained by calculating $\Delta t1-(\delta 4+\delta 5+\delta 6)$.

Next, the procedure in a case of calculating the transfer data rate as the performance information for each thread will be explained with reference to FIG. 104. When the start of calculation is triggered, the performance information obtaining tool 1112 reads the access log table 1120 (Step S1250). The performance information obtaining tool 1112 obtains the sum $\delta n$ of the inactive time $\delta$ between the time tn−1 and the time tn in one thread (in this case, thread Qx (x=0, 1, 2, . . . , 31)) on the basis of the time information recorded in the access log table 1120 (Step S251). Next, the performance information obtaining tool 1112 subtracts the start time tn−1 in the performance measurement target period from the end time tn in the performance measurement target period to obtain the performance measurement target period $\Delta tn$. Furthermore, the performance information obtaining tool 1112 subtracts the inactive total time $\delta n$ from the performance measurement target period $\Delta tn$ to obtain the effective performance measurement target period $\Delta tn'$ (=$\Delta tn-\delta n$) (Step S1252).

Next, the performance information obtaining tool 1112 obtains a list of commands of the thread Qx, which are started and completed between the time tn−1 and the time tn, on the basis of recorded information in the access log table 1120 and calculates the total data amount (=S0) by summing transfer lengths thereof (Step S1253). Moreover, the performance information obtaining tool 1112 obtains a list of commands of the thread Qx, which are started between the time tn−2 and the time tn−1 as the last period and are completed between the time tn−1 and the time tn as the current period, on the basis of recorded information in the access log table 1120, and calculates the contribution of each command to the current period in a manner similar to the above to calculate the sum (=S1) of multiplications of the data amount of each command and a corresponding contribution (Step S1254). Next, the performance information obtaining tool 1112 calculates the contribution by performing a similar calculation for each command of the thread Qx, which are started between the time tn−1 and the time tn as the current period and are completed between the time tn and the time tn+1 as the next period, on the basis of recorded information in the access log table 1120 to calculate the sum (S=2) of multiplications of the data amount of each command and a corresponding contribution (Step S1255). Furthermore, the performance information obtaining tool 1112 calculates the transfer data rate of the current period in the thread Qx according to the following equation (Step S1256).

(transfer data rate)=$(S0+S1+S2)/\Delta tn'$

Such processing is repeatedly performed for each thread.

FIG. 111 illustrates an example of the performance log table 1125 in the case of calculating the transfer data rate for each thread. As shown in FIG. 111, the total transfer data rate is recorded for each measurement target period in each thread in the performance log table 1125. As a performance log, each of the total transfer data rate, read transfer data rate, and write transfer data rate may be calculated. Alternatively, as a performance log, each of the transfer data rate, processing command rate, response time, processing time, and relative score may be calculated. Moreover, a plurality of threads (queues) may be grouped together, such as (Q1 and Q2) and (Q3 and Q4), and a performance log may be recorded for each group. In the similar manner to FIG. 97, a performance log can be visualized on the display 1133 by a graph. Moreover, in the similar manner to FIG. 98, when there is no read/write access to the SSD 1010 for a certain period of time or longer in a certain thread, it is desirable to hide the graph for the period in the thread or clearly display that there is no access to the thread during the period.

In this manner, according to the ninth embodiment, the host 1100 obtains access logs of commands that the software 1140 or the OS 1150 transmits and receives to and from the SSD 1010, stores the access logs in the access log table 1120, and calculates the performance information on the SSD 1010 by using the stored access logs during normal use of the host 1100, so that special writing for measuring the performance and a special measurement period for measuring the performance do not occur. Therefore, it is possible to correctly obtain momentarily changing performance information of an external memory device extremely close to the performance while in actual use, which a user experiences, and the reliability of an external memory device is not adversely affected. Moreover, when calculating the performance information by using the time information, the performance information is calculated by using the effective time information obtained by excluding the time during which a command to an external memory device is inactive, so that the performance of an external memory device can be obtained correctly without being affected by, for example, a period of waiting for input from a user or a period of waiting for a response from a CPU or other hardware. Extra writing to the SSD 1010 is made only in the case of storing a performance log in the SSD 1010. The data size of a performance log is extremely small, so that the effect on the performance and the reliability of the SSD 1010 is extremely low, and the effect thereof can be made further smaller as the performance information obtaining time interval is made longer.

Tenth Embodiment

In the tenth embodiment, performance logs are classified into a sequential access (sequential reading and sequential writing) and a random access (random reading and random writing) and are further classified according to transfer length (data length). FIG. 112 illustrates the performance log table 1125 to which the tenth embodiment is applied and illustrates the data transfer rate as the performance information. As shown in FIG. 112, the performance log table 1125 is classified into four tables, that is, sequential reading, sequential writing, random reading, and random writing. Furthermore, each table is classified according to a plurality of different transfer length. For example, the performance of the SSD 1010 becomes different between a case of performing a sequential access every transfer length=4 KiB, which is a small size, and a case of performing a sequential access every transfer length=128 KiB, which is a relatively large size, so that the present embodiment performs performance classification according to transfer length.

Figure 113:
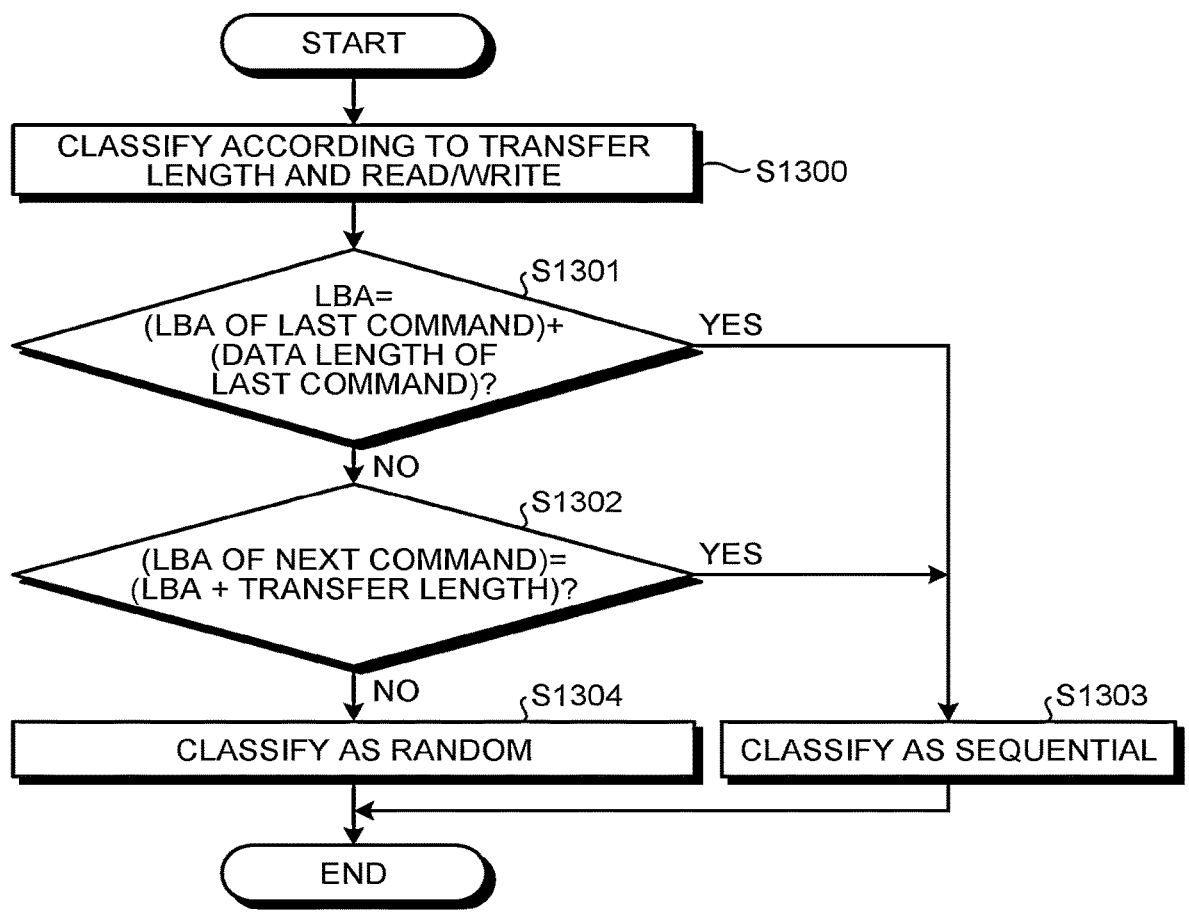
FIG. 113 is a flowchart illustrating an example of an operation procedure of identifying whether a command is a sequential access or a random access.

FIG. 113 illustrates an example of a procedure for identifying whether the access log information is classified as a sequential access or a random access. The performance information obtaining tool 1112 reads the access log information recorded in the access log table 1120 in time sequence, classifies each access log information according to whether the access log information is a read command or a write command and further classifies it according to transfer length (Step S1300). Next, the performance information obtaining tool 1112 determines whether LBA of a command included in the access log information is equal to the result obtained by adding transfer length included in the last access log information to LBA of a command included in the last access log information for one group classified according to a read command or a write command and transfer length. (Step S1301). When the LBA is equal to the result, the access log information is classified as a sequential access (Step S1303). Moreover, when the determination in Step S1301 is NO, the performance information obtaining tool 1112 determines whether LBA of a command included in the access log information immediately after the access log information is equal to the result obtained by adding transfer length included in the access log information to the LBA of the command included in the access log information (Step S1302). When the LBA is equal to the result, the access log information is classified as a sequential access (Step S1303), and, when the LBA is not equal to the result, the access log information is classified as a random access (Step S1304). Such processing is performed for each classified group.

In the above processing, when there is a plurality of threads, it is desirable to determine whether the access log information is classified as a sequential access or a random access by comprehensively judging the threads. Moreover, when continuity of LBA of a current command and the next command continues for a predetermined number of commands or more, the access log information may be determined as a sequential access, and, when the continuity does not continue for the predetermined number of commands or more, the access log information may be determined as a random access. Moreover, when continuity of LBA of a current command and the next command continues for a predetermined data size or more, the access log information may be determined as a sequential access, and, when the continuity does not continue for the predetermined data size or more, the access log information may be determined as a random access.

In the Step S1301, the group does not have to be classified according to transfer length, and the performance may be calculated including all of the transfer lengths.

According to the tenth embodiment, because performance logs are classified as a sequential access or a random access, the performance of the SSD can be evaluated separately for each of a sequential access and a random access. Moreover, because performance logs are classified according to transfer length, the performance of the SSD can be evaluated separately for each transfer length.

Eleventh Embodiment

In the eleventh embodiment, the performance information obtaining tool 1112 detects performance degradation of the SSD 1010 on the basis of the performance information monitored in real time and performs processing for restoring the performance of the SSD 1010. As described above, when the performance of the SSD 1010 decreases, the transfer data rate decreases, the processing command rate decreases, the response time increases, and the processing time increases. The relative score degrades depending on each score value definition. The performance degradation of SSD 1010 can be detected by comparing the performance data with a boundary condition. The boundary condition is, for example, the lower limit of the transfer data rate, the lower limit of the processing command rate, the upper limit of the response time, the upper limit of the processing time, or the threshold of the relative score. When the transfer data rate of SSD 1010 is smaller than the lower limit of the transfer data rate, the performance of SSD 1010 is deteriorated. When the processing command rate is smaller than the lower limit of the processing command rate, the performance of SSD 10 is deteriorated. When the response time is greater than the upper limit of the response time, the performance of SSD 1010 is deteriorated. When the processing time is greater than the upper limit of the processing time, the performance of SSD 1010 is deteriorated. When the relative score exceeds the threshold of the relative score, the performance of SSD 1010 is deteriorated. In the following, only a case of the transfer data rate is described, but similar processing can be performed in a case of other performance indexes. Moreover, each boundary condition value may be determined, for example, based on an expected design value at the time of designing the SSD or minimum specifications presented to a customer.

Figure 114:
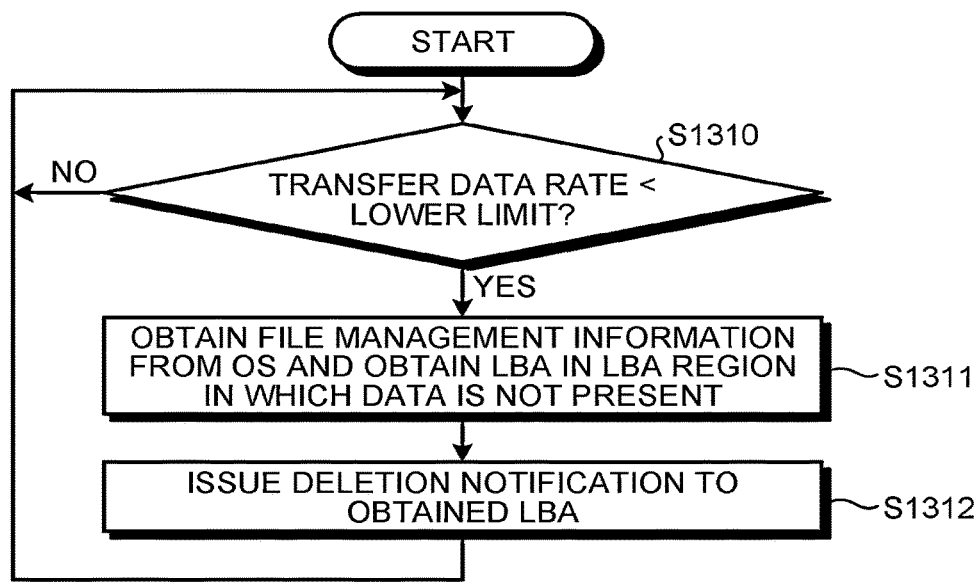
FIG. 114 is a flowchart illustrating an example of an operation procedure by the performance information obtaining tool when performance of the SSD decreases.

FIG. 114 illustrates a procedure of restoring the performance by issuing the deletion notification (for example, TRIM command) when the transfer data rate becomes lower than the lower limit. The performance information obtaining tool 1112 determines whether the transfer data rate becomes lower than the lower limit on the basis of stored information in the performance log table 1125 (Step S1310). When the transfer data rate becomes lower than the lower limit, the performance information obtaining tool 1112 obtains file management information (metadata for OS 1150) from the OS 1150, obtains LBA in a LBA region in which data is not valid for the OS 1150 based on the obtained file management information (Step S1311), and issues the deletion notification (for example, TRIM command) to the obtained LBA region (Step S1312). Consequently, the number of free blocks in the SSD 1010 increases and therefore the performance of the SSD 1010 is restored.

Figure 115:
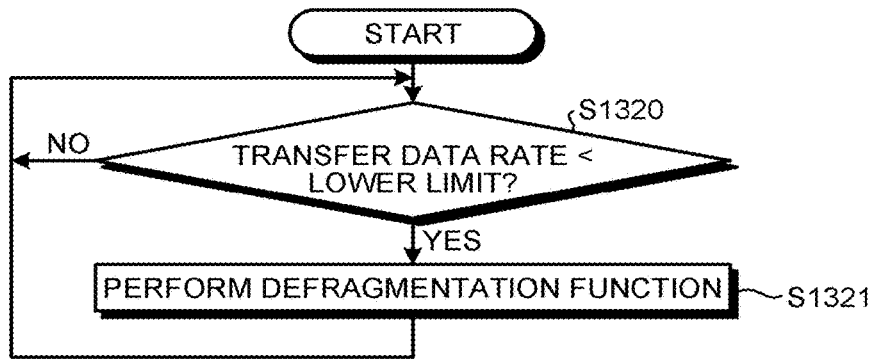
FIG. 115 is a flowchart illustrating an example of an operation procedure by the performance information obtaining tool when performance of the SSD decreases.
Figure 116A:
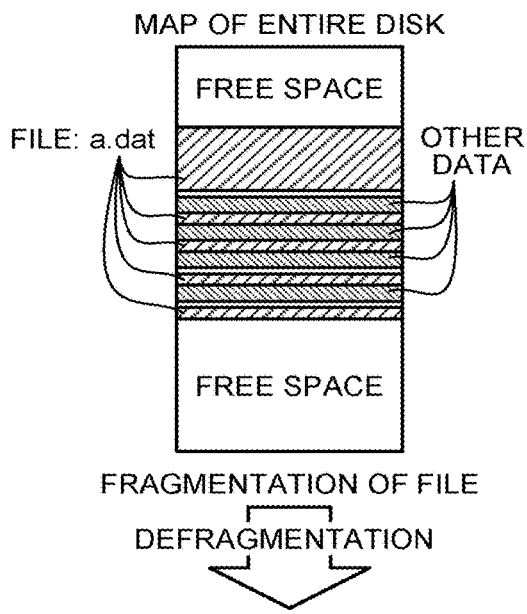
FIGS. 116A, 116B, 116C, and 116D are respectively a diagram illustrating defragmentation.

FIG. 115 illustrates a procedure of restoring the performance by performing defragmentation on the host 1100 when the transfer data rate becomes lower than the lower limit. When the transfer data rate becomes lower than the lower limit (Step S1320), the performance information obtaining tool 1112 performs defragmentation in the host 1100 by using, for example, a file optimization tool (defragmentation tool) installed in the host 1100 (Step S1321). Normally, as shown in FIG. 116A, LBA of a file or a free space is fragmented as use of an external memory device progresses. User data is normally managed in units of files by the OS 1150 and data in the same file is stored in discontinuous LBA regions in some cases (files "a.dat" shown in FIG. 116A). At this time, when the fragmented files "a.dat" are read, a read command needs to be divided to each LBA region, so that the read performance degrades. In the defragmentation function, fragmented data is relocated to continuous LBA regions to eliminate the fragmented state as shown in FIG. 116B. Such performance restoration by defragmentation has an effect of reducing the number of read commands to be processed in the nonvolatile memory device 1010. It is therefore useful for, for example, other nonvolatile memory devices, such as a hard disk drive as well as an SSD including a NAND flash memory that is a storage medium. Furthermore, in a hard disk drive, if a LBA region as a read target is fragmented, the number of seek operations of a header increases and the performance is degraded, so that defragmentation is effective.

Figure 116C:
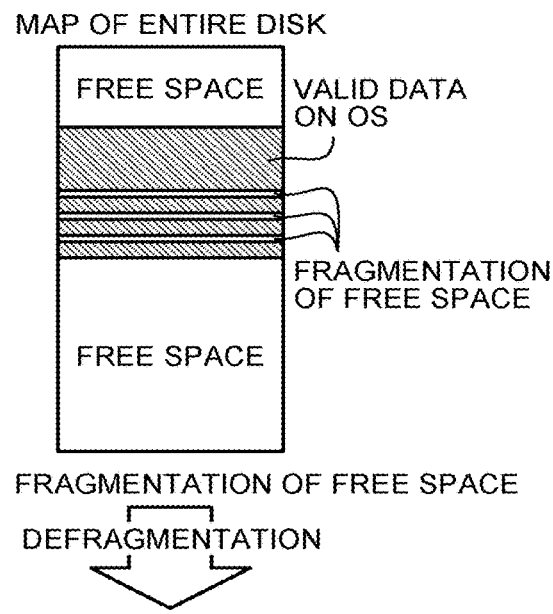
Figure 116B:
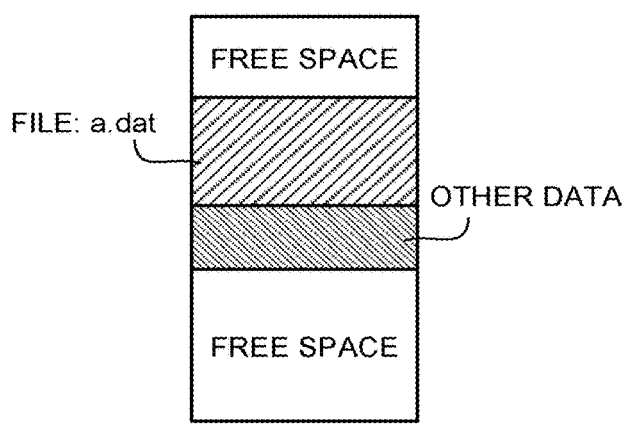
Figure 116D:
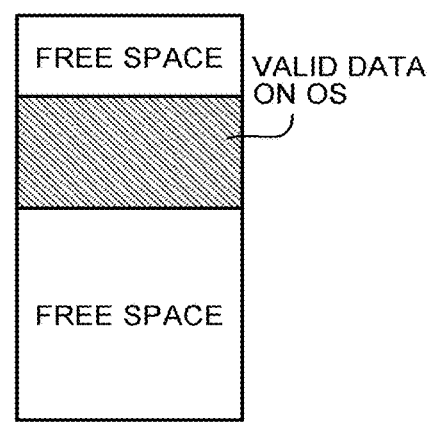

As shown in FIG. 116C, a LBA region (free space), in which data is not stored, in the file management table in the OS 1150 is fragmented over discontinuous LBA regions as a user uses the region. In this state, when a user newly generates and updates a file, the OS 1150 allocates fragmented LBA regions for data writing in some cases. At this time, a write operation that would otherwise be finished by only one writing to continuous LBA regions results in writing to a plurality of fragmented LBA regions in some cases, thereby degrading the write performance. In the defragmentation function, as shown in FIG. 116D, LBA is relocated so that user data is moved to the fragmented free spaces to fill the fragmented free spaces, thereby eliminating fragmentation of a free space. Consequently, the write performance of an external memory device improves. Such performance restoration by defragmentation has an effect of reducing the number of write commands to be processed in the nonvolatile memory device 1010. It is therefore useful for, for example, other nonvolatile memory devices, such as a hard disk drive as well as an SSD including a NAND flash memory that is a storage medium. Furthermore, in a hard disk drive, if a LBA region as a write target is fragmented, the number of seek operations of a header increases and the performance is degraded, so that defragmentation is effective.

Figure 117:
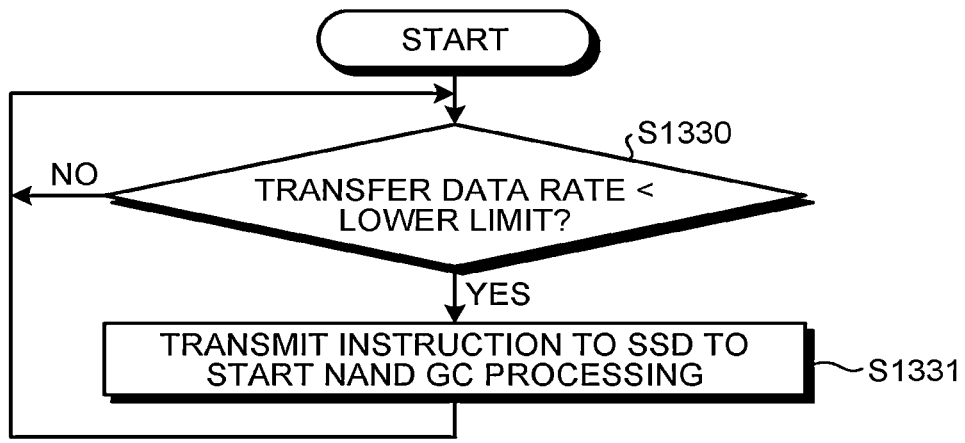
FIG. 117 is a flowchart illustrating an example of an operation procedure by the performance information obtaining tool when performance of the SSD decreases.

FIG. 117 illustrates a procedure of restoring the performance by transmitting an instruction to the SSD 1010 to forcibly performing the NAND GC processing when the transfer data rate becomes lower than the lower limit. The instruction may be performed, for example, by SCT Command Transport described in INCITS ACS-2, a vendor unique command or the like. When the transfer data rate becomes lower than the lower limit (Step S1330), the performance evaluation tool 1110 transmits an instruction to the SSD 1010 to cause the SSD 1010 to perform the NAND GC processing (Step S1331). Consequently, the NAND GC processing is performed in the SSD 1010 and the number of free blocks increases, thereby restoring the performance of the SSD 1010.

Figure 118:
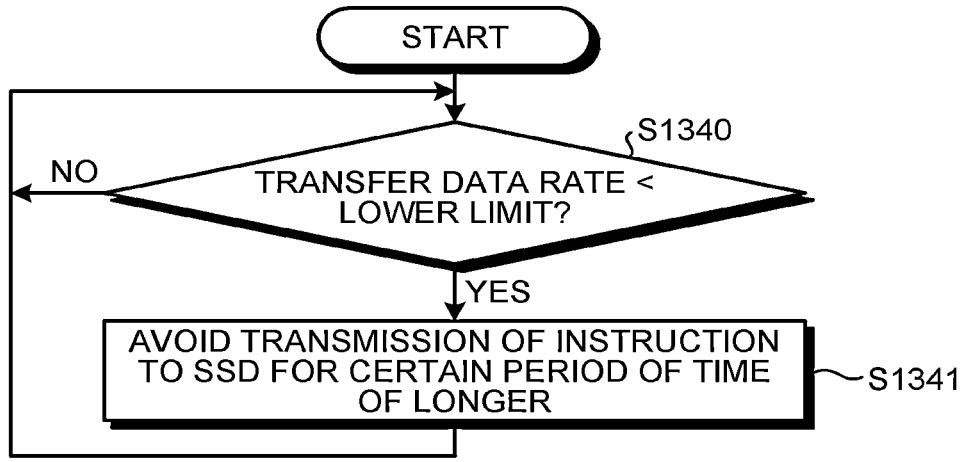
FIG. 118 is a flowchart illustrating an example of an operation procedure by the performance information obtaining tool when performance of the SSD decreases.

FIG. 118 illustrates a procedure of restoring the performance when the transfer data rate becomes lower than the lower limit, by causing the above-described automatic NAND GC processing to be performed in the SSD 1010 by prohibiting the software 1140 or the OS 1150 from transmitting any instruction to the SSD 1010 for a certain period of time or longer or prohibiting the software 1140 or the OS 1150 from transmitting a media access command (command with which access to the NAND memory 1020 occurs. e.g. Write Command, Read Command) to the SSD 1010. When the transfer data rate becomes lower than the lower limit (Step S1340), the performance information obtaining tool 1112 prohibits the software 1140 or the OS 1150 from transmitting any instruction to the SSD 1010 for a certain period of time or longer or prohibits the software 1140 or the OS 1150 from transmitting a media access command to the SSD 1010 (Step S1341). The NAND GC processing is caused to be performed in the SSD 1010 in this manner, so that the number of free blocks in the SSD 1010 increases, thereby restoring the performance of the SSD 1010.

Figure 119:
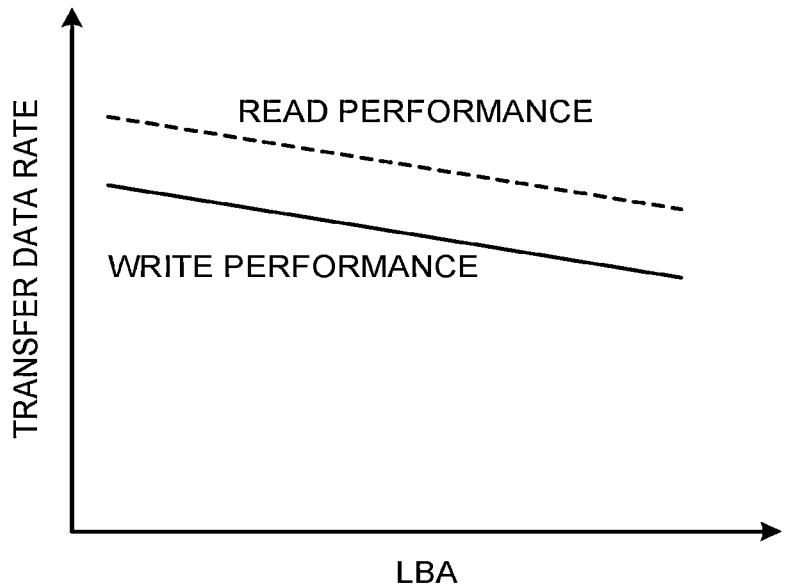
FIG. 119 is a diagram illustrating LBA dependence of the transfer data rate of a hard disk drive (HDD)

FIG. 119 illustrates LBA dependence of the transfer data rate of a hard disk drive (HDD). Normally, in an HDD, data having a smaller LBA is located in an outer periphery of a magnetic disk of the HDD and data having a larger LBA is located in an inner periphery of a magnetic disk of the HDD. Because the angular speed of a magnetic disk is constant, the number of bits that a header passes per unit time is larger in an outer periphery of the HDD and the number of bits that a header passes per unit time is smaller in an inner periphery of the HDD. Therefore, as shown in FIG. 119, the performance degrades as LBA becomes larger.

Figure 120:
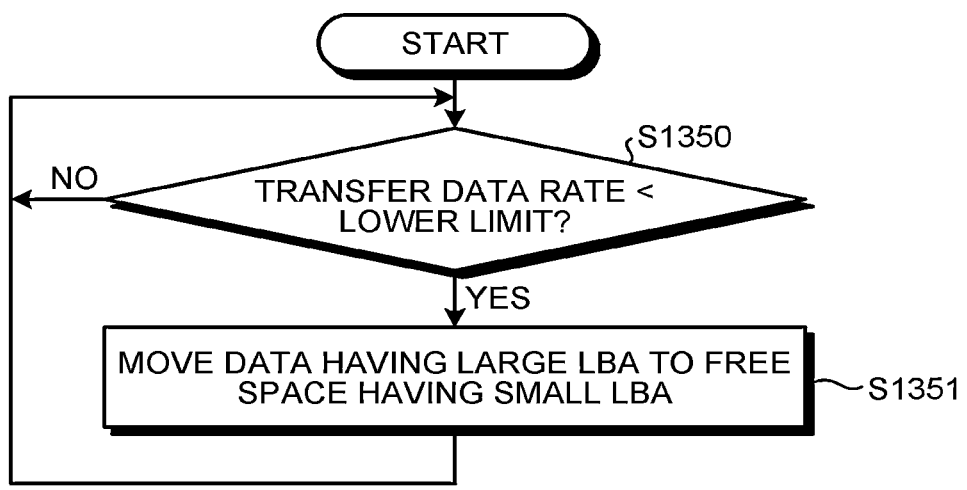

FIG. 120 illustrates a performance restoring procedure in a case where an HDD is employed as an external memory device. When the transfer data rate becomes lower than the lower limit (Step S1350), the performance information obtaining tool 1112 moves data having a large LBA to a free LBA space having a small LBA (Step S1351). Consequently, the performance degradation of the HDD can be restored.

As described above, when the transfer data rate becomes lower than the lower limit, the performance of an SSD can be restored by transmitting various commands or controlling the SSD to optimize the SSD. The optimization function of the present embodiment is not limited to the specific examples of the optimization function described in the present embodiment.

Figure 121:
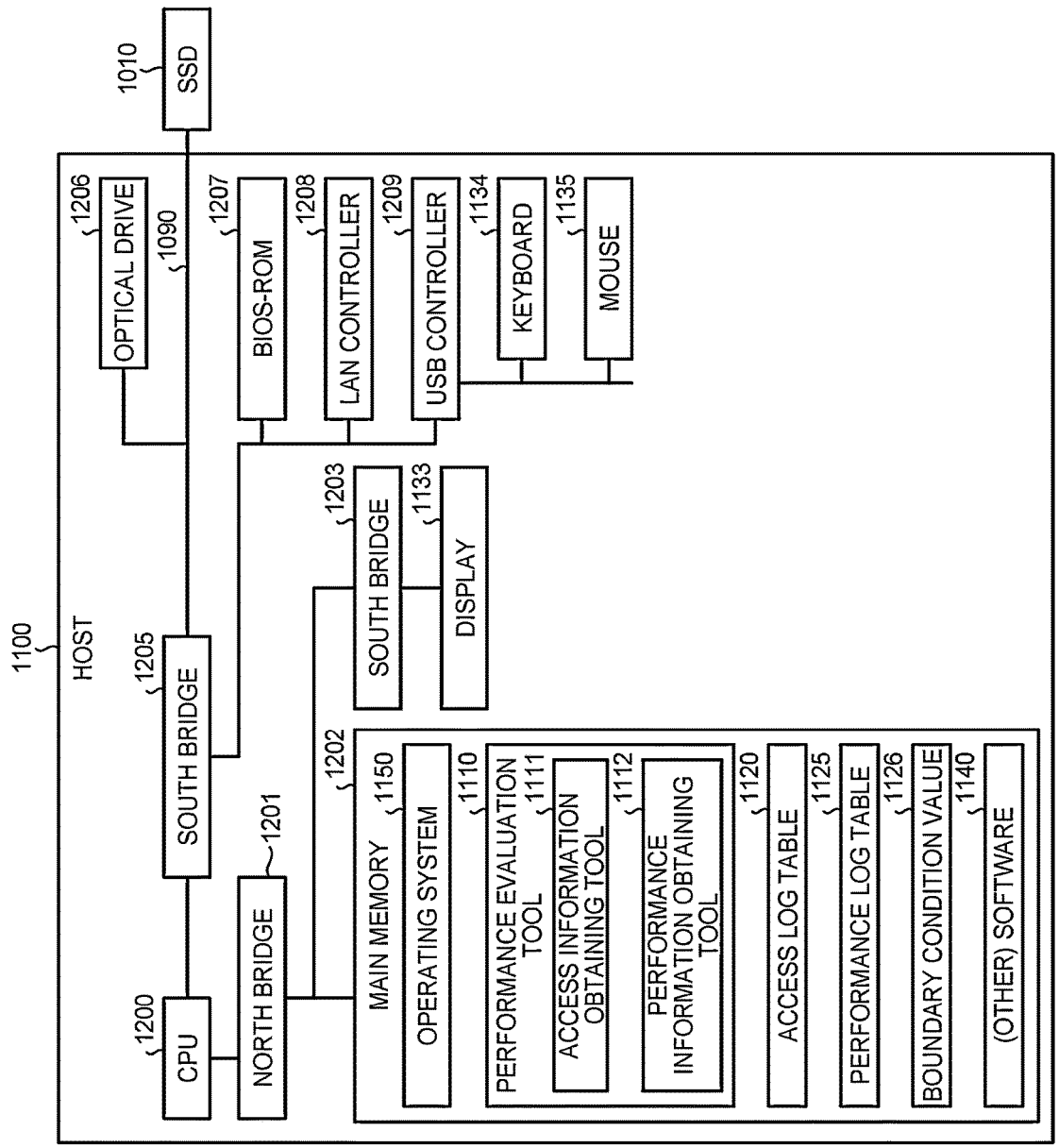
Figure 122:
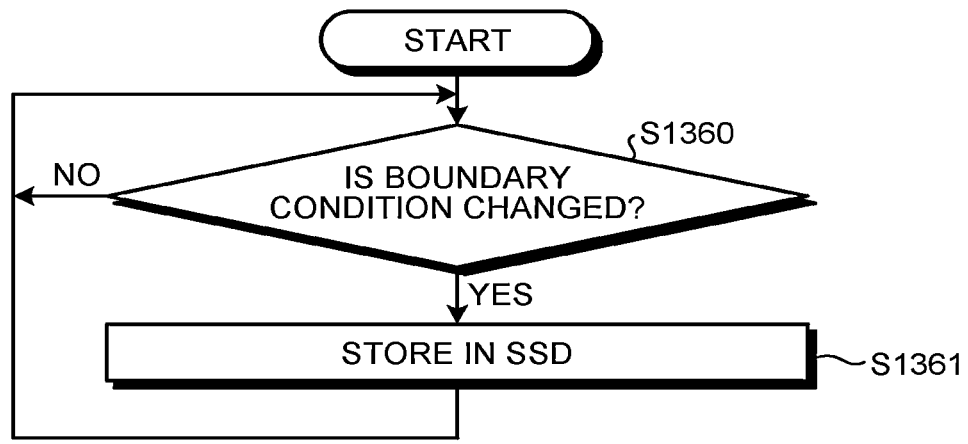

In the case of exceeding the boundary condition value used above, a warning message may be displayed to a user instead of performing the above-described performance optimization. Moreover, the above-described boundary condition value (such as upper limit and lower limit) may be set to a fixed value in a design phase of an external memory device or may be changed dynamically later. For example, the performance information obtaining tool 1112 may increase the upper limit (decrease the lower limit) if the performance is not restored even by performing the above optimization or if the optimization occurs too frequently. The dynamic boundary condition value is stored in the main memory 1202 of the host 1100 as shown in FIG. 121. In FIG. 121, a boundary condition value storing region 1126, which stores the boundary condition value, is provided in the main memory 1202. Moreover, as shown in FIG. 122, when the boundary condition is changed (Step S1360), the performance evaluation tool 1110 may store the changed boundary condition value in the SSD 1010 (Step S1361) to prevent the value being lost when the power of the computer system is off.

When determining the boundary condition value, the boundary condition may be calculated based on the past performance information stored in the performance log table 1125. For example, if the average performance information in a predetermined period (for example, 1 month) after first powered-up is stored in the SSD 1010 and, for example, 0.8 times of this average performance information is used as the boundary condition, the above optimization is performed on the SSD 1010 when the performance degrades by 20% from the performance immediately after shipping.

Twelfth Embodiment

In the above embodiments, the performance evaluation tool 1110 is configured such that the access information obtaining tool (access information obtaining program) 1111 always monitors the access information on the software 1140 and additionally records the access information to the access log table 1120. On the other hand, the frequency of obtaining the access information may be reduced to improve the efficiency of calculation processing for the OS 1150 and the software 1140 when the performance of the CPU of the host 1100 is extremely low and when a CPU load caused by the access information obtaining tool 1111 is high. Therefore, when the performance information obtaining tool 1112 of the performance evaluation tool 1110 periodically obtains the CPU utilization from the OS 1150, if the CPU utilization of the host 1100 is a predetermined value or higher, the access information obtaining tool 1111 may be unloaded not to obtain access logs.

Figure 123:
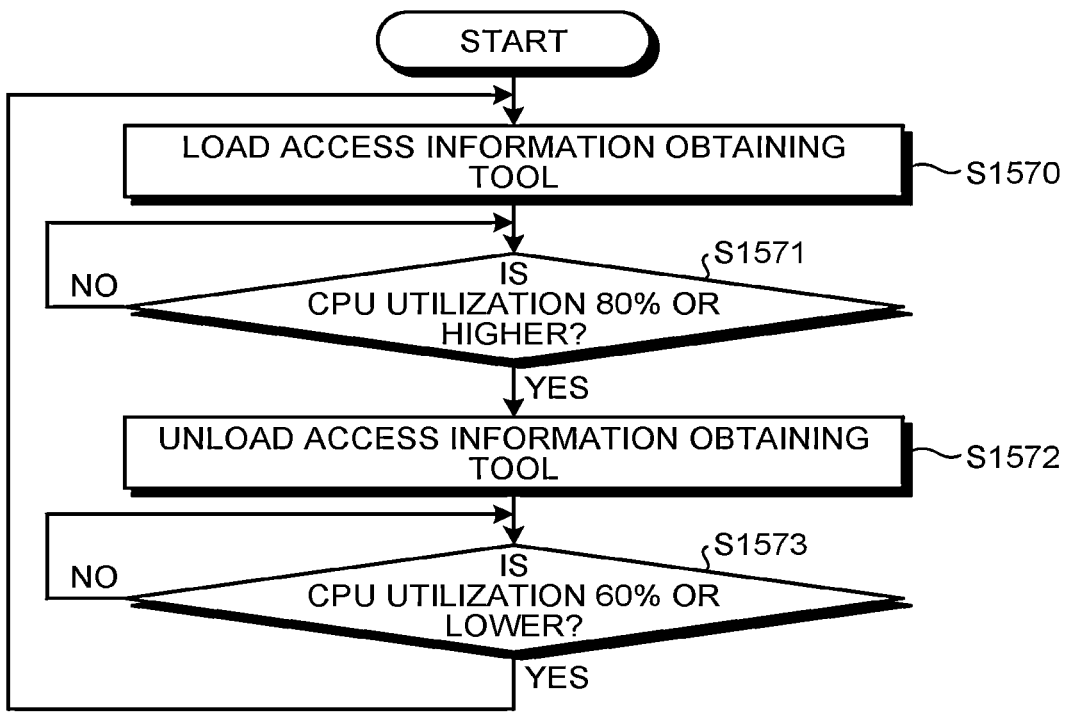

FIG. 123 illustrates a procedure for unloading and reloading the access information obtaining tool 1111 by the performance information obtaining tool 1112 on the basis of the CPU utilization. After the host 1100 is started, the performance information obtaining tool 1112 of the performance evaluation tool 1110 is started and the performance information obtaining tool 1112 loads the access information obtaining tool 1111 (Step S1570). The performance information obtaining tool 1112 periodically obtains the CPU utilization from the OS 1150 and determines whether the CPU utilization is a predetermined value J1 (for example, 80%) or higher (Step S1571). When the CPU utilization is the predetermined value J1 or higher, the performance information obtaining tool 1112 determines that the CPU load is too high and unloads (or disable) the access information obtaining tool 1111 to prioritize processing of other applications (Step S1572). Thereafter, the performance information obtaining tool 1112 periodically obtains the CPU utilization from the OS 1150 and determines whether the CPU utilization is a predetermined value J2 (for example, 60%) or lower (Step S573). When the CPU utilization is the predetermined value J2 or lower, the performance information obtaining tool 1112 determines that the CPU load is reduced and reloads the access information obtaining tool 1111 to resume obtaining access logs (Step S1570).

The predetermined values J1 and J2 desirably have a relation of J1>(J2+margin) to prevent that switching of loading and unloading of the access information obtaining tool 1111 occurs frequently and to prevent that the switching itself burdens the host 1100. For example, the margin is set to about 20%. Moreover, the time interval to obtain the CPU utilization in Step S1573 is desirably made longer than the time interval to obtain the CPU utilization in Step S1571 for preventing that the monitoring itself burdens the CPU when the CPU load is high.

Figure 124:
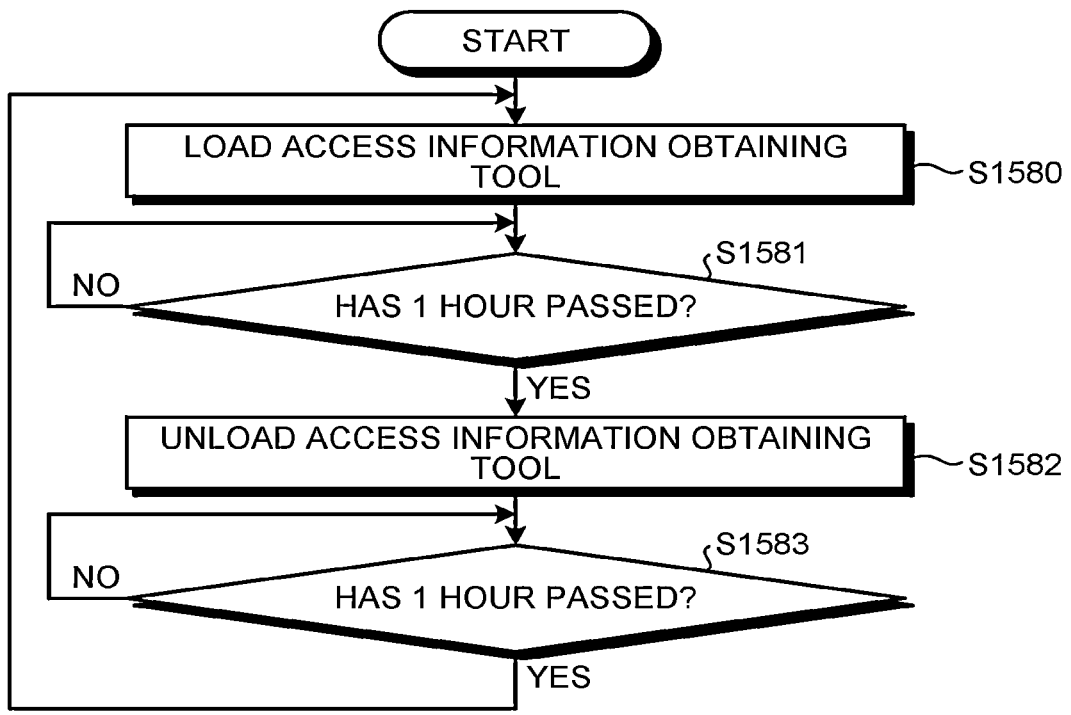

FIG. 124 illustrates a procedure for unloading and reloading the access information obtaining tool 1111 by the performance information obtaining tool 1112 at regular time intervals. After loading the access information obtaining tool 1111 (Step S1580), the performance information obtaining tool 1112 determines whether a certain period of time (for example, 1 hour) has passed (Step S1581). When the certain period of time has passed, the performance information obtaining tool 1112 unloads the access information obtaining tool 1111 (Step S1582). Thereafter, the performance information obtaining tool 1112 determines whether a certain period of time (for example, 1 hour) has passed (Step S1583). When the certain period of time has passed, the performance information obtaining tool 1112 reloads the access information obtaining tool 1111 and resumes obtaining access logs (Step S1580). In this manner, a period during which access logs are obtained and a period during which access logs are not obtained are switched at regular time intervals.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A host device to which a semiconductor memory device is connectable,
the semiconductor memory device comprising:
   a nonvolatile semiconductor memory including memory cells for storing data, and configured to electrically erase, in a first unit, data stored in the memory cells, the first unit including the plurality of memory cells;

a volatile semiconductor memory;

a controller; and a host interface, each of the nonvolatile semiconductor memory and the volatile semiconductor memory being configured to store first information for specifying a physical address of the nonvolatile semiconductor memory corresponding to logical address information received via the host interface, when receiving a write command via the host interface, the controller being configured to generate a correction code by using data specified by the received write command and to store the data and the correction code in the nonvolatile semiconductor memory, and when receiving a read command via the host interface, based on data and a corresponding correction code read from the nonvolatile semiconductor memory using the first information, the controller being configured to correct the read data, the nonvolatile semiconductor memory being configured to further store:

second information based on a total number of pieces of write data received according to the received write command;

third information based on a total number of pieces of data read from the nonvolatile semiconductor memory according to the received read command;

fourth information related to a number of pieces of data that have not been corrected by using the corresponding correction code among data read from the nonvolatile semiconductor memory;

fifth information indicating, with the first unit, information corresponding to a number of memory cells in the nonvolatile semiconductor memory that are determined to be unable to write data therein; and sixth information corresponding to a number of the memory cells in the nonvolatile semiconductor memory that are determined to be able to write data therein, wherein the host device is configured to:

transmit the write command and the read command to the semiconductor memory device;

read the second information from the semiconductor memory device;

read the third information from the semiconductor memory device;

read the fourth information from the semiconductor memory device;

read the fifth information from the semiconductor memory device;

read the sixth information from the semiconductor memory device;

display, on a display device connected to the host device, first status information of the nonvolatile semiconductor memory based on the read second information or the read third information, and second status information of the nonvolatile semiconductor memory based on the read fourth information or the read fifth information, the second status information indicating a remaining lifespan of the semiconductor memory device; and display, when the remaining lifespan becomes less than a first threshold, a warning screen on the display device, the warning screen including a message that prompts back up of data stored in the semiconductor memory device.

2. The host device according to claim 1, wherein a color of an icon included in the first status information is changed when the second information or the third information has exceeded a second threshold.

3. The host device according to claim 1, wherein the host device is configured to transmit, to the semiconductor memory device, a certain command that specifies logical address information, and the semiconductor memory device is configured to erase, in the first unit, data stored in a corresponding physical address based on the certain command and the logical address information received from the host device, and to change the sixth information.

4. The host device according to claim 1, wherein the host device is configured to acquire a third to eighth threshold corresponding to each of the second to sixth information from the semiconductor memory device.

5. The host device according to claim 4, wherein the host device is configured to calculate the remaining lifespan based on at least one piece of information among the acquired second to sixth information.

6. The host device according to claim 5, wherein the host device is configured to calculate the remaining lifespan based on at least one piece of the information among the acquired second to sixth information and at least one threshold among the acquired third to eighth threshold, the at least one threshold among the acquired third to eighth threshold corresponding to the at least one piece of the information among the acquired second to sixth information.

7. The host device according to claim 1, wherein each of the second to sixth information includes an attribute ID.

8. The host device according to claim 1, wherein the nonvolatile semiconductor memory is a NAND type flash memory, and wherein a capacitance of the semiconductor memory device is larger than a capacitance of data that is accessible from the host device.

9. The host device according to claim 1, further including a memory, and wherein the host device is configured to be capable of storing at least one piece of information among the second to sixth information acquired from the semiconductor memory device into the memory, and configured to display time-series data of the at least one piece of information stored in the memory on the display device.

10. The host device according to claim 9, further including a nonvolatile memory, and wherein the host device is configured to back up the at least one piece of information stored in the memory into the nonvolatile memory, and configured to erase, when data is backed up in the nonvolatile memory, old data among data stored in the nonvolatile memory.

* * * * *